(12) United States Patent
Shin et al.

(10) Patent No.: US 6,295,728 B1
(45) Date of Patent: Oct. 2, 2001

(54) PRINTED CIRCUIT BOARD ASSEMBLY MANUFACTURING SYSTEM

(75) Inventors: Eon-Min Shin; Kyu-Dong Lee; Tae-Ha Kim; Doo-Won Kang; Bum-Suck Kim; Yang-Koog Kim; Seong-Deok Lee, all of Gumi (KR)

(73) Assignee: SamSung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/327,159

(22) Filed: Jun. 3, 1999

Related U.S. Application Data

(62) Division of application No. 08/978,469, filed on Nov. 25, 1997, now Pat. No. 6,145,190.

(30) Foreign Application Priority Data

Nov. 25, 1996 (KR) ................................. 96/57795
Nov. 29, 1996 (KR) ................................. 96/60056
Nov. 29, 1996 (KR) ................................. 96/61340
Nov. 29, 1996 (KR) ................................. 96/61342

(51) Int. Cl.$^7$ .............................. A05K 3/34; B23P 19/00
(52) U.S. Cl. ............................... 29/840; 29/740; 29/832; 29/564.1; 198/339.1; 198/341; 198/436; 198/520; 414/130; 414/136; 414/224
(58) Field of Search ............................ 29/840, 740, 832, 29/564.1; 198/339.1, 341, 435, 436, 520; 414/134, 136, 786, 224

(56) References Cited

U.S. PATENT DOCUMENTS

| | | |
|---|---|---|
| 3,421,211 | 1/1969 | Eaves et al. . |
| 3,803,556 | 4/1974 | Duffy . |
| 4,256,296 | 3/1981 | Scheinert . |
| 4,504,919 | 3/1985 | Fujii et al. . |
| 4,564,102 | * 1/1986 | Mori et al. . |
| 4,604,704 | 8/1986 | Eaves et al. . |
| 4,694,570 | * 9/1987 | Rudolph et al. . |
| 4,706,187 | * 11/1987 | Arai et al. . |
| 4,719,694 | 1/1988 | Herberich et al. . |
| 4,731,567 | 3/1988 | Dands et al. . |
| 4,759,488 | 7/1988 | Robinson et al. . |
| 4,821,197 | 4/1989 | Kenik et al. . |
| 4,850,104 | 7/1989 | Matrone et al. . |
| 4,980,970 | 1/1991 | Uchida et al. . |
| 5,067,648 | 11/1991 | Cascini . |
| 5,086,557 | 2/1992 | Hyatt, Jr. . |
| 5,170,554 | 12/1992 | Davis et al. . |
| 5,268,849 | 12/1993 | Howlett et al. . |
| 5,321,885 | 6/1994 | Hino et al. . |
| 5,335,601 | 8/1994 | Matsumoto et al. . |
| 5,355,579 | 10/1994 | Miyasaka et al. . |
| 5,536,128 | 7/1996 | Shimoyashiro et al. . |
| 5,680,696 | 10/1997 | Bonura et al. . |

* cited by examiner

Primary Examiner—Carl J. Arbes
(74) Attorney, Agent, or Firm—Robert E. Bushnell, Esq.

(57) ABSTRACT

A system for manufacturing a print board assembly, which is implemented in a system having a computer for storing parts insertion instruction diagrams and displaying parts insertion instructions, and a soldering unit for soldering a printed circuit board, includes: assembling different types of the printed circuit boards from pieces of parts and inspecting them in a multitude of cells; installing different types of the printed circuit boards in carriers to assemble them separately according to the parts insertion instructions displayed by the computer of each cell, and moving them to the soldering unit through a transfer conveyor line; and returning the carriers having the printed circuit boards completely soldered to each cell identified for the carriers through a return conveyor line.

39 Claims, 99 Drawing Sheets

```
     T115
2518─┤ ├────[F0  MV  ,  K 15  ,  DT 0   ]
     t/t#2
     t/r er
     T121
2524─┤ ├────[F0  MV  ,  K 21  ,  DT 0   ]
     t/t#1
     1't er
     T122
2530─┤ ├────[F0  MV  ,  K 22  ,  DT 0   ]
     t/t#1
     2'd er
     T123
2536─┤ ├────[F0  MV  ,  K 23  ,  DT 0   ]
     t/t#1
     t/r er
     T124
2542─┤ ├────[F0  MV  ,  K 24  ,  DT 0   ]
     t/t#1
     cet er
     T131
2548─┤ ├────[F0  MV  ,  K 31  ,  DT 0   ]
     w1 l/d
     #1 u/d
     T132
2554─┤ ├────[F0  MV  ,  K 32  ,  DT 0   ]
     w1 l/d
     #1 fwd
     T133
2560─┤ ├────[F0  MV  ,  K 33  ,  DT 0   ]
     w1 l/d
     #1 u/d
     T134
2566─┤ ├────[F0  MV  ,  K 34  ,  DT 0   ]
     w1 l/d
     #2 fwd
     T135
2572─┤ ├────[F0  MV  ,  K 35  ,  DT 0   ]
     w1 l/d
     #3 u/d
     T136
2578─┤ ├────[F0  MV  ,  K 36  ,  DT 0   ]
     w1 l/d
     #3 f/r
```

FIG. 95

```
     T141
2584─┤ ├───[F0  MV  ,  K 41  ,  DT 0    ]
     w2 l/d
     #1 u/d
     T142
2590─┤ ├───[F0  MV  ,  K 42  ,  DT 0    ]
     w2 l/d
     #1 fwd
     T143
2596─┤ ├───[F0  MV  ,  K 43  ,  DT 0    ]
     w2 l/d
     #2 u/d
     T144
2602─┤ ├───[F0  MV  ,  K 44  ,  DT 0    ]
     w2 l/d
     #2 fwd
     T145
2608─┤ ├───[F0  MV  ,  K 45  ,  DT 0    ]
     w2 l/d
     #3 u/d
     T146
2614─┤ ├───[F0  MV  ,  K 46  ,  DT 0    ]
     w2 l/d
     #3 f/r
     T151
2620─┤ ├───[F0  MV  ,  K 51  ,  DT 0    ]
     w3 l/d
     #1 u/d
     T152
2626─┤ ├───[F0  MV  ,  K 52  ,  DT 0    ]
     w3 l/d
     #1 fwd
     T153
2632─┤ ├───[F0  MV  ,  K 53  ,  DT 0    ]
     w3 l/d
     #2 u/d
     T154
2638─┤ ├───[F0  MV  ,  K 54  ,  DT 0    ]
     w3 l/d
     #2 fwd
     T155
2644─┤ ├───[F0  MV  ,  K 55  ,  DT 0    ]
     w3 l/d
     #3 u/d
```

FIG. 96

PRINTED CIRCUIT BOARD ASSEMBLY MANUFACTURING SYSTEM

CROSS-REFERENCE TO RELATED APPLICATIONS

This application is a division of Applicant's Ser. No. 08/978,469, filed in the U.S. Patent & Trademark Office on Nov. 25, 1997 now U.S. Pat. No. 6,145,190.

CLAIM OF PRIORITY

This application makes reference to and claims all benefits accruing under 35 U.S.C. §§119 and 120 from applications for PRINT BOARD ASSEMBLY PRODUCING SYSTEM AND METHOD earlier filed in the Korean Industrial Property Office: on the 25th day of Nov. 1996 and there to duly assigned Ser. No. 1996-57795; on the 29th day of Nov. 1996 and there duly assigned Ser. No. 1996-60056; on the 29th day of Nov. 1996 and there duly assigned Ser. No. 1996-61342; and on the 29th day of Nov. 1996 and there duly assigned Ser. No. 1996-61340.

BACKGROUND OF THE INVENTION

1. Field of the Invention

The present invention relates to a printed circuit board assembly manufacturing system and, more particularly, to a such manufacturing system that can simultaneously produce various kinds of printed circuit boards in one production line.

2. Description of the Related Art

The extraordinary growth in demand for consumer electronics products in recent years has resulted in a concomitant growth in demand for printed circuit board (PCB) assemblies used in such products. Rapid technological advances have also shortened the life cycles of electronics products, as consumer preferences adjust to the availability of new product features and improved quality. To compete in markets where consumers demand ever-increasing quality along with low prices, electronics manufacturers must reduce the production costs associated with PCB assembly production.

PCB assembly (PCBA) manufacture has tended to carry particularly high costs arising from two sources: set-up operations and production defects. Set-up of a production line for a different PCBA product entails refitting line equipment, retraining line operators, adjusting product transport equipment such as conveyors, and distributing parts for the new product to the various work stations. A change of the line set-up from one product to another therefore requires extensive expertise and substantial amounts of time. These operations have necessarily idled the entire production line for the duration of the retooling process. The shortened product life cycles that have become characteristic of the electronics industry only exacerbate the impact of set-up costs, because shorter production runs necessarily increase the per unit costs of production.

Line parallelism has been proposed as a way to mitigate the effect of set-up operations on overall productivity. For example, U.S. Pat. No. 4,719,694, issued Jan. 19, 1988 to Herberisch et al., discloses a system that divides a large number of PCB process steps into several groups of related operations performed in succession at several parallel cells of work stations. Each cell has a buffer area to store incoming units for which the cell is not ready or outgoing units for which a succeeding cell is not ready. Changing the production line over to a new product model can therefore proceed from cell to cell sequentially, rather than stopping the entire production line until every cell has completed its set-up for the new model.

This system substantially reduces down time costs, but its effectiveness is limited because it requires extensive coordination as the set-up process progresses through successive cells of the production line. Once a set-up process begins, it must propagate through the entire production line before the line can resume an optimal production rate. Moreover, the set-up process cannot easily be suspended or interrupted. The disclosed system also only rearranges a multiplicity of individual process steps, and it therefore does not address the issue of quality control.

A related approach is proposed in U.S. Pat. No. 5,170,554, issued Dec. 15, 1992 to Davis et al., which discloses a method of reducing set-up overhead by arranging a known production bottleneck into temporal cells. A temporal cell is defined in terms of a group of products, each of which is capable of being processed through the bottleneck using a single machine set-up. The method provides for careful planning of the duration and scope of these cells to allow a reduction in the number of set-up cycles and to overlap set-up cycles with production cycles.

This method shares some of the advantages of the '694 system discussed above. However, the approach of the '554 patent also demands careful coordination between production and set-up. Also like the system of the '694 patent, this system does not enhance quality control. It also does not consider potential gains from reconfiguring the physical arrangement of the production line.

An alternative approach uses multiple production lines to manufacture several different product models simultaneously. For example, U.S. Pat. No. 5,355,579, issued Oct. 18, 1994 to Miyasaka et al., discloses a production line system that comprises several individual lines arranged in parallel. Redundancy in the system is reduced by directing the output of the several parallel lines to a common packaging station. Each individual line in the system operates independently of the other lines to produce a particular product model, with the only interaction between lines occurring indirectly through the packaging station.

The substantial parallelism of the '579 patent's system reduces idle time for the overall system by decoupling the system into semi-independent sub-lines. This result comes, however, at the price of equipment duplication to implement the parallel production lines. More importantly, set-up for a production line generates similar overhead costs whether the line stands alone or in parallel with several other lines. Each of the disclosed system's sub-lines must be stopped to be changed over to a new product set-up, just as if that sub-line stood as an independent production line. The sharing a common packaging station at the end reduces these costs somewhat. However, the relative benefit of this measure declines as each of the individual lines grows in complexity and length.

None of the references mentioned above addresses the second major source of lost productivity in manufacturing systems for PCB assemblies: the incidence of production defects. These defects arise because the assemblies typically are structurally and functionally complex. The production system must therefore reliably assemble numerous different components and provide for a multitude of testing procedures to ensure proper operation of completed units. Faced with these system requirements, a traditional view of mass production has taught the division of the process into numerous specialized tasks, whereby the performance of each task (whether by a human operator or by automated equipment) can be designed to maximize throughput.

Extensive task specialization can cause its own problems, however, because it generally multiples the number of discrete operations in a fabrication process. This discretization can quickly erode the efficiency gains of task specialization because it increases the costs of adjusting the system to changed circumstances. Task discretization therefore tends to increase both the occurrence of production problems and the difficulty of quickly detecting those problems.

This problem arises whether the production line consists of fully automated process station or also employs human operators. For example, suppose that a process involves three or four operators working in serial relation. If a recurrent defect begins to arise in work units output from the first operator station, the problem can be quickly corrected even if it is not detected until the affected work units begin to arrive at the last station. If the system distributes the same process steps across 15 or 20 workers, in contrast, it may incorporate the defect into many more units before the defect is noticed. The effect can be even more pronounced with automated stations, where defect detection may be delayed by test and measurement limitations.

Two other mechanisms particularly affect production systems that employ human operators. First, the presence of a latent defect may be more difficult to detect in a highly discretized process. For example, a human operator carrying out a highly specialized task is more prone to boredom or inattentiveness, which can cause errors or prevent their prompt detection. Moreover, in a line with more process stations (whether operator controlled or fully automated), the nature and cause of a defect and its likely effects must be assessed for more stations.

In the case of human-operated stations, problem assessments and corresponding instructions must be quickly communicated to the station operators. This communication facilitates a coordinated response and is particularly important when the defect results from the combined work operations of several stations. In addition, similar problems may occur across several parallel sub-lines, and an adequate response to these situations requires an additional level of communication and coordination.

It follows that when a manufacturing system includes a large number of discrete work stations, problems are more difficult to detect rapidly and coordinated responses are more difficult to implement. Parallelism, as disclosed in the references cited above, reduces the overhead costs of line set-up, but it does not mitigate and may exacerbate the difficulty of responding to problems that arise during production.

We have therefore found that the electronics manufacturing arts have lacked a production arrangement that reduces overhead costs from both line set-up and production defects. Such an arrangement should minimize the need to reconfigure line equipment for production of a different PCBA product. It should also allow line elements not involved in a set-up operation to continue production, as well as allowing rapid detection and response to problems that arise in production. Preferably, such an arrangement would address these goals at all levels of the system design. Ideally, such a system would amplify its efficiency gains both by incorporating modem computerized process control technologies and by realizing the system responsiveness that human operators can provide.

SUMMARY OF THE INVENTION

An object of the present invention is to provide a cell line for a PBA manufacturing system which can enhance productivity by assembling different types of PCBs in several work frames simultaneously while providing a common soldering facility and return of each soldered unit to its respective work frame for inspection.

Another object of the present invention is to provide a PBA manufacturing system by which a small number of skilled workers assigned to each work frame do the overall procedures in a production line covering from assembly to inspection for different kinds of parts.

According to one aspect of the present invention, a system for manufacturing a print board assembly, which has a spray flux for flux-coating a printed circuit board installed in a carrier, and a soldering unit for soldering the printed circuit board coated with flux, comprising: a multitude of work frames having a multitude of work frame upper conveyors for placing each of the carriers thereon by a number of workers, installing different types of the printed circuit boards in the carriers and inserting parts into the printed circuit boards according to parts insertion instructions, the carriers with the printed circuit boards soldered being returned to the work frame upper conveyors by types of the printed circuit board; an upper conveyor for transferring the carriers from the work frames to the soldering unit, with a multitude of transfer switch turned on; a carrier transfer distance controller for adjusting a transfer distance of the carriers on the upper conveyor so as to prevent the carriers from colliding with each other; a multitude of up/down and rotation units for moving the carriers up to the height of the spray flux and rotating them in a 90-degree arc; a slope conveyor for moving one side of the carriers down so as to have a declination during soldering; an elevator for moving the carriers down when the carriers are transferred from the slope conveyor and enter the elevator; a rotation unit for rotating the carriers reversely in a 90-degree arc so as to change their orientations; a lower conveyor for transferring the carriers rotated reversely by the rotation units to return, the carriers being moved down to the lower conveyor by the elevator when they are transferred from the slope conveyor; a multitude of lifters for moving the carriers returned by the lower conveyors up to the work frame upper conveyors; a multitude of carrier type sensing units installed in each designated position of the lower conveyor to detect positions of cell-recognizing indicators of the carriers; a controller for controlling the carriers to return to each work frame designated in response to a determining signal received from a carrier type discrimination unit to determine a transfer status of the carriers, generating a driving control signal for the work frame upper and lower conveyors and a carrier control signal to move up or down the carriers, and generating a motor control signal to drive base boards for supplying the parts in the clockwise or counterclockwise direction; and a multitude of sensors installed on the upper and lower conveyors to sense the transfer status of the carriers.

BRIEF DESCRIPTION OF THE DRAWING FIGURES

A more complete appreciation of this invention, and many of the attendant advantages thereof, will be readily apparent as the same becomes better understood by reference to the following detailed description when considered in conjunction with the accompanying drawing figures, in which like reference symbols indicate the same or similar components, but which are attached only by way of example, wherein:

FIG. 1 schematically illustrates a PCB assembly system with several discrete process stations in serial order;

DETAILED DESCRIPTION OF THE PREFERRED EMBODIMENT

Figure 1:
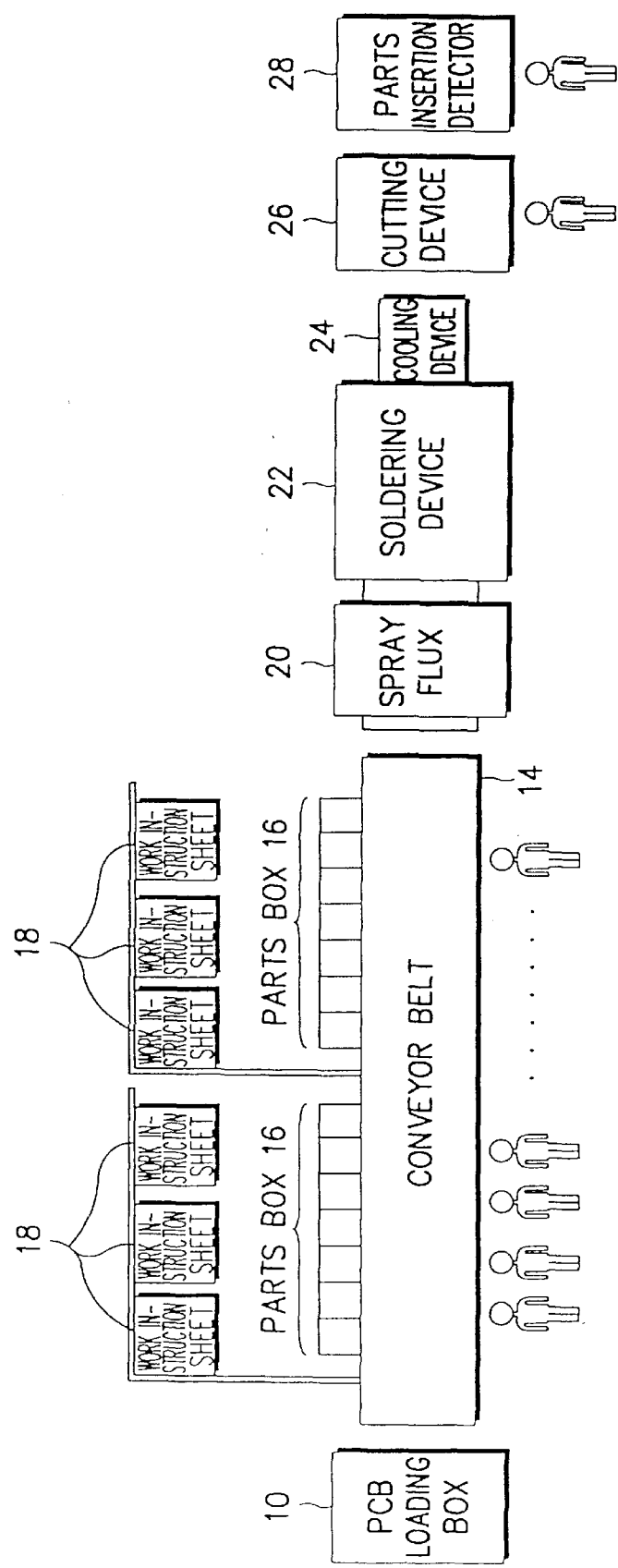

FIG. 1 schematically illustrates a serial PCB assembly manufacturing system having several discrete work stations. A number of bare PCBs (not shown) are loaded in a PCB loading box 10. A worker takes out a PCB from PCB loading box 10, places it on a conveyor belt 14, and inserts corresponding parts, indicated on a work instruction sheet 18 and provided in parts boxes 16, into the PCB as the PCB slowly moves. The next worker takes out the parts indicated in the work instruction sheet 18 from parts boxes 16 and inserts them into the PCB as it travels past the second worker on conveyor belt 14.

In the serial arrangement of FIG. 1, each worker only inserts his assigned parts into the PCB and passes the PCB on to the next worker through the conveyor belt 14. When all the required parts are inserted into the PCB by the workers, the PCB is conveyed to a spray flux station 20. At spray flux station 20 the PCB is coated with soldering flux, and then it is delivered to a soldering device 22. The soldering machine 22 solders the fluxed PCB, after which the soldered PCB is cooled at a cooling station 24. A worker then shifts the soldered and cooled PCB to a cutting device 26. After cutting the PCB, anther worker checks whether the parts are correctly inserted by using a parts insertion detector 28. This operation is repeated with each PCB assembled.

Figure 2:
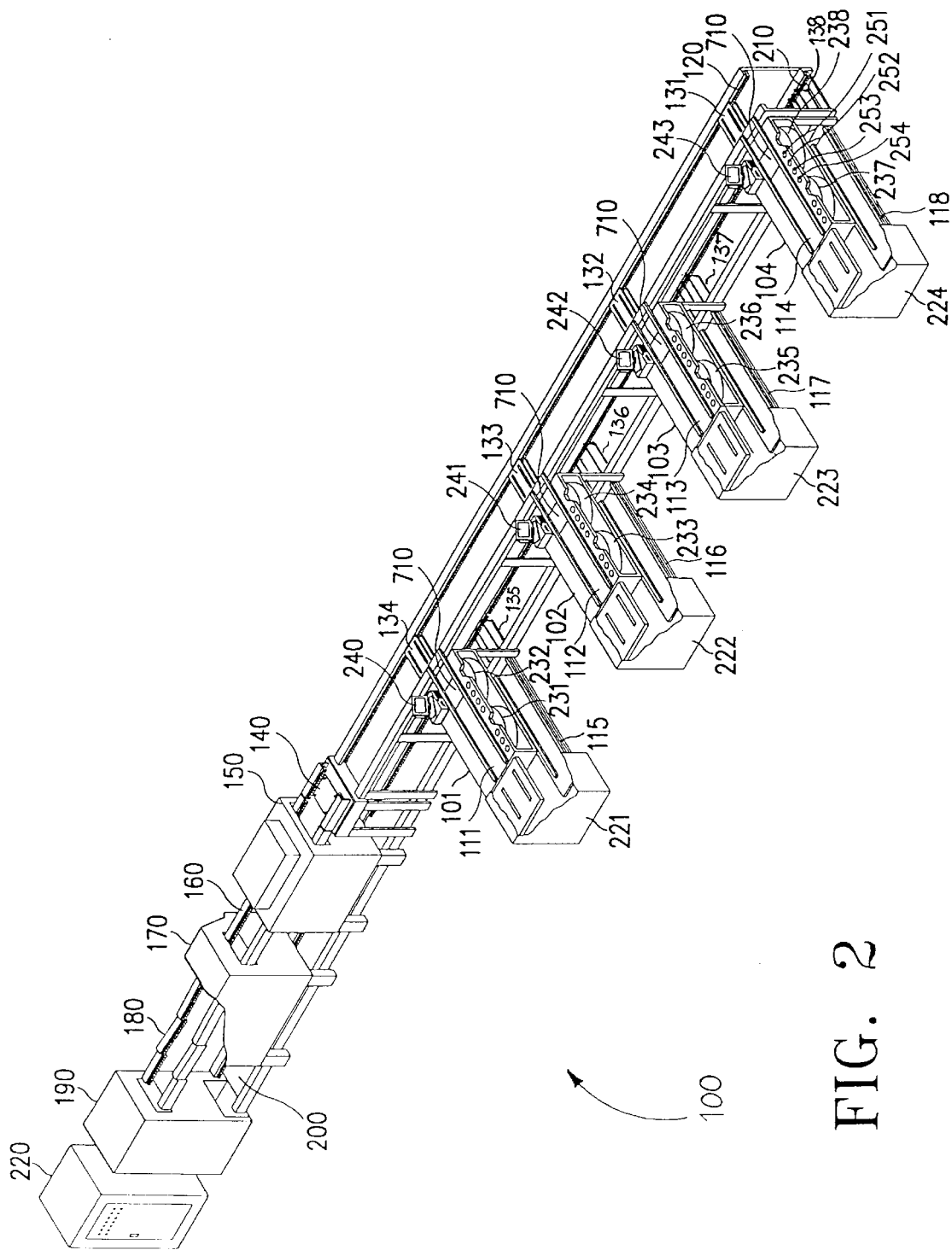
FIG. 2 is a perspective view of a system configured as a line of parallel work frames, according to the present invention for manufacturing various types of PCBA products in small quantities.

FIG. 2 shows a production line embodying the present invention. The disclosed system 100 illustratively includes first through fourth work frames 101 to 104, at which a number of workers place carriers 710 on a plurality of work frame upper conveyors 111 to 114. The workers then install a PCB (not shown) in each carrier 710 in preparation for inserting parts into the PCB. After parts insertion at work frames 101–104, the parts-installed but unsoldered PCBs are transferred to an automated spray flux station 150 and an automated soldering unit 170. Carriers 710 containing soldered PCBs are returned for collection at the right side end of the work frame upper conveyors 111 to 114.

Work frames 101–104 each have the following features that facilitate their operation. Each one of work frames 101–104 includes a respective one of a plurality of computers 240–243. Computers 240–243 store a program for displaying parts insertion instruction diagrams according to the type of PCB to be assembled at their respective work frames. Each carrier 710 can be rotated both clockwise and counterclockwise about a vertical axis, which facilitates the insertion process by allowing the PCB to be in either a clockwise or counterclockwise orientation.

Each of the computers 240–243 displays, on a monitor, work instructions for inserting the parts in the clockwise or counterclockwise orientation. Clockwise and counterclockwise rotation switches 252 and 253 display the work instructions for insertion of parts in the clockwise and counterclockwise orientations, respectively. Alternatively, a foot switch 256 (see FIG. 7) controls the same display function for inserting the parts in the clockwise orientation.

Figure 10:
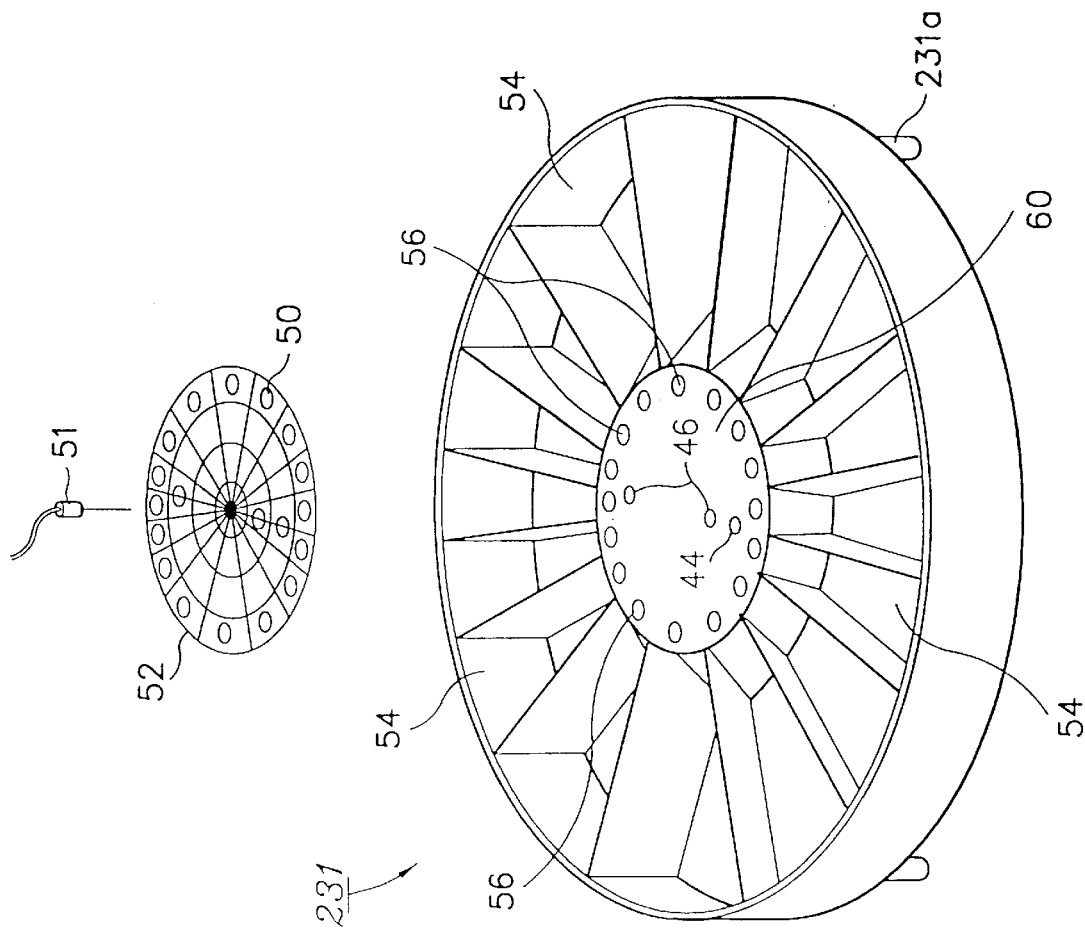
FIG. 10 is a perspective view of a base board which can put a variety of parts according to the present invention.

Work frames 101–104 also collectively include a plurality of baseboards 231–238 with, for example, two such base boards included in each work frame. As shown in FIG. 10, each of base boards 231–238 has a generally round cross-section and is divided by partitions into a plurality of parts containers 54 to be loaded with different kinds of parts. Each of base boards 231–238 supplies required parts to a worker at a respective one of work frames 101–104 by rotating under the control of a PLC (Programmable Logic Controller) 220. In the illustrative embodiment of FIG. 2, two of base boards 231–238 are installed in each work frame.

The operation of base boards 231–238 will be described with reference to base board 238 as a concrete example. Pressing one of rotation switches 252 or 253 generates a key signal that causes PLC 220 to control base board 238 to rotate in the clockwise or counterclockwise direction, respectively. Actuation of foot switch 256, which is connected to clockwise rotation switch 252, similarly causes base board 238 to rotate in the clockwise direction. Pressing a reset switch 254 causes a key signal to rotate base board 238 to its original position.

The process and equipment for transfer of PCBs in system 100 from work frames 101–104 to flux and soldering stations 150 and 170 will now be described, with exemplary reference to work frame 104. When the parts insertion process has been completed for one or more carrier-mounted PCBs at work frame 104, a worker presses a transfer switch 251, which causes a key signal to be generated. The key signal controls work frame upper conveyor 114 to move carriers 710 from the right side end of conveyor 114 to a first conveyor 120. When transfer switch 251 is pressed, an up-down unit 131 moves up to work frame upper conveyor 114 so as to receive a loaded carrier 710. When carrier 710 has been completely transferred to up-down unit 131, then up-down unit 131 moves down to load first conveyor 120 with carrier 710.

First conveyor 120 then conveys carrier 710 thus received from work frame 104 toward soldering unit 170 for soldering of the PCB installed in carrier 710. An up-down and rotation unit 140 moves carrier 710 up to a designated height and rotates it through a 90-degree angle. This rotation ensures proper formation of solder junctions during soldering. Spray flux station 150 flux-coats the PCB installed in carrier 710 in a manner well known in the art. Spray flux station 150 discharges carrier 710 horizontally, but then an auxiliary conveyor 160 transfers carrier 710 at an incline of 6 degrees to soldering unit 170.

Soldering unit 170 applies solder to the PCB in a manner well known in the art. Carrier 710 is then discharged from soldering unit 170 at a designated position. A slope conveyor 180 transfers carrier 710 from soldering unit 170 to a first elevator 190. Slope conveyor 180 may be configured, for example, to perform this transfer horizontally from soldering unit 170 to first elevator 190, but with one side of carrier 710 lowered to maintain the PCB at an inclined angle after carrier 710 exits soldering unit 170.

First elevator 190 receives carrier 710 from slope conveyor 180 at a designated position and transfers carrier 710 down to a second conveyor 210. A rotation unit 200 then receives carrier 710 from first elevator 190 and rotates it through a 90-degree angle. This second rotation operation returns carrier 710 to its original orientation, thus preparing carrier 710 for return to work frame 104 from whence it came. A second conveyor 210 transfers carrier 710 back to work frame 104.

Fifth through eighth up-down units 135–138 are installed at the bottom of second conveyor 210 and aligned vertically with first through fourth up-down units 131–134. Carrier 710 transferred by second conveyor 210 is lifted up to a work frame lower conveyor 118 of work frame 104 by up-down unit 138. Lower conveyor 118 transfers carrier 710 from up-down unit 138 to the right hand end of work frame 104. A lifter 224 raises carrier 710 from work frame lower conveyor 118 up to work frame upper conveyor 114.

Work frames 101–103 of course include respective lower up-down units 131–133, frame unit lower conveyors 115–117, and lifters 221–223. This arrangement of conveyors, up-down units, and lifters thus enables a specific carrier 710 originating from any of work frames 101–104 to return to that same work frame for post-soldering inspection. In contrast with the systems of the cited references, therefore, the present invention enables the same workers who performed the initial component insertion process to inspect the boards for flaws after the boards have been soldered.

The operation of computers 240–243 in conjunction with base boards 231–238, to be described in more detail below, substantially reduces the rate of defects in PCBAs produced in accordance with the present invention. However, system 100 enables further improvements in productivity by sending each soldered PCB back to its frame of origin for testing. The expertise and observations of the workers who inserted components into a PCB are thus used to advantage a second time by returning each of the soldered PCBs to its frame of origin for inspection by the workers who inserted the components.

In effect, the serial line of FIG. 1, wherein parts insertion, trimming, and inspection are each performed at discrete stations, is "folded" after the soldering step. With this folded configuration, the defect detection and communication problems associated with discretized process steps are largely eliminated. This is possible because the same workers who perform the parts insertion steps, where most production defects may originate, also perform the inspection steps to detect defects and report them for correction.

The operation of system 100 depends extensively upon computerized control systems. PLC 220 stores a program to control the overall operation of system 100. PLC 220 receives output signals from a plurality of sensors that monitor the movement status of carrier 710. In accordance with these sensor output signals and its stored program, PLC 220 initiates and suspends movements of carrier 710 at each transfer stage. For example, pressing transfer switch 251 signals PLC 220 to drive work frame upper conveyor 114 (or one of work frame upper conveyors 111–113 corresponding to work frames 101-1–3, respectively). PLC 220 also controls each of base boards 231–238 for rotation in response to signals from their respective rotation switches 252 and 253, as well as for clockwise rotation in response to a respective foot switch 256.

The basic configuration of system 100, described above, differs substantially from and provides definite advantages over the systems disclosed in the cited references. However, particular structural features of system 100 warrant further detailed description because these features, while not necessary to the basic system, are included in a preferred version of the system and enhance its effectiveness. The discussion will therefore now turn to a description of preferred embodiments for carriers 710, work frames 101–104, and base boards 231–238.

Figure 3:
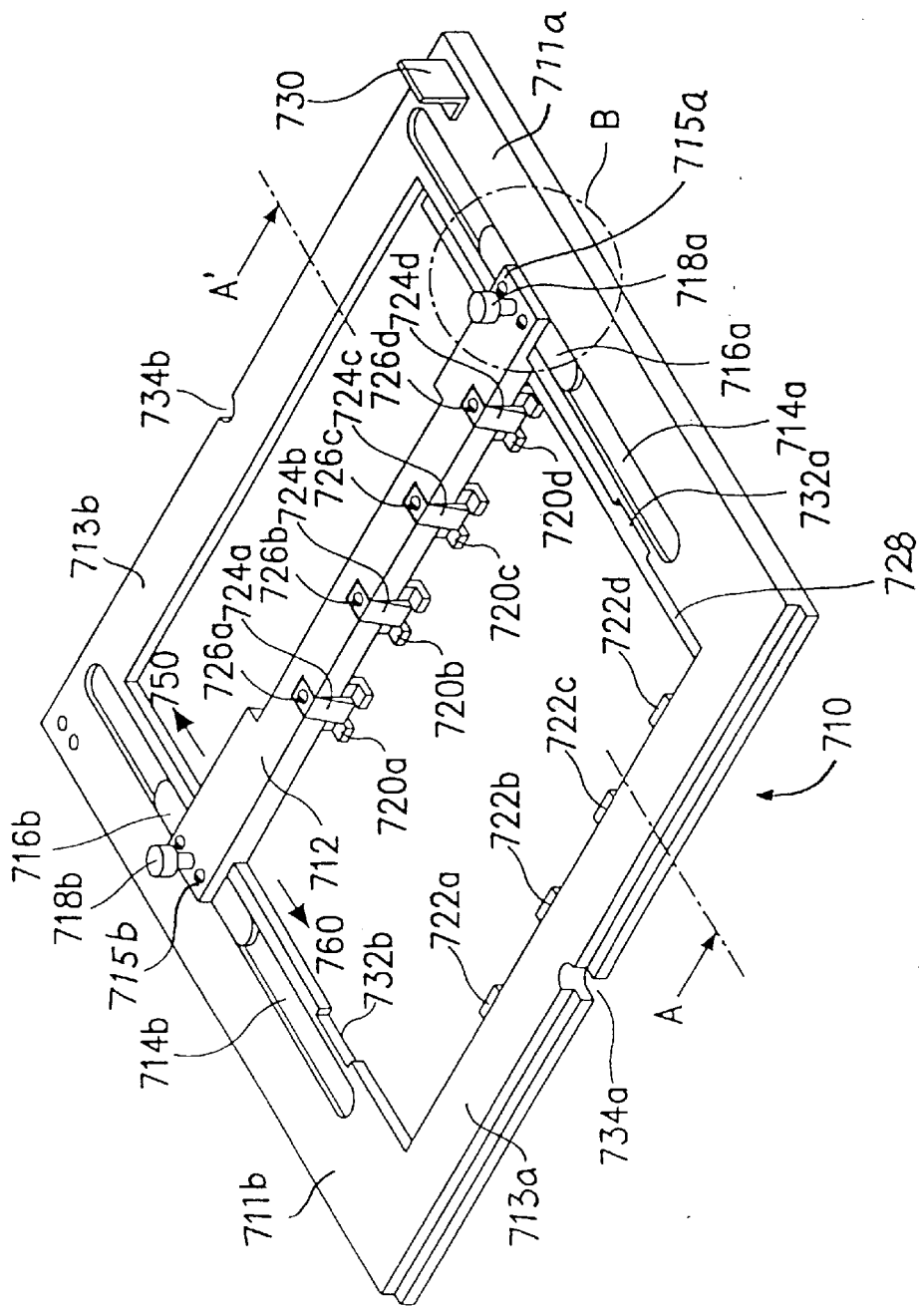
FIG. 3 is a perspective view of a carrier as shown in FIG. 2.

FIG. 3 is a perspective view of carrier 710 shown in FIG. 2. Carrier 710 includes front and rear bars 711a and 711b, which together with right and left bars 713a and 713b define a generally rectangular opening. U-shaped guide grooves 714a and 714b are formed along the top surfaces of the front and rear bars 711a and 711b, respectively. Guides 716a and 716b are respectively inserted into guide grooves 714a and 714b and move freely in a back direction 760 and a forth direction 750 along the common length of guide grooves 714a and 714b.

A positioning bar 712 having front and rear ends 715a and 715b, respectively, is disposed between front bar 711a and rear bar 711b and generally parallel to right and left bars 713a and 713b. Guides 716a and 716b are also inserted into a pair of C-shaped grooves formed at front end 715a and rear end 715b, respectively, and are fastened to positioning bar 712 with suitable fastening means, such as screws. Guides 716a and 716b are clamped into fixed positions in guide grooves 714a and 714b with clamping screws 718a and 718b, installed at front and rear ends 715a and 715b, respectively.

The heads of clamping screws 718a and 718b, for fixing guides 716a and 716b, project above positioning bar 712. Screws 718a and 718b also have shanks that pass through holes formed in front and rear ends 715a and 715b of positioning bar 712 and through guides 716a and 716b and press against the bottoms of the guide grooves 714a and 714b. Coupling grooves 732a and 732b are formed on inside edges of front and rear bars 711a and 711b, respectively. The lower parts of the C-shaped grooves formed at the ends of positioning bar 712 are inserted through coupling grooves 732a and 732b.

A solder preventive sill 728 extends along the bottom surface of front bar 711a and generally parallel thereto. Sill 728 has a side rail that extends downward from front bar 711a and a bottom rail that projects horizontally from the bottom edge of the side rail and into the rectangular opening defined by carrier 710. Sill 728 is fastened to front bar 711a by suitable means, such as a screw.

Two holes, which are used for attaching a cell detection plate 730, are drilled in the left end of each of front and rear bars 711a and 711b. Cell detection plate 730 carries an identifying indicium that, when detected by a sensor to be described later, enables PLC 220 to determine the correct work frame to which carrier 710 corresponds. Plate 730 may be attached to either front bar 711a or rear bar 711b by screws threaded into the holes described above. The position and orientation of cell detection plate 730 will depend on the location of the work frame where the operation for the PCB is performed.

Right and left bars 713a and 713b have defined therein stop grooves 734a and 734b, respectively, each of which is formed at the center of an outside edge of its respective bar. L-shaped brackets 722a, 722b, 722c, and 722d are fastened to and project from the bottom of an inside edge of right bar 713a. Brackets 722a–d are separated by predetermined intervals that increase in length from front bar 711a to rear bar 711b. Brackets 720a, 720b, 720c, and 720d are fastened to and project from the bottom right side of positioning bar 712 and respectively face brackets 722a–d. Each one of brackets 720 has a lower end that defines a groove therein.

Attached to the right side of positioning bar 712 are a plurality of leaf springs 724, with each leaf spring 724 corresponding to one of brackets 720a–d. upper ends of leaf springs 724a–d attach to the top of the positioning bar 712 with coupling screws 726a, 726b, 726c, and 726d, respectively. The lower ends of leaf springs 724a–d are curved at the edge of positioning bar 712 at a first predetermined angle (not exceeding 90°) and offset from the right side of positioning bar 712. Therefore, the bottom ends of leaf springs 724 project into the grooves in their respective brackets 720 but do not touch the left and right sides of the grooves.

Figure 4:
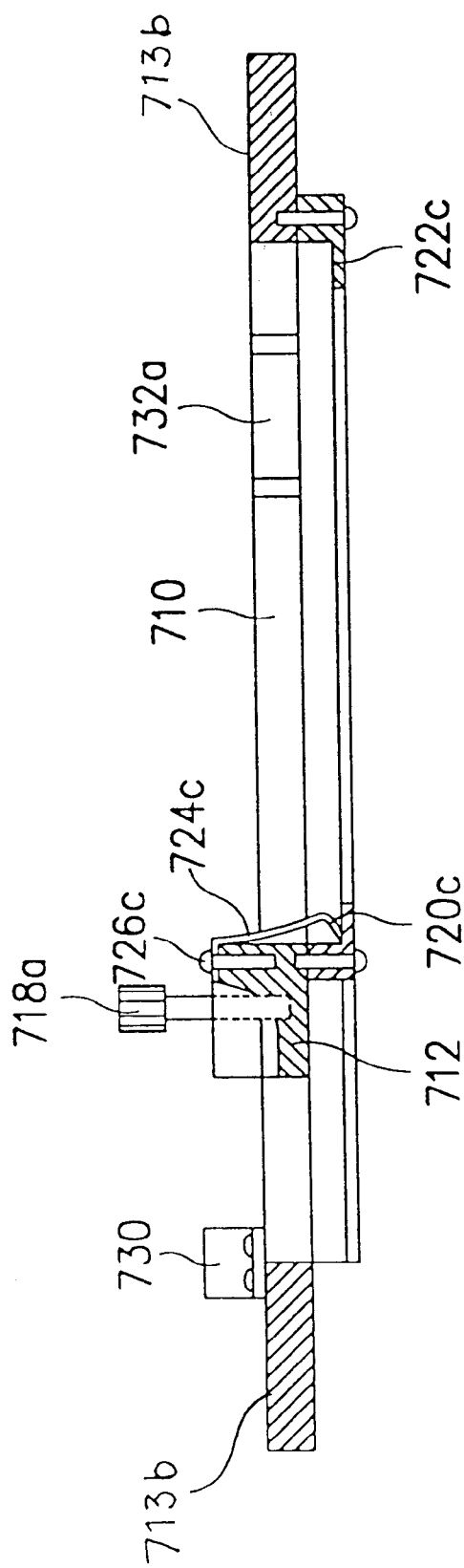
FIG. 4 is a cross sectional view taken along line A–A' of the carrier shown in FIG. 3.

FIG. 4 shows a cross-section of carrier 710 along the line A–A" and depicts details of bracket 722c and its facing bracket 720c. As shown in FIG. 4, the right face of bracket 720c must extend downward collinearly from the right (i.e., inner) side of positioning bar 712. Bracket 720c has a lower protrusion that extends horizontally at a vertical level substantially equal to the level of the bottom rail of solder preventive sill 728.

Leaf spring 724c has a free lower end and a fixed upper end that is attached to the top of positioning bar 712 with coupling screw 726c. From its fixed upper end, leaf spring 724c curves away from the right side of positioning bar 712 at the first predetermined angle (not exceeding 90°). This arrangement defines a space between the side of positioning bar 712 and leaf spring 724c. Closer to its free lower end leaf spring 724c curves again, but this time toward the side of the positioning bar 712, at a second predetermined angle. The free lower end of leaf spring 724c is formed so that it does not touch the left and right sides of the groove defined in bracket 720c.

The double curvature of leaf spring 724c thus defines the space between the right side of positioning bar 712 and leaf spring 724c to be generally triangular and enables leaf spring 724c to deform elastically under tension.

Bracket 722c is fastened to and projects from the bottom left side of right bar 713a. As FIG. 4 indicates, the right face of bracket 722c must extend downward from and collinearly with the left (i.e., inner) side of right bar 713a. Bracket 722c has a lower protrusion that extends horizontally at substantially the same level vertically as the bottom rail of solder preventive sill 728 and the lower end of bracket 720c.

Figure 5:
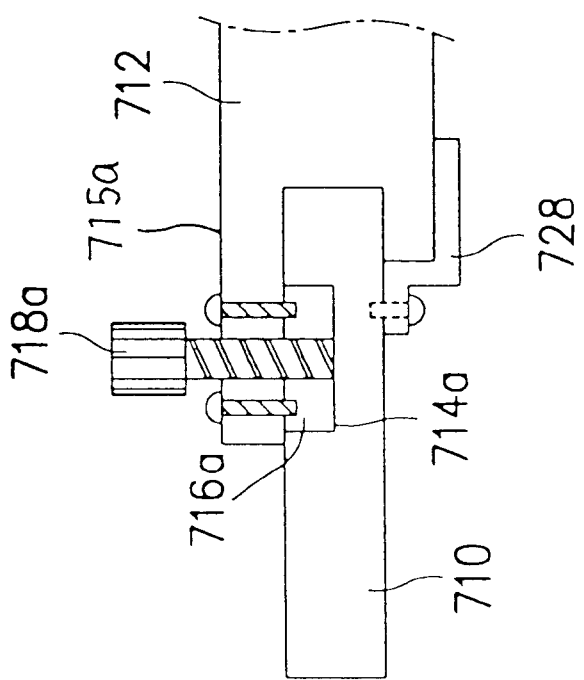
FIG. 5 is a cross sectional view of a part B shown in FIG. 3.

FIG. 5 shows a cross-section detail of the front area designated as B in FIG. 3. Guide 716a slidably resides in guide groove 714a formed in the top of front bar 711a. A top protrusion of the front end 715a of the positioning bar 712, which along with A top protrusion thereof defines the C-shaped groove of front end 715a, extends over guide 716a and the top of front bar 712. The lower protrusion extends under the bottom of front bar 712. Guide 716a fastens to the upper protrusion of positioning bar 712 by suitable means, such as with two screws as shown. The arrangement of the upper and lower protrusions retain front end 715a in proper vertical alignment with respect to front bar 712.

The head of clamping screw 718a projects above the top of the positioning bar 712. Its shank extends through threaded holes through positioning bar 712 and guide 716a, and butts against the bottom of guide groove 714a. Clamping screw 718a, when screwed into contact with the bottom of guide groove 714a, therefore fixes guide 716a and positioning bar 712 at a selected position along the length of guide groove 714a. That is, the end of the shank of clamping screw 718a presses against the bottom of guide groove 714a and thereby generates an upward tension against the upper protrusion of front end 715a of positioning bar 712. Solder preventive sill 728, which may be attached to the bottom of front bar 711 a with screws, projects inward from the bottom of front bar 711a at the same vertical level as brackets 720a–d and 722a–d.

Figure 6:
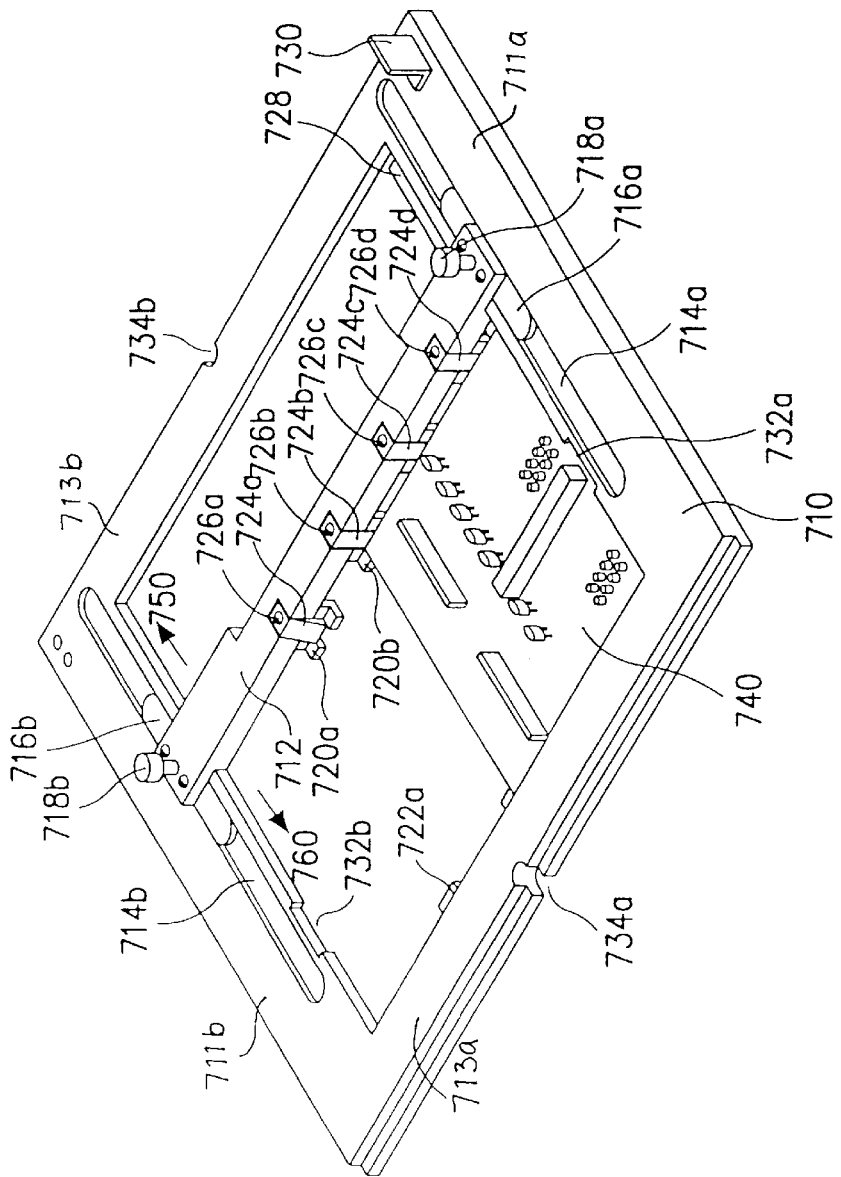
FIG. 6 is a diagram illustrating the carrier of FIG. 3 on which a PCB is mounted.

Carrier 710 as described above effectively holds PCBs of various dimensions and allows a PCB to be mounted easily therein. FIG. 6 illustrates, by way of example, a PCB 740 mounted on carrier 710 of FIG. 3. A worker may loosen the clamping screws 718a and 718b by turning them counterclockwise, which relaxes any tension between clamping screws 718 and the lower protrusions of front and rear ends 715 of positioning bar 712. This allows guides 716 to slide freely left 750 and right 760 (which directions are represented in FIG. 6 with corresponding arrows) along their respective guide grooves 714a and 714b.

The worker then can relocate positioning bar 712 to the left side of carrier 710, which facilitates insert of PCB 740 between positioning bar 712 and right bar 713a. Right bar 713a, it will be recalled, carries brackets 722a–d, some or all of which will support the right side of PCB 740. When positioning bar 712 is moved to the left, guides 716 and their respective ends 715 of positioning bar 712 move in the left direction 750 along guide grooves 714.

With positioning bar 712 positioned sufficiently far from right bar 713a for PCB 740 to be easily inserted therebetween, the worker places the right edge of PCB 740 upon one or more of brackets 722a–d and the front edge of PCB 740 upon the bottom rail of solder preventive sill 728. The worker then returns guides 716a and 716b in the right direction 760, along their respective guide grooves 714a and 714b, until the left side of PCB 740, which is not yet supported by carrier 710, is contacted by one or more of leaf springs 724a–d. The left side of PCB 740 slides onto the lower protrusions of one or more of brackets 722 and depresses the contacted leaf springs 724. Positioning bar 712 can then be adjusted left 750 or right 760 to generate an amount of tension in leaf springs 724 to snugly retain PCB 740 within carrier 710.

With the desired tension in leaf springs 724, the worker tightens down clamping screws 718a and 718b to fix positioning bar 712 and guides 716a and 716b in the selected position. Winding clamping screws 718a and 718b clockwise forces the ends of the clamping screws 718a and 718b against the bottoms of guide grooves 714a and 714b, which in turn generates an upward force against ends 715 of positioning bar 712. The lower protrusions of ends 715 are thereby forced against the bottoms of front and rear bars 711a and 711b, and guides 716a and 716b and positioning bar 712 are thus clamped in the selected position.

If PCB 740 is not correctly mounted on brackets 720, although its left edge presses against leaf springs 724 with the desired tension, the worker can press PCB 740 down to correctly position it on brackets 720 using the elasticity of leaf springs 724. When correctly positioned on brackets 720, PCB 740 is clamped to carrier 740 such that the left side of PCB 740 is held by the gaps formed by the lower curved ends of the leaf springs 724 and thus is prevented from warping during the soldering process.

The PCB mounting operation described above need be performed only the first time a particular carrier 710 for a run of a given PCBA product through system 100. Once carrier 710 has been adjusted for the specific product, the worker need only has remove the soldered PCBA from carrier 710 by pressing it leftward against the tension of leaf springs 724 and lifting. A new PCB can then be mounted without repeating the adjustment operation described above. It is noted that positioning bar 712 can be installed in or removed from carrier 710 by positioning the lower protrusions of ends 715 of positioning bar 712 at the respective coupling grooves 732a and 732b.

Figure 7:
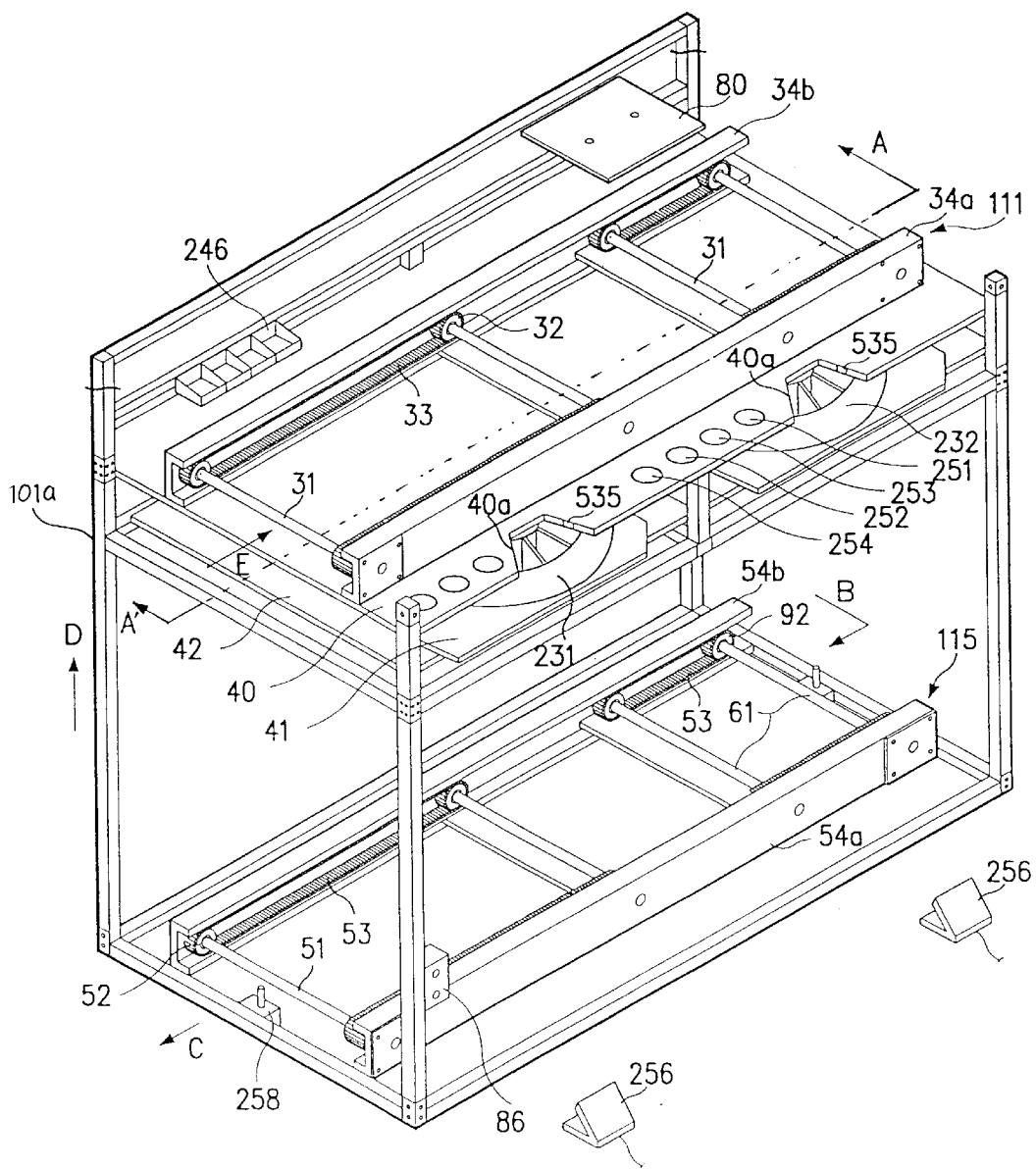
FIG. 7 is a perspective view of a work frame shown in FIG. 2.
Figure 8:
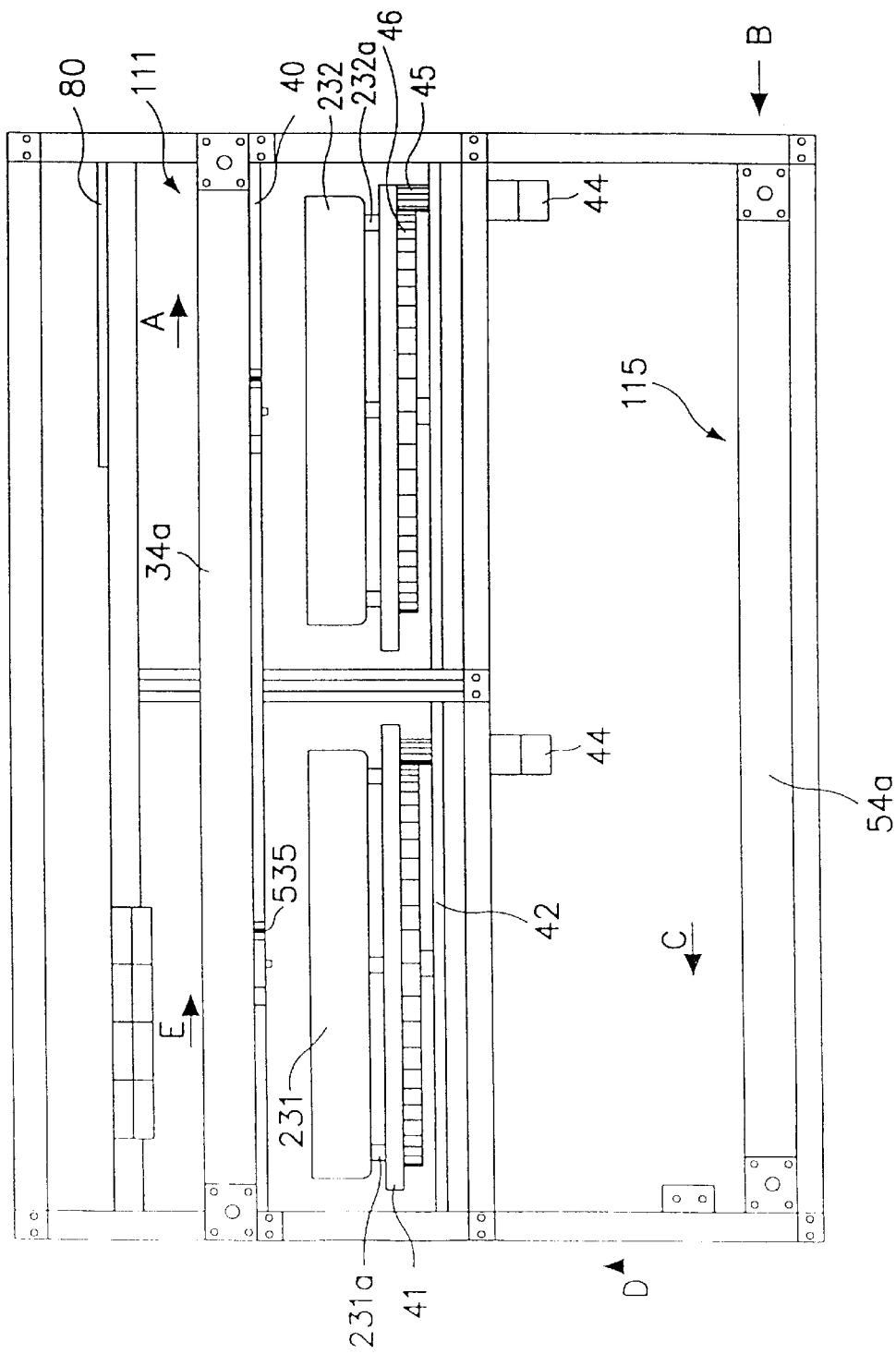
FIG. 8 is a front view of the work frame of FIG. 7.

FIGS. 7 & 8 illustrate the work frame of the present invention and will be used to describe the advantages thereof. FIG. 7 is a perspective view of work frame 101 shown in FIG. 2. FIG. 8 is a front view of the same. FIGS. 7 and 8 do not show carrier 710. Although system 100 includes a plurality of work frames 101–104, only first work frame 101 is illustrated in FIGS. 7 & 8 by way of example.

Referring to FIGS. 7 and 8, a plurality of parts are placed in circular base boards 231 and 232 in groups divided according to part type. A gear 46 is fixed to the underside of each of base boards 231 and 232 to enable rotation thereof (both clockwise and counterclockwise). A drive motor 44 has a motor gear 45 that meshes with gear 46 so as to rotate the base boards 231 and 232. Motor 44 is fixed to a support plate 42. Work frame upper conveyor 111, which conveys carriers 710 to first conveyor 120 (see FIG. 2), is attached to a working plate 40, which in turn is positioned above base boards 231 and 232. Work frame lower conveyor 115 is positioned below base boards 231 and 232 and conveys carriers 710 with soldered PCBs from second conveyor 210.

Rotation switches 252 (for clockwise rotation) and 253 (for counterclockwise rotation) are located adjacent to a frame rail 34a of work frame upper conveyor 111 and are used to signal for rotation of base boards 231 and 232. Reset switch 254 is located adjacent to rotation switches 252 and 253 and is used to signal for base boards 231 and 232 to be returned to an initial position. Work frame 101 according to the present invention may be configured to allow screws of the basic frame structure to be tightened, whereby work plate 40, base plates 41, and support plate 42 are fixed at specified vertical positions.

Base boards 231 and 232 are used to organize, according to type, various parts to be inserted into PCBs mounted in carriers 710. A label 52 (see FIG. 10) is attached to the upper portion of each of base boards 231 and 232 in order to prevent the parts from being incorrectly inserted. A plurality of holes 50 are defined through label 52. The motion of base boards 231 and 232 is controlled by PLC 220 through motor 44 in accordance with signals from an optical sensor 51. Base boards 231 and 232 then rotate by stages, and the worker removes appropriate parts therefrom in accordance with assembly instructions displayed by computer 240 (see FIG. 2). A plurality of guides 231a on the underside of each of base boards 231 and 232, and corresponding guide recesses 30 are formed in each base plate 41. If base plate 41 is rotated by motor 44, the corresponding base board 231 also rotates.

A worker may pull base boards 231 and 232 in order to load them with parts. To load them, base boards 231 and 232 are pulled out by a sliding operation between guides 231a and the guide recesses 30. Gear 46 is fixed to base plate 41 and meshes with motor gear 45 of drive motor 44. Therefore, if drive motor 44 is operated, base plate 41 is rotated together with the corresponding base board 231. The angle of rotation through which drive motor 44 turns base board 231 is controlled by PLC 220 in accordance with key signals from rotation switches 252 and 253 and reset switch 254.

Work frame upper and lower conveyors 111 and 115, installed at the upper and lower portions of work frame 101, respectively, are of a rail type, as shown in FIG. 7. Conveyor frame rails 34a, 34b, 54a and 54b provide frames for work frame upper and lower conveyors 111 and 115. Chains 33 and 53 mesh with opposed pairs of wheels 82 and 92, which are rotatably attached to frame rail 34 and 54, respectively. Each pair of wheels 82 and 92 is connected together by a respective one of shafts 31 and 61. Therefore, if a drive motor of conveyor 111 or 115 is actuated, the corresponding wheels and chains are sequentially rotated and a carrier 710 is conveyed to or from first conveyor 120.

At a worker position of work frame 101, cut-away portions 40a are formed in work plate 40 to enable the worker to easily take out the parts contained in base boards 231 and 232. A sensor 535 is located at the inner side of each cut-away portion 40a in order to detect an obstruction, such as a worker"s hand, in cut-away portion 40a and thus prevent injuries that might otherwise occur when base boards 231 and 232 are rotated. If the worker puts his hand in the cut-away portion 40a, sensor 535 generates a signal that inhibits PLC 220 from controlling base boards 231 and 232 to rotate.

Rotation switches 252 and 253 and reset switch 254 are installed adjacent to frame rail 34a of work frame upper conveyor 111 at the worker position of work frame 101. For the convenience of the worker, foot switch 256 is connected in parallel with clockwise rotation switch 252 and is installed on the floor. Foot switch 256 is used to operate base boards 231 and 232 by foot. Rotation switches 252 and 253 are also used to allow access to desired parts by rotating base boards 231 and 232 in the desired direction.

A shelf 80, for supporting computer 240 including a keyboard thereof, is attached to frame 101a of work frame 101 above the rear of work frame upper conveyor 111. A parts box 246 also may be fixed to frame 101a for storage of parts that do not easily fit into base boards 231 and 232. Optical sensor and stopper pairs 258 are installed at the terminal end of work frame lower conveyor 115 and between conveyor 115 and second conveyor 210 to detect when a carrier 710 is conveyed from second conveyor 210. A speed controller 86, for sensing the convey speed of carriers 710, is installed at frame rail 54a of work frame lower conveyor 115 and generates speed signals enabling conveyor 115 to convey the carrier at a constant speed. This operation is controlled by PLC 220.

In operation, the worker puts a carrier 710 on work frame upper conveyor 111, confirms from computer 240 a work instruction set including parts insertion positions, parts names, and the quantity of each part, and accordingly inserts appropriate parts into a PCB fixed to carrier 710. After the parts are inserted, the worker transfers carrier 710 toward first conveyor 120 by signaling for transfer with transfer switch 251. Carrier 710 is then conveyed to first conveyor 120 by work frame upper conveyor 111 in the direction denoted by reference character A in FIG. 7.

Carrier 710 thereafter passes through spray flux station 150 and soldering unit 170, after which it is conveyed to second conveyor 210 by elevator 190. Carrier then returns to the work frame from which it originated through detection of the indicium on cell detection plate 730. That is, the indicium is sensed by the optical sensor of optical sensor and stopper pair 258 located between second conveyor 210 and work frame lower conveyor 115. When PLC 220 determines that the indicium corresponds to the work frame from which the indicium has been read, carrier 710 is transferred to work frame lower conveyor 115 by lower up-down unit 135. (This occurs at work frame 101 because, in this example, carrier 710 originated from work frame 101).

PLC 220 stops the progress of carrier 710 in accordance with a signal from optical sensor and the stopper pair 258 at the terminal end of work frame lower conveyor 115. The signal indicates the presence there of carrier 710. Lifter 221 then conveys carrier 710 to work frame upper conveyor 111, as indicated in FIGS. 7 & 8 by direction reference character D. Conveyed carrier 710 is then situated at work frame upper conveyor 111 by a timing belt in direction E. The worker inspects to soldered PCB mounted in carrier 710 for proper parts insertion and soldering and confirms the same, the assembly of the PCB is completed.

Figure 9:
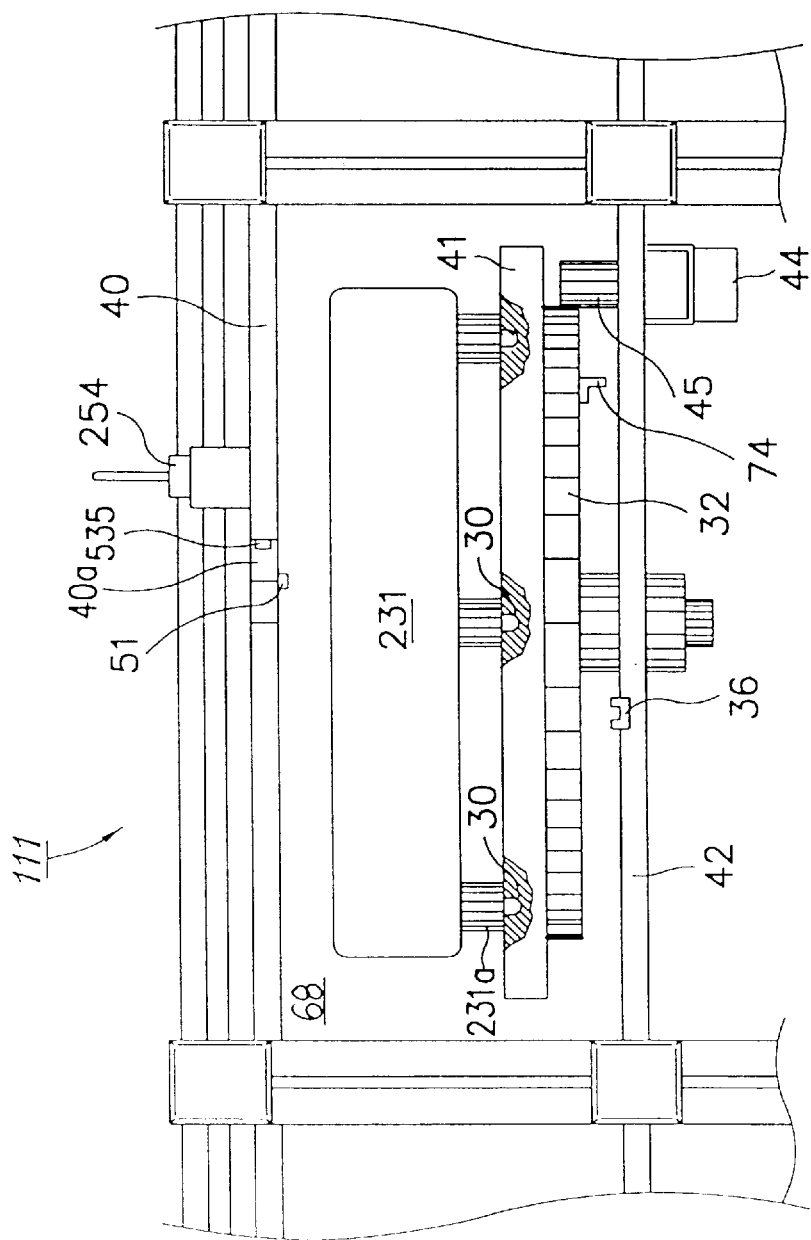
FIG. 9 is a front view illustrating a state in which a base board is mounted in the work frame of FIG. 7.
Figure 11:
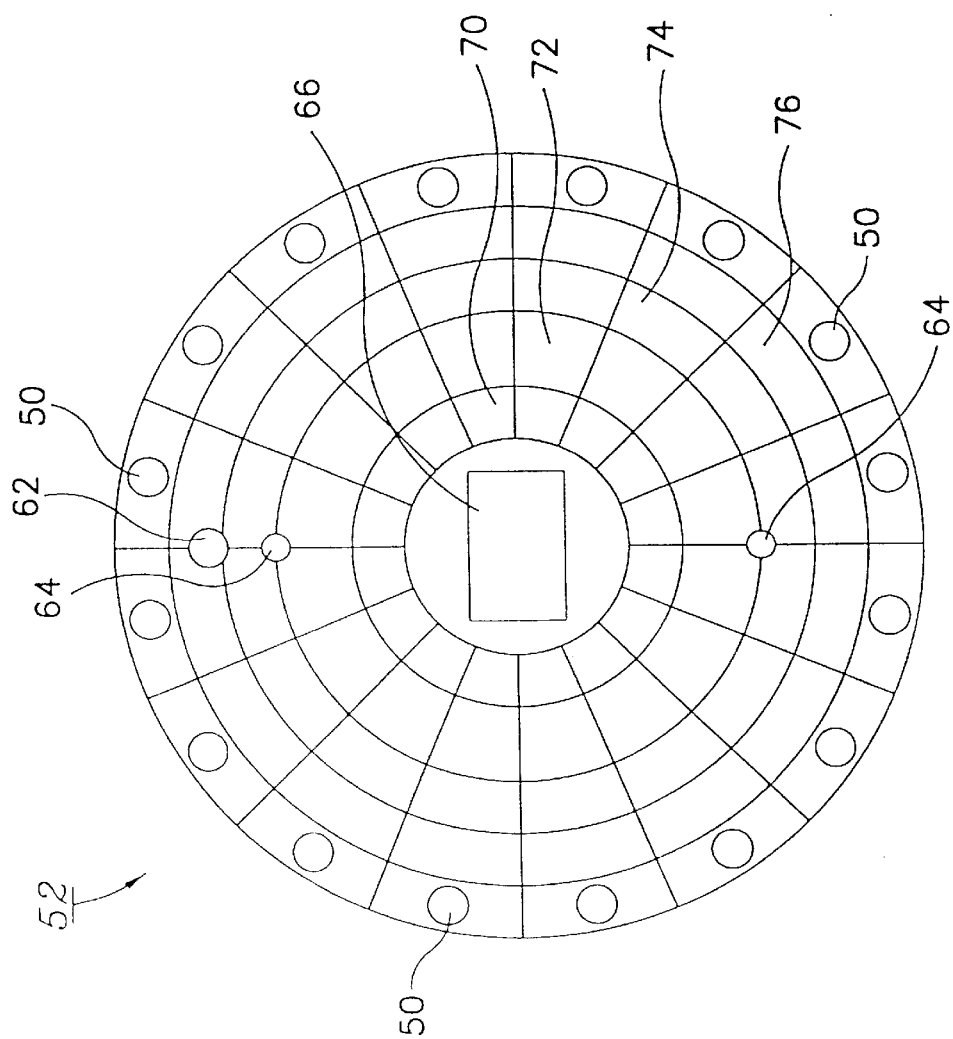
FIG. 11 is a plan view of a parts information label showing the list of parts that are assembled in a PCB according to the present invention.

FIG. 9 is a front view of a work position of work frame 101 detailing the arrangement of base board 231 and associated features. FIG. 10 is a perspective view of base board 231 and label 52 and illustrates how base board 231 can organize a variety of parts. FIG. 11 is a plan view of parts information label 52 that carries a list of parts to be inserted into the PCB.

As shown in FIG. 9, opening 68, in which base board 231 is mounted, is defined between work plate 40 and support plate 42. Cut-away portions 40a (see FIG. 7) are defined in work plate 40 adjacent to the upper side of opening 68. Drive motor 44 is installed below opening 68. Motor gear 45, mounted on drive motor 44, transmits torque from drive motor 44 to a driving gear 32. An L-shaped bracket 74 is located on the underside of driving gear 32 and provides a reference position allowing base board 231 to return to its starting position. A sensor 36 detects bracket 74 and generates a signal indicating that base board 231 is in the reference position. Base plate 41, which is fixed to the top side of driving gear 32, rotates with driving gear in response to the rotation of drive motor 44 and thereby positions base board 231 at any of a plurality of angular positions.

Base board 231 has a preferred construction, as shown in FIGS. 10 and 11, as a squat circular cylinder. The cylinder is divided into a plurality of parts containers 54 disposed at equal intervals around in the axis of the cylinder. Containers 54 store parts in accordance with a particular assembly procedure or in accordance with part types. Distribution of the parts among parts containers 54 helps to prevent misinsertion of the parts in PCBs under assembly. In the embodiment of FIG. 10, base board 231 is divided into 16 equal segments wherein parts containers 54 are formed. Preferably, cut-away portion 40a has dimensions corresponding to the dimensions of parts containers 54. Thus, at each angular position, cut-away portion 40a exposes a specified parts container 54. The width of each parts container 54 tapers from the perimeter to the center of the cylinder, and cut-away portion 40a defined in work plate 40 conforms to this shape.

Label 52 is located on a parts information label mounting face 60 at a central region of base board 231. Label 52 is printed for each PCB assembly job to identify the various parts contained in parts containers 54. FIG. 11 shows that, in one embodiment, label 52 is divided into 16 equal segments, thereby providing one segment for each parts container 54. In a preferred embodiment, label 52 is divided into 18 equal segments.

A first rotation sensing aperture 56 is formed in the parts information label mounting face 60 adjacent to each parts container 54. A second rotation sensing aperture 50 is formed in each segment label 52. When label 52 is mounted on parts information label mounting face 60, second rotation sensing apertures 50 align with first rotation sensing apertures 56. The aligned pairs of rotation apertures 50 and 56 allow the angular position of base board 231 corresponding to a specified part to be selected. Optical sensor 51, installed in work plate 40, detects when a pair of rotation apertures 50 and 56 is aligned below sensor 51. When a given parts container 54 is not used, second rotation sensing aperture 50 corresponding to the empty part container 54 is covered with a reflective material, such as silvered paper, to prevent passage of light to photo sensor 51.

A first original point setting aperture 44 is formed in parts information label mounting face 60. A corresponding second original point setting aperture 62, formed in label 52 at a position radially inward from second rotation sensing apertures 50, aligns with first original point setting aperture 44 when label 52 is attached to mounting face 60. The pair of original point apertures 44 and 62 enable return of base board 231 to its original reference position. As with the pairs of rotation apertures 50 and 56, A second sensor (not shown) detects the aligned pair of original point apertures 44 and 62. This second sensor indicates when base board 231 has returned to its original position after completing an assembly cycle.

Label 52 is correctly positioned on label mounting face 60 through alignment of first and second fixing apertures 46 and 64. First fixing apertures 46 are formed in information label mounting face 60 and align with second fixing apertures 64, respectively. When label 52 is correctly mounted on parts information label mounting face 60, each second original point setting aperture 62 aligns with a corresponding first fixing aperture 46. Second fixing apertures 64 are formed in the upper and lower portions of the label 52 for correctly positioning label 52 on parts information label mounting face 60.

A model indicator 66 is marked in the center of label 52 and identifies the product model for which the parts organized in base board 231 are intended. Each segment of label 52 further provides four separate information fields disposed at successive radial positions in the segment. A work procedure indicator 70 identifies a work procedure for the respective parts contained in the parts container 54 corresponding to the label segment. A quantity indicator 72 specifies the number of the given parts type needed for each unit under assembly. A parts code indicator 74 provides a part number of the parts in the particular parts container 54. Finally, a parts name indicator 76 shows the name of the part.

Label 52, listing information on parts to be loaded into base board 231, is mounted on parts information label mounting face 60 before the parts are loaded. The respective apertures 44 and 62, 46 and 64, and 56 and 50 are aligned to ensure that the parts container 54 for each group of parts will be correctly identified. A worker then loads the various parts to be inserted into the PCBs, into parts containers 54 in accordance with the respective indicators 66, 70, 72, 74 and 76. When a given parts container 54 is not to be used, its second rotation sensing aperture 50 is covered with silvered paper to block light from reaching optical sensor 51. Base board 231 is then inserted into opening 68 and smoothly mounted to base plate 41 by sliding guides 23 la into the corresponding guide recesses 30 of the base plate 41.

To begin the parts insertion process for a PCB, the worker activates reset switch 254 or a corresponding foot switch (not shown). This generates a key signal, in accordance with which PLC 220 controls drive motor 44 to rotate base board. The second sensor detects when the aligned pair of original point apertures 44 and 62 pass therebelow. Base board 231 continues to advance. A light source included in optical sensor 51 continuously emits light. The light thus emitted cannot reach an optical detector of optical sensor 51, however, until it passes through first and second rotation sensing apertures 56 and 50 corresponding to an initial parts container 54. Optical sensor 51 detects the presence of light and generates a signal, in accordance with which PLC 220 stops drive motor 44, thereby stopping the base board 231. It is noted that when a second rotation sensing aperture 50 is covered, such as with silvered (i.e., reflective) paper, the light blocked from photo sensor 51 and base board 231 therefore continues to rotate beyond to angular position for access to the unused parts container 54.

After this, the worker retrieves parts from the initial parts container 54, through cut-away portion 40a, and inserts them into a PCB. The worker repeats this operation until all parts to be inserted at his work station are correctly positioned on the PCB. Upon completion of the insertion process, base board 231 rotates until aligned first and second original point setting apertures 44 and 58 are positioned below the light of the second sensor (not shown), which generates a signal for PLC 220 to return base board 231 to its original position. Alternatively, when one of rotation switches 252 and 253 operates, driving gear 32 rotates until bracket 74 of the driving gear 32 is sensed by a optical sensor 36, whereby base board 231 returns to its original position.

Figure 12A:
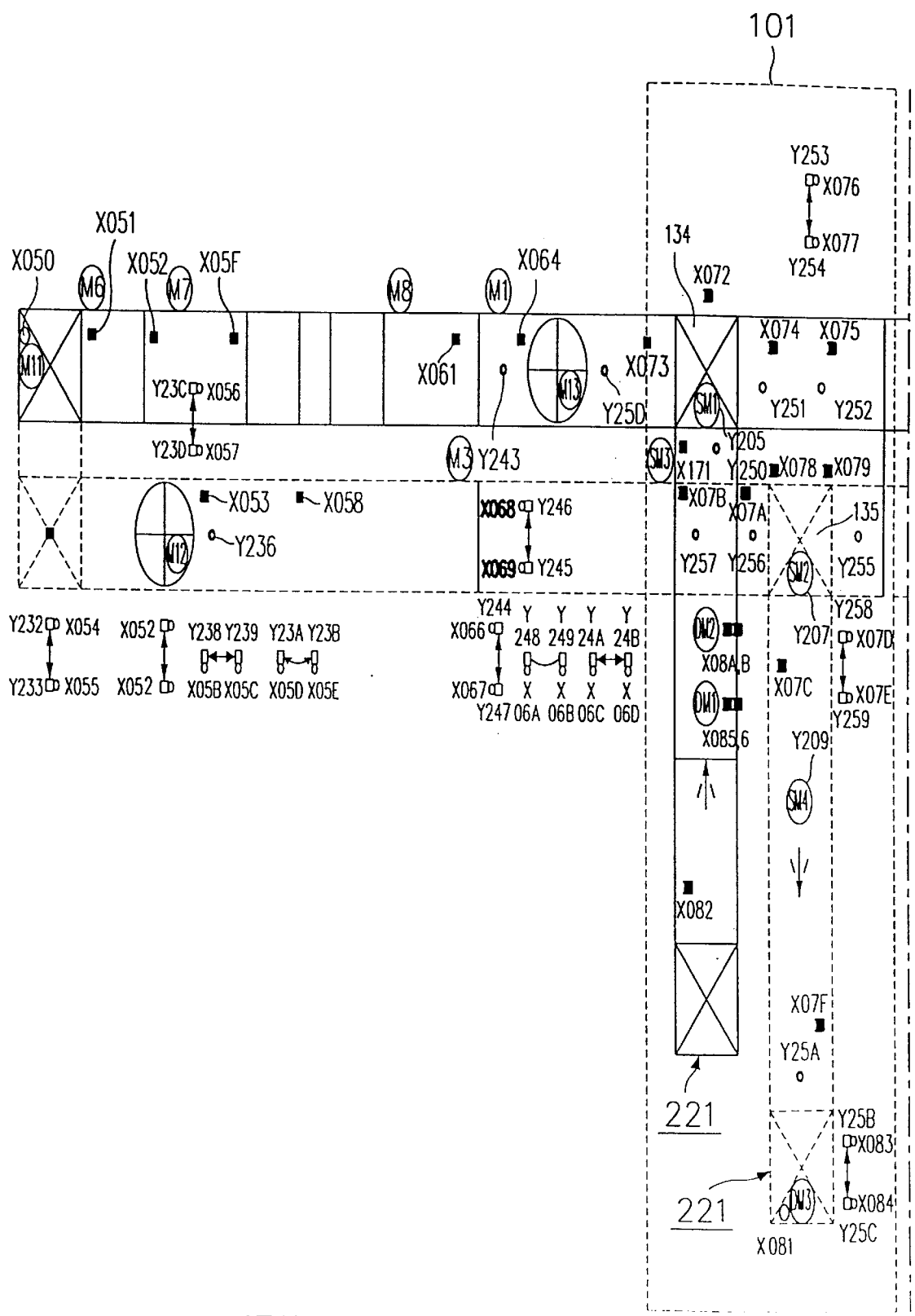
FIG. 12 is a schematic configuration of sensors for sensing the movement status of carriers and motors, according to the present invention.
Figure 12B:
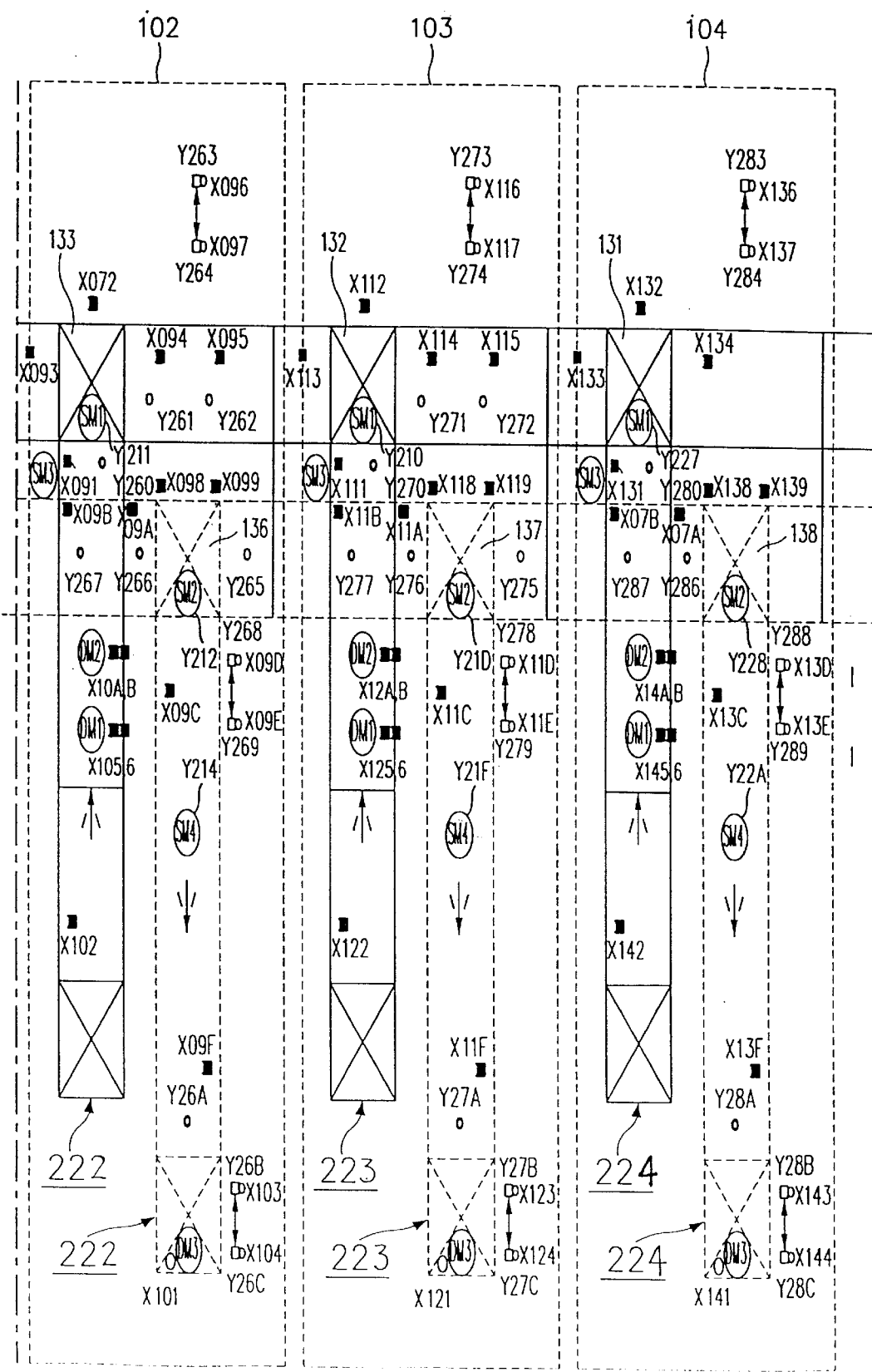

FIGS. 12A and 12B schematically show a configuration of sensors for sensing the movement status of a carrier 710 and the motors included in the present invention. Referring to FIGS. 12A and 12B, when specified moving conditions are not satisfied under the control of PLC 220, a plurality of stoppers Y25D, Y243, Y250 to Y252, Y255 to Y257, Y260 to Y262, Y265 to Y267, Y270 to Y272, Y275 to Y277, Y280 to Y287, and Y285 to Y287 intermittently stop carriers 710 in order to space them at regular intervals on first and second conveyors 120 and 210.

Photosensors X051 to X053, X05F, X058 and X061, X064, X072 to X079, X07A to X07C, X07F, X082, X091 to X099, X09A to X09F, X102, X111 to X119, X11A to X11F, X122, X131 to X139, and X13A to X13F detect the movement carriers 710 and transmit the results to PLC 220. These photosensors employ transparent and reflective fiber sensors. Fiber sensors X078, X098, X118 and X138 detect the type of each carrier 710 and generate signals used by PLC 220 to transfer each carrier 710 back to its original work frame. The fiber sensors may either scan the indicium located on cell detection plate 730 of each carrier 710 or, alternatively, detecting the presence of a bracket (not shown) attached to each carrier 710 in a position indicative of the origin of the carrier.

A plurality of reflective fiber sensors X085–X086, X10A, B, X105–X106, X12A,B, X125–X126, X14A,B, and X145–146 detect the rotation status of base boards 231–238 and generate signals indicating the same for use by PLC 220. Limit switches X050, X081, X101, X121 and X141 sense that a carrier 710 has been fully lowered by levator 190 or one of lifters 221–224, respectively, and send signals indicating that status to PLC 220.

Figure 13:
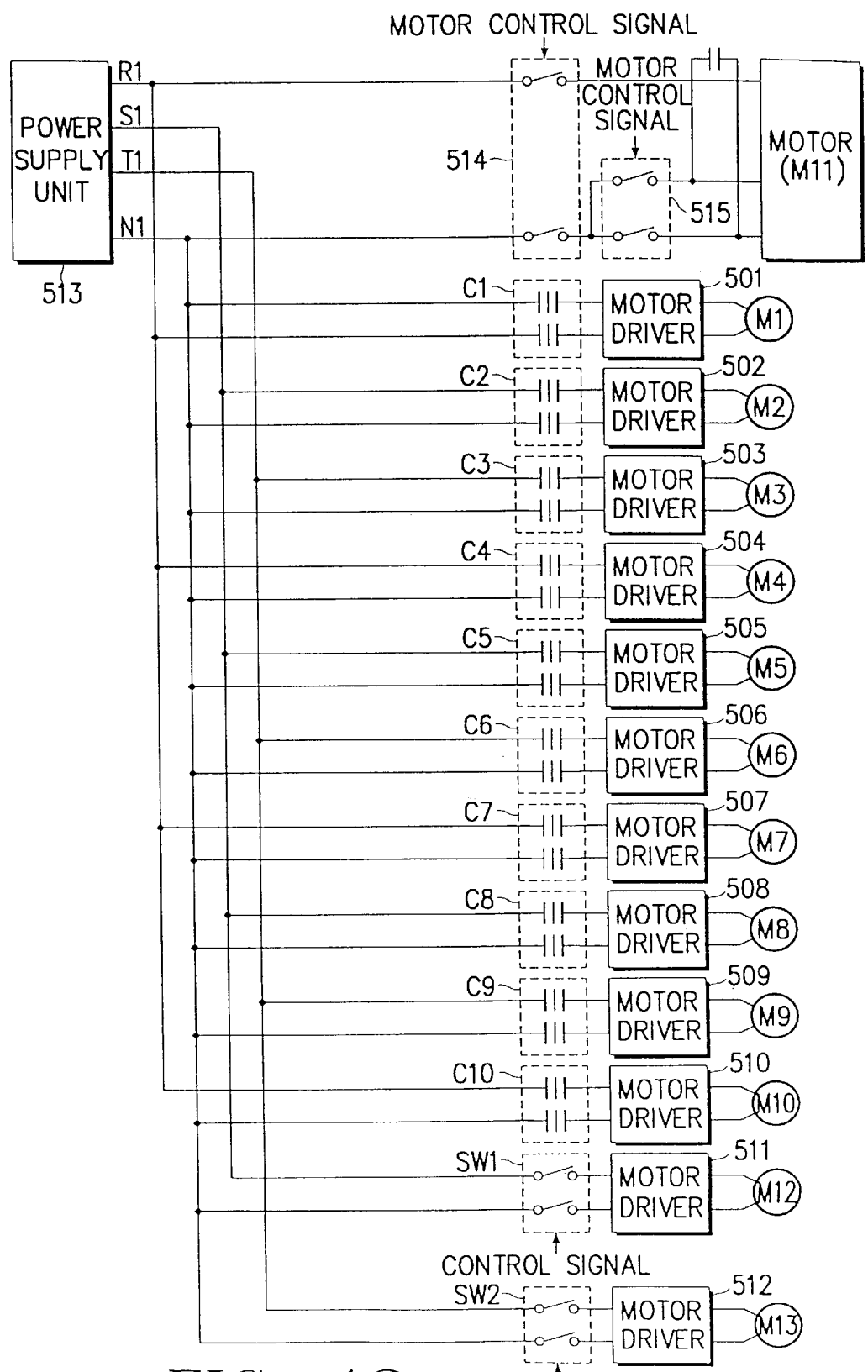
FIG. 13 is a circuit diagram of a motor driver installed on a conveyor according to the present invention.

FIG. 13 shows a block circuit diagram of a conveyor motor driver for use with system 100 of the present invention. Referring to FIG. 13, a power supply unit 513 supplies power to the circuit. A relay 514 is switched on and off by a motor control signal transferred from PLC 220. A switching unit 515 receives the motor control signal from PLC 220 and, in accordance therewith, drives a motor M11 in the clockwise or counterclockwise direction. Specifically, motor M11 drives elevator 190.

Magnet contact switches C1 to C10 supply power to motor drivers 501 to 510 connected thereto. Motor driver 501 drives motors M1 to M10. Motors M1 and M2 drive first conveyor 120, and motors M3 to M6 transfer carriers 710 to elevator 190. Motor M7 transfers carriers 710 on slope conveyor 180, and motor M8 drives a conveyor between up-down and rotation unit 140 and spray flux station 150. Motors M9 and M10 are spare motors. Motors M12 and M13 drive conveyor belts in rotation unit 200 and up-down and rotation unit 140, respectively. Switches SW1 and SW2 are turned on by a control signal from PLC 220, thus applying a power from power supply unit 513 to motor drivers 511 and 512.

FIGS. 14 to 17 are block circuit diagrams of motor drivers installed at first to fourth work frames 101 to 104, respectively, in accordance with the present invention. These motor drivers are all constructed as described next with respect to FIG. 14 corresponding to work frame 101. With rotation switches 252 and 253 on, respective rotation signals are generated. Pressing foot switch 256 similarly generates a clockwise rotation signal. Sensing unit 535 comprises two reflective fiber sensors. When PLC 220 receives a key signal from one of rotation switches 252 and 253 or foot switch 256, it generates a motor control signal to rotate base boards 231 and 232 unless inhibited by a sensing signal detected by sensing unit 535.

Upon receipt of a control signal from a base board control unit (not shown), PLC 220 turns on switches 520, 521 and 522 to apply power from power supply unit 513 to motor units DM1, DM2, and DM3, respectively. A control signal from the base board control unit also turns on switches 523, 524 and 525, thereby running motor units DM1, DM2, and DM3 in either the clockwise or the counterclockwise direction. Motor units DM1 and DM2 each rotates one of base boards 231 and 232; work frames 101–104 comprise eight such motor units in total.

Motor DM3 transfers carriers 710 into lifters 221. Switches 526 to 529 are turned on by the motor control signal received from PLC 220, thereby applying power from power supply unit 513 to motor drivers 530 to 533, respectively. Motor drivers 530 to 533 drive motors SM1 to SM4, respectively, with the power from power supply unit 513. Motor SM1 is installed in first up-down unit 131. Operation of first up-down unit 131, by supplying power to motor SM1, transfers carriers 710 from work frame upper conveyor 111 to first conveyor 120 in accordance with the control signal of PLC 220. Motor SM2 is installed in eighth up-down unit 138 and functions in a manner substantially similar to motor SM1, in accordance with an appropriate control signal from PLC 220. Motor SM3 drives work frame upper conveyor 111 and motor SM4 drives work frame lower conveyor 115, both under the control of PLC 220.

Figure 18:
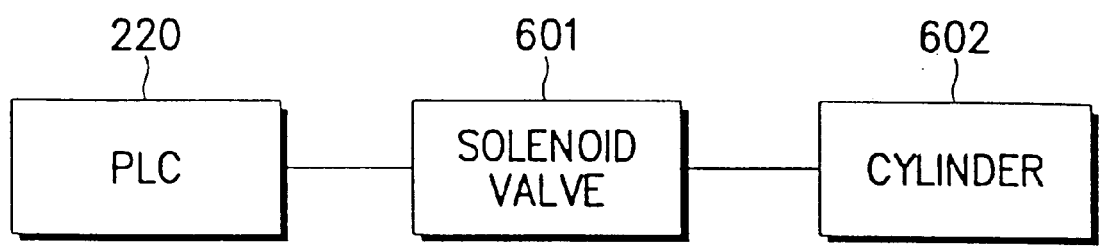
FIG. 18 is a block diagram of a device for driving an elevator or a plurality of lifters according to the present invention.

FIG. 18 is a block diagram of a device for driving each of elevator 190 and lifters 221–224 according to a preferred embodiment of the present invention. Each such device has the same construction as described below with respect to elevator 190. Referring to FIG. 18, PLC 220 generates a solenoid control signal when the presence of a carrier 710 is sensed by sensor X051 (see FIG. 12A). A solenoid valve 601 drives a cylinder 602 in accordance with the solenoid control signal of PLC 220 and thereby moves carrier 710 from slope conveyor 180 down to rotation unit 200. A device as illustrated in FIG. 18 is provided as a driving unit for each of elevator 190 and lifters 221–224.

Figure 19:
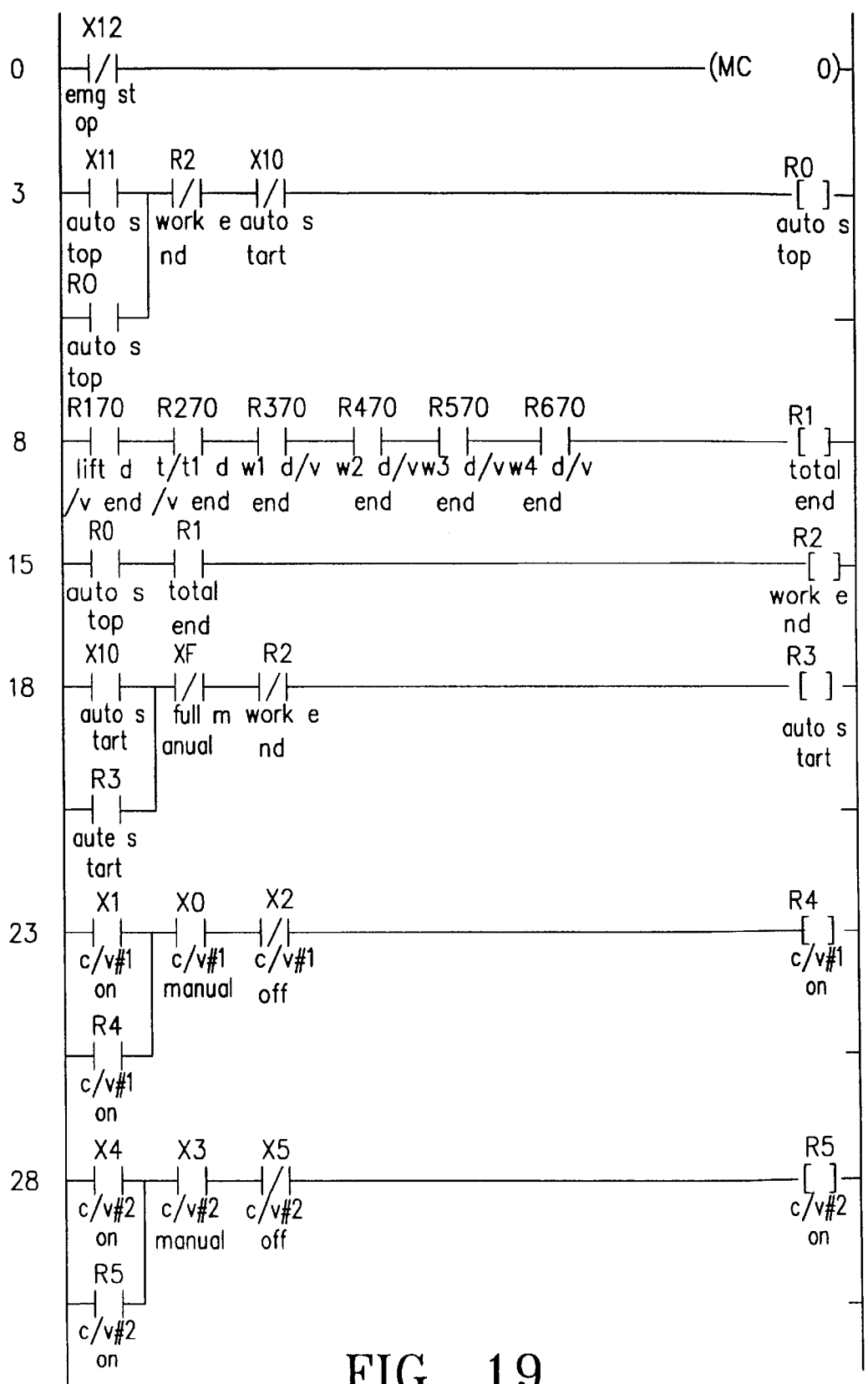
FIGS. 19 to 98 are diagrams illustrating the operation of a control program of a PLC according to the present invention.
Figure 20:
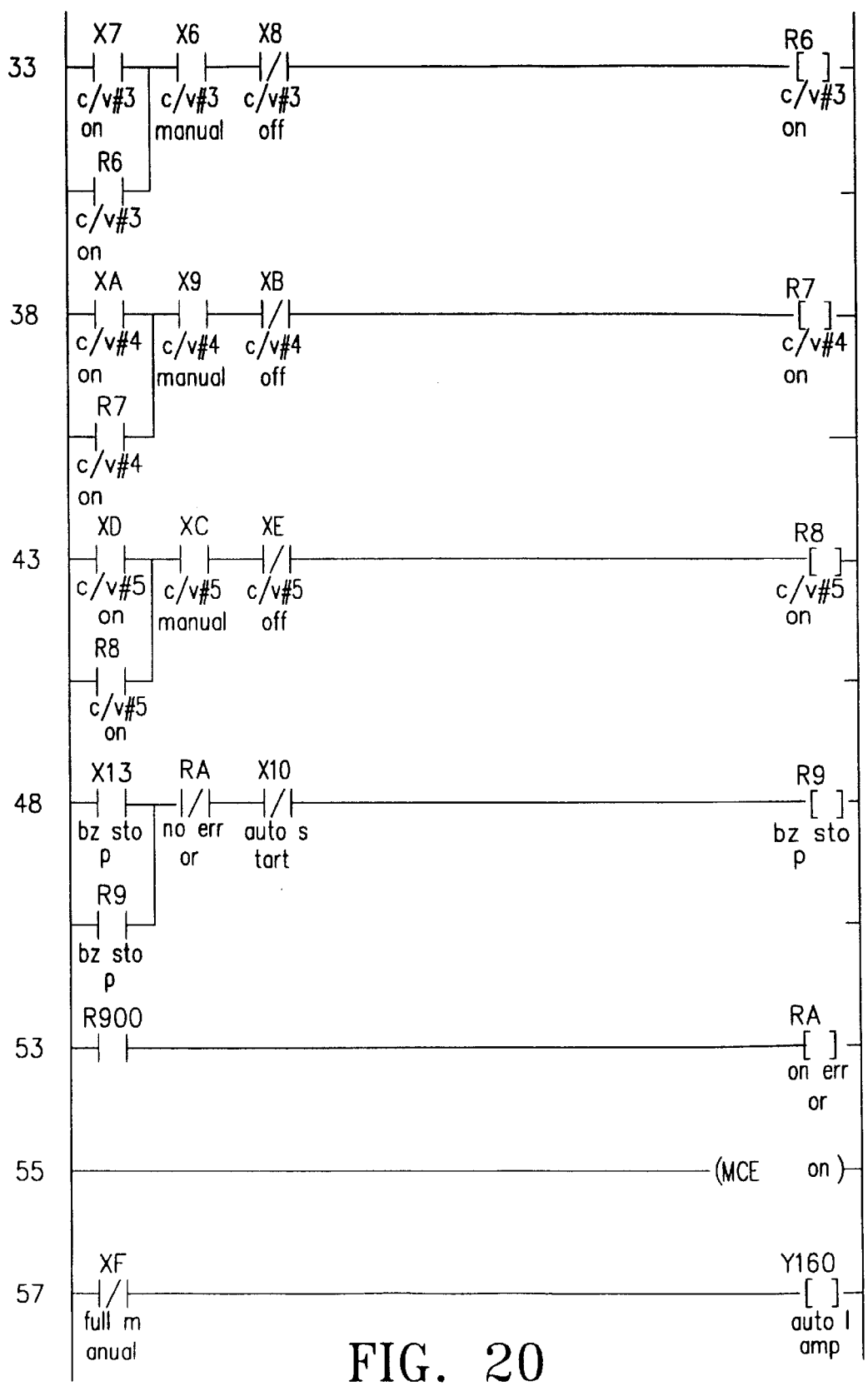
Figure 21:
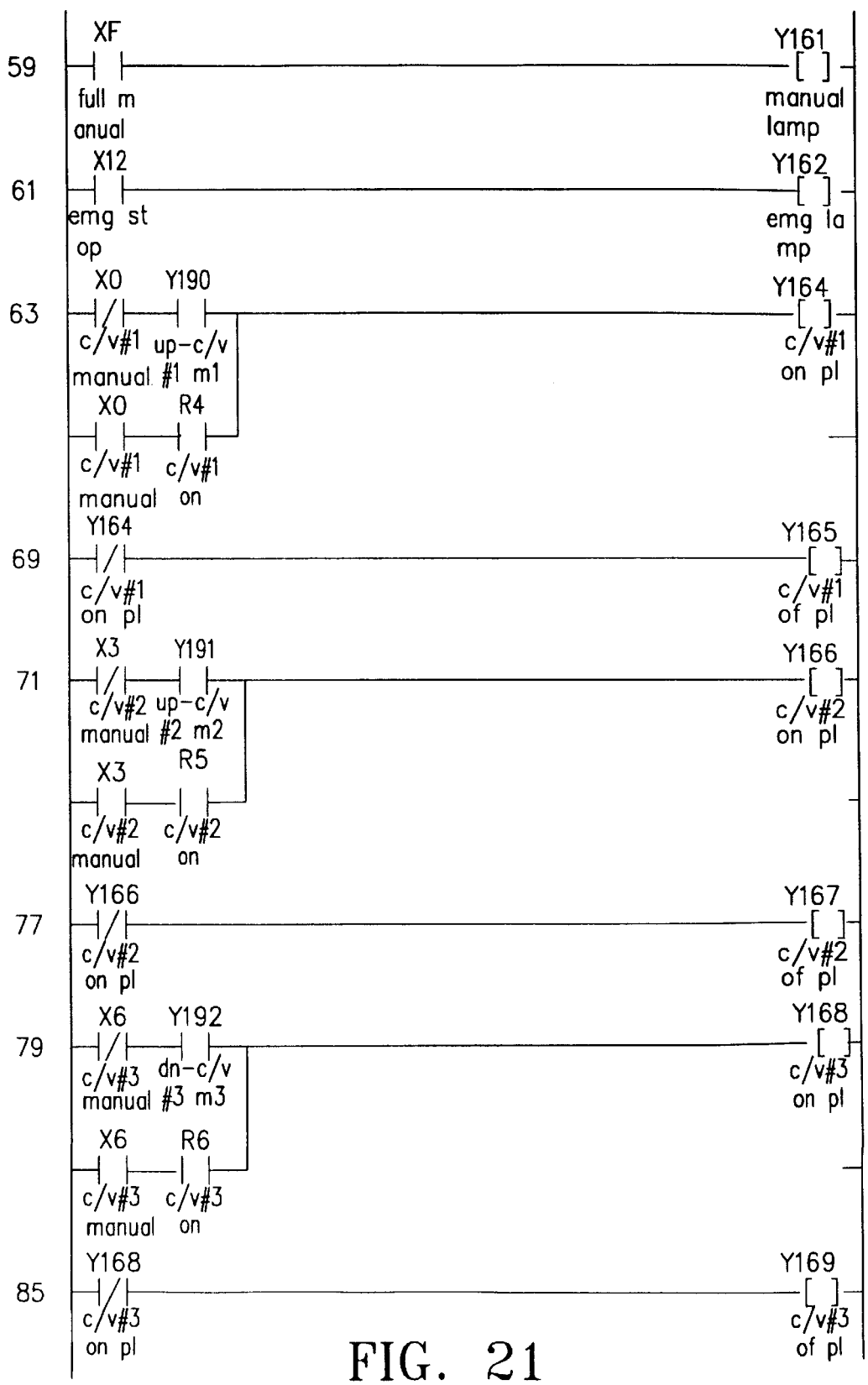
Figure 22:
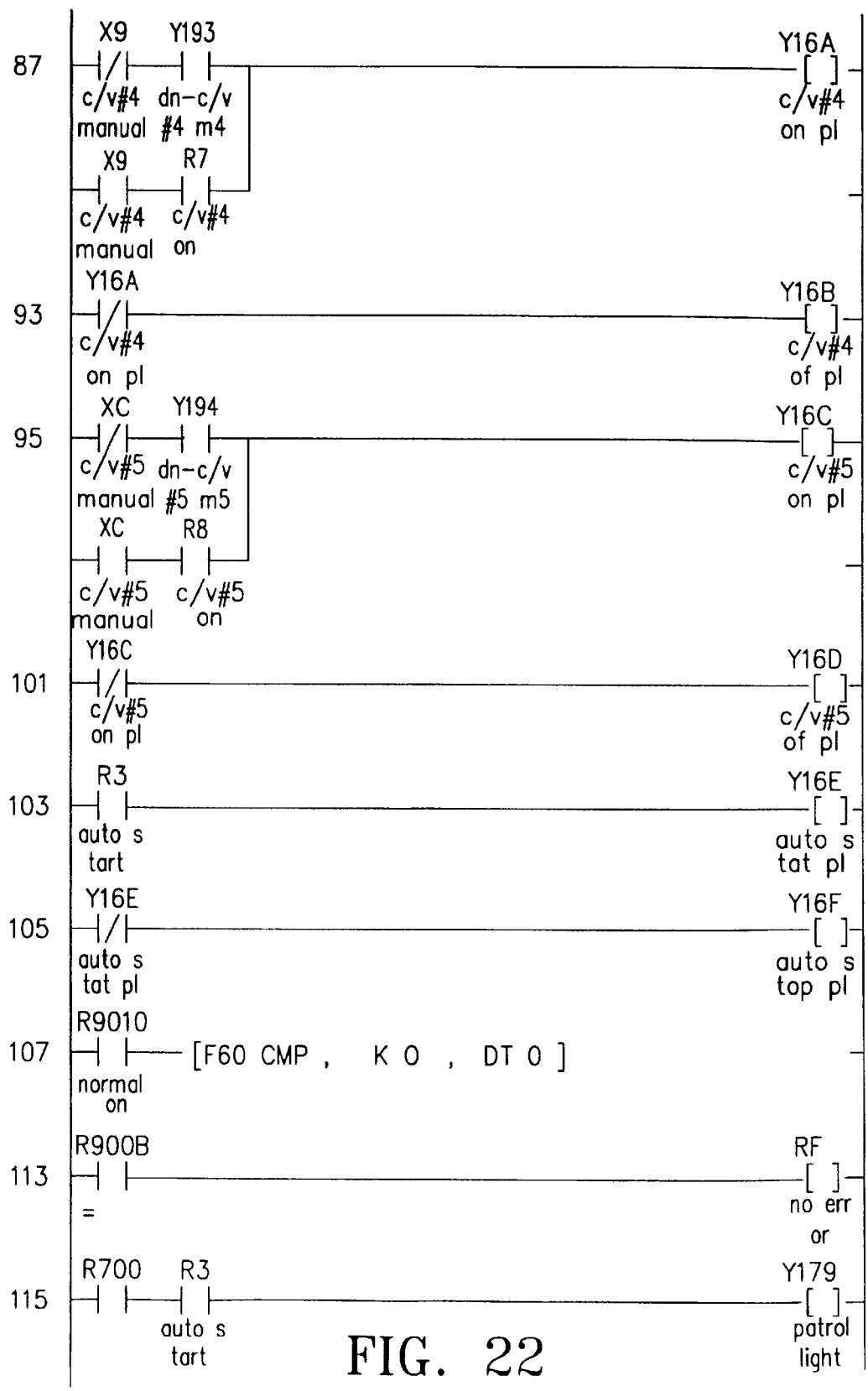
Figure 23:
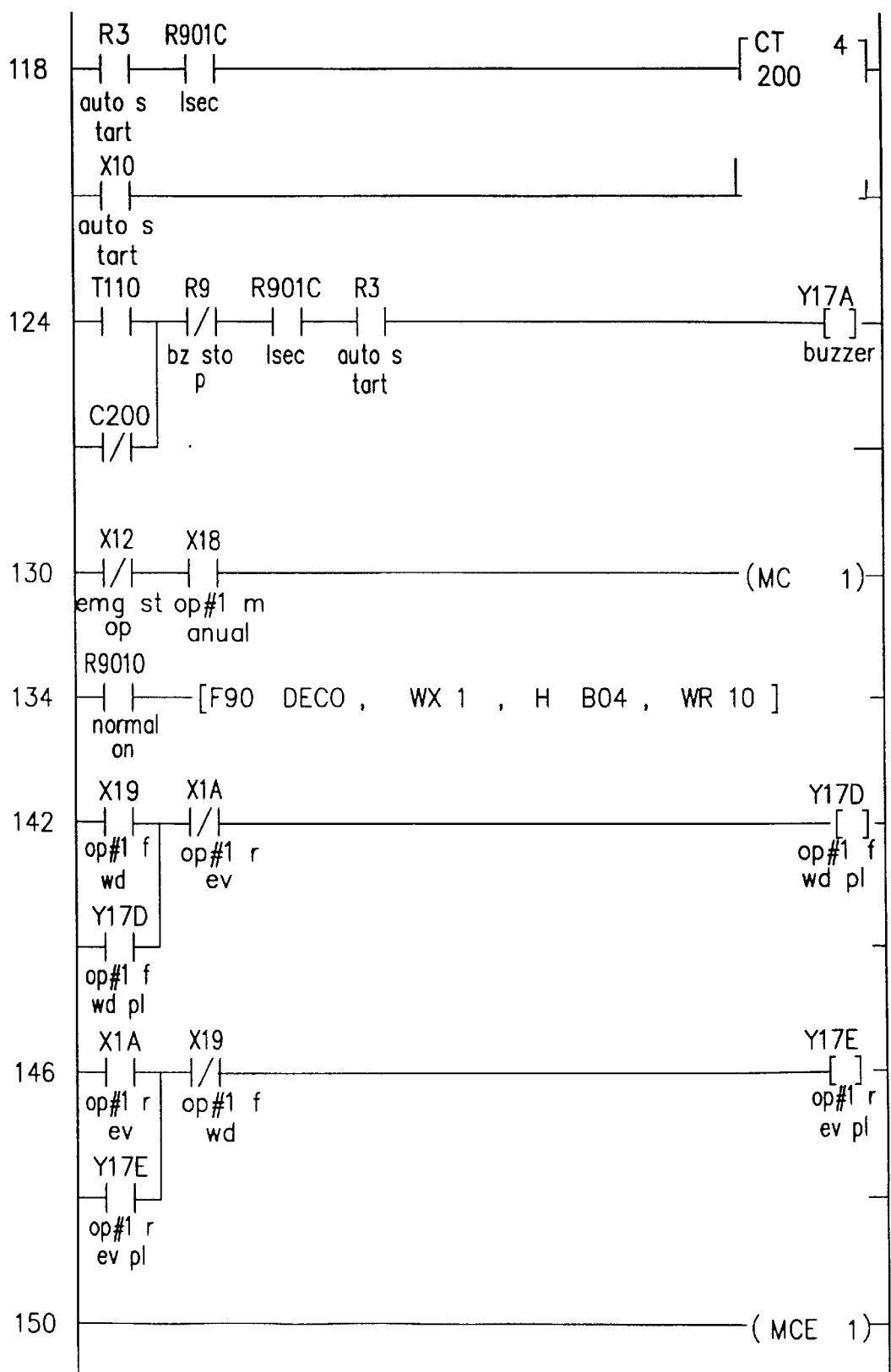
Figure 24:
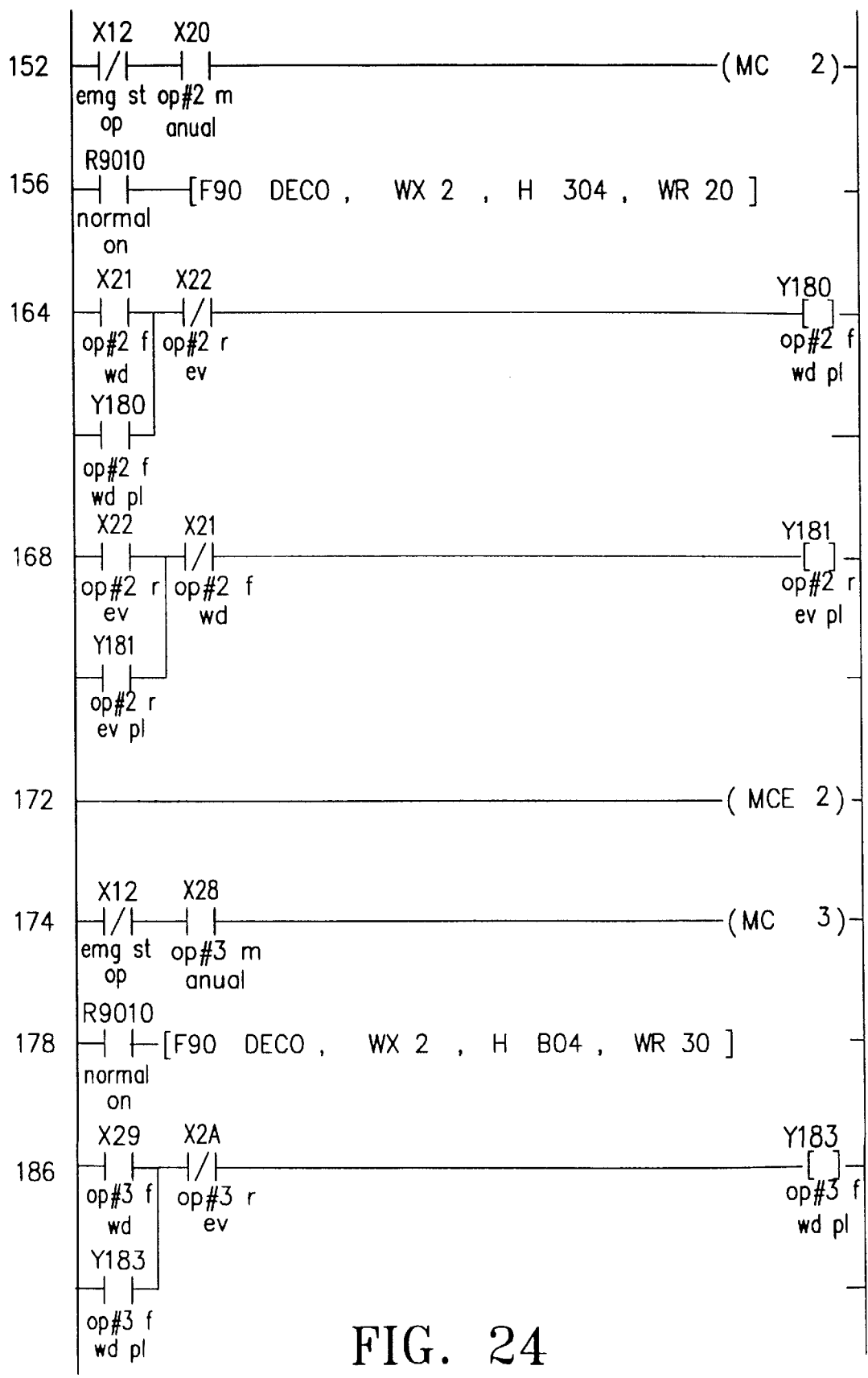
Figure 25:
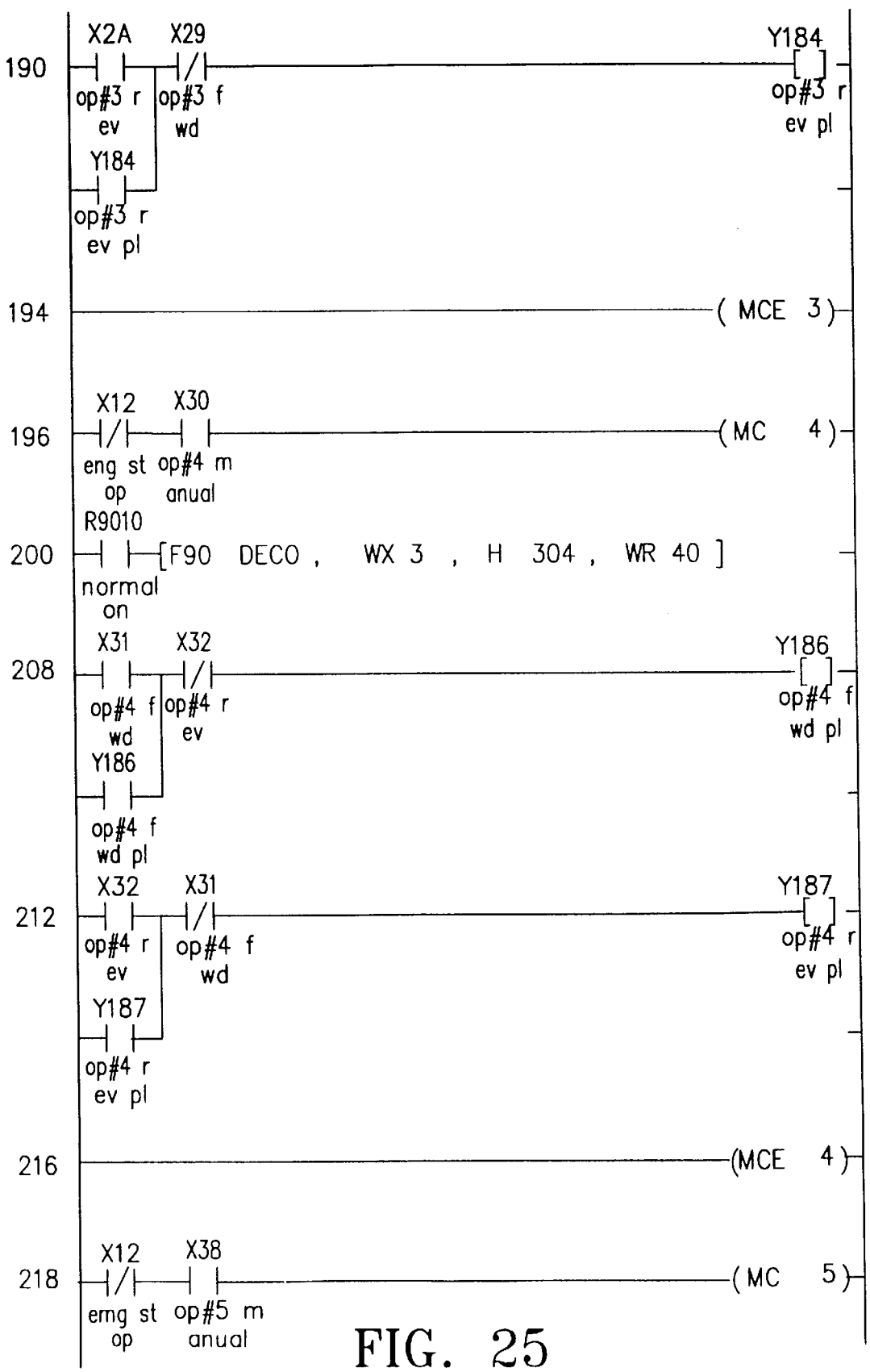
Figure 26:
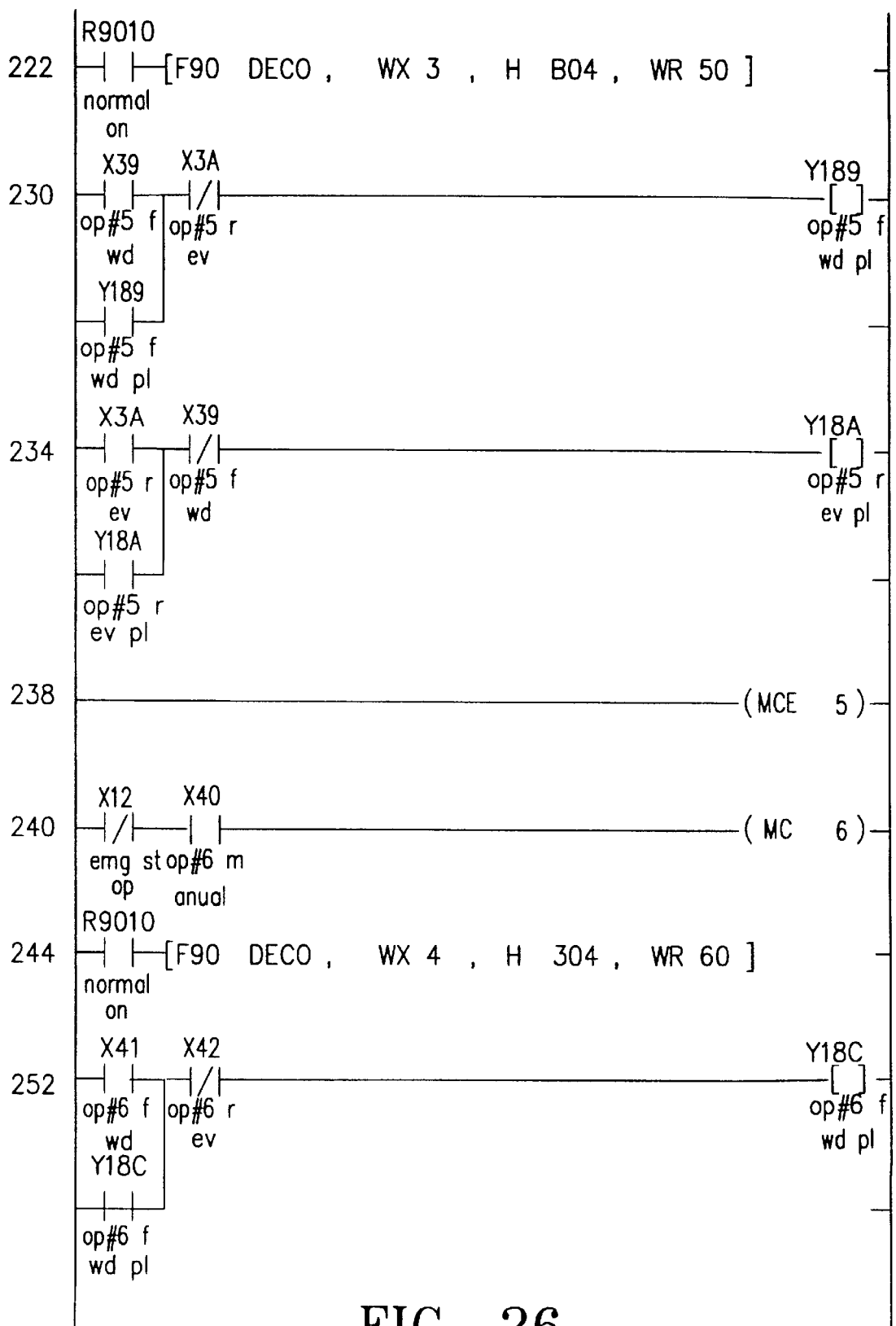
Figure 27:
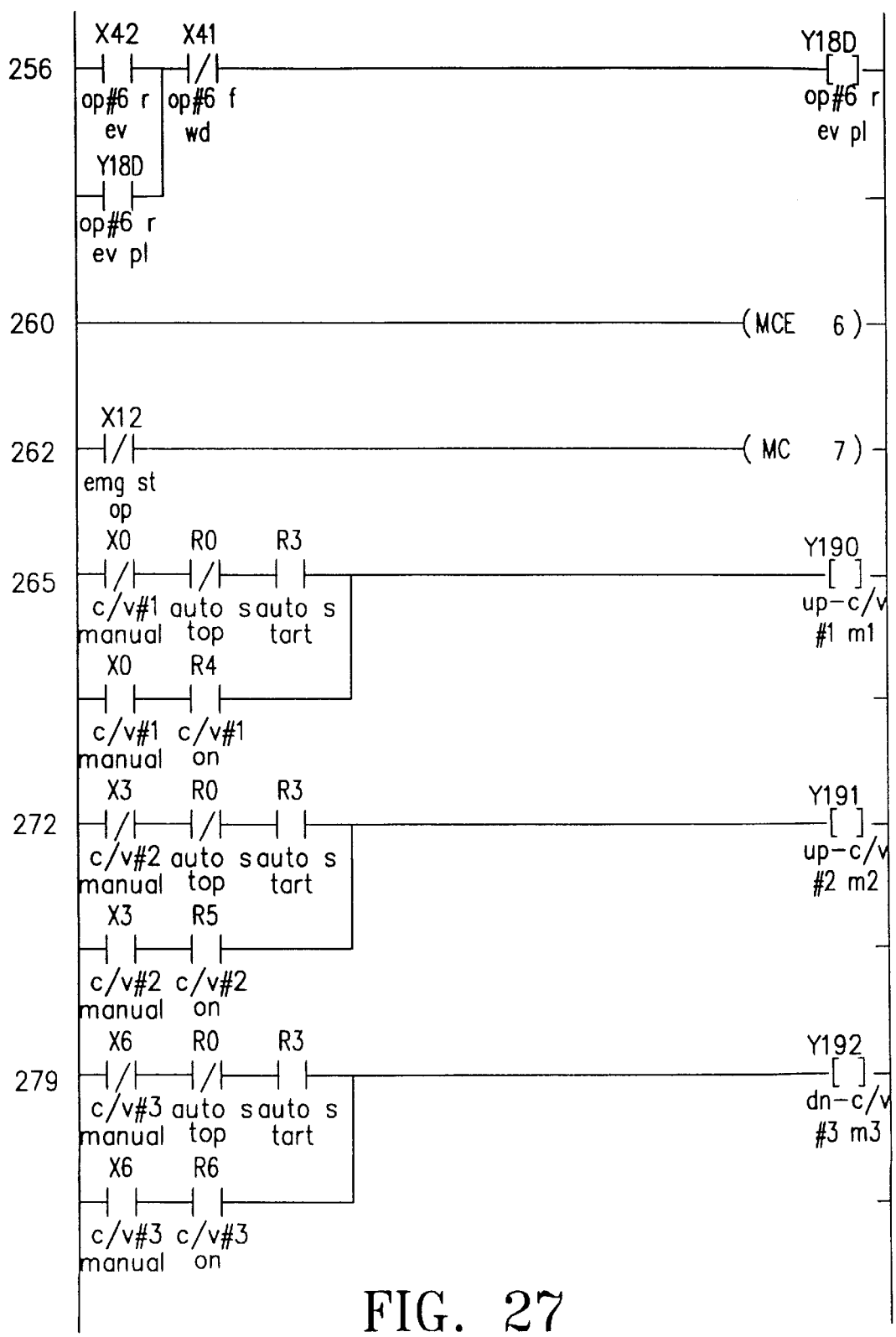
Figure 28:
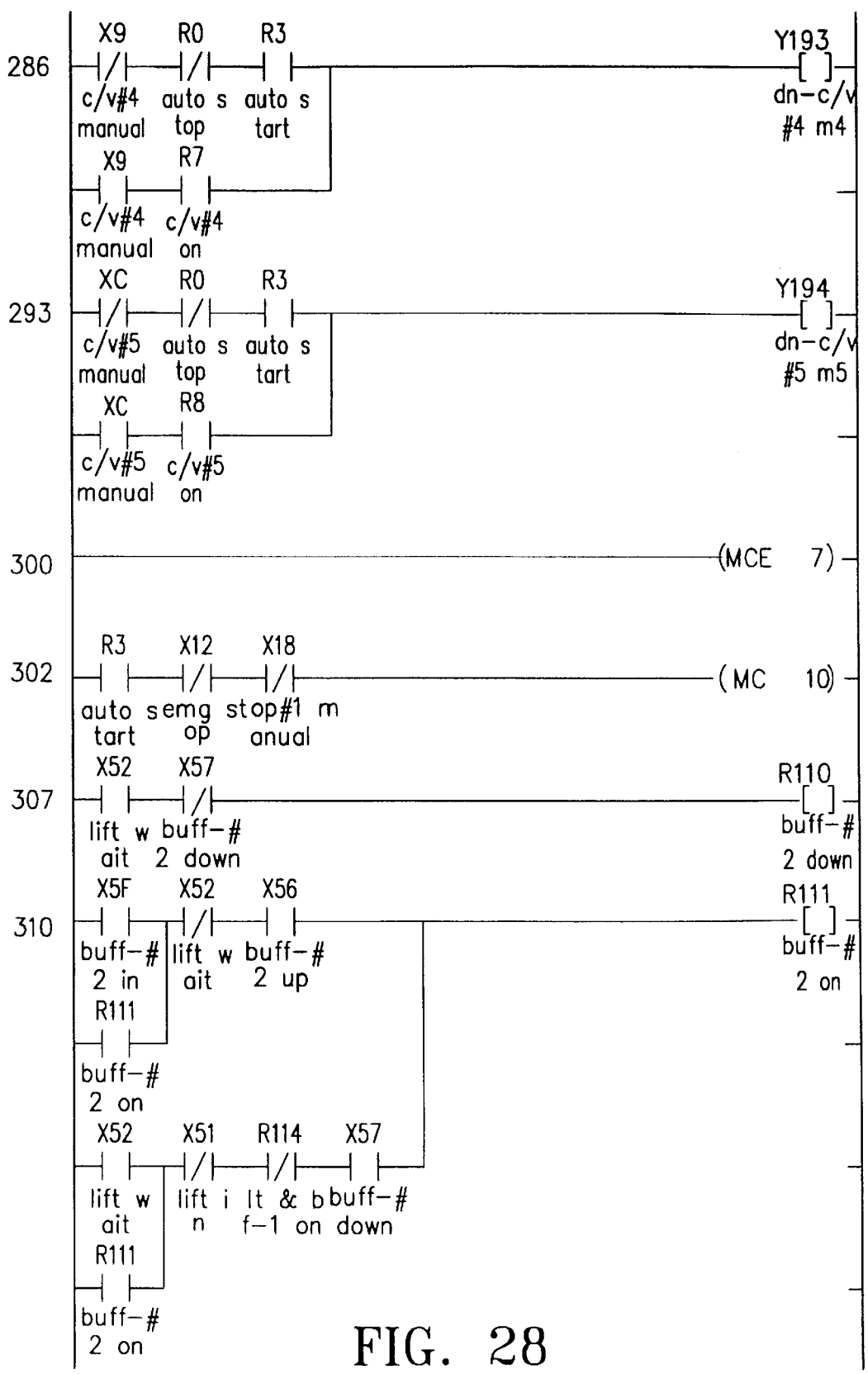
Figure 29:
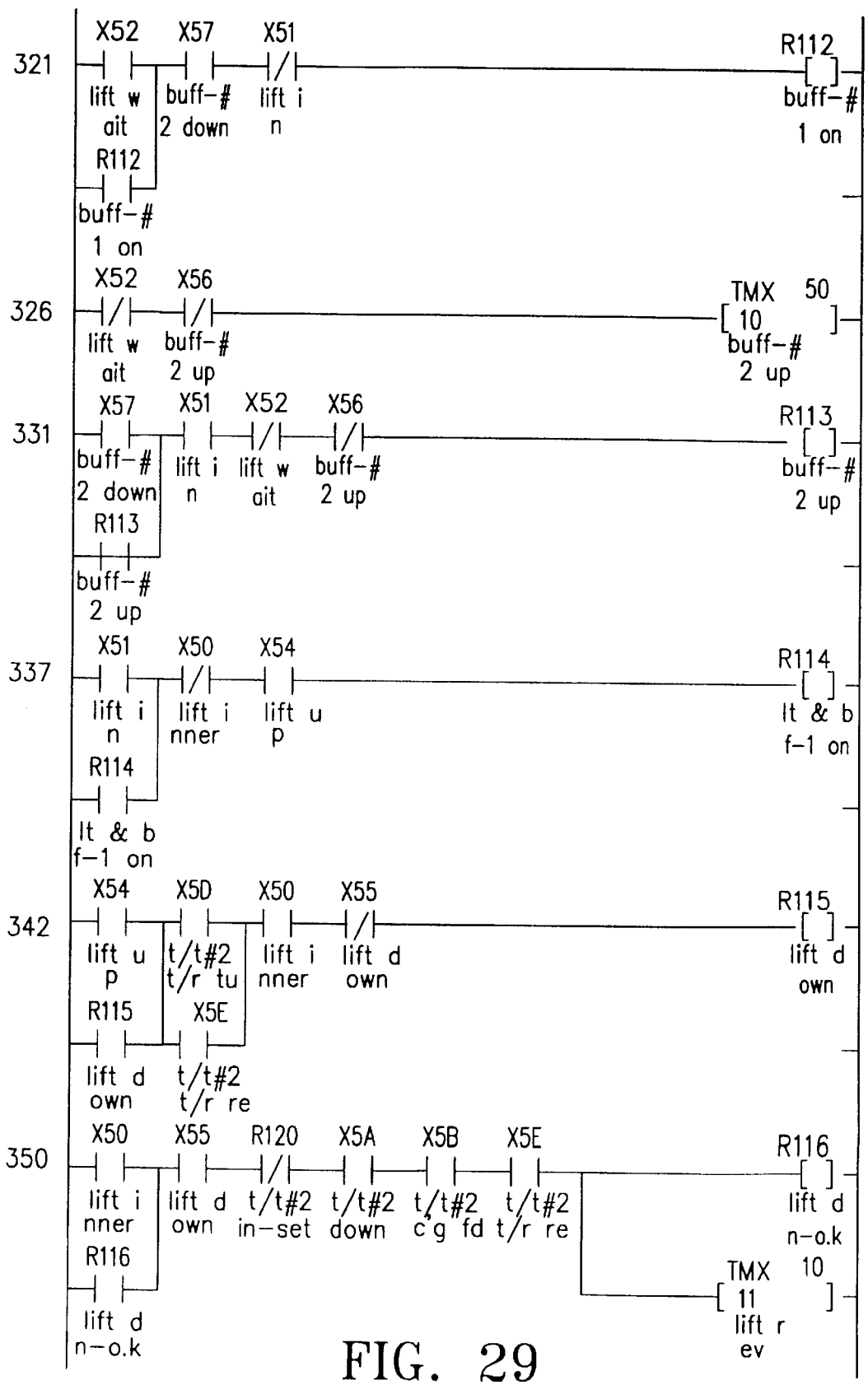
Figure 30:
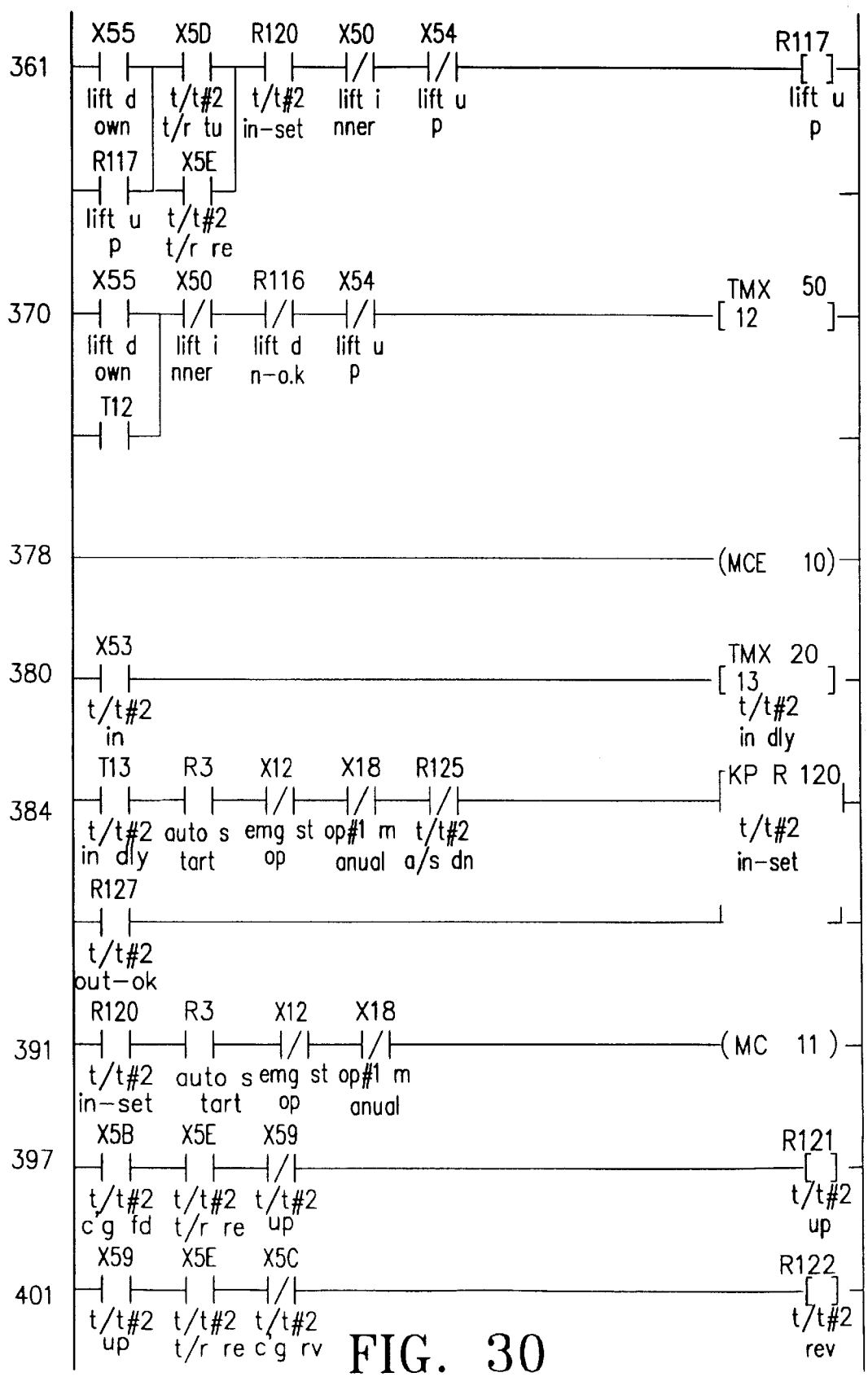
Figure 31:
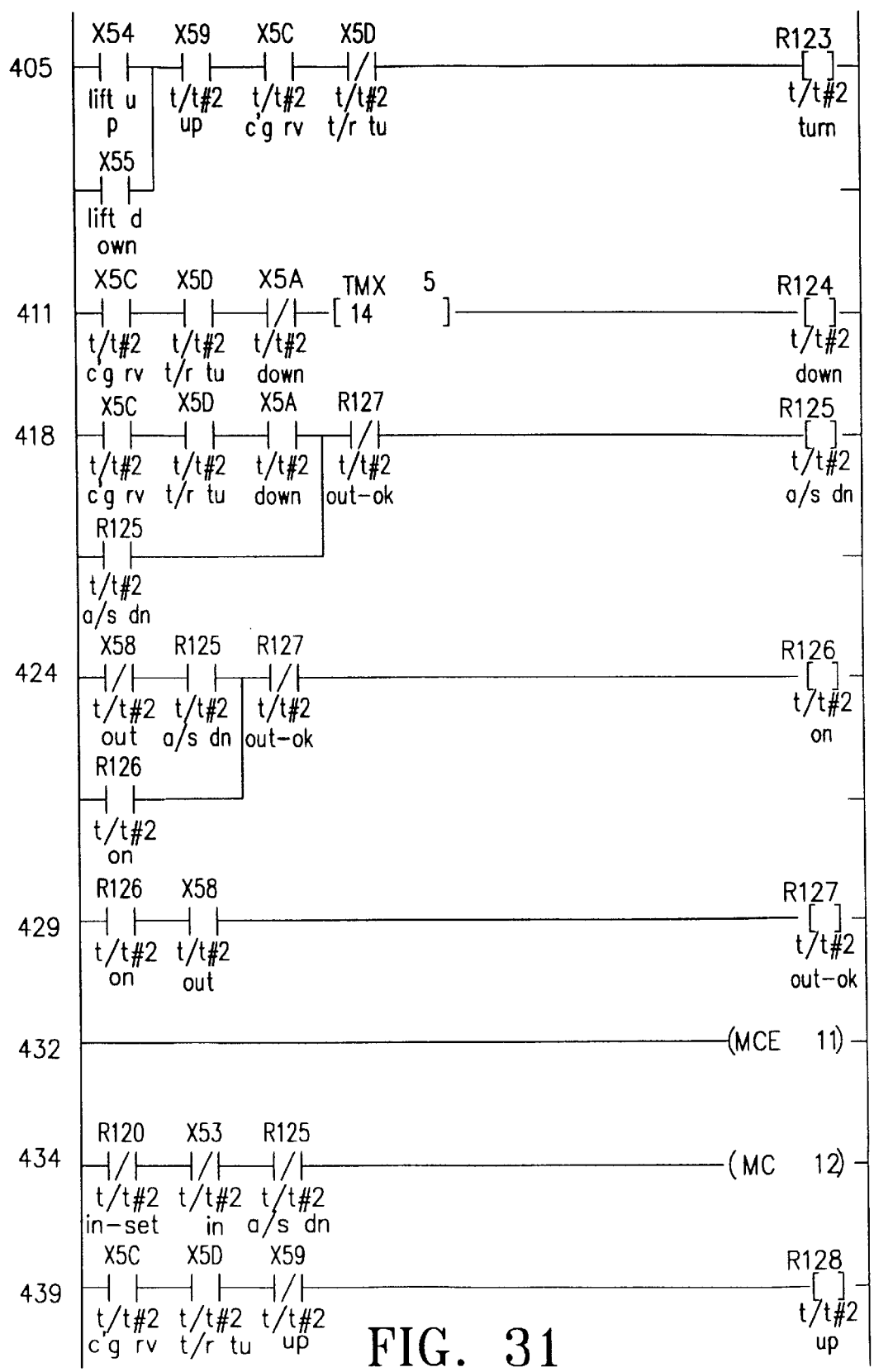
Figure 32:
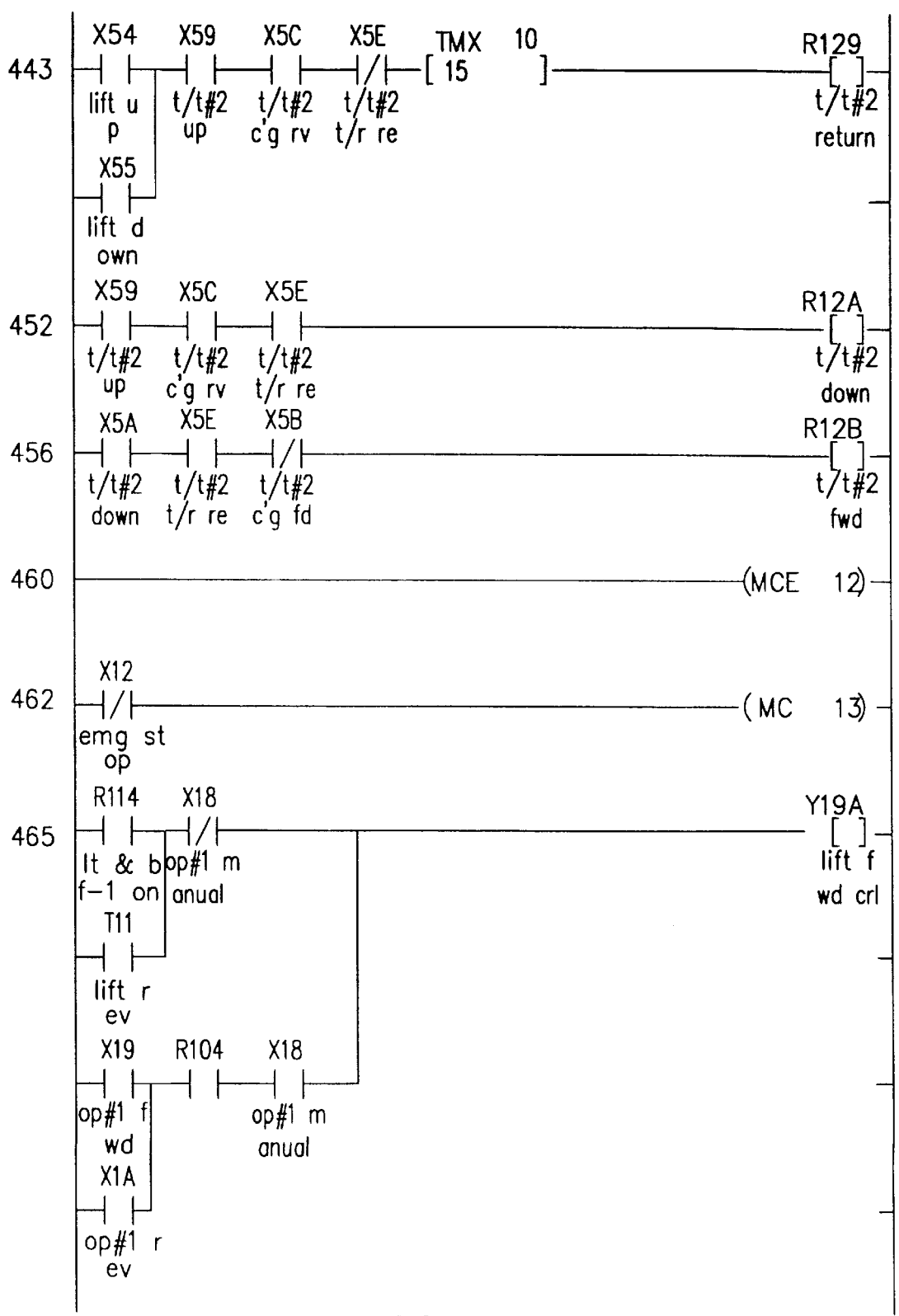
Figure 33:
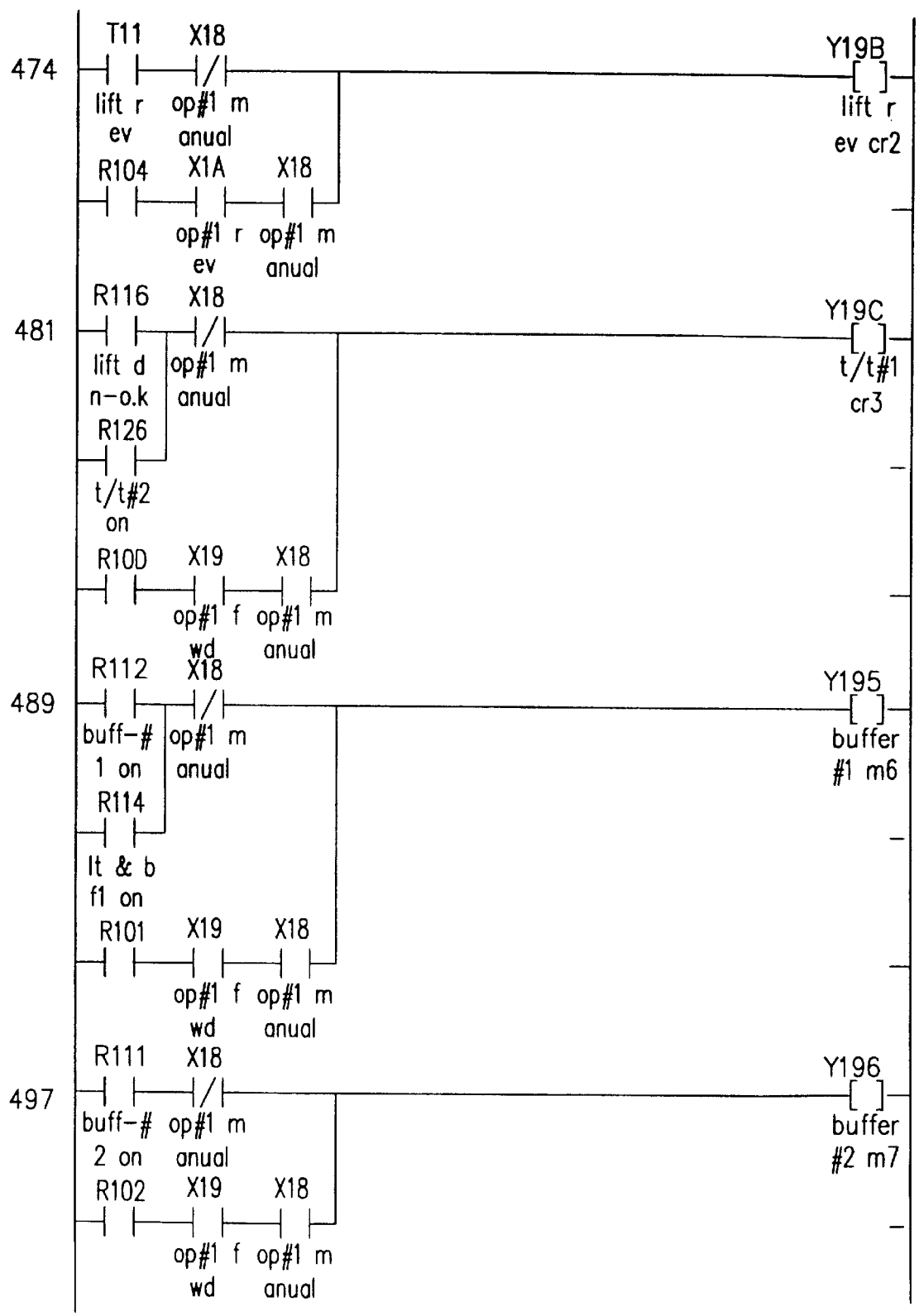
Figure 34:
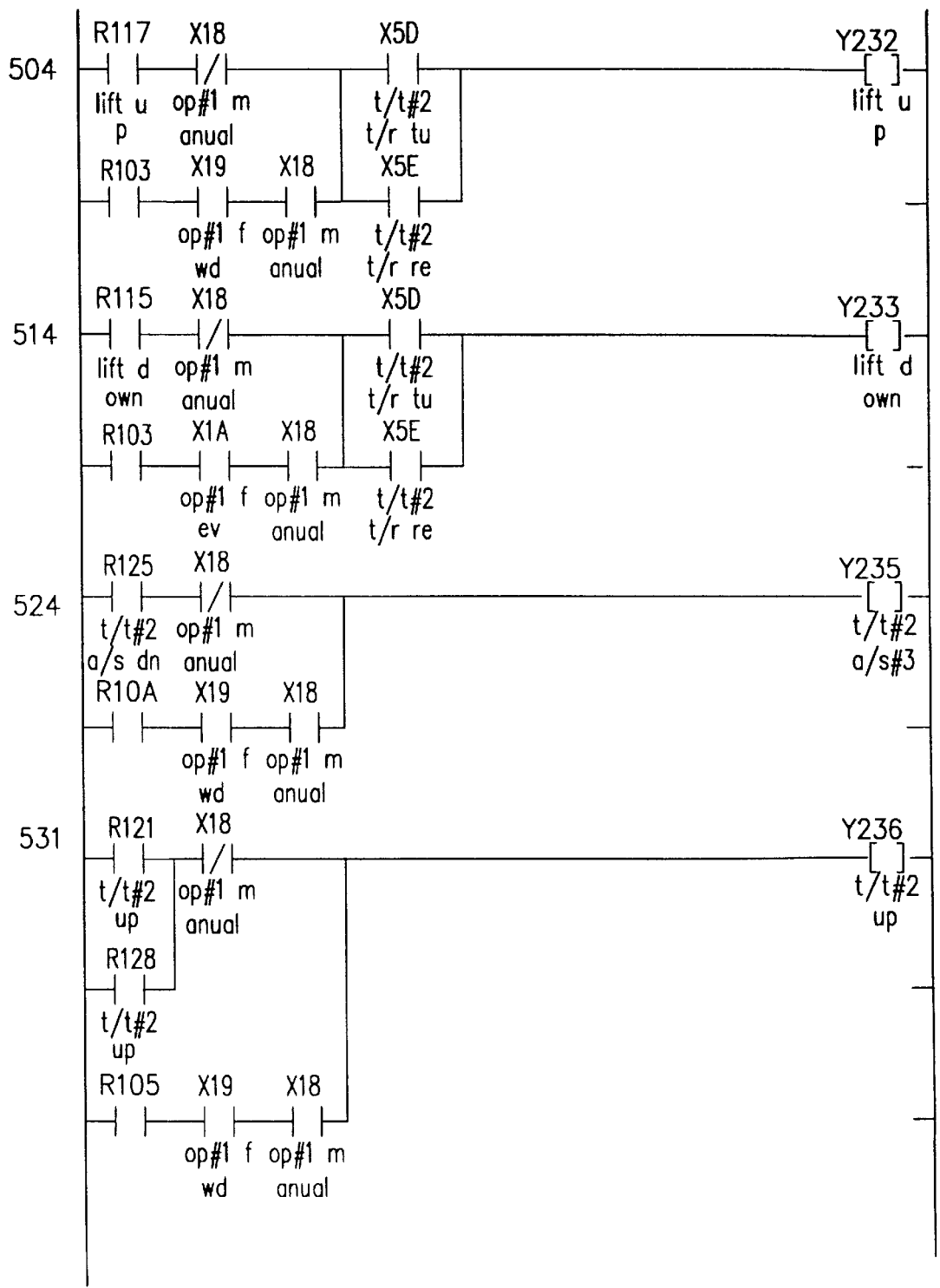
Figure 35:
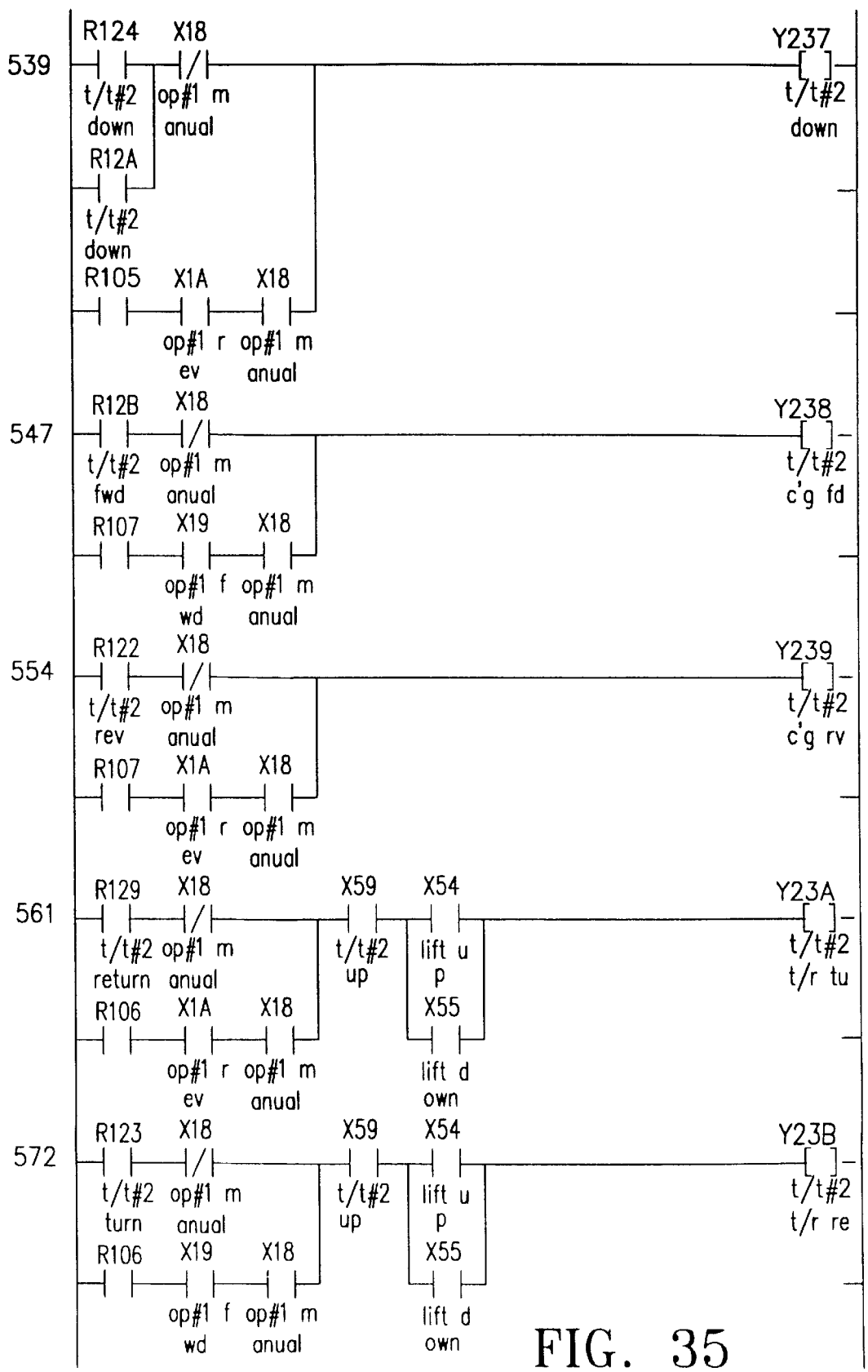
Figure 36:
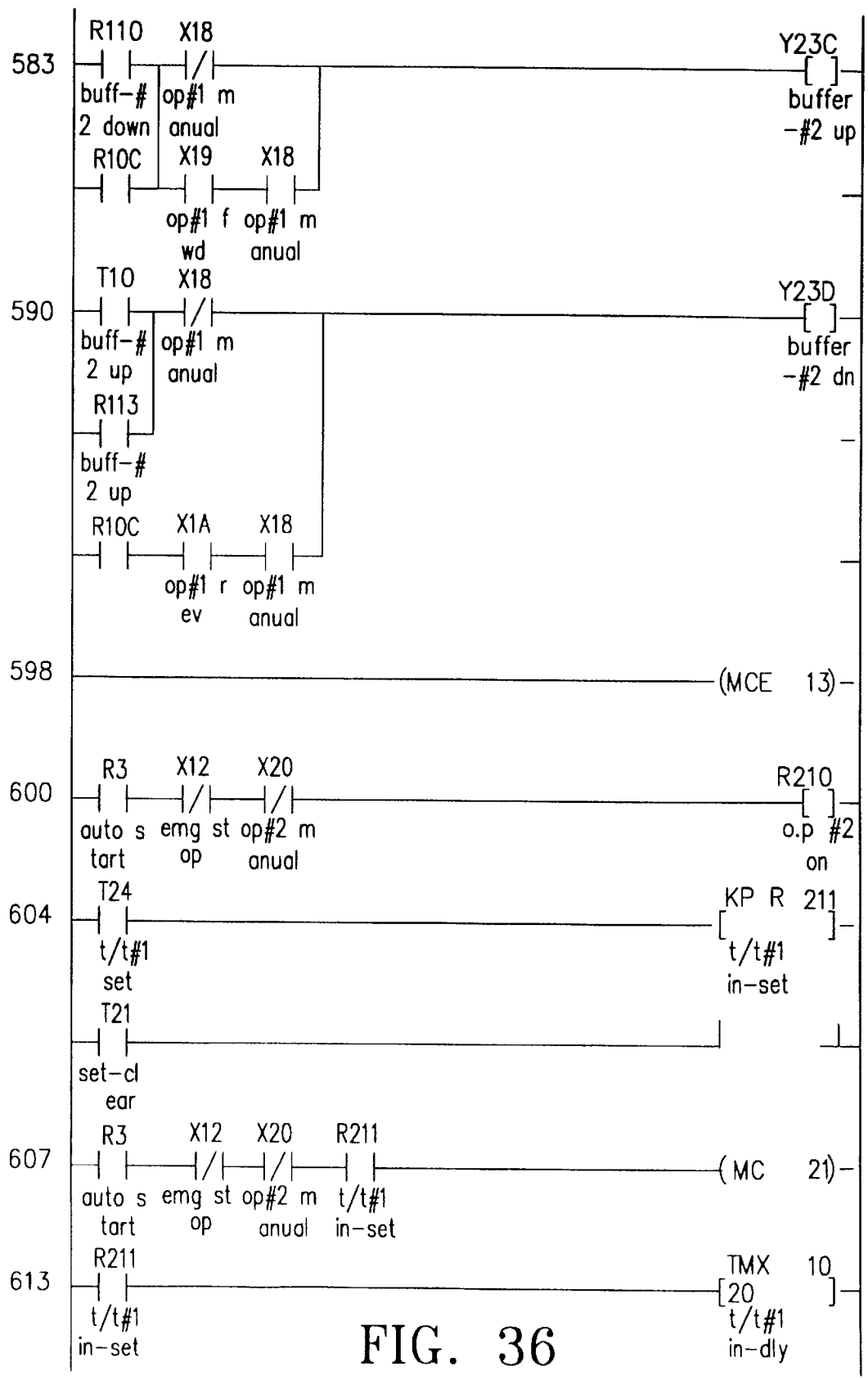
Figure 37:
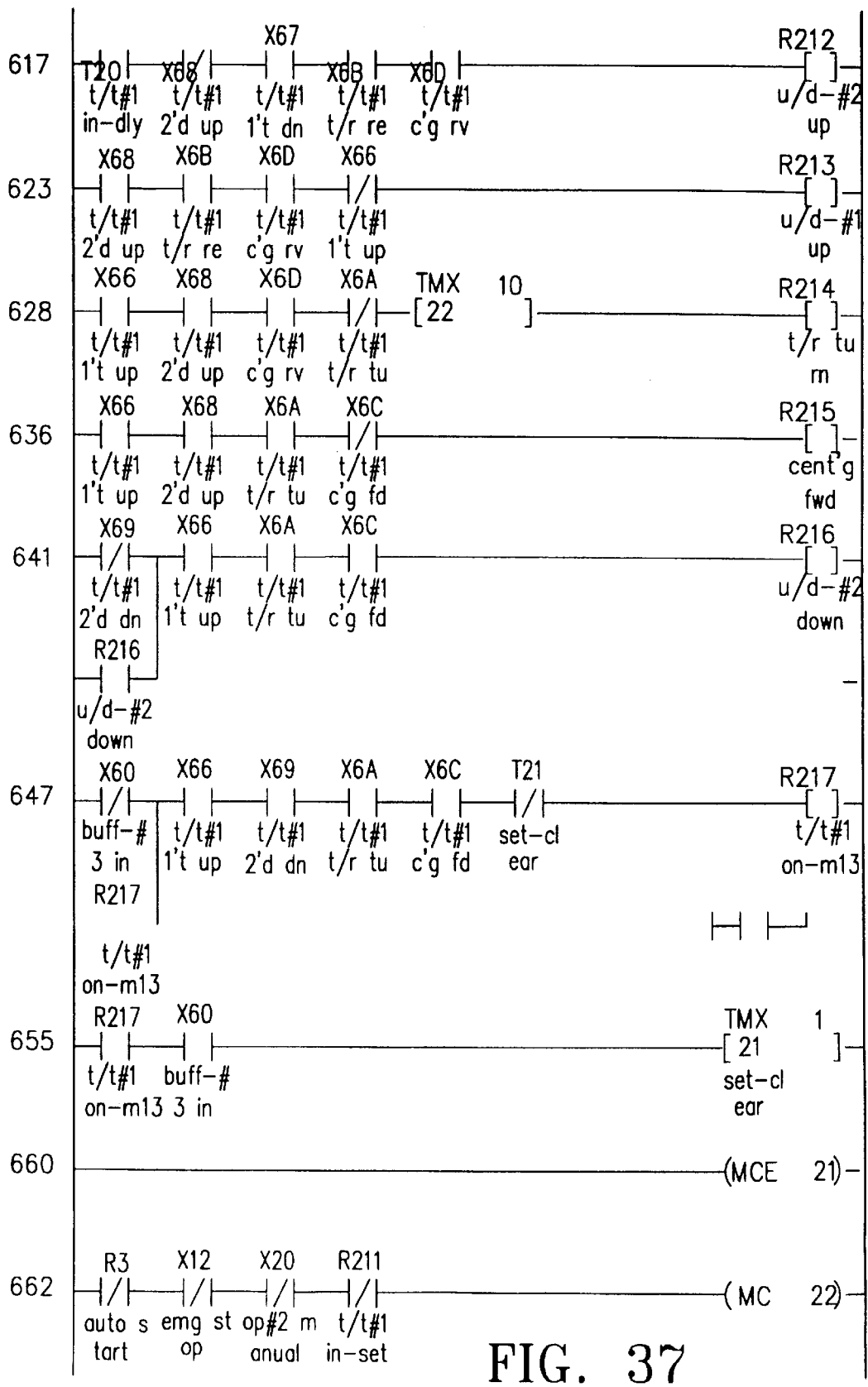
Figure 38:
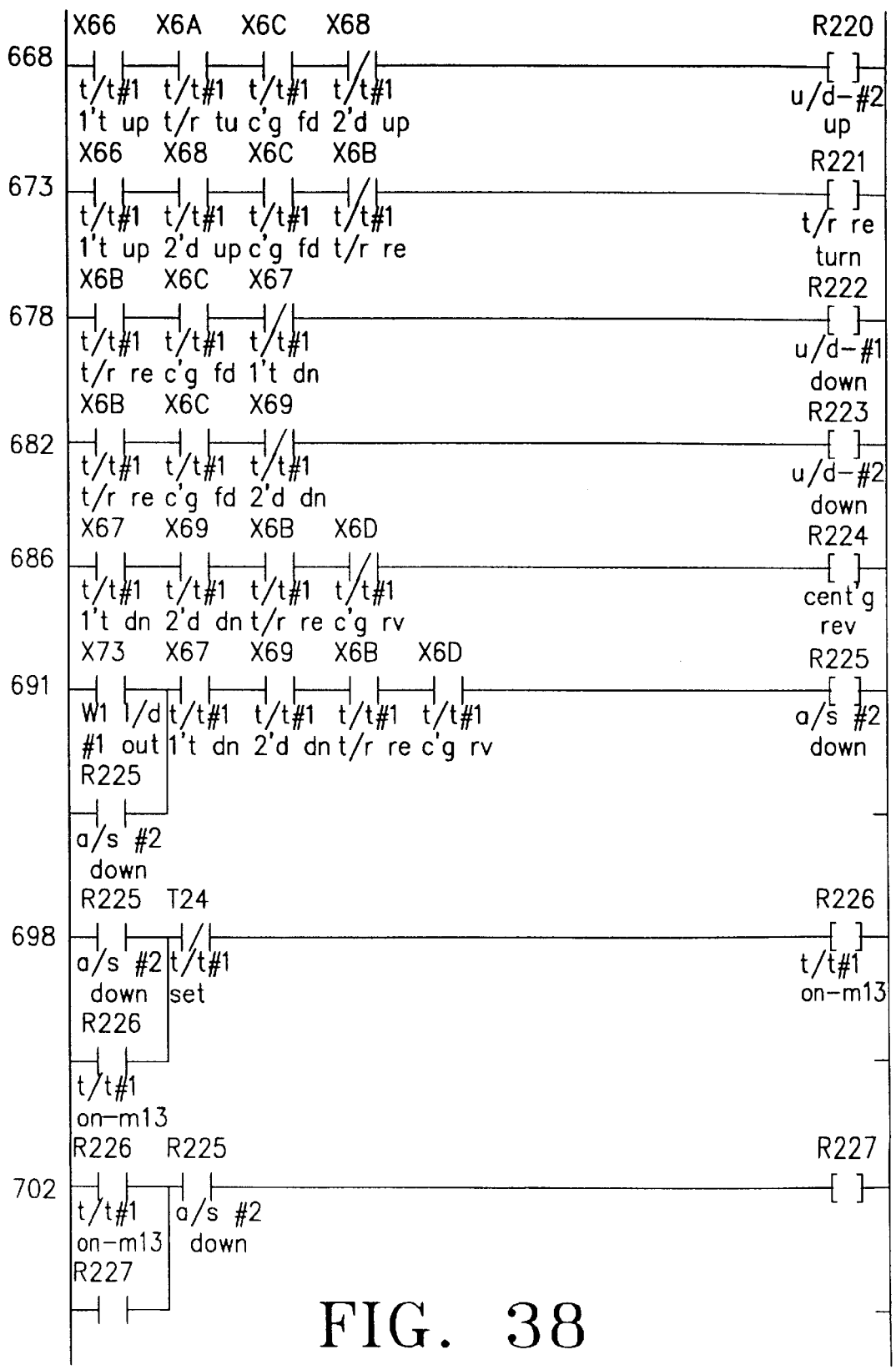
Figure 39:
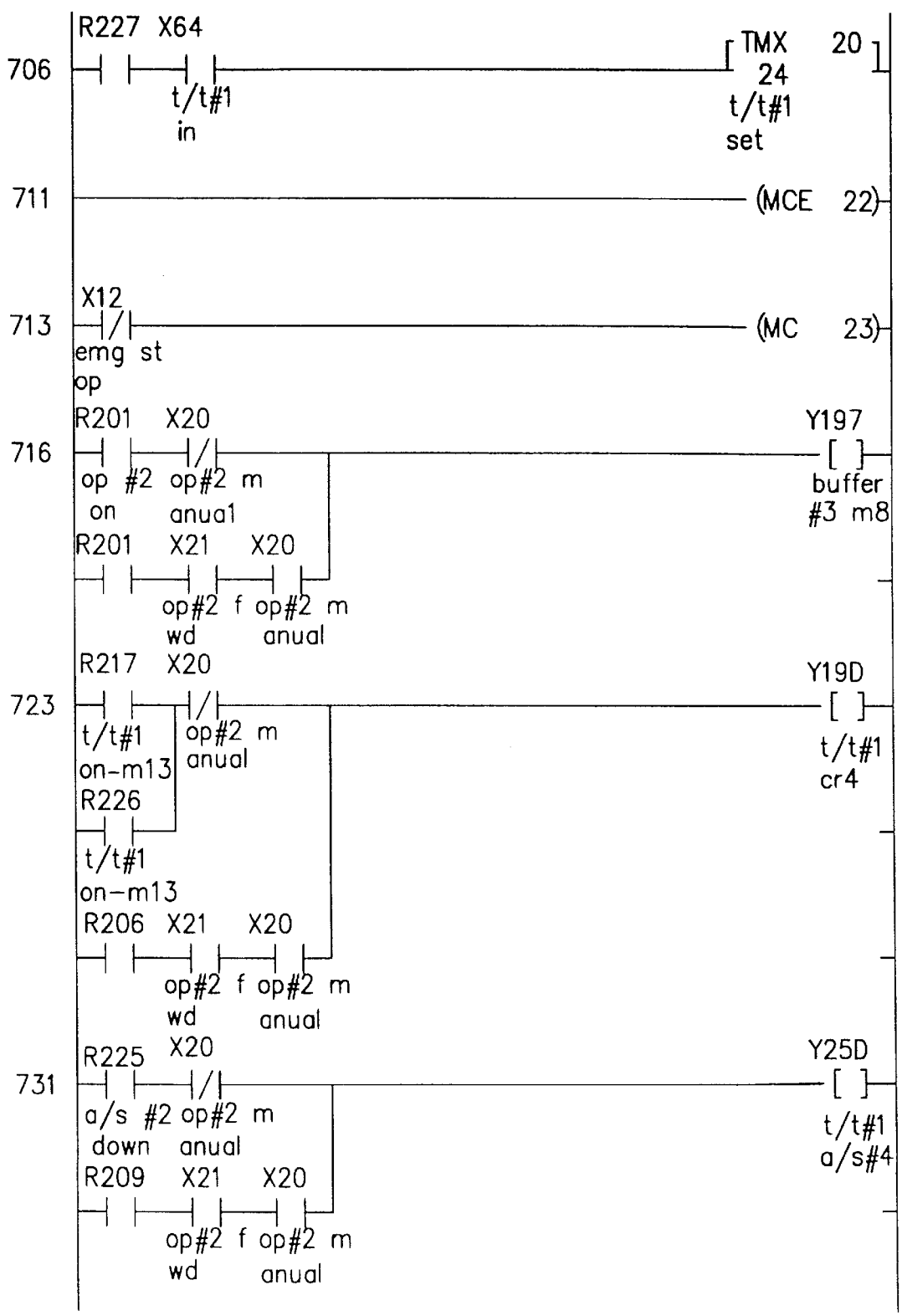
Figure 40:
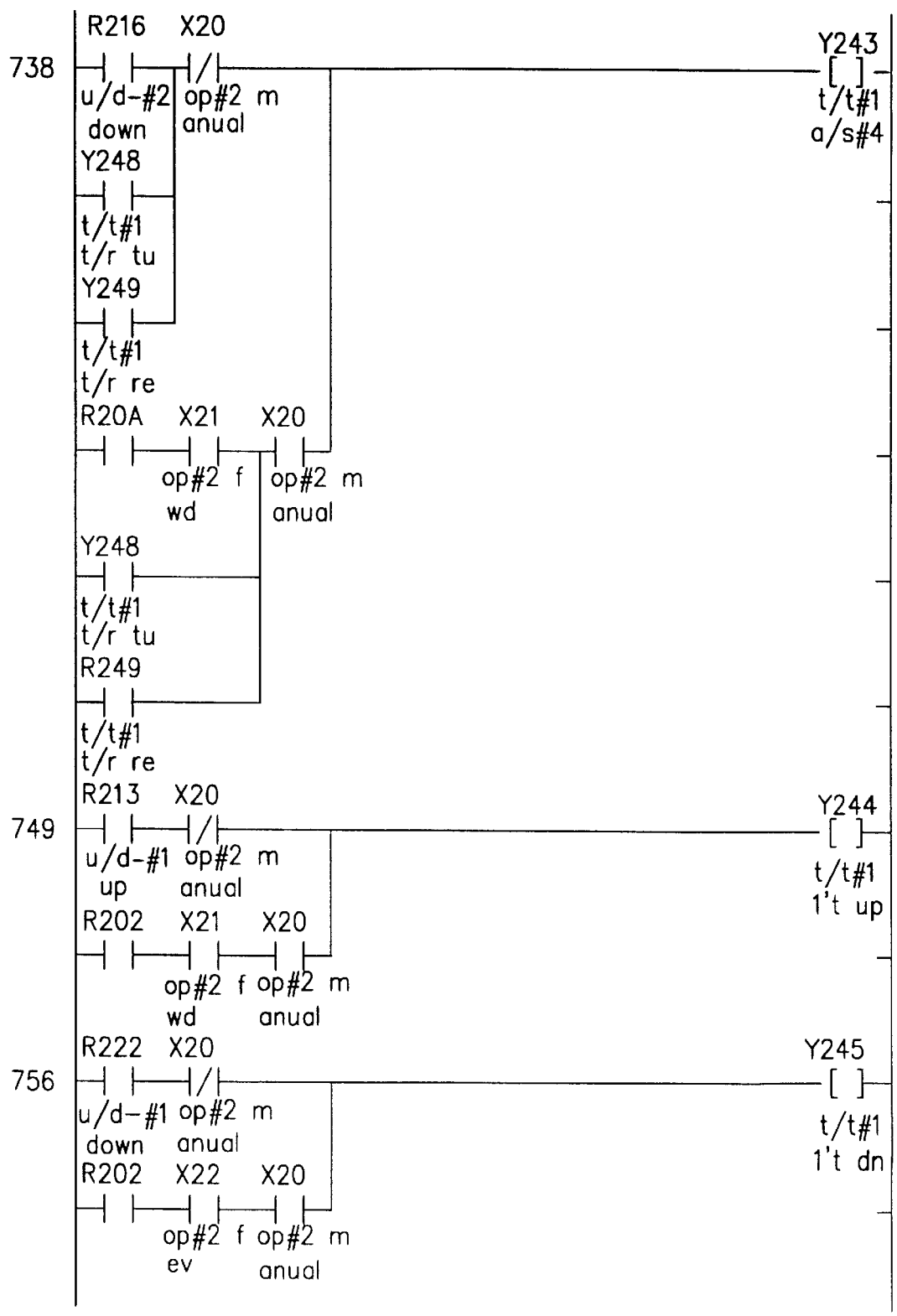
Figure 41:
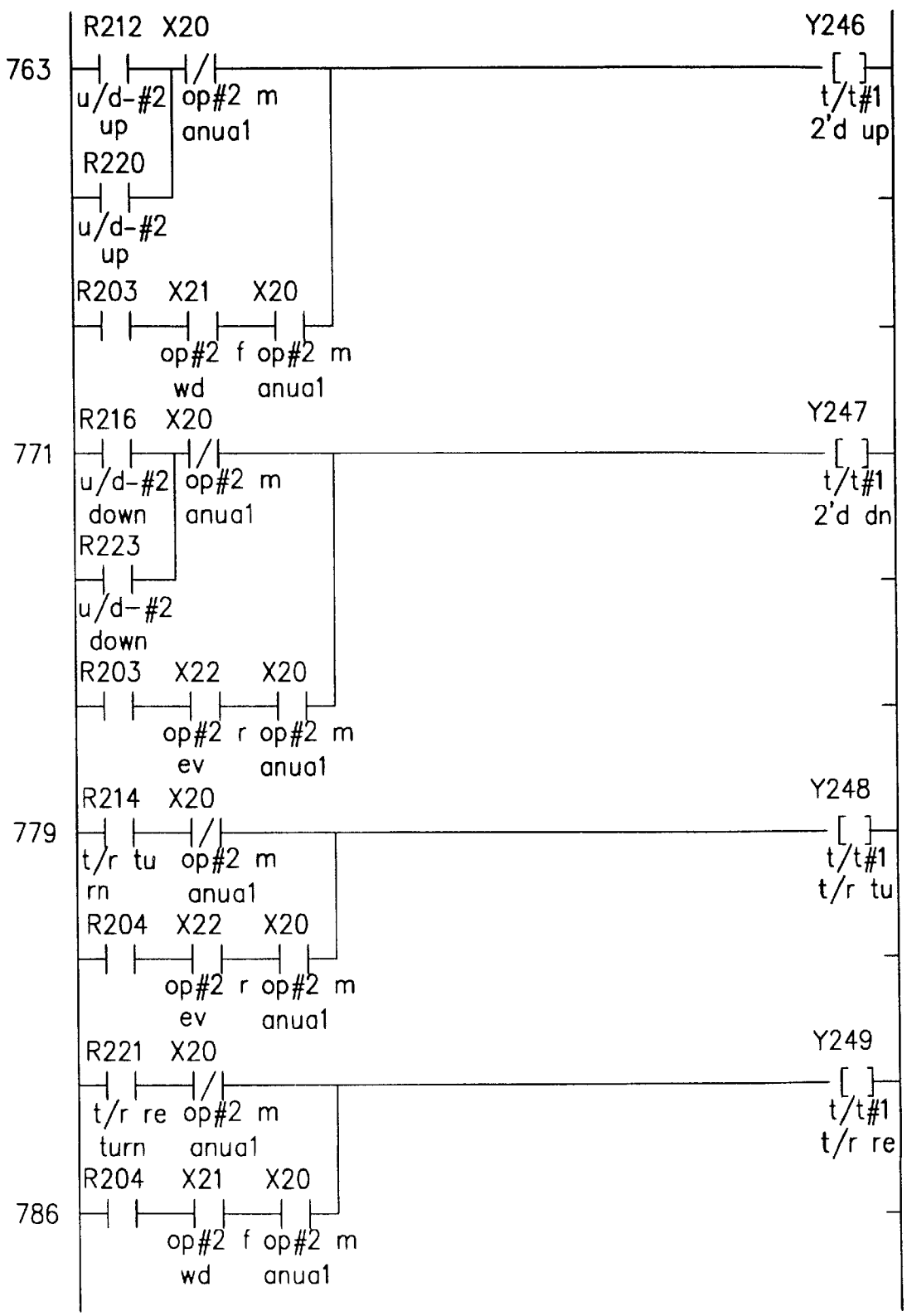
Figure 42:
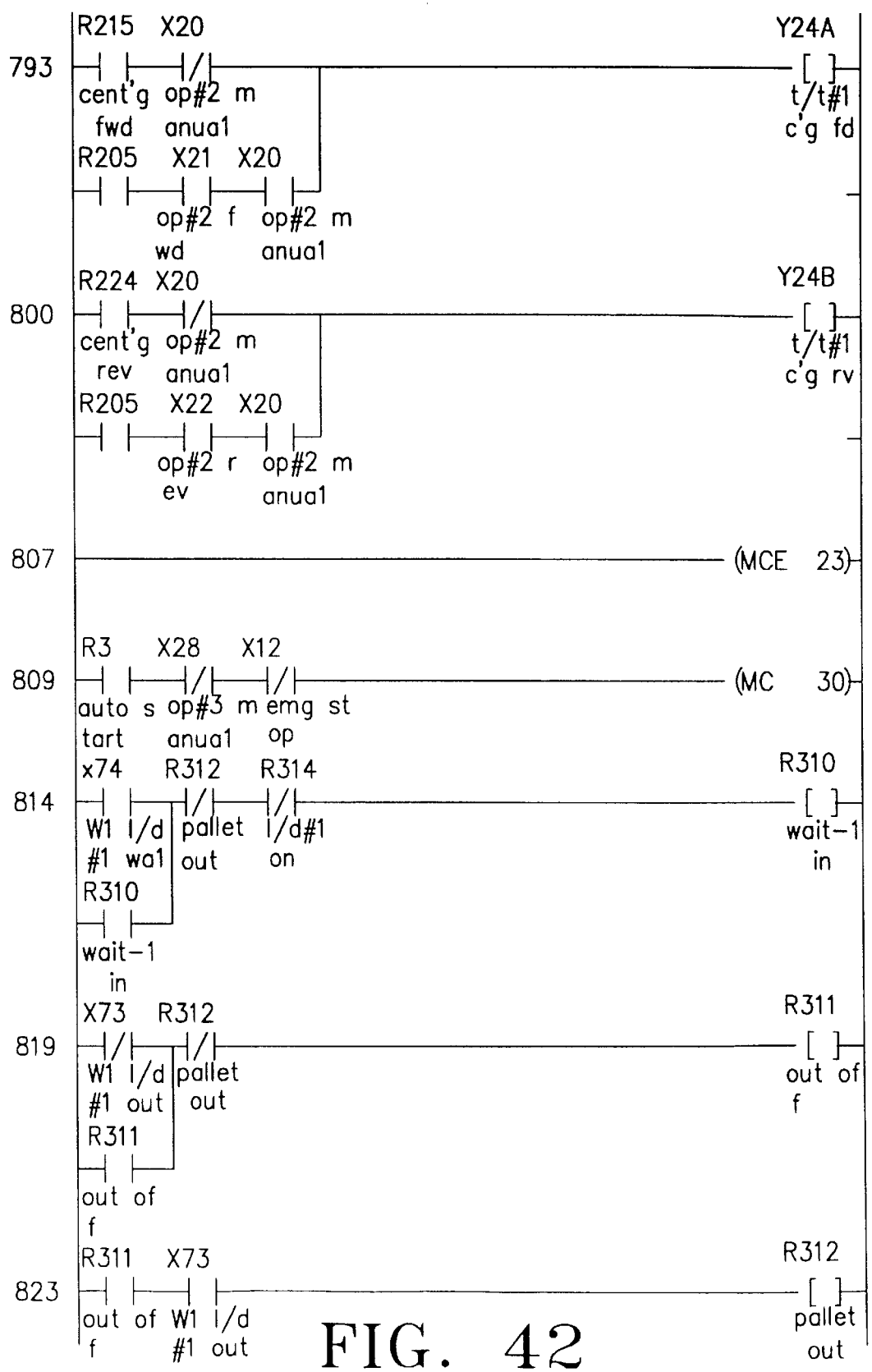
Figure 43:
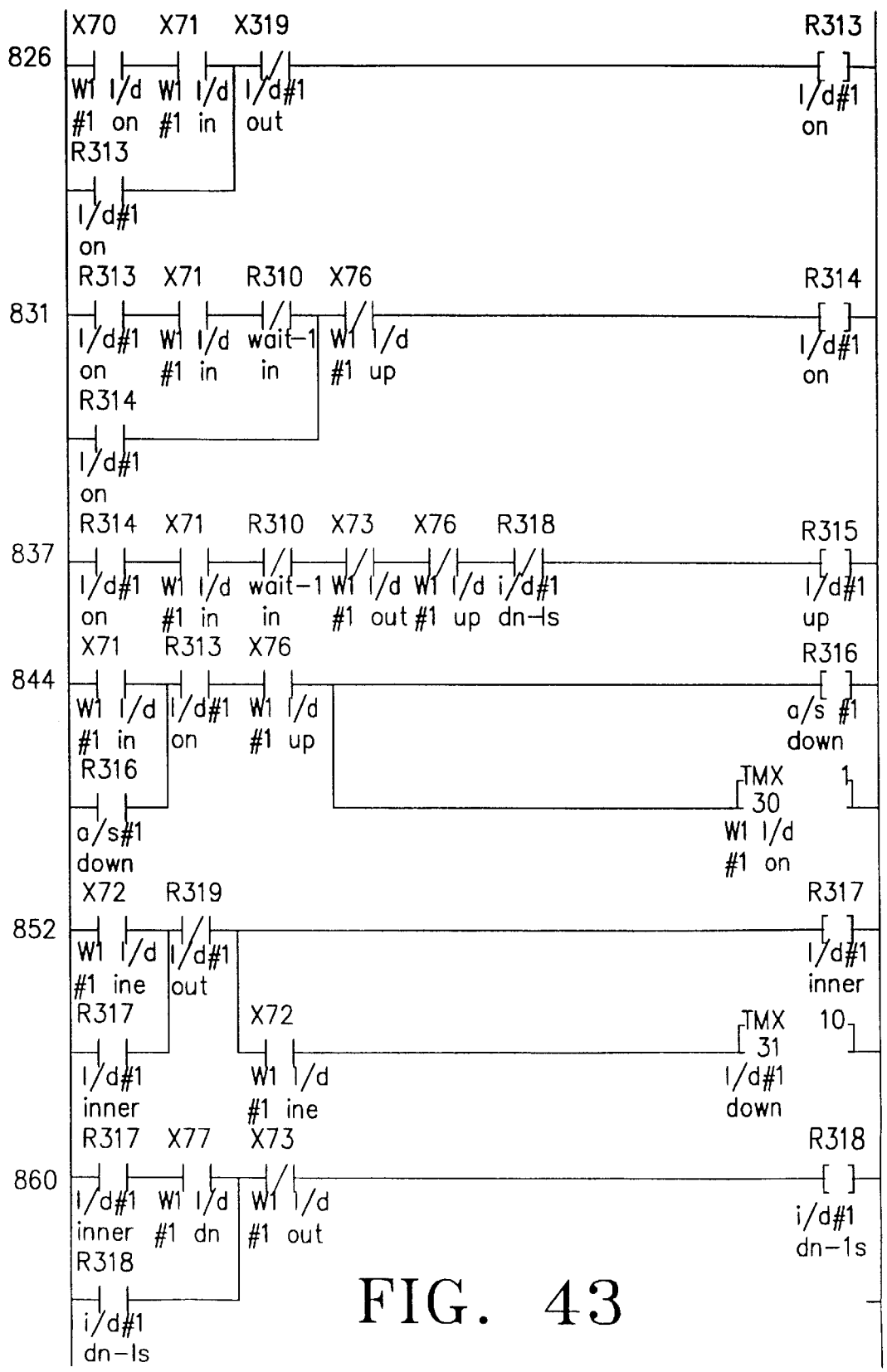
Figure 44:
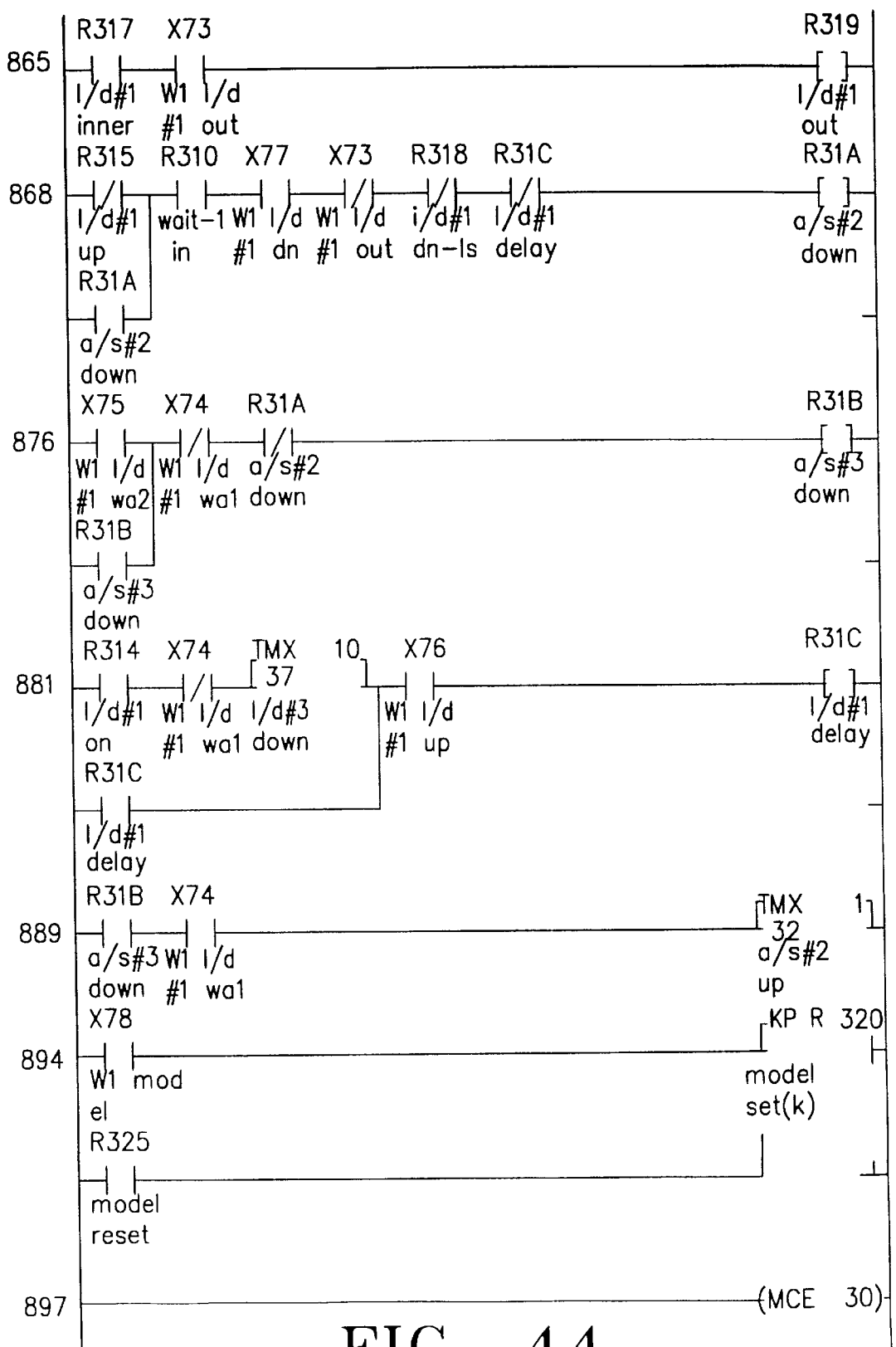
Figure 45:
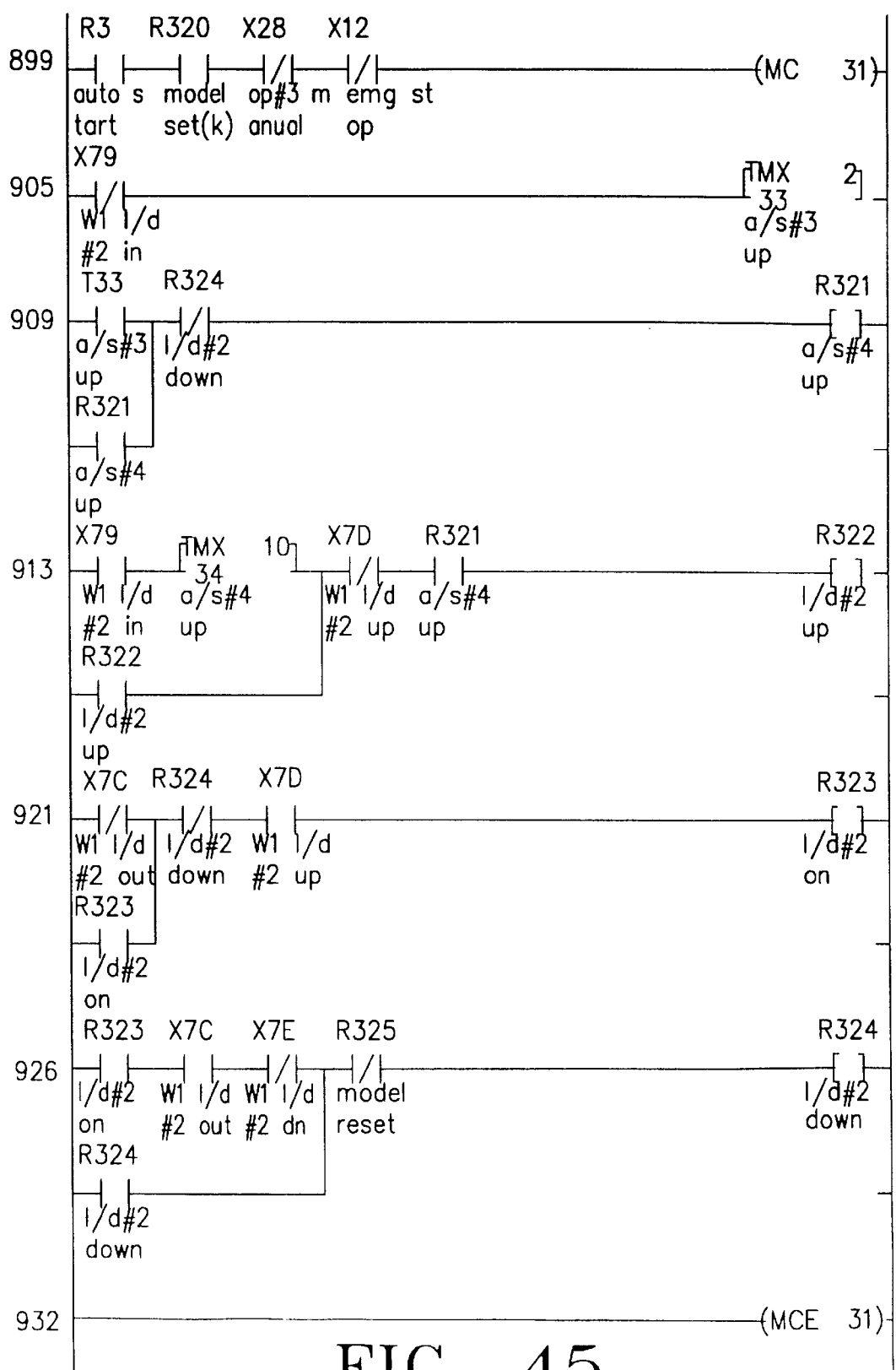
Figure 46:
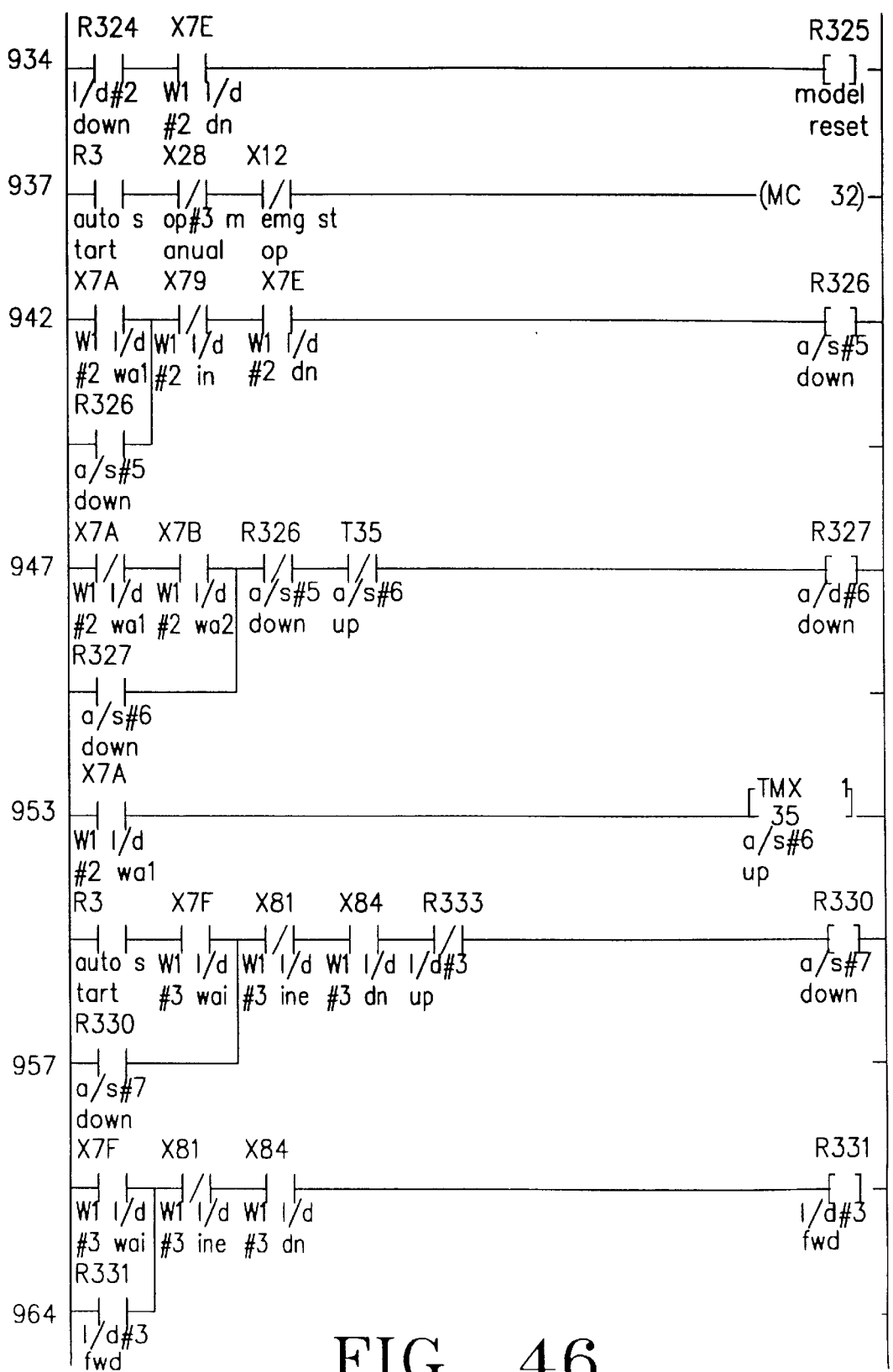
Figure 47:
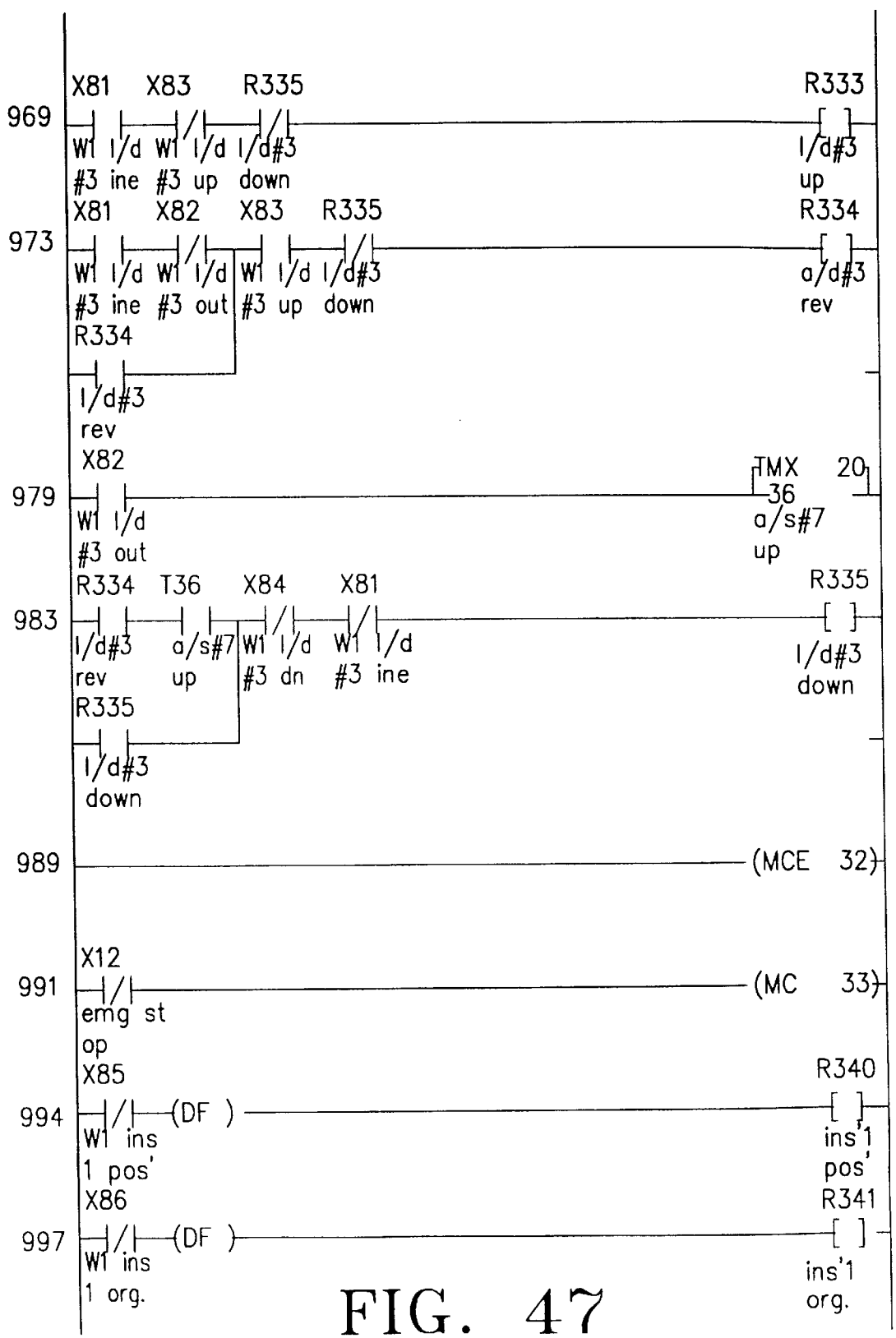
Figure 48:
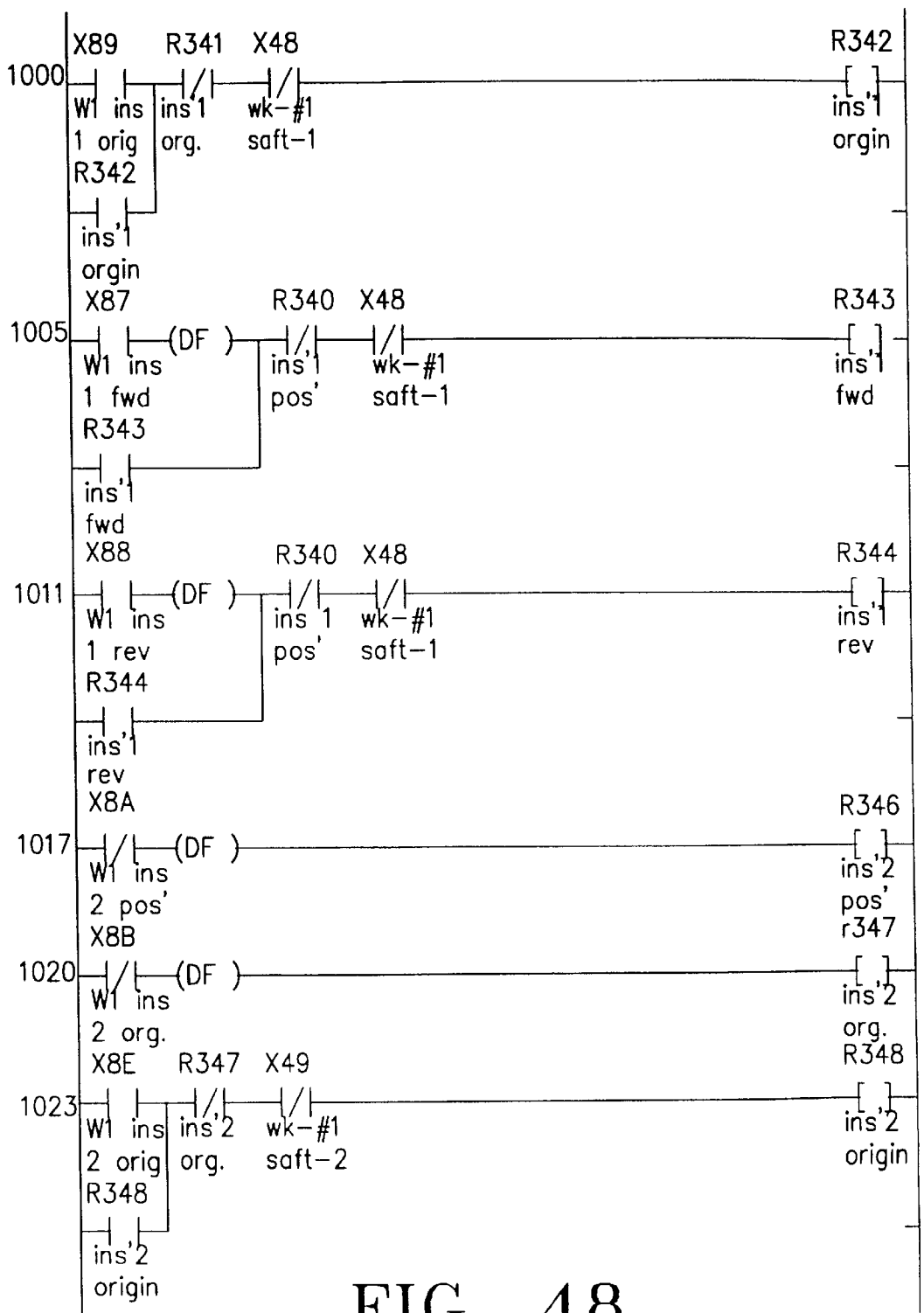
Figure 49:
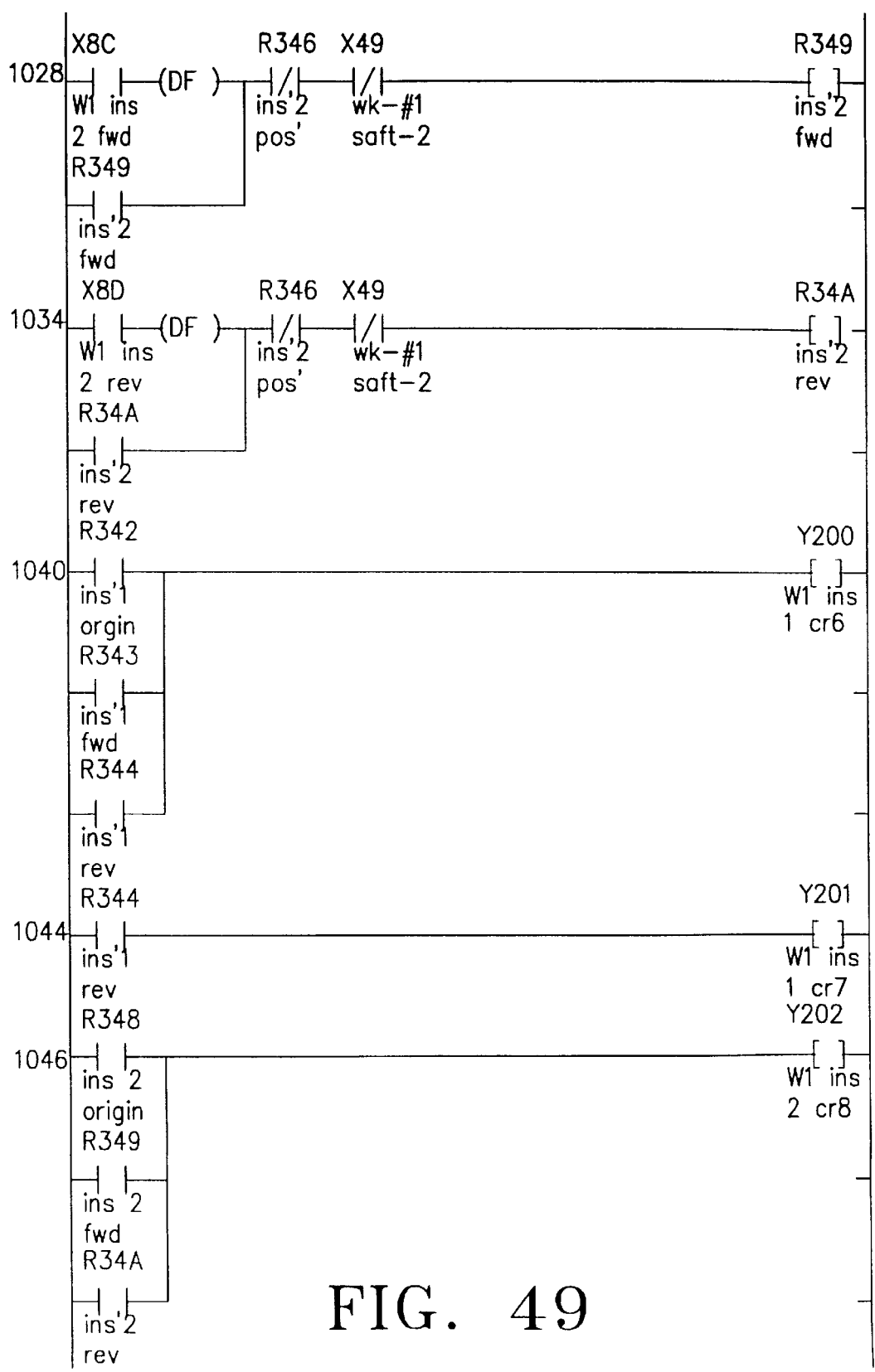
Figure 50:
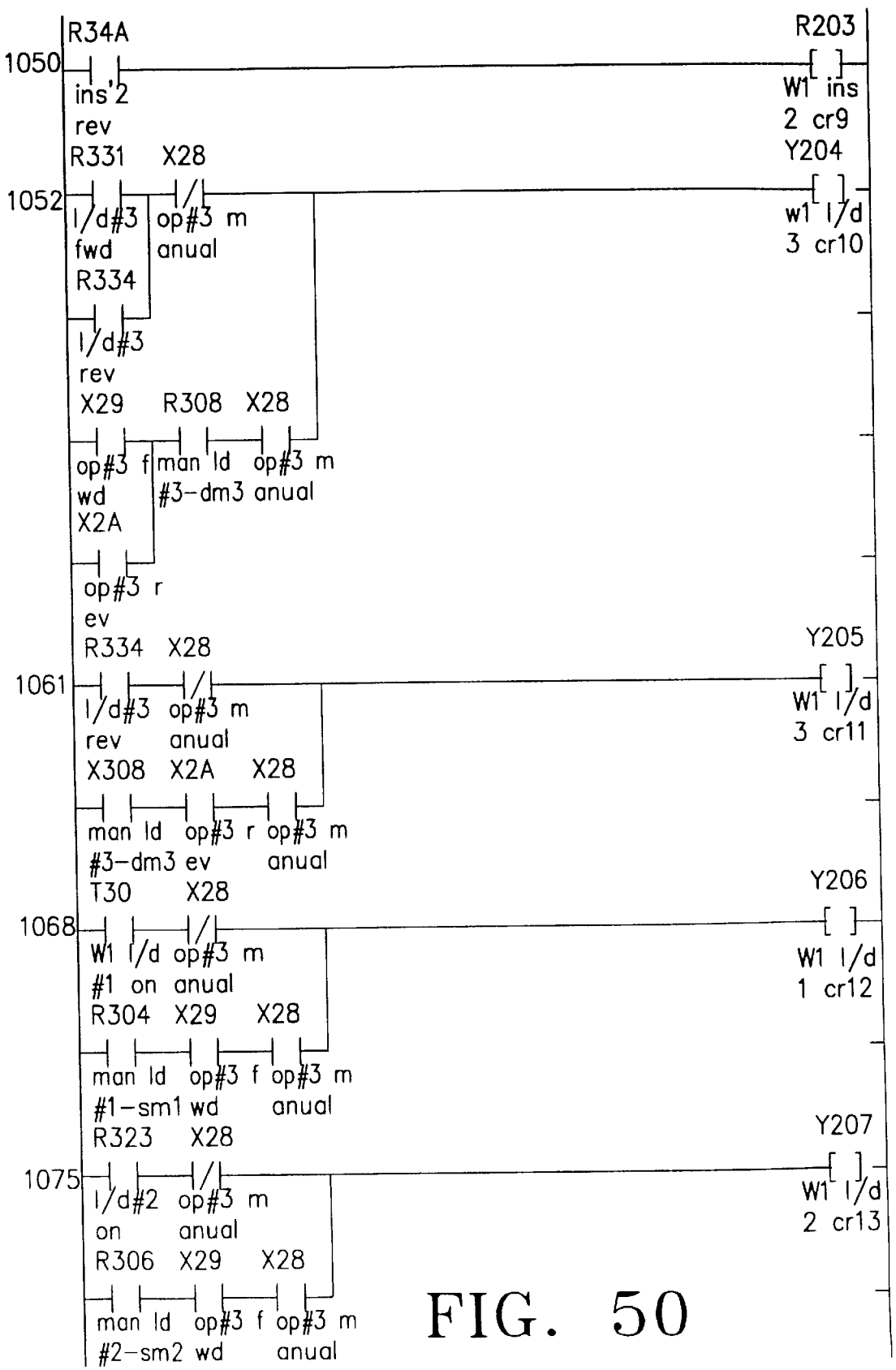
Figure 51:
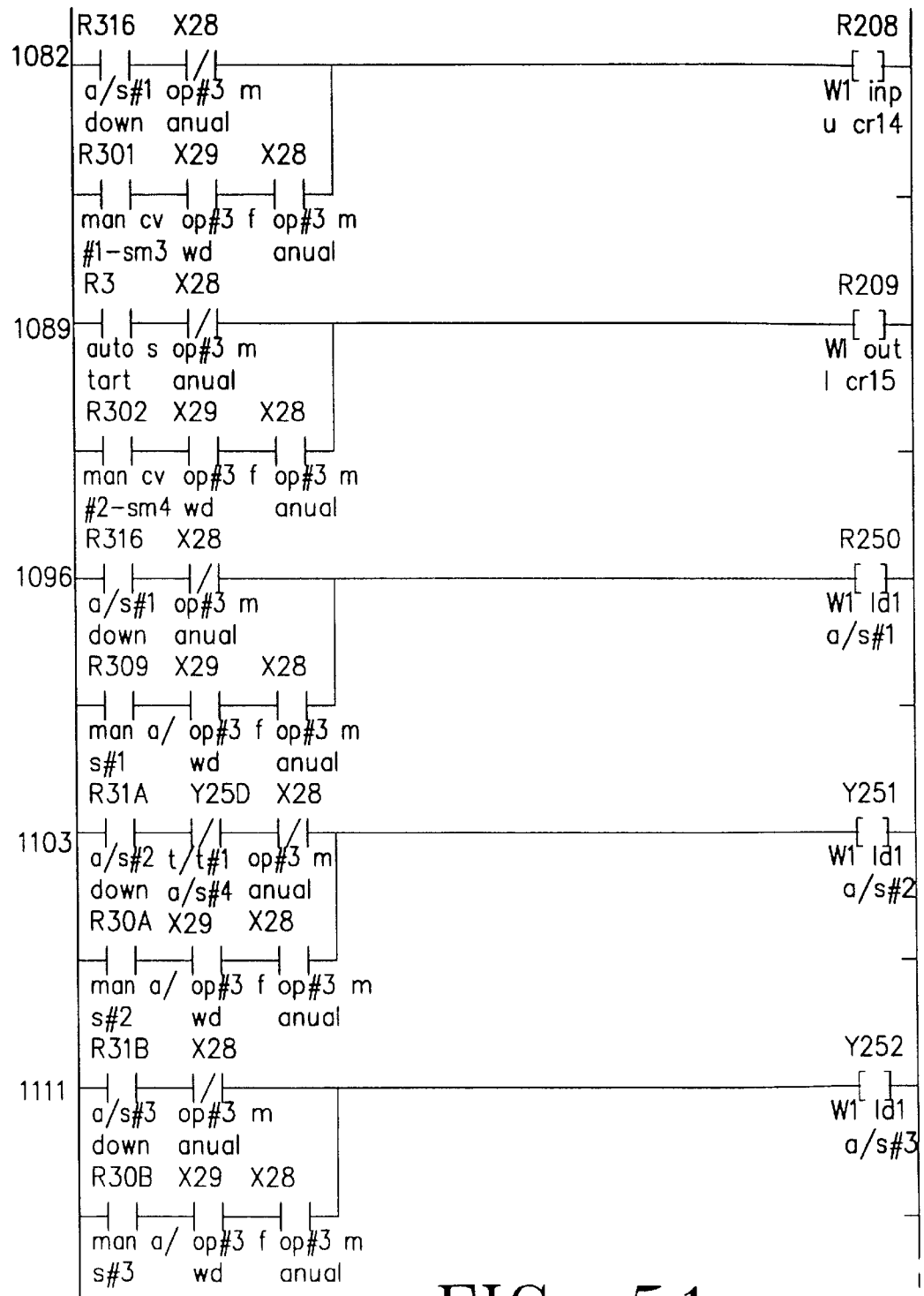
Figure 52:
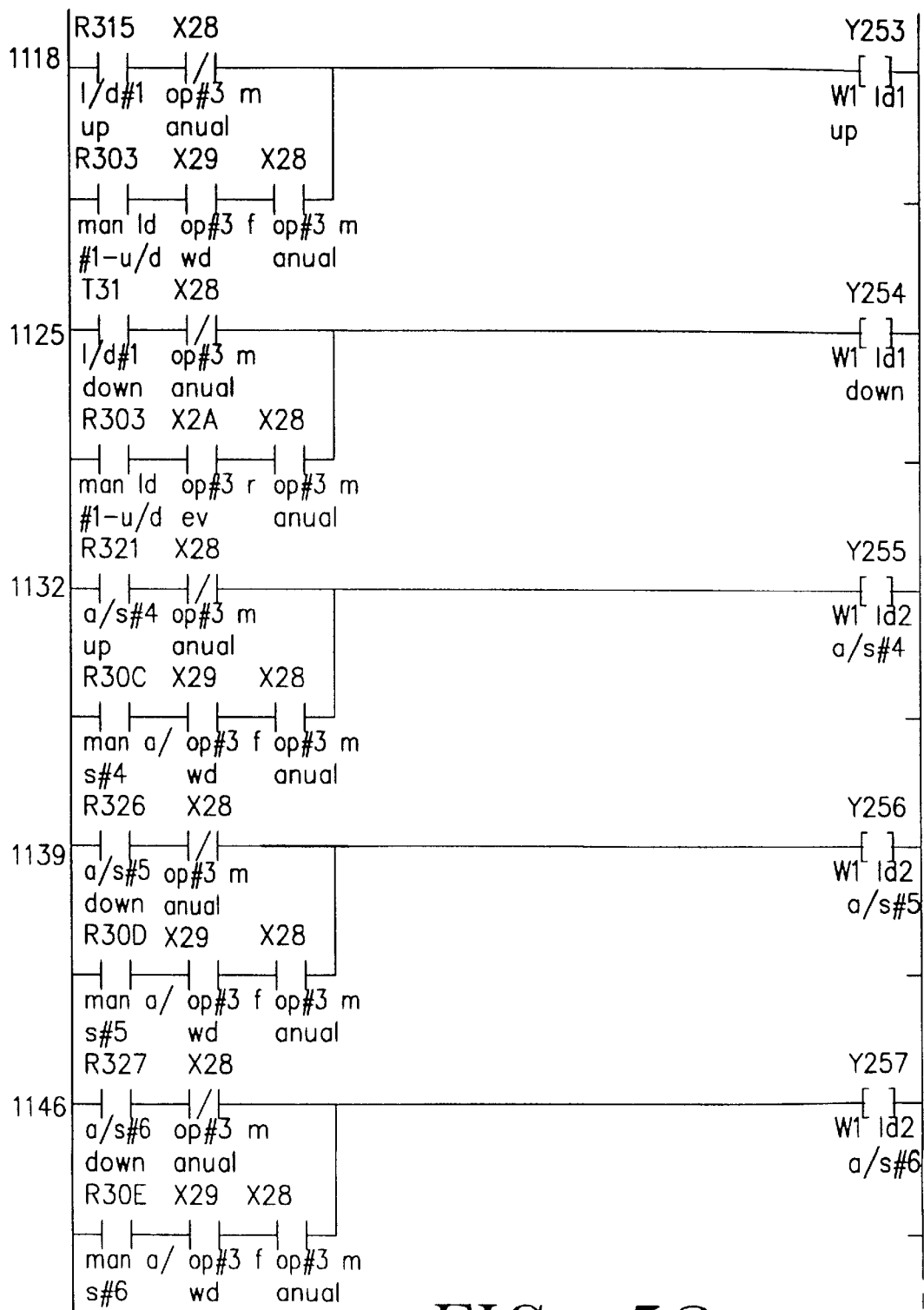
Figure 53:
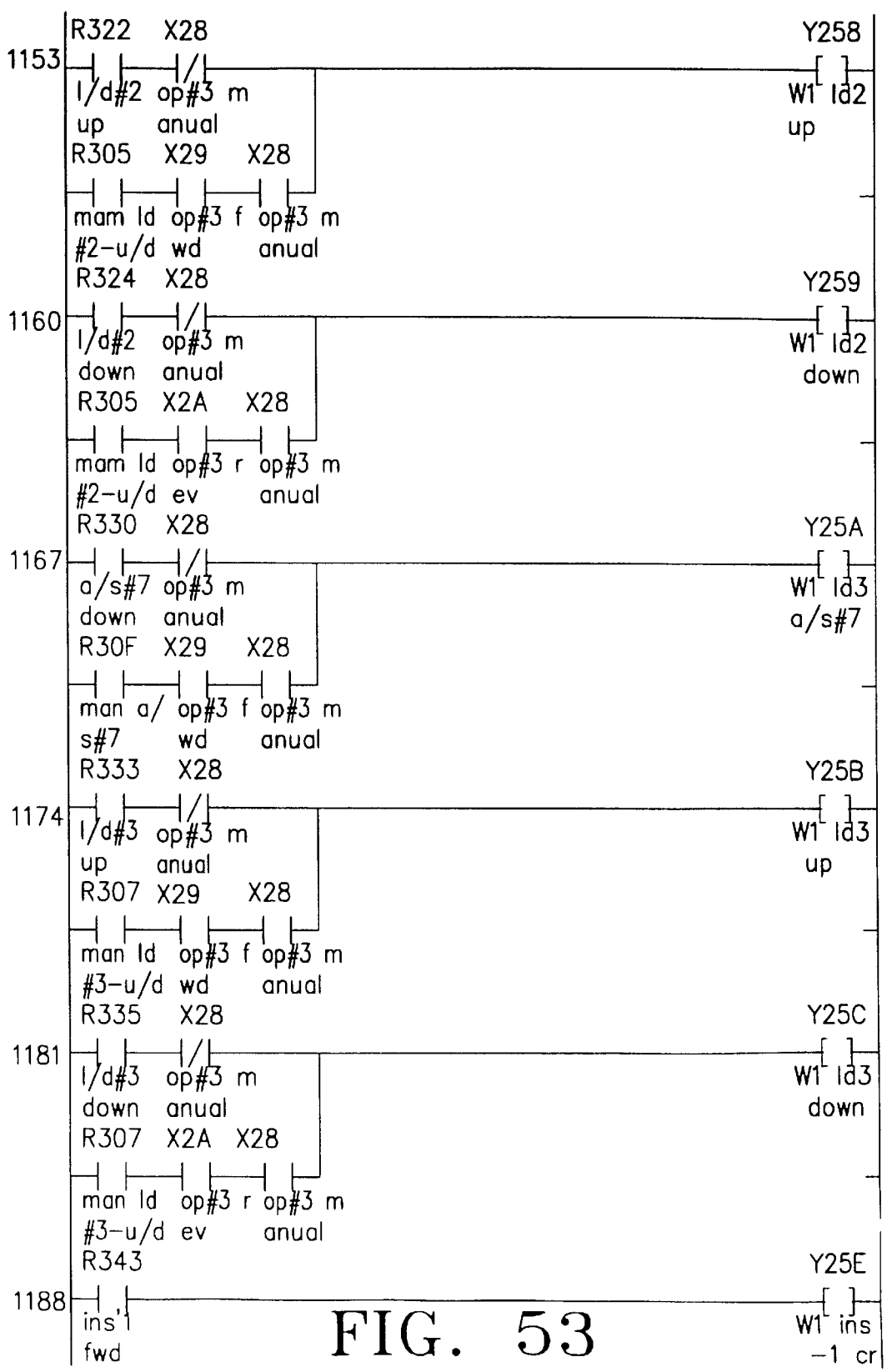
Figure 54:
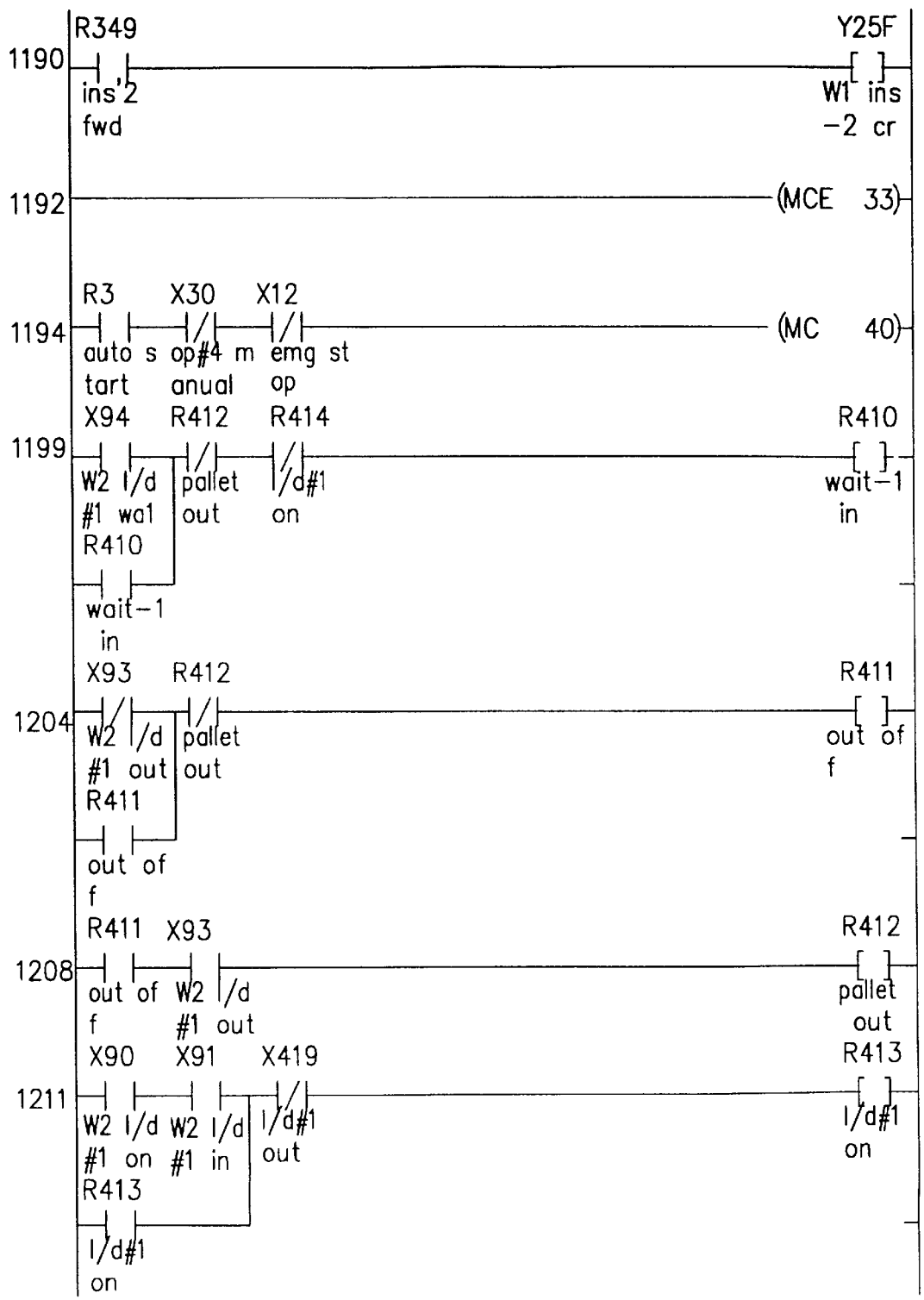
Figure 55:
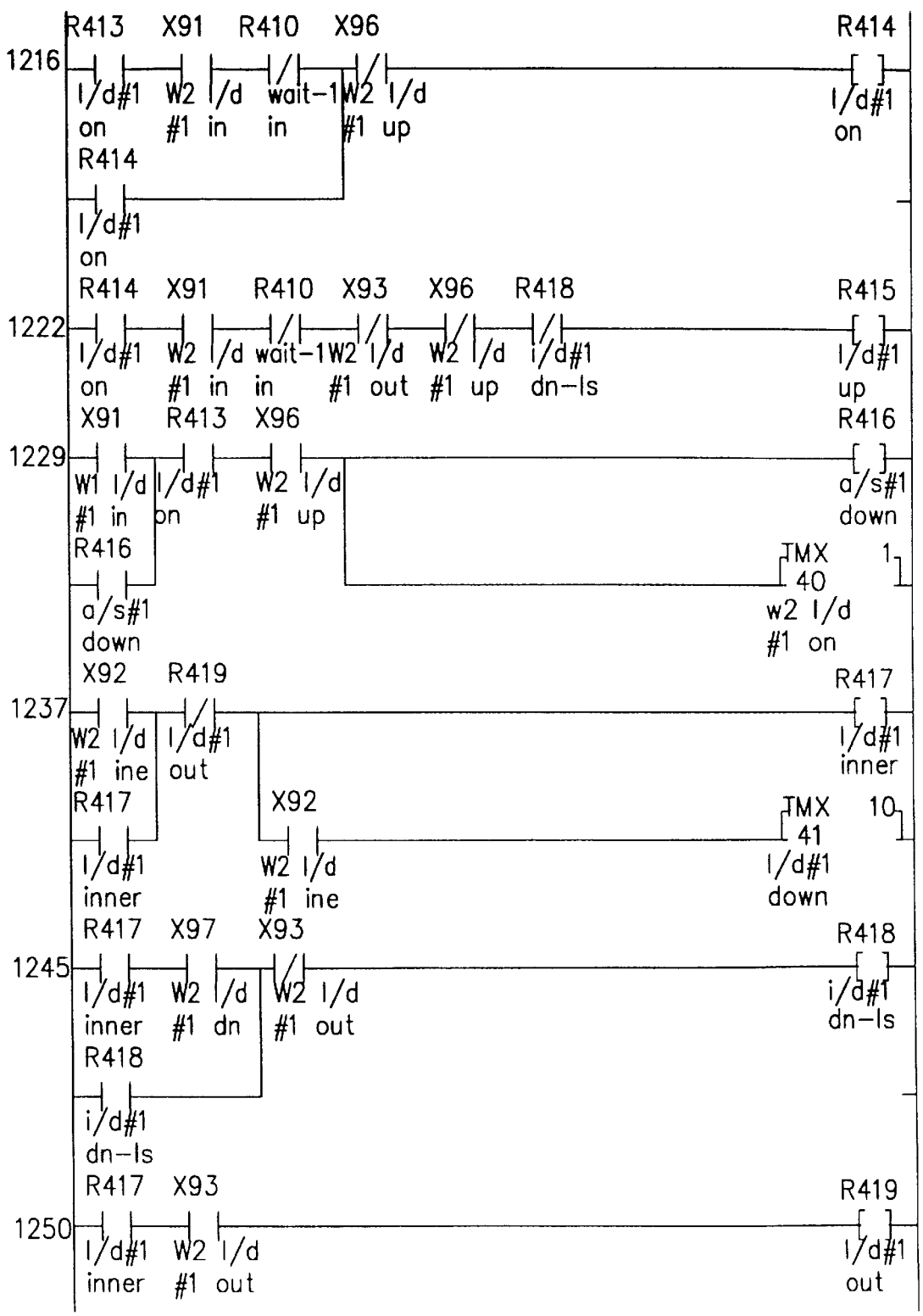
Figure 56:
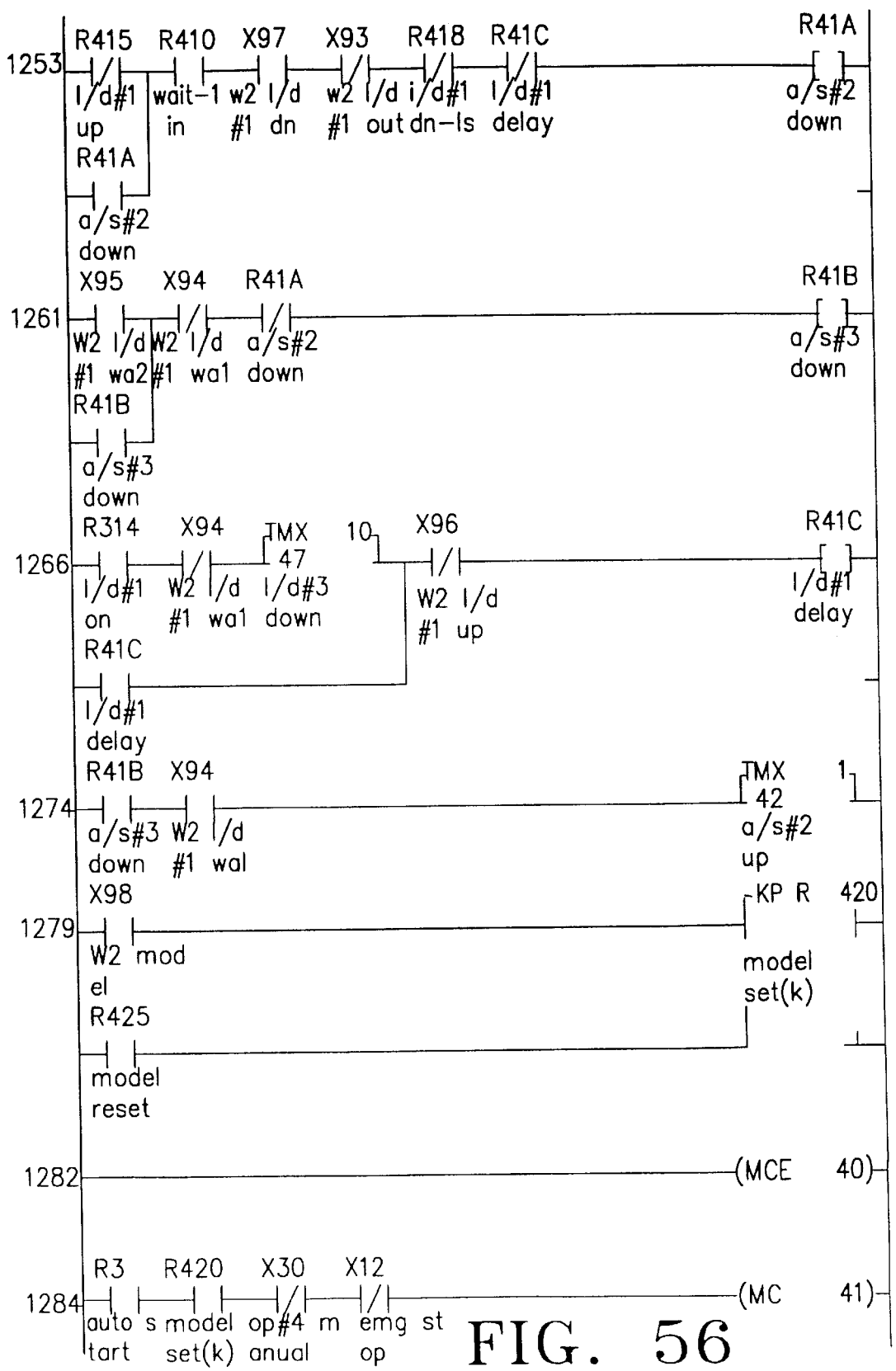
Figure 57:
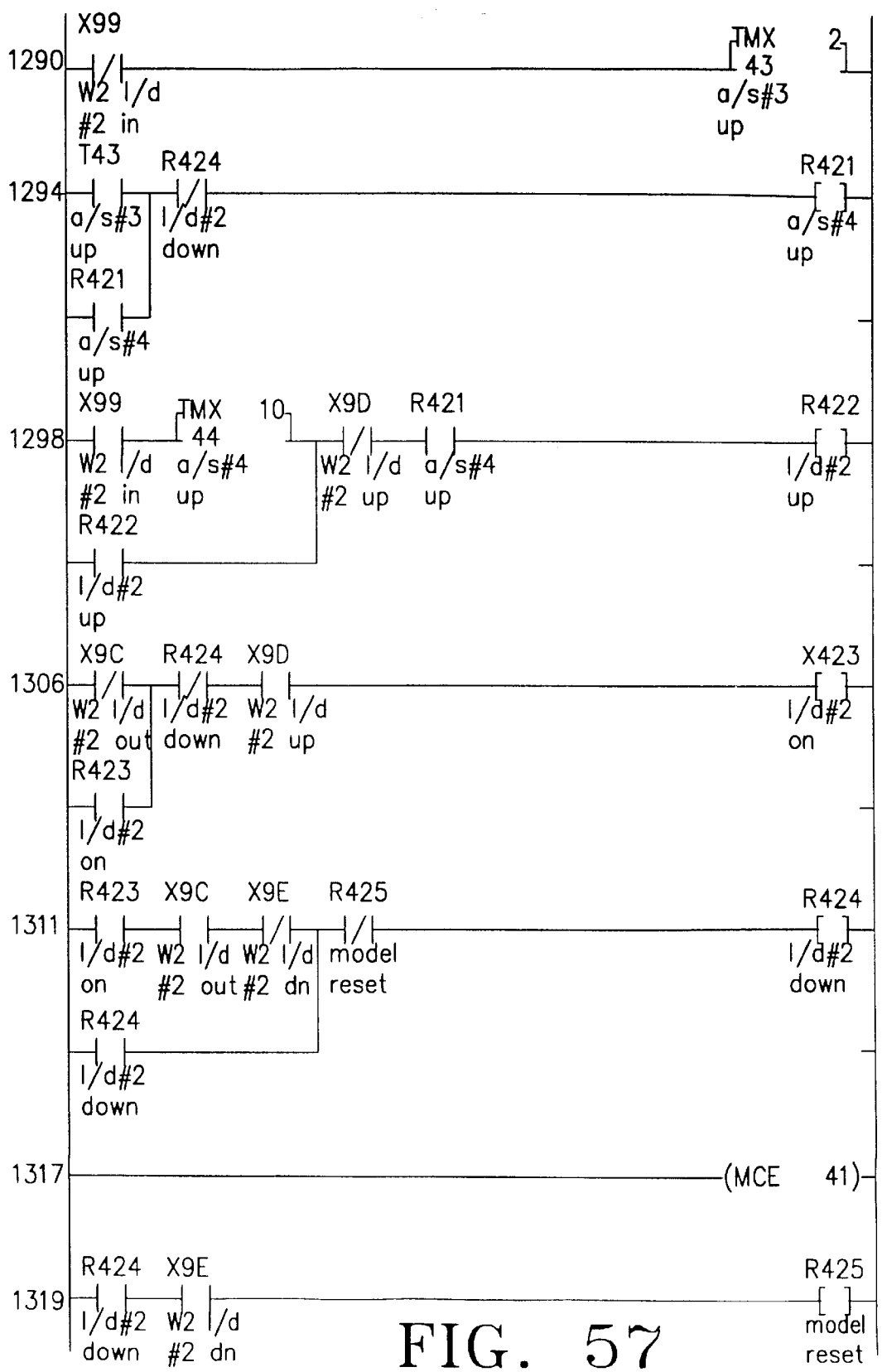
Figure 58:
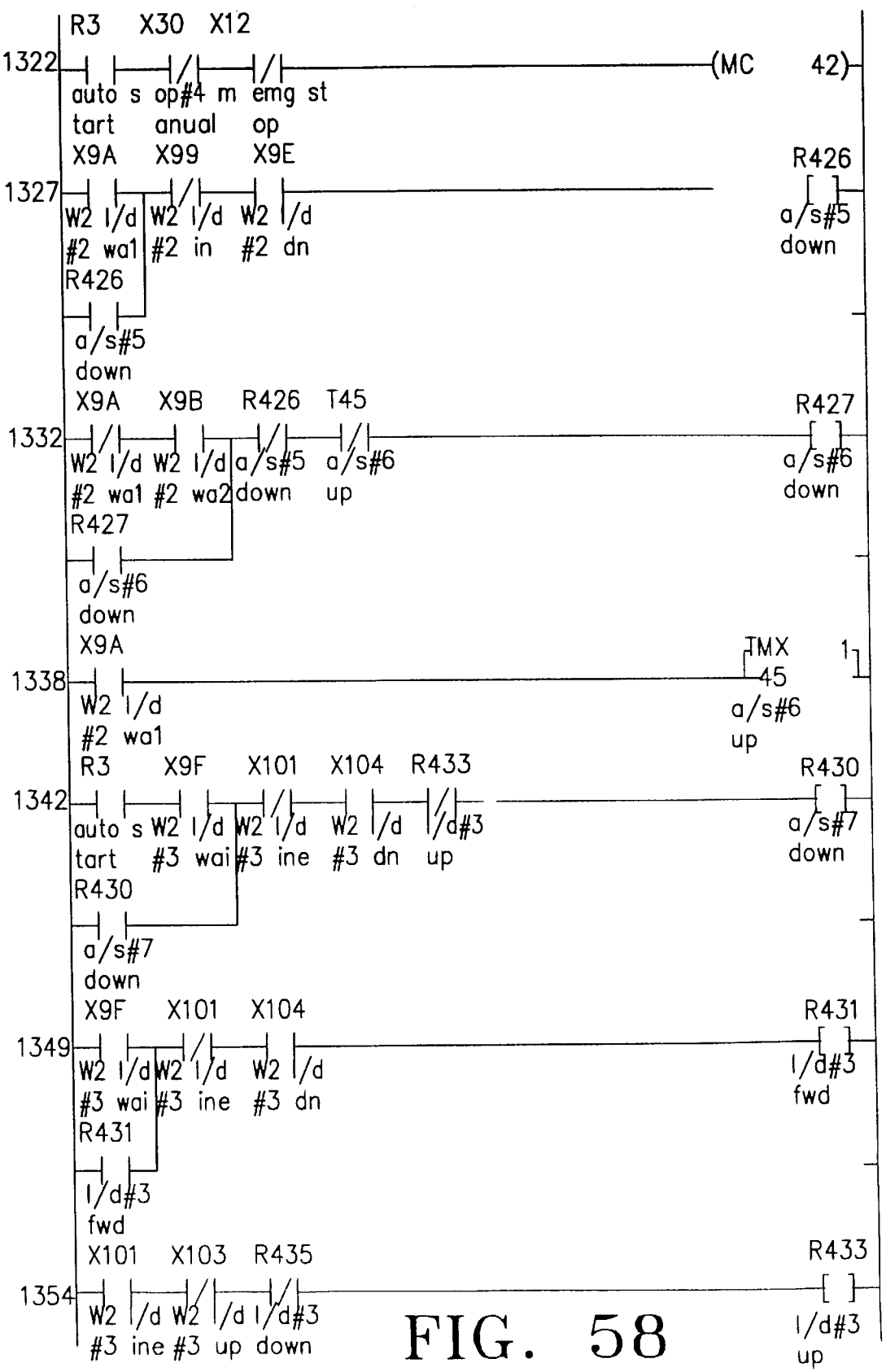
Figure 59:
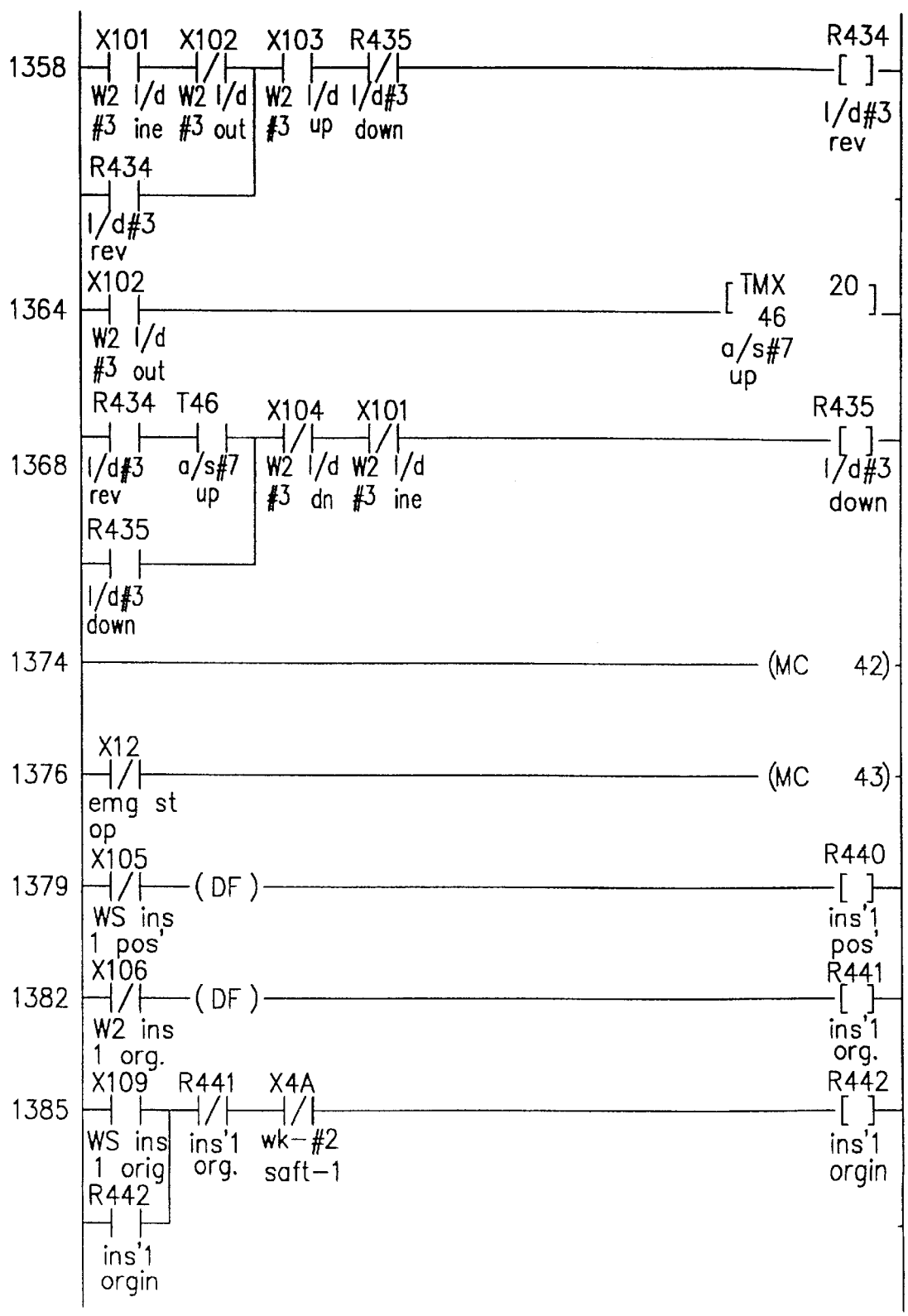
Figure 60:
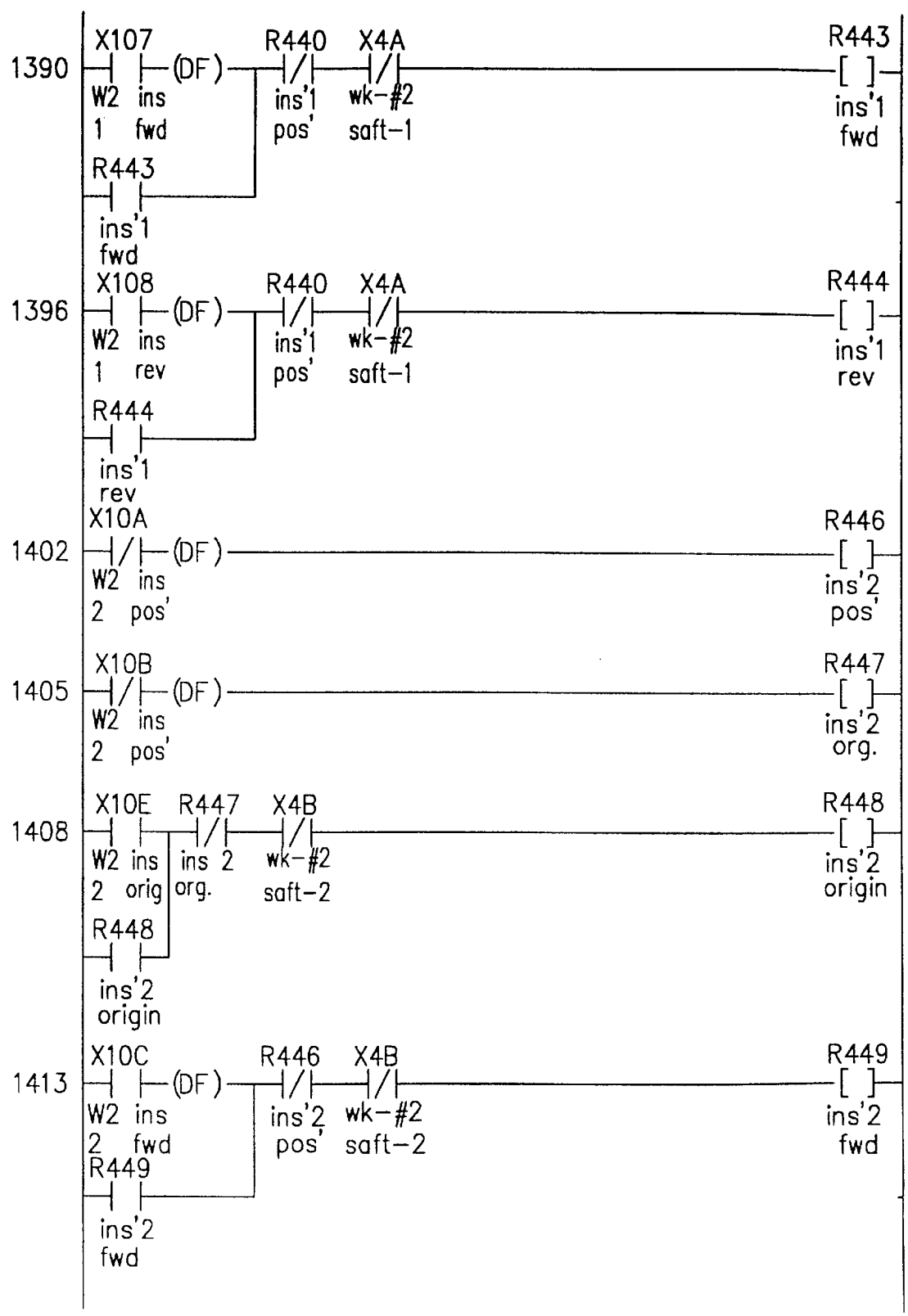
Figure 61:
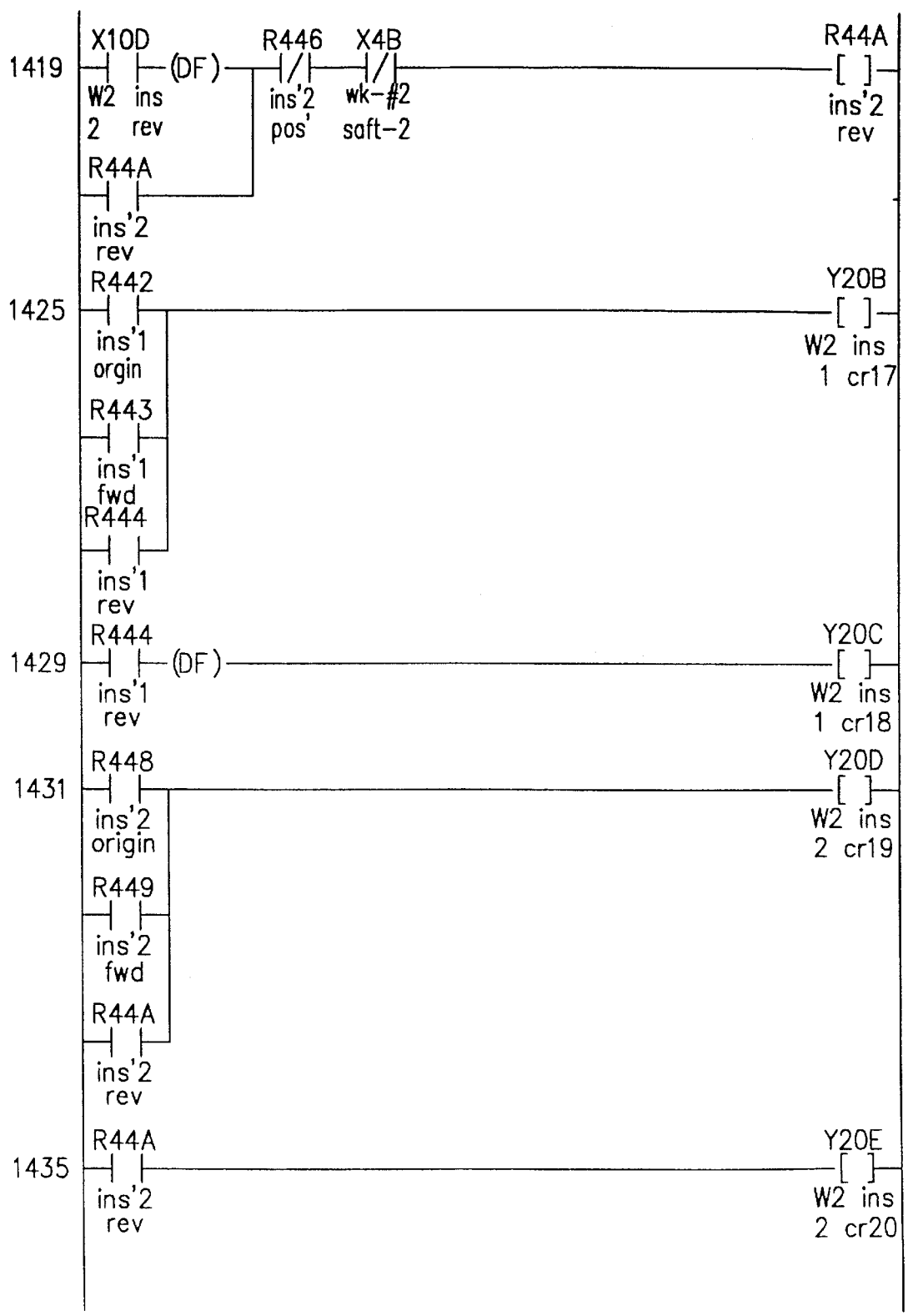
Figure 62:
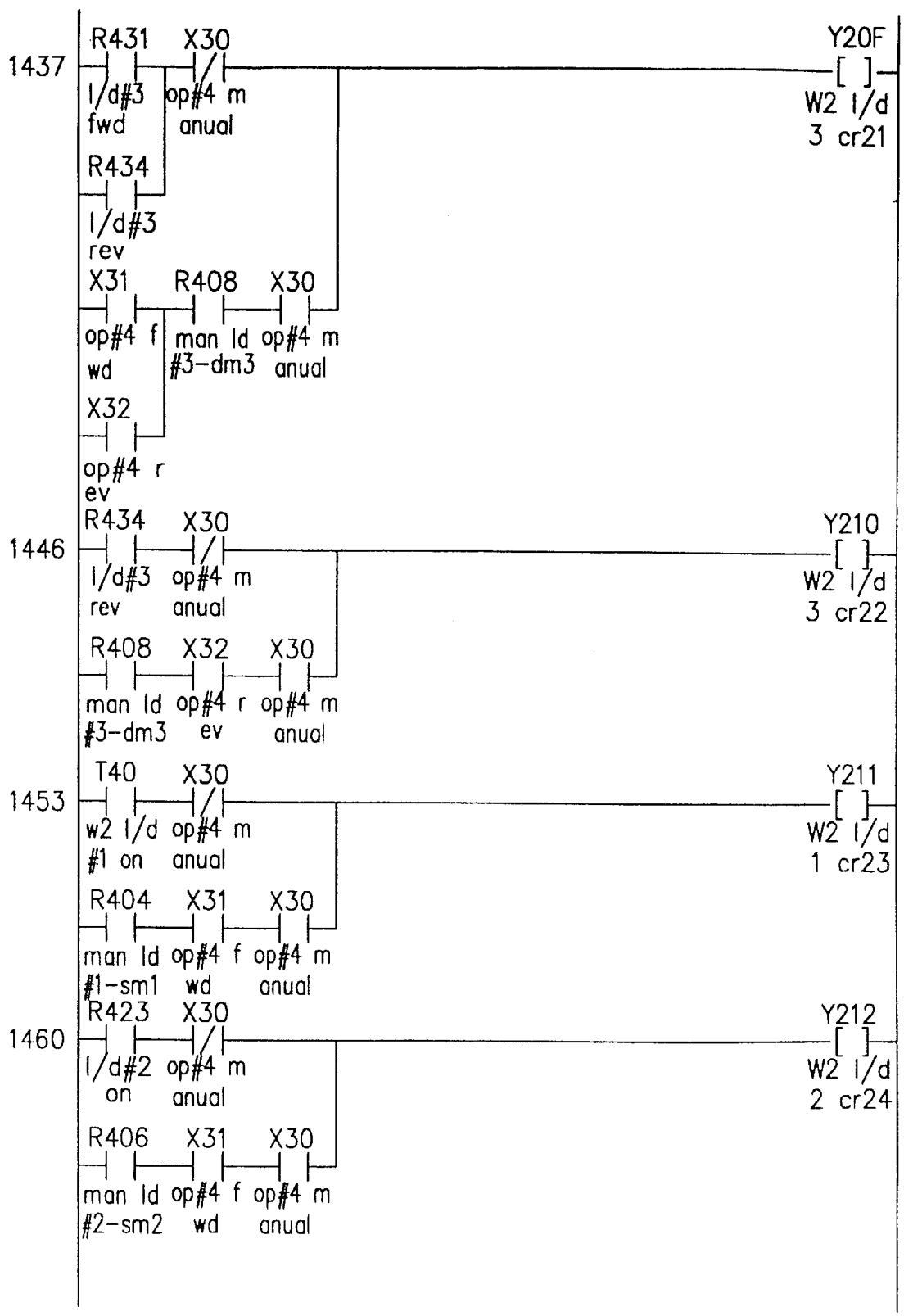
Figure 63:
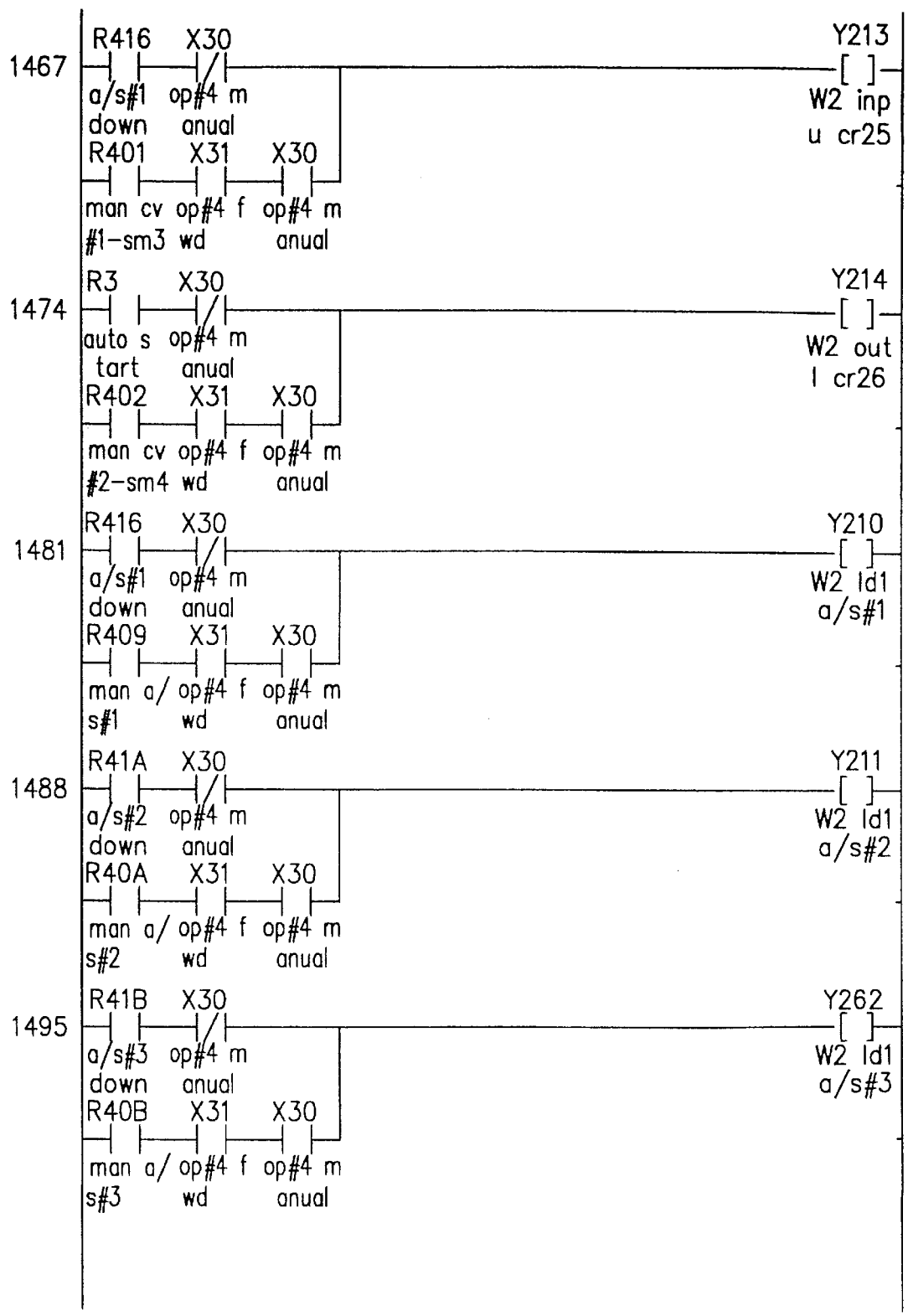
Figure 64:
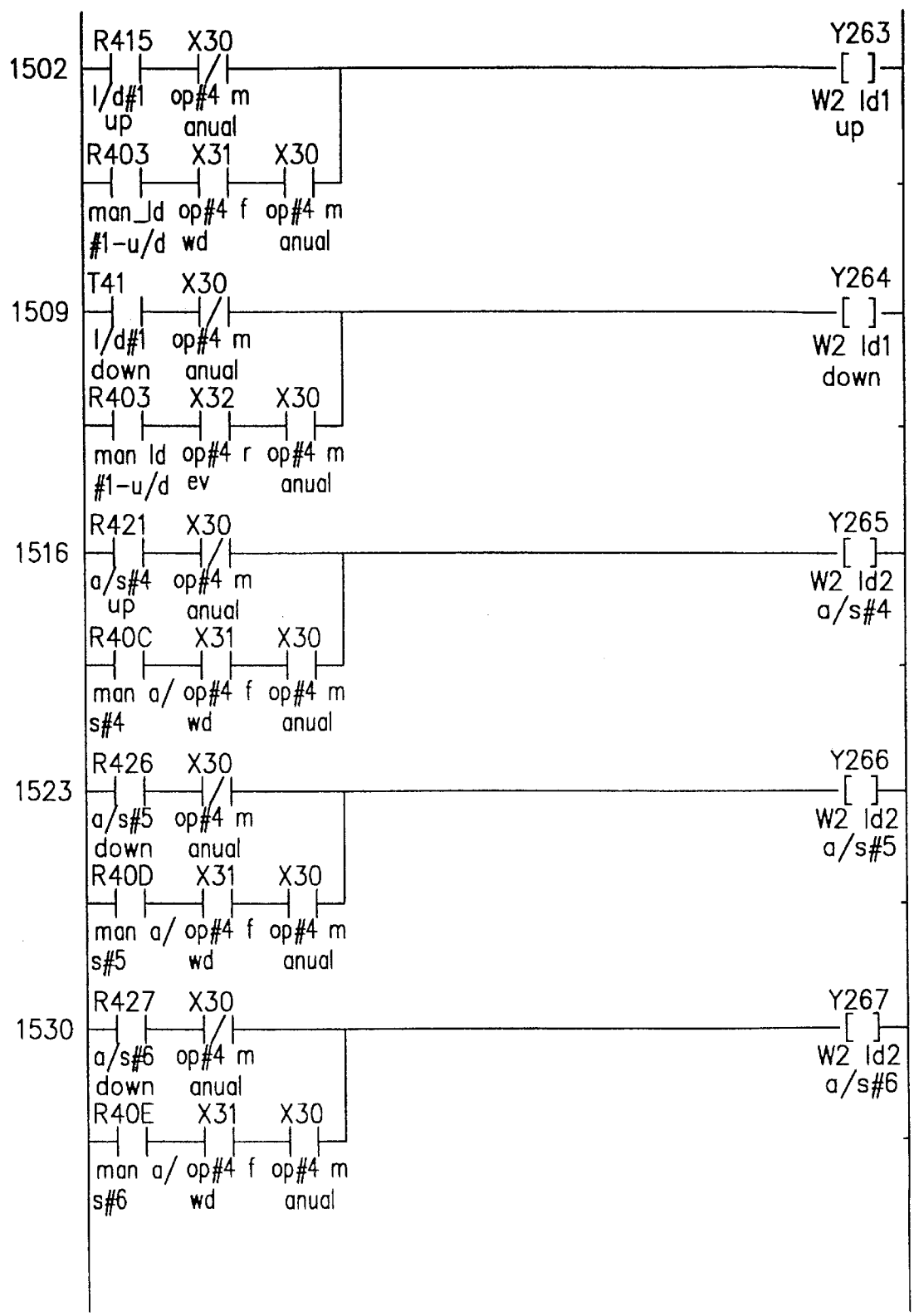
Figure 65:
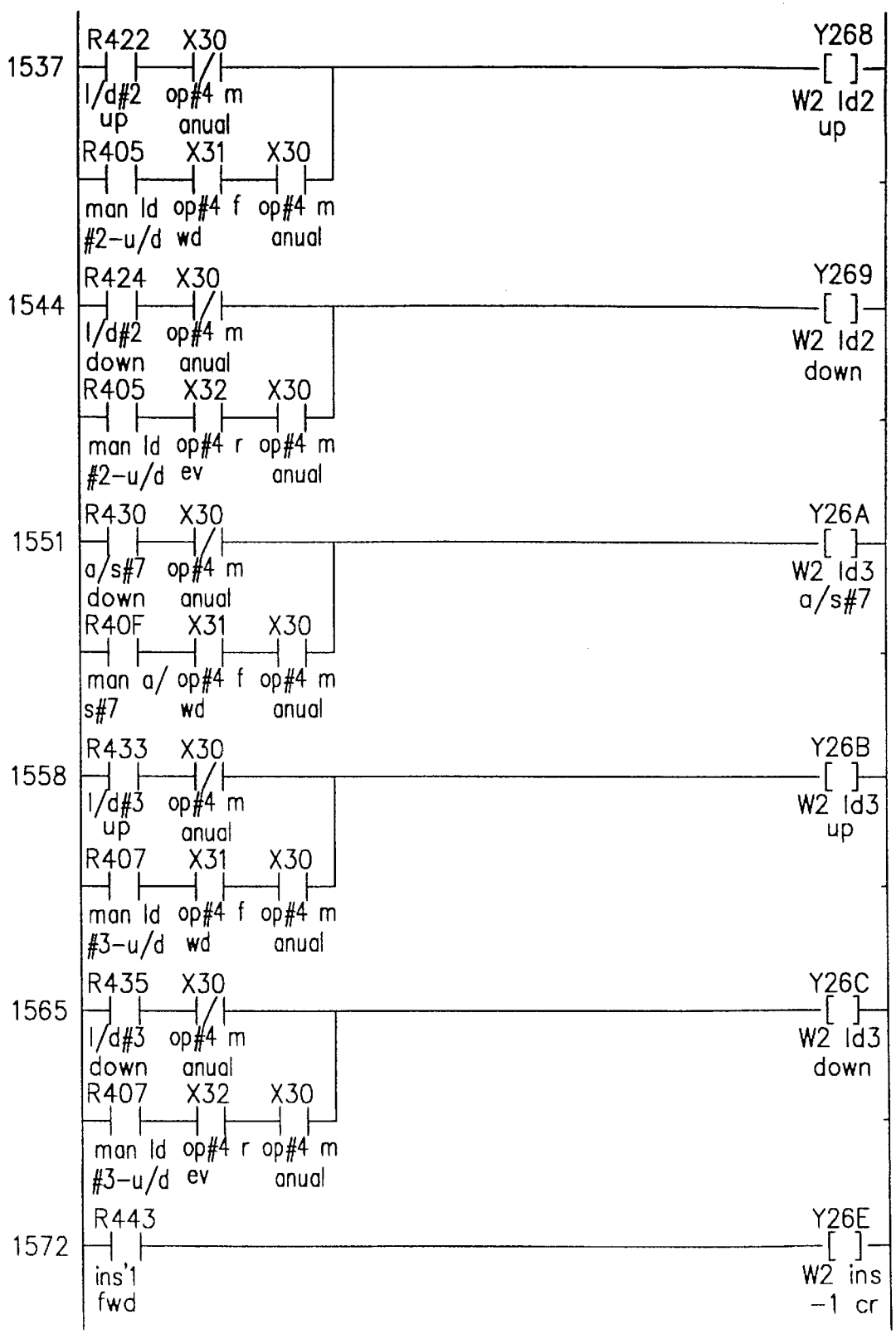
Figure 66:
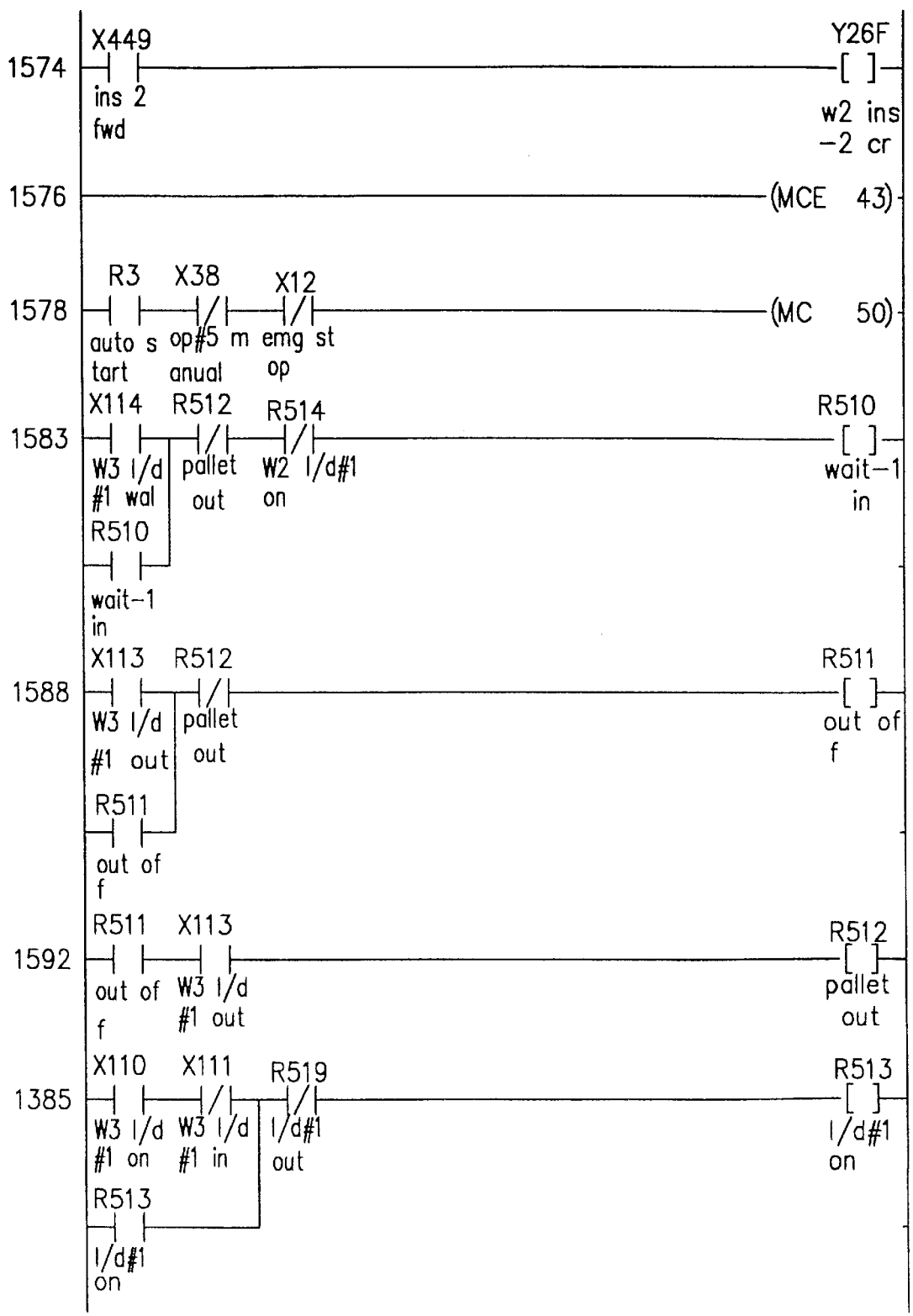
Figure 67:
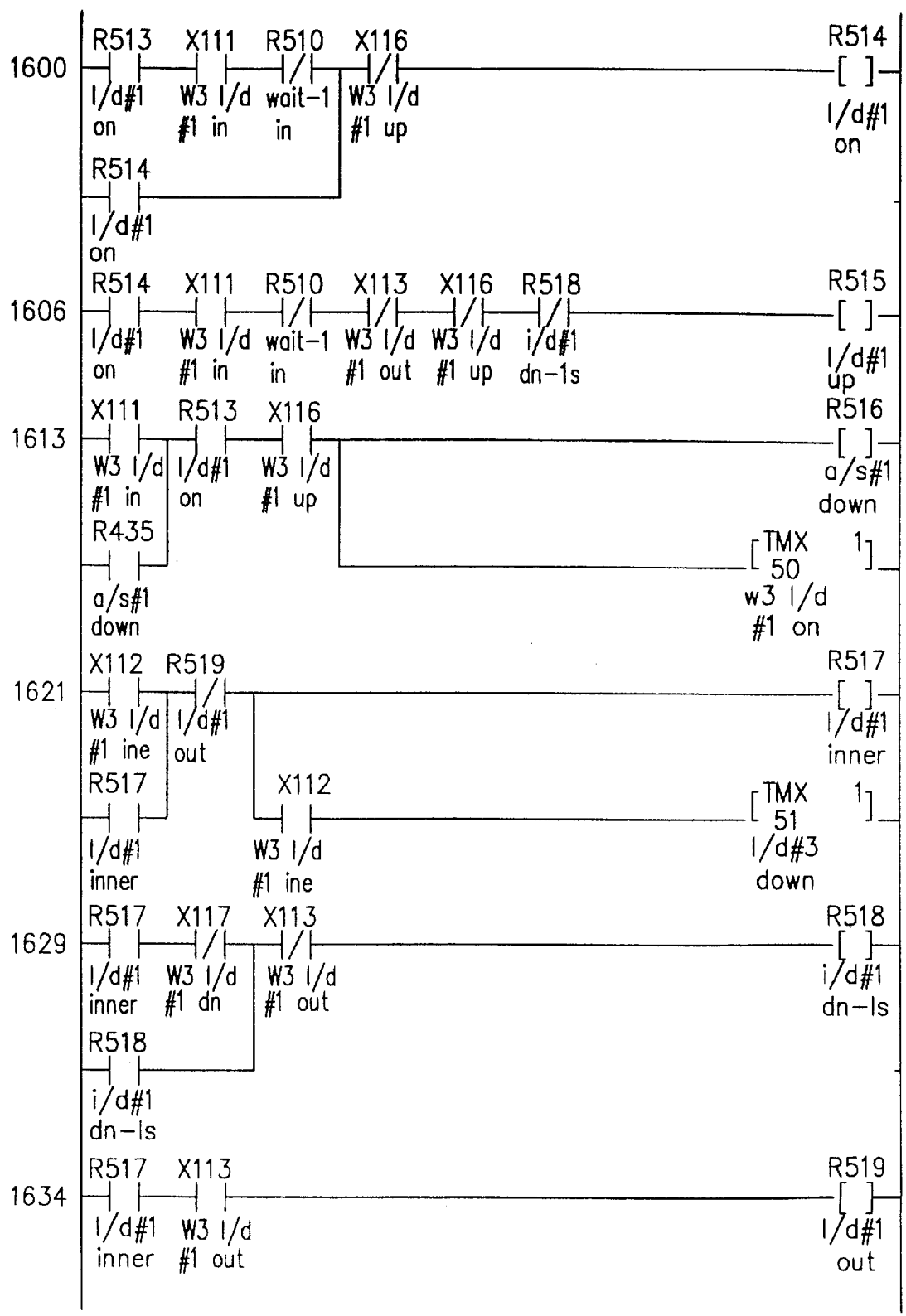
Figure 68:
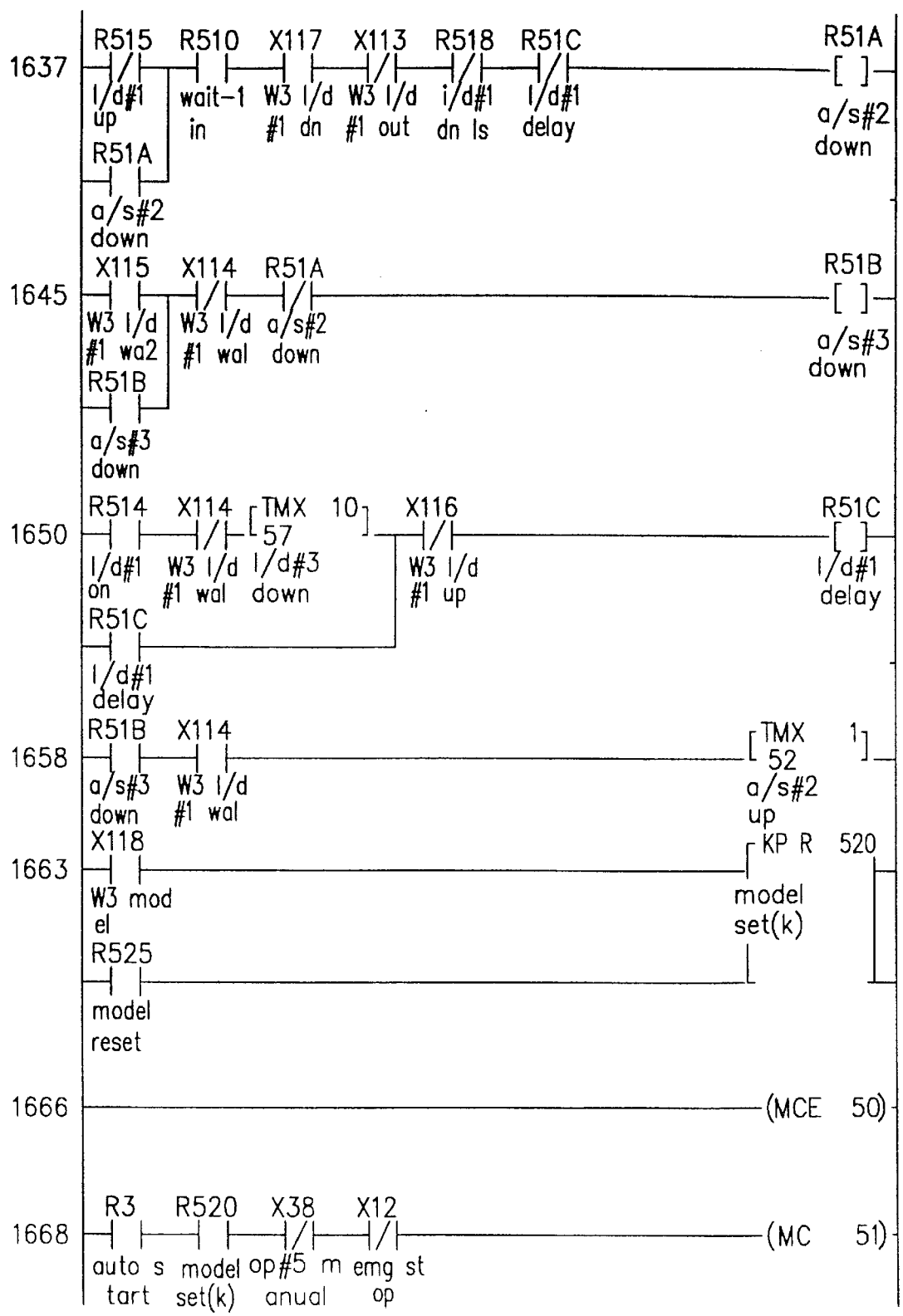
Figure 69:
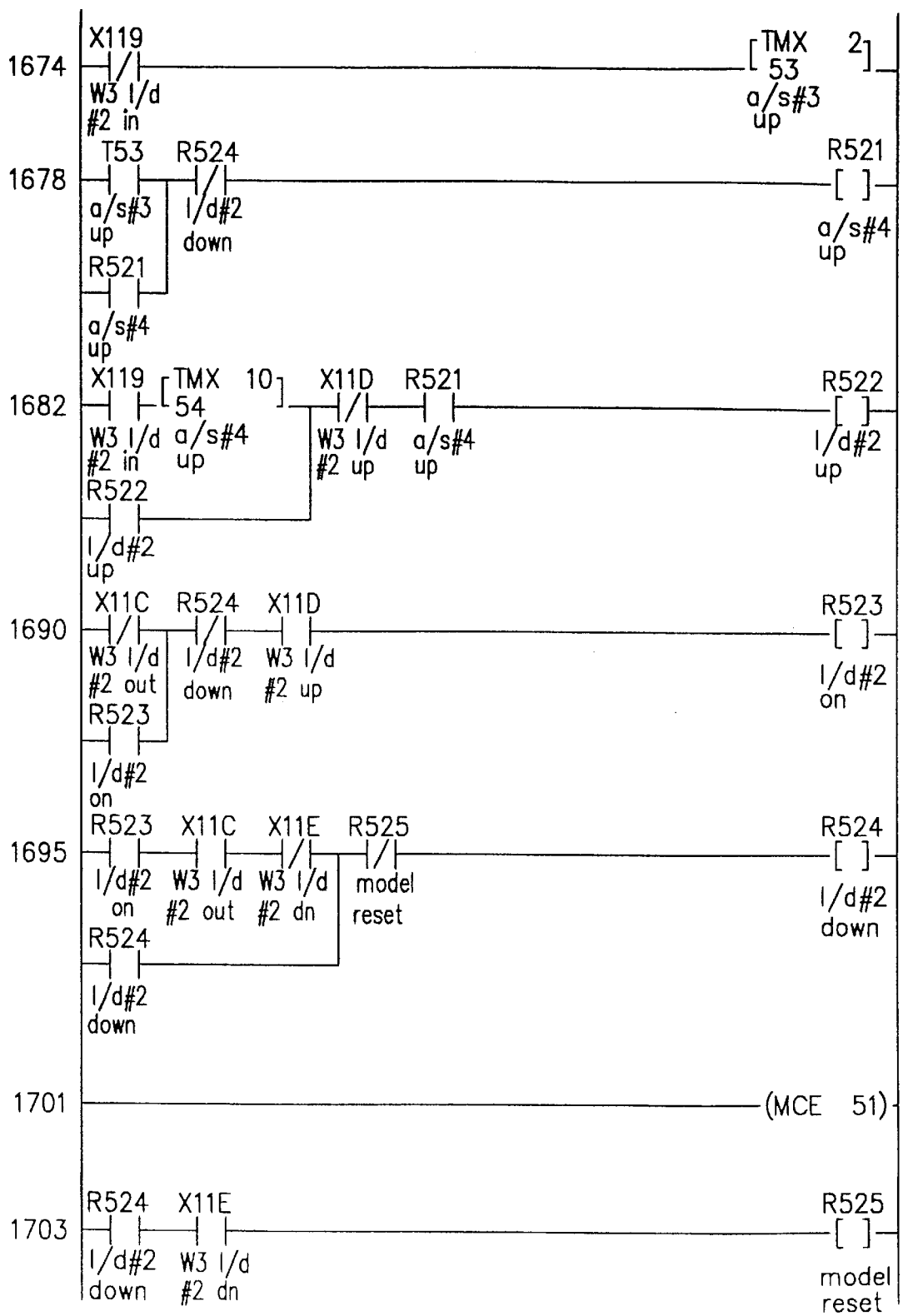
Figure 70:
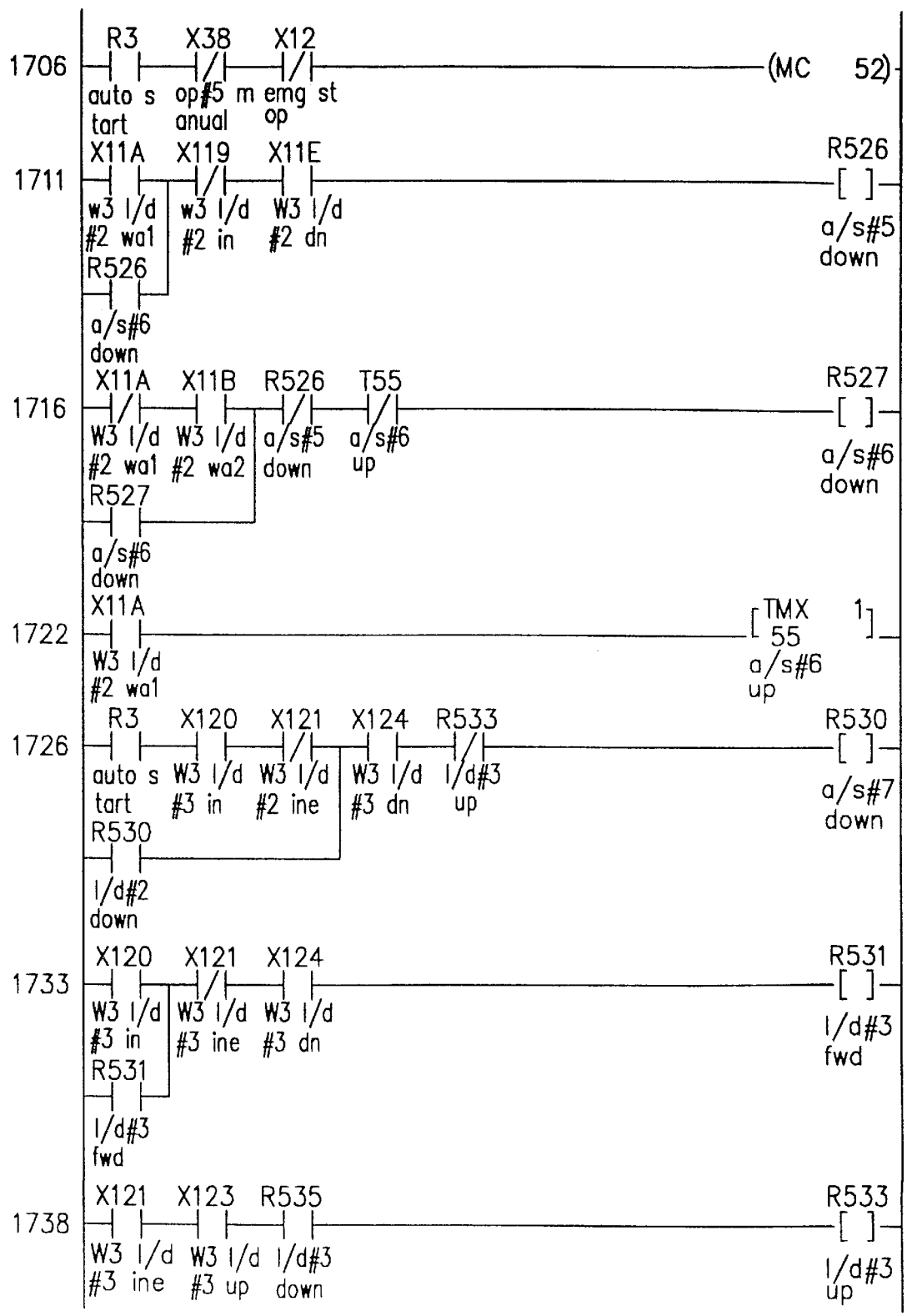
Figure 71:
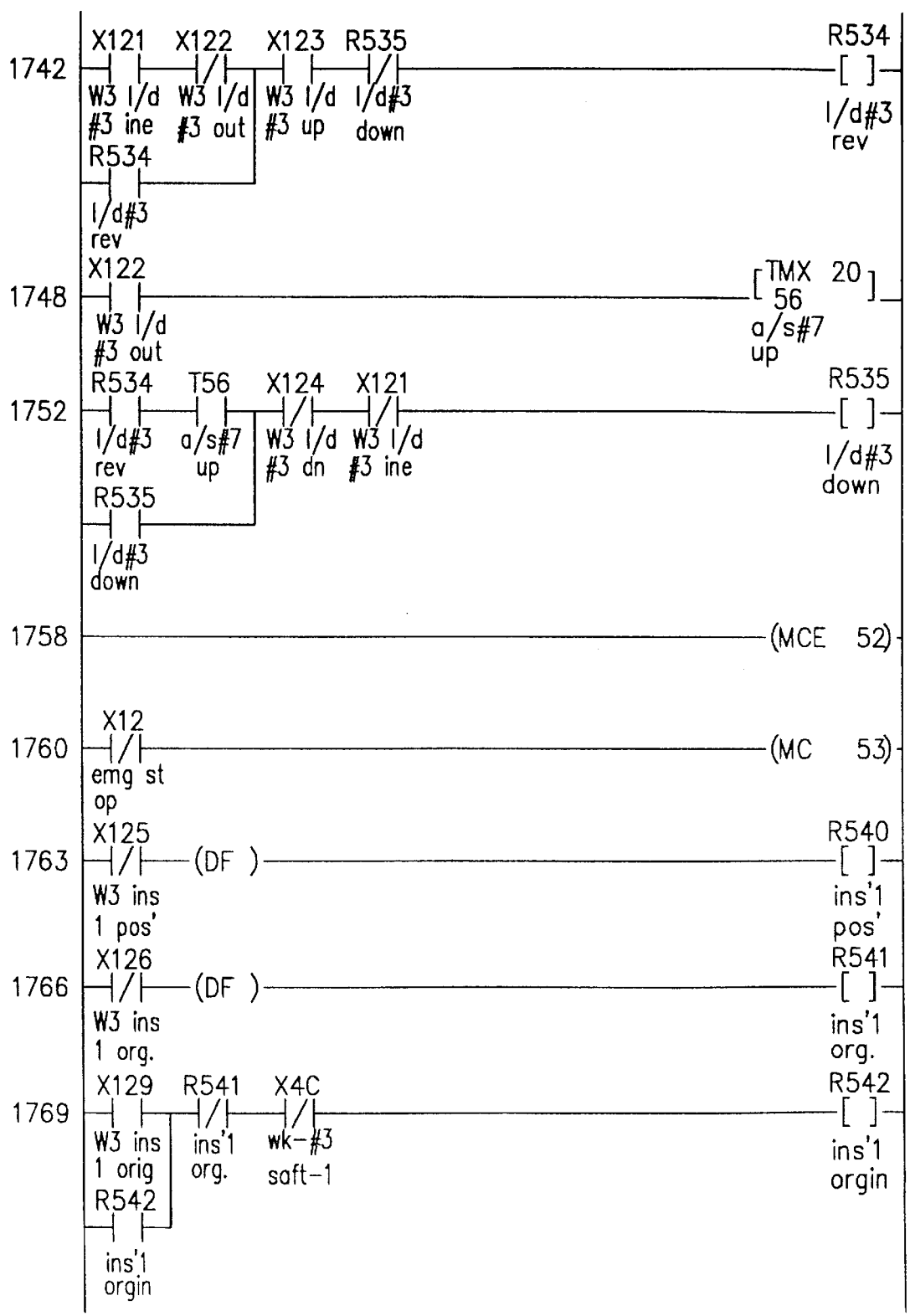
Figure 72:
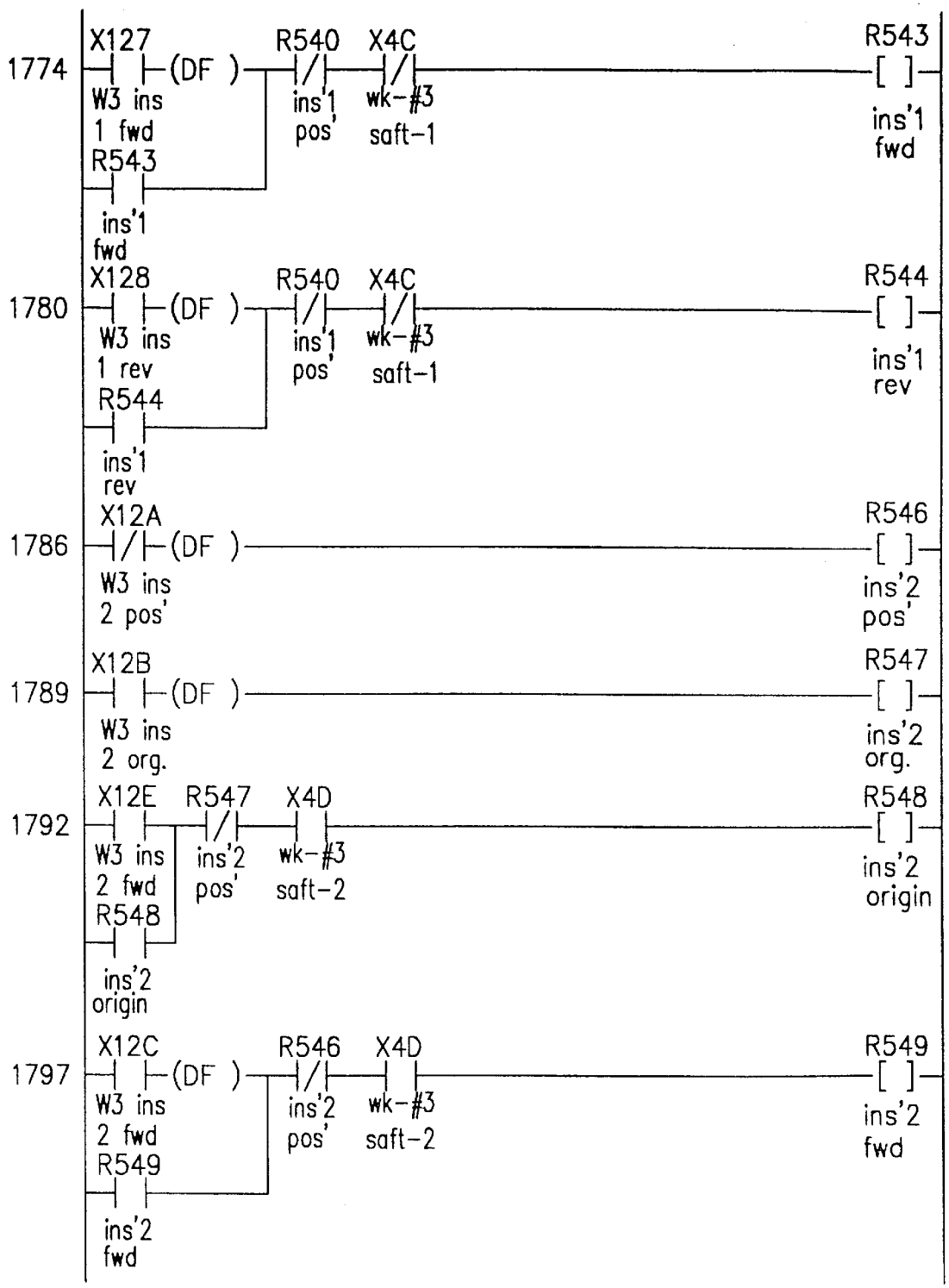
Figure 73:
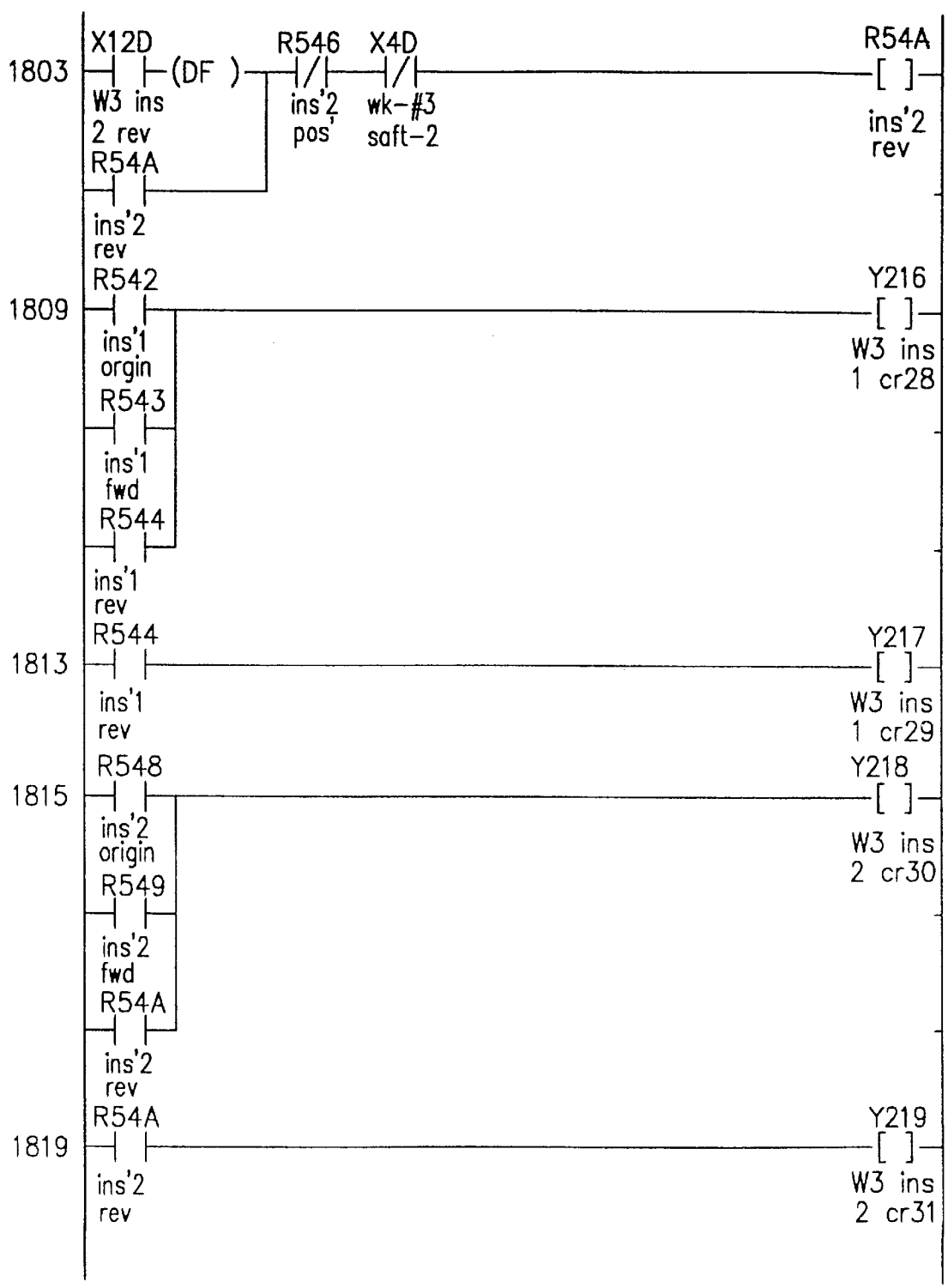
Figure 74:
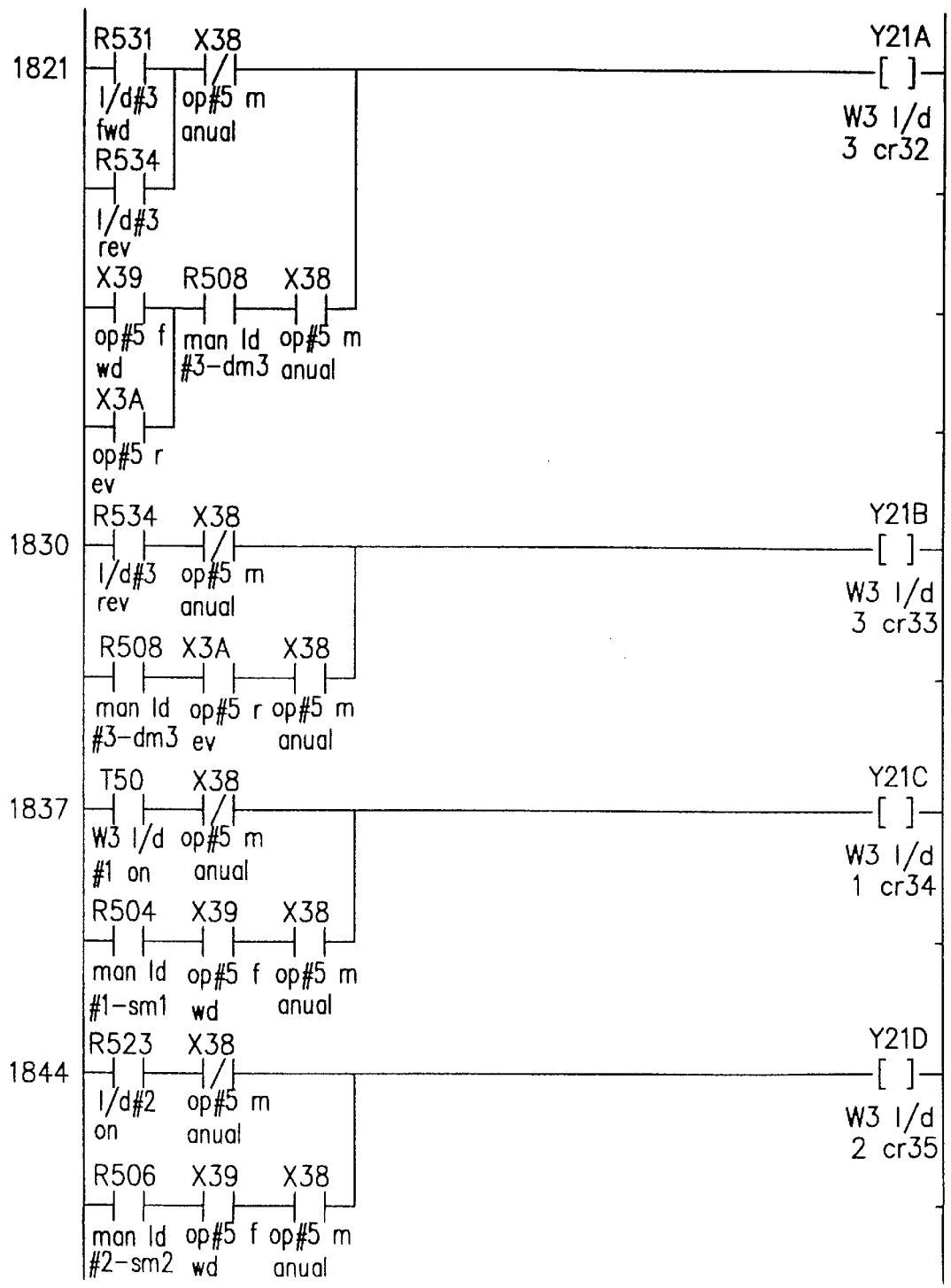
Figure 75:
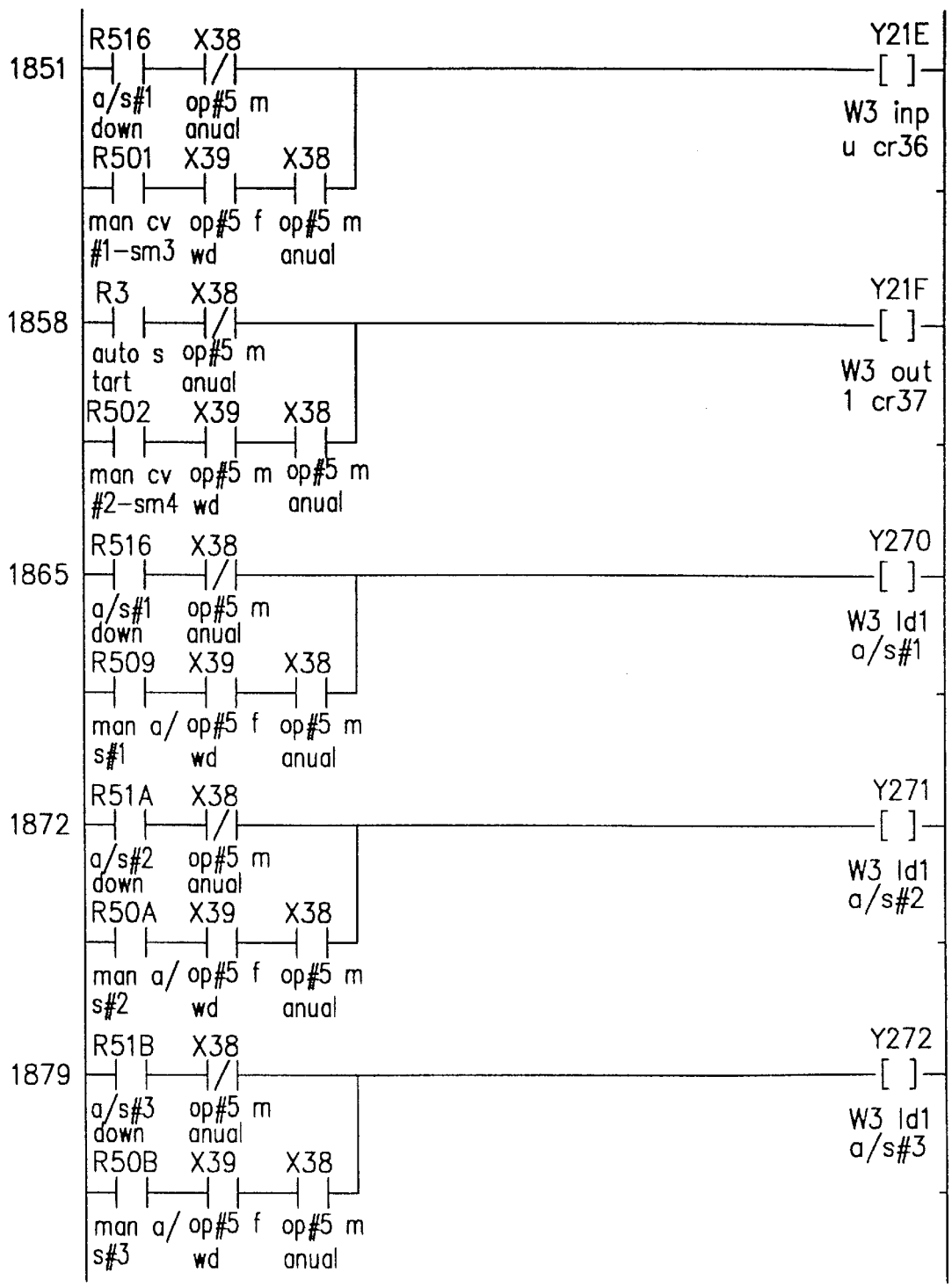
Figure 76:
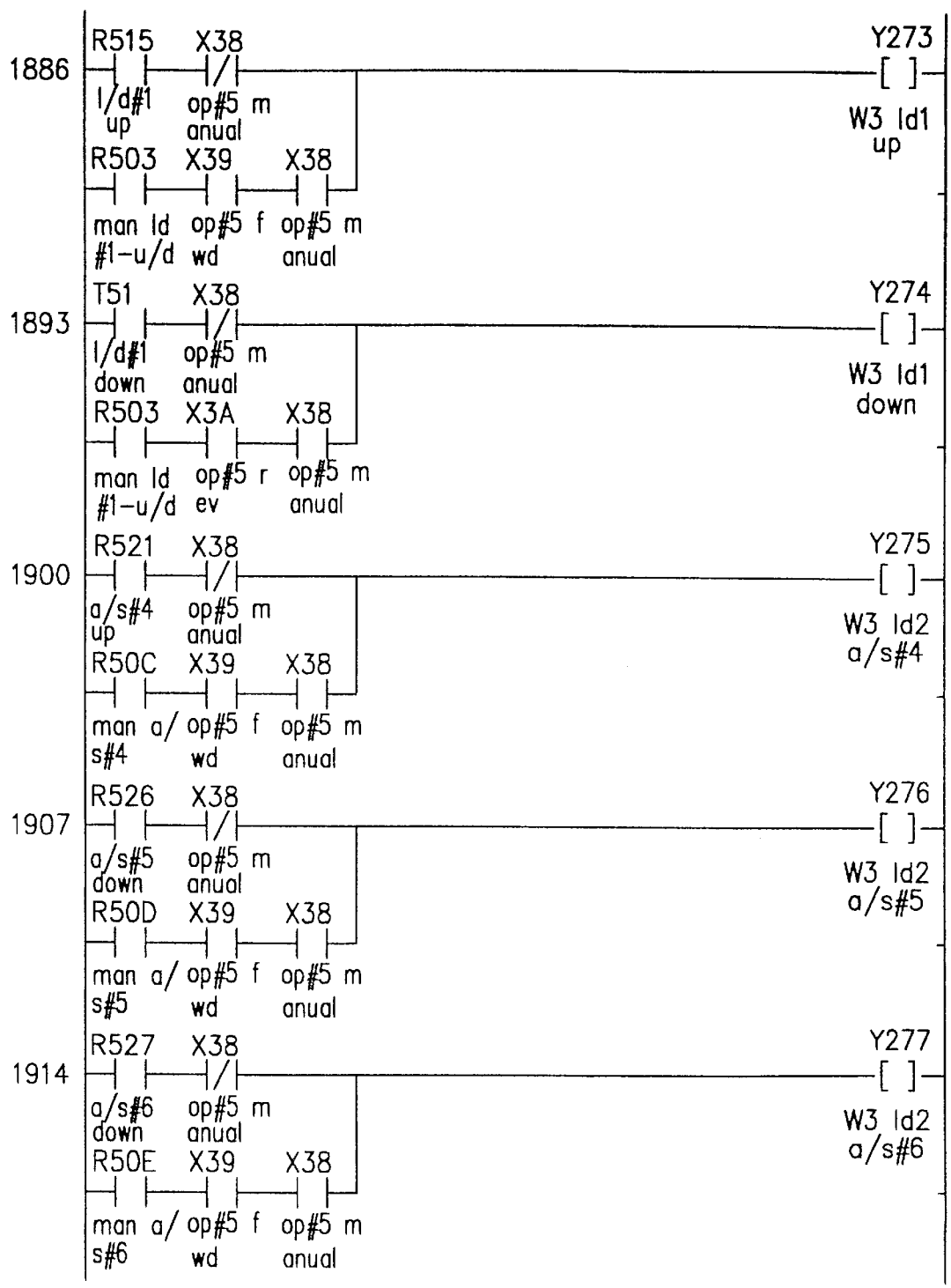
Figure 77:
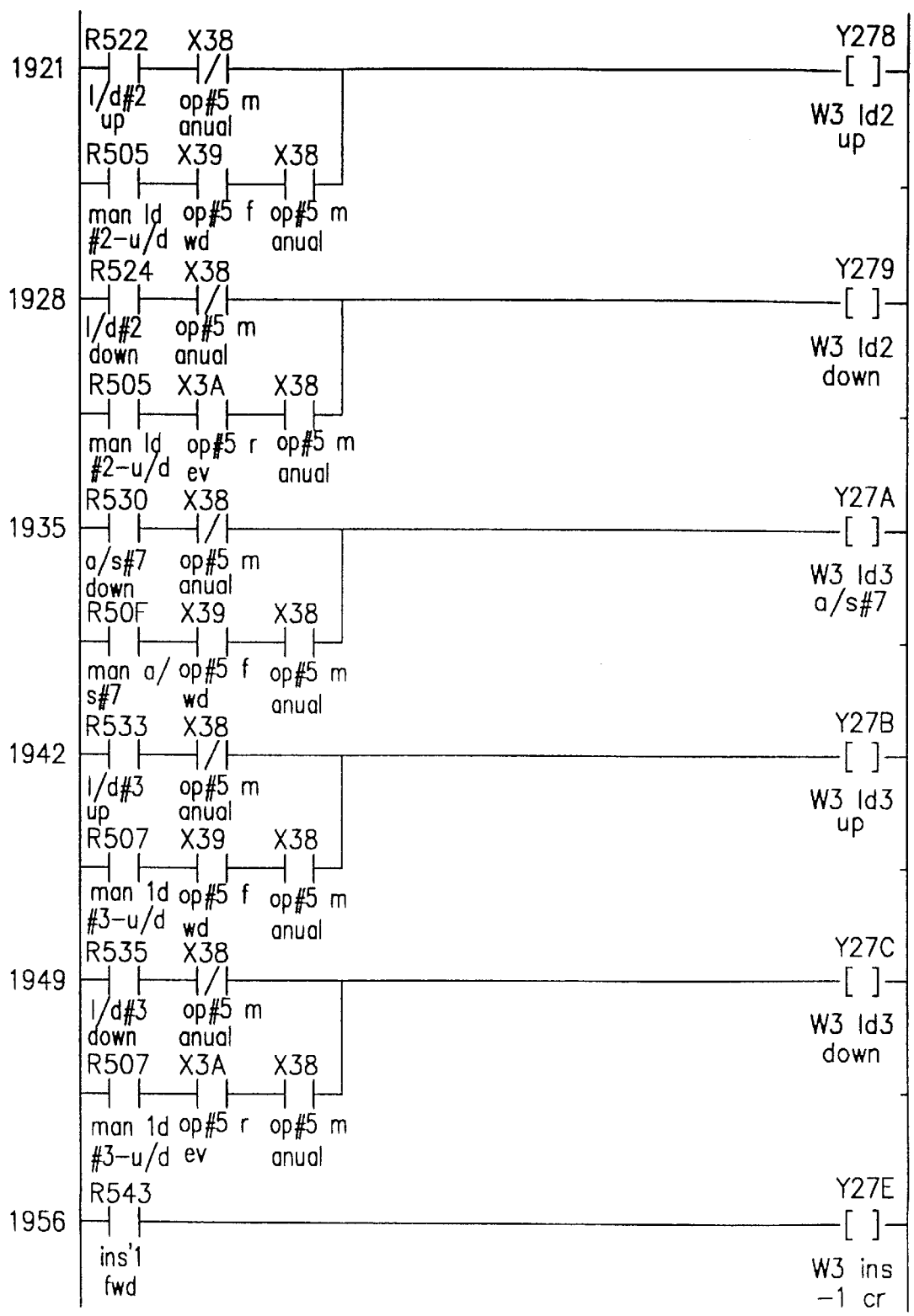
Figure 78:
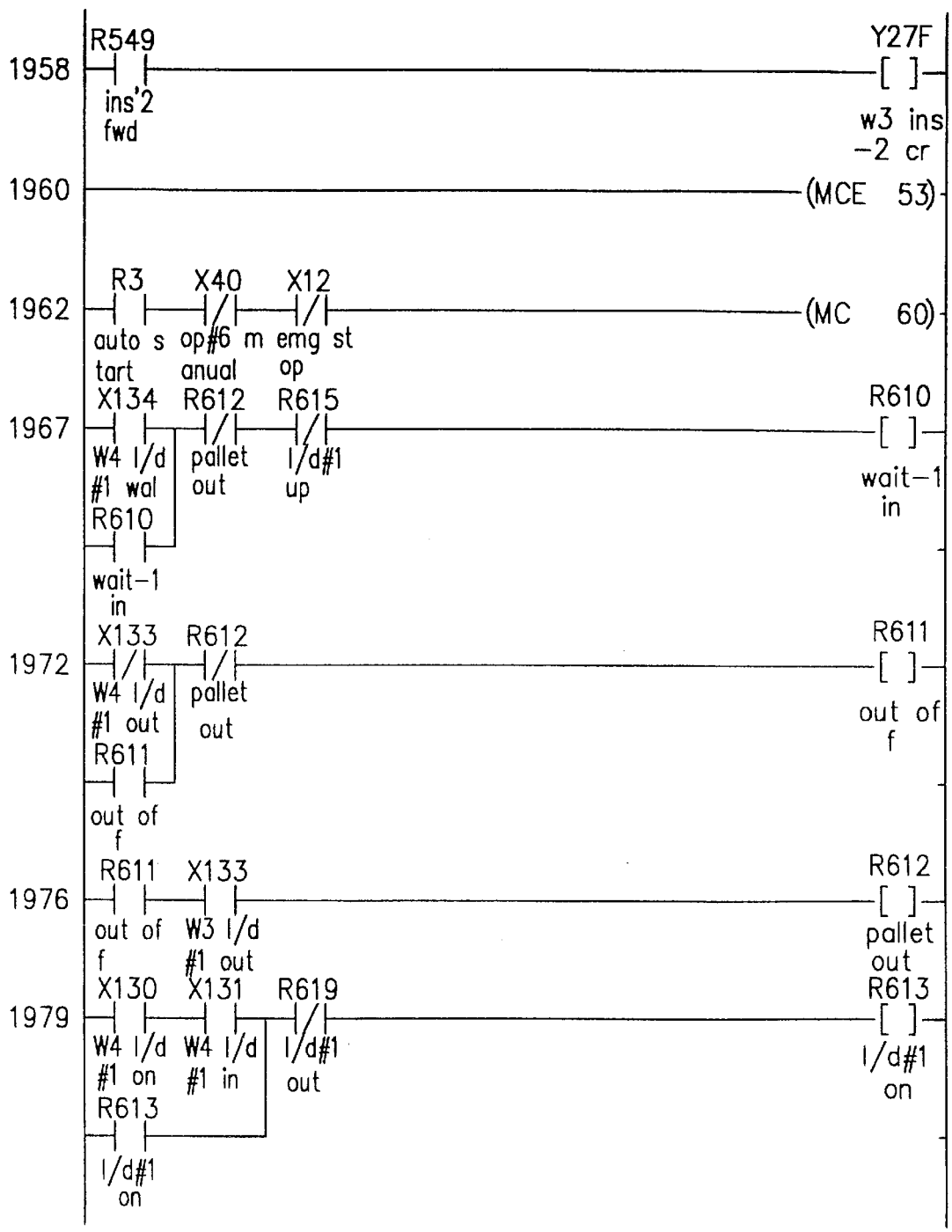
Figure 79:
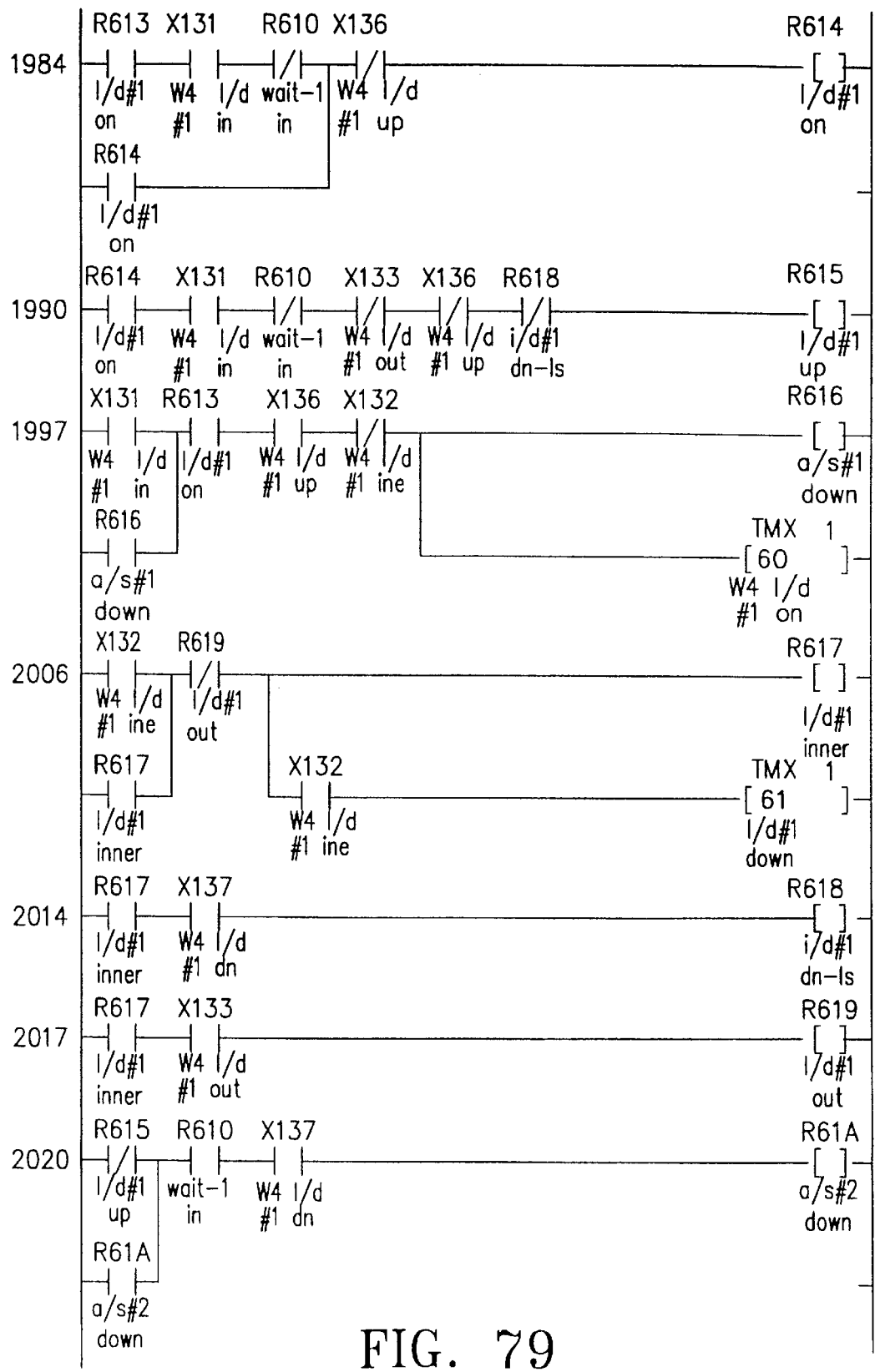
Figure 80:
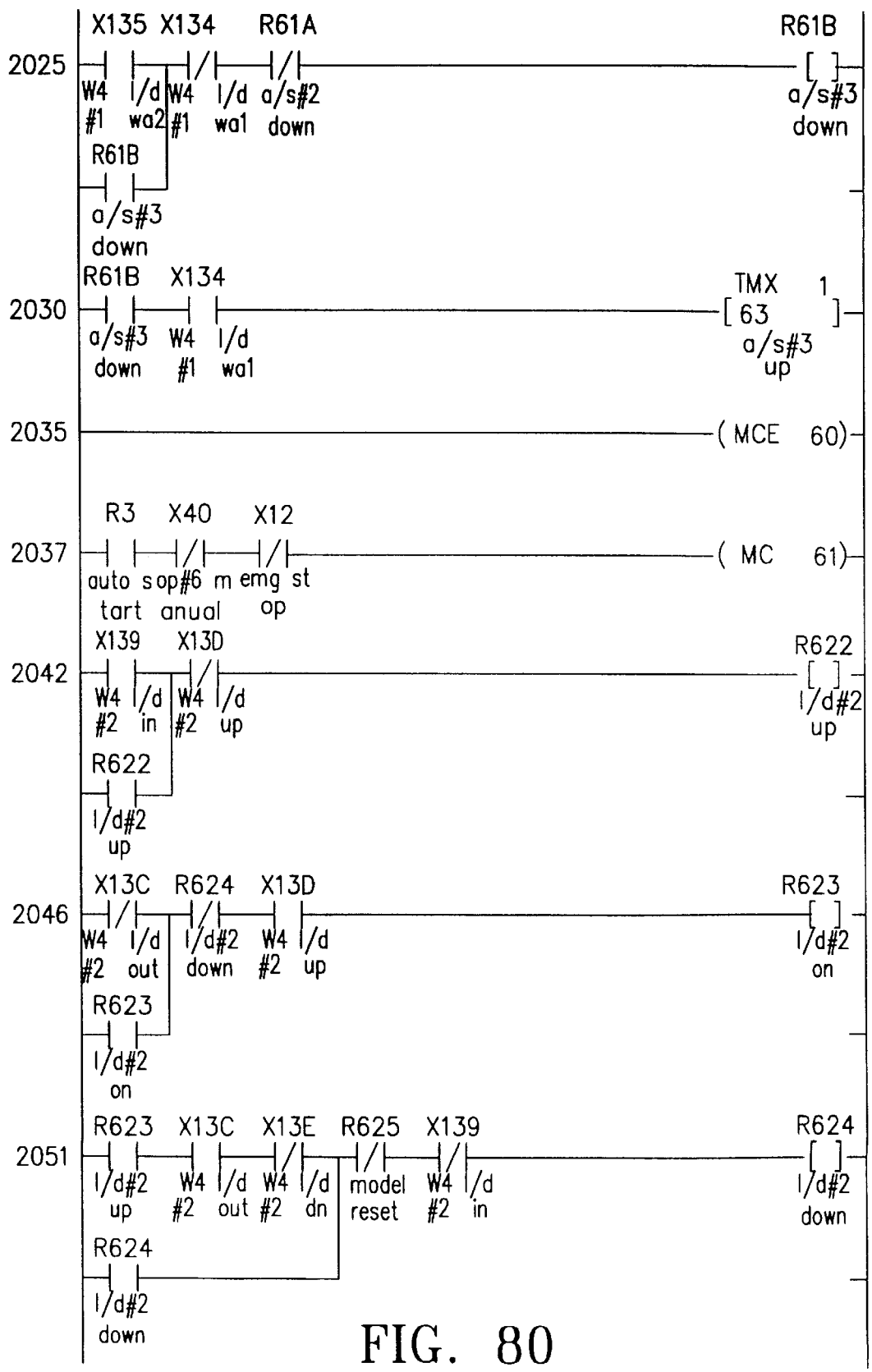
Figure 81:
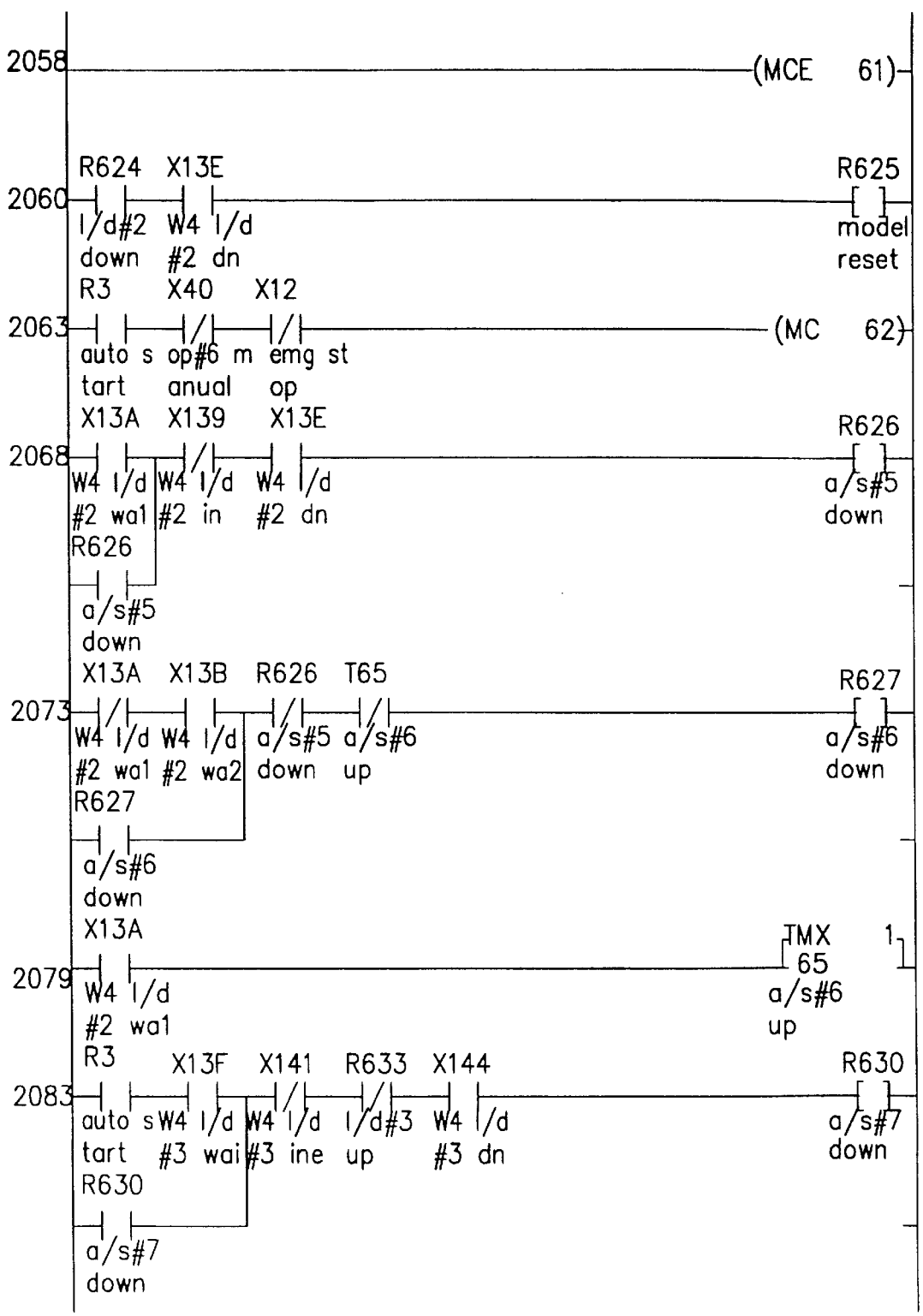
Figure 82:
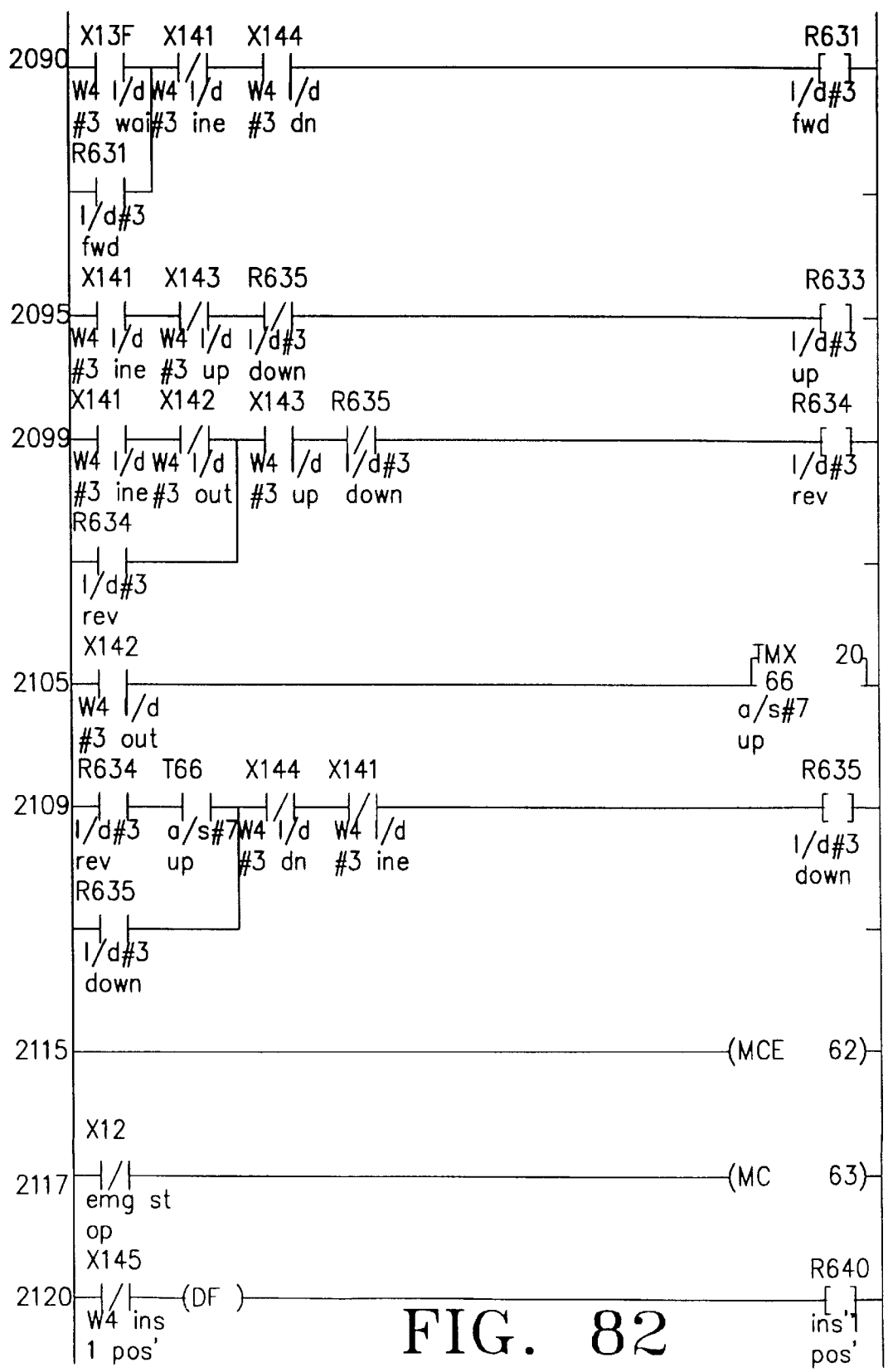
Figure 83:
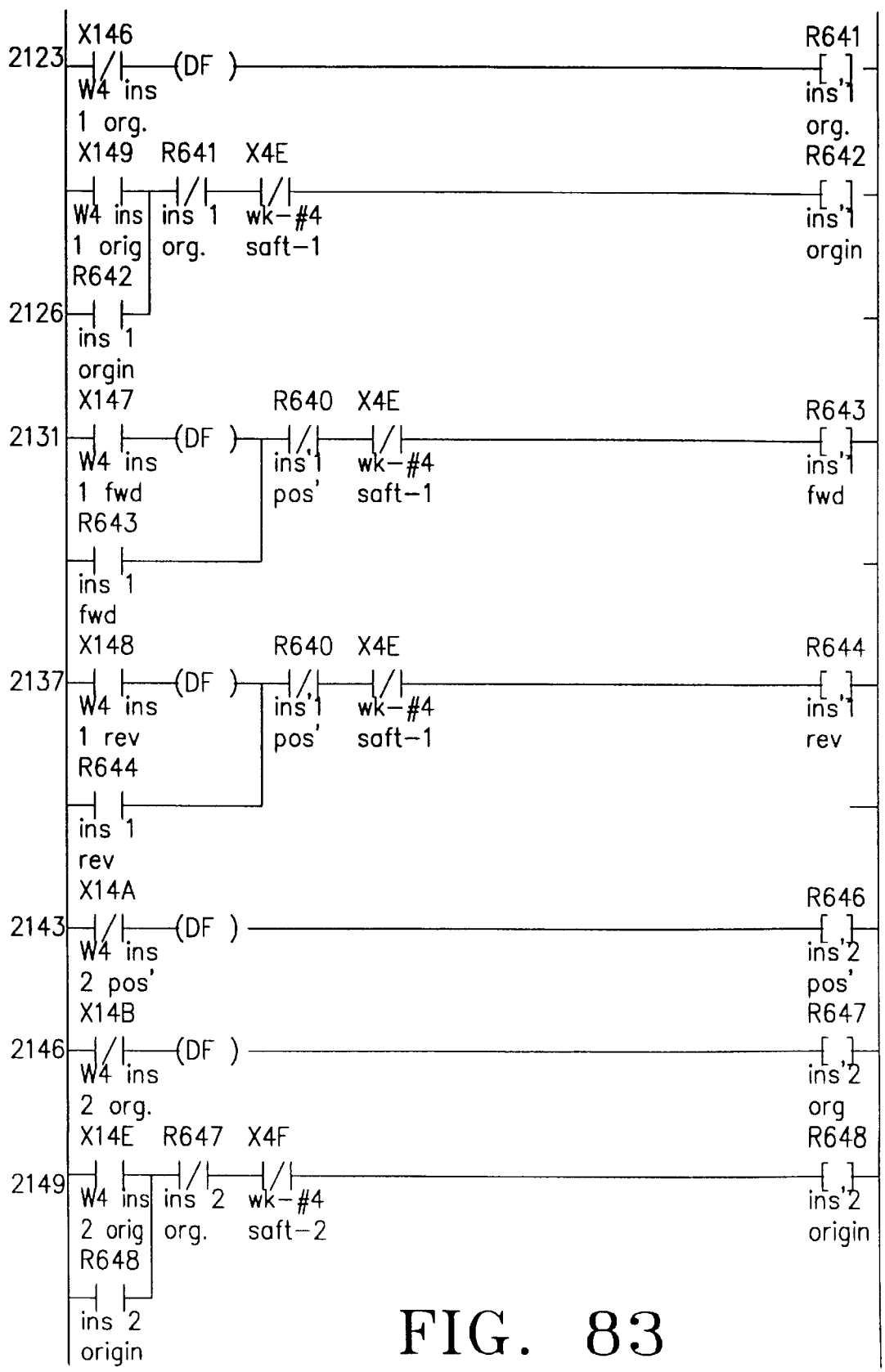
Figure 84:
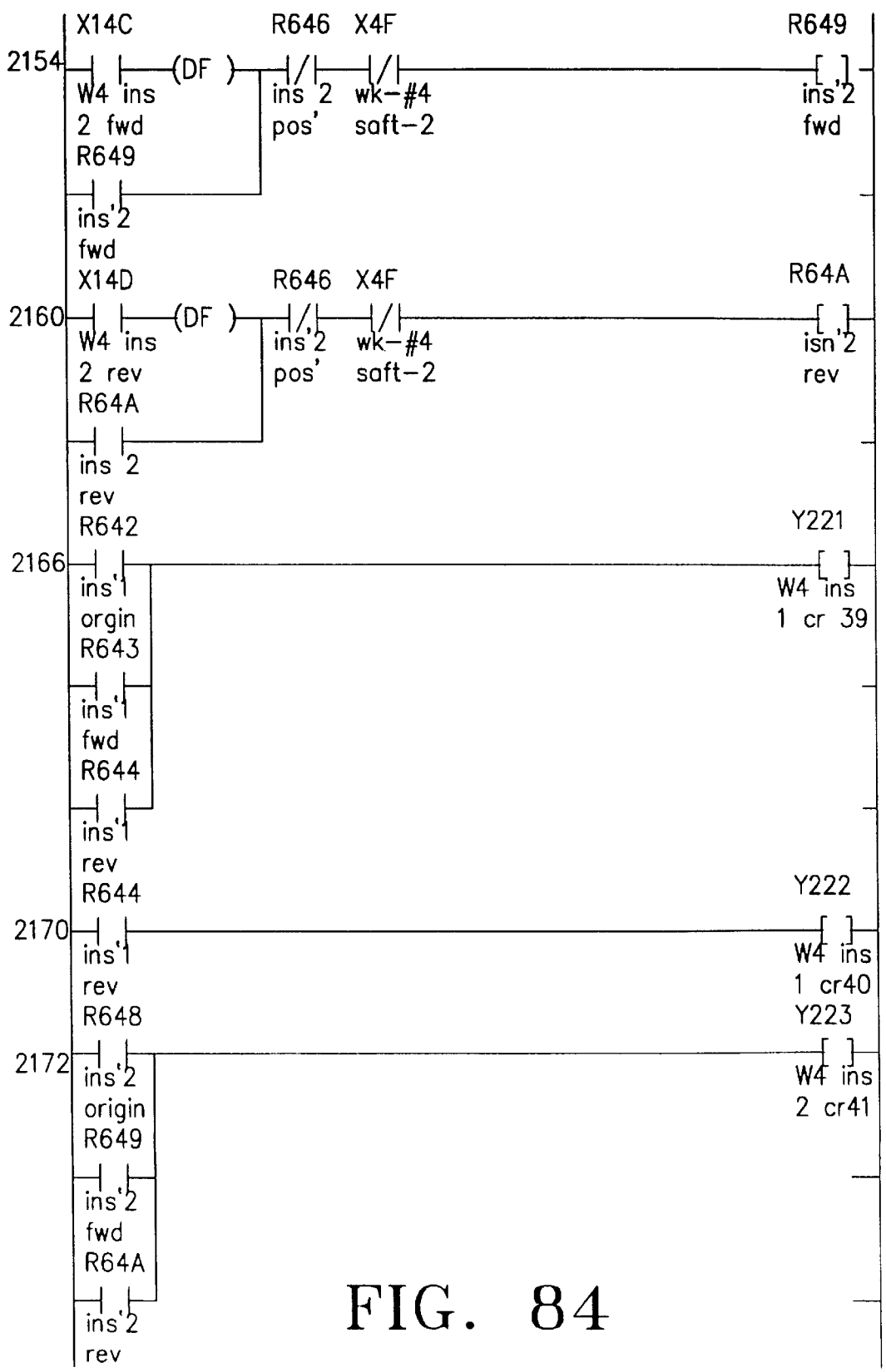
Figure 85:
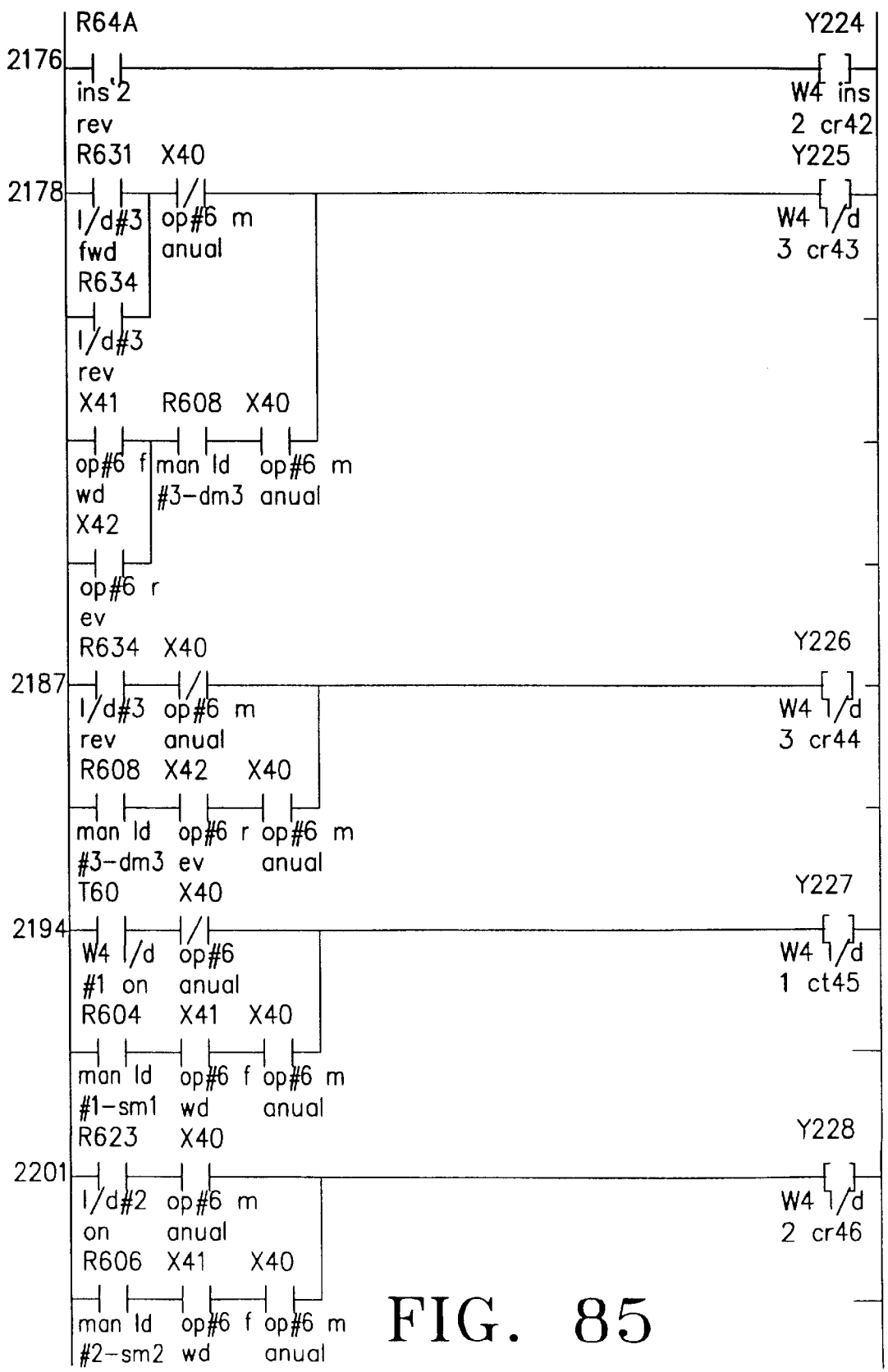
Figure 86:
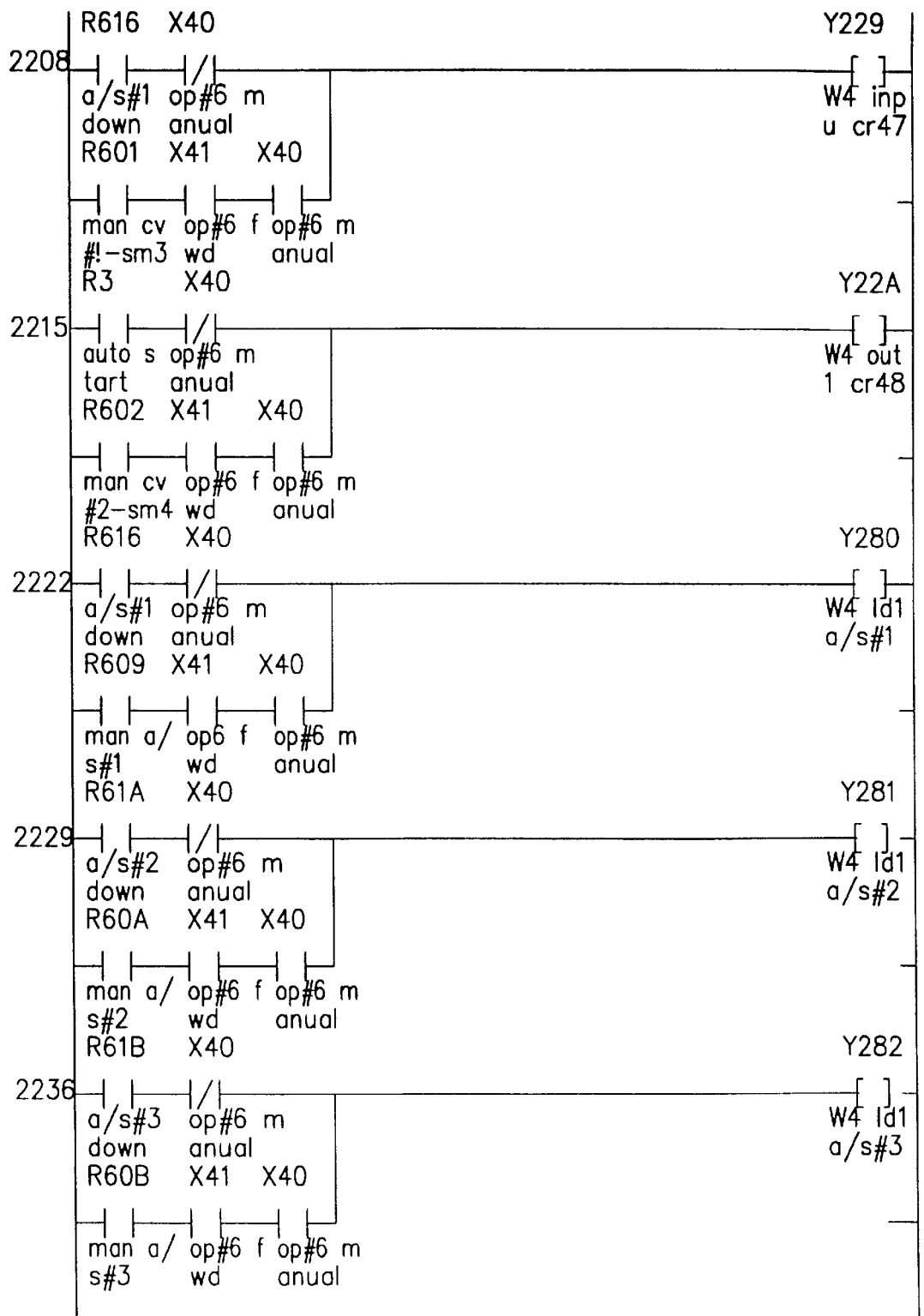
Figure 87:
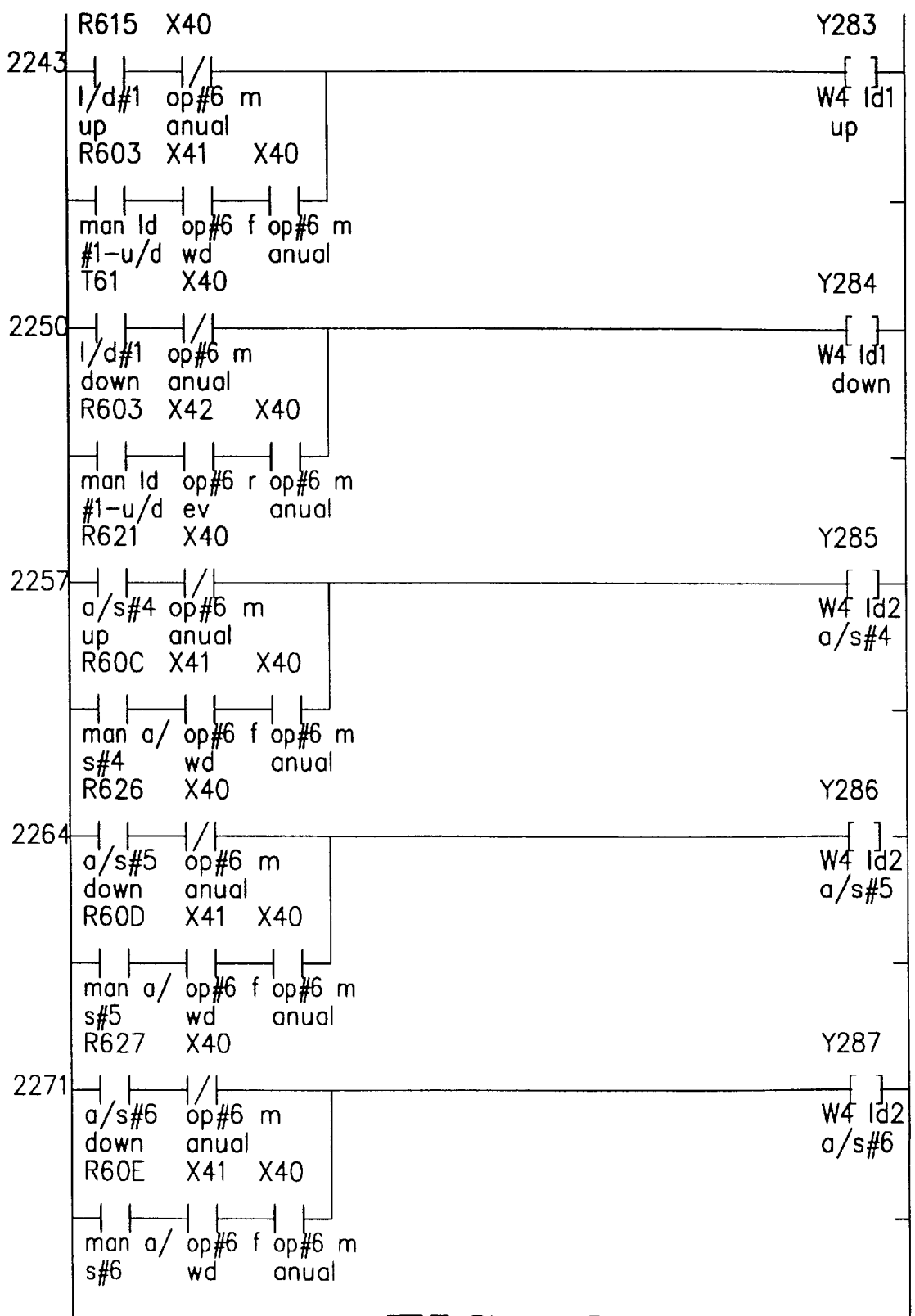
Figure 88:
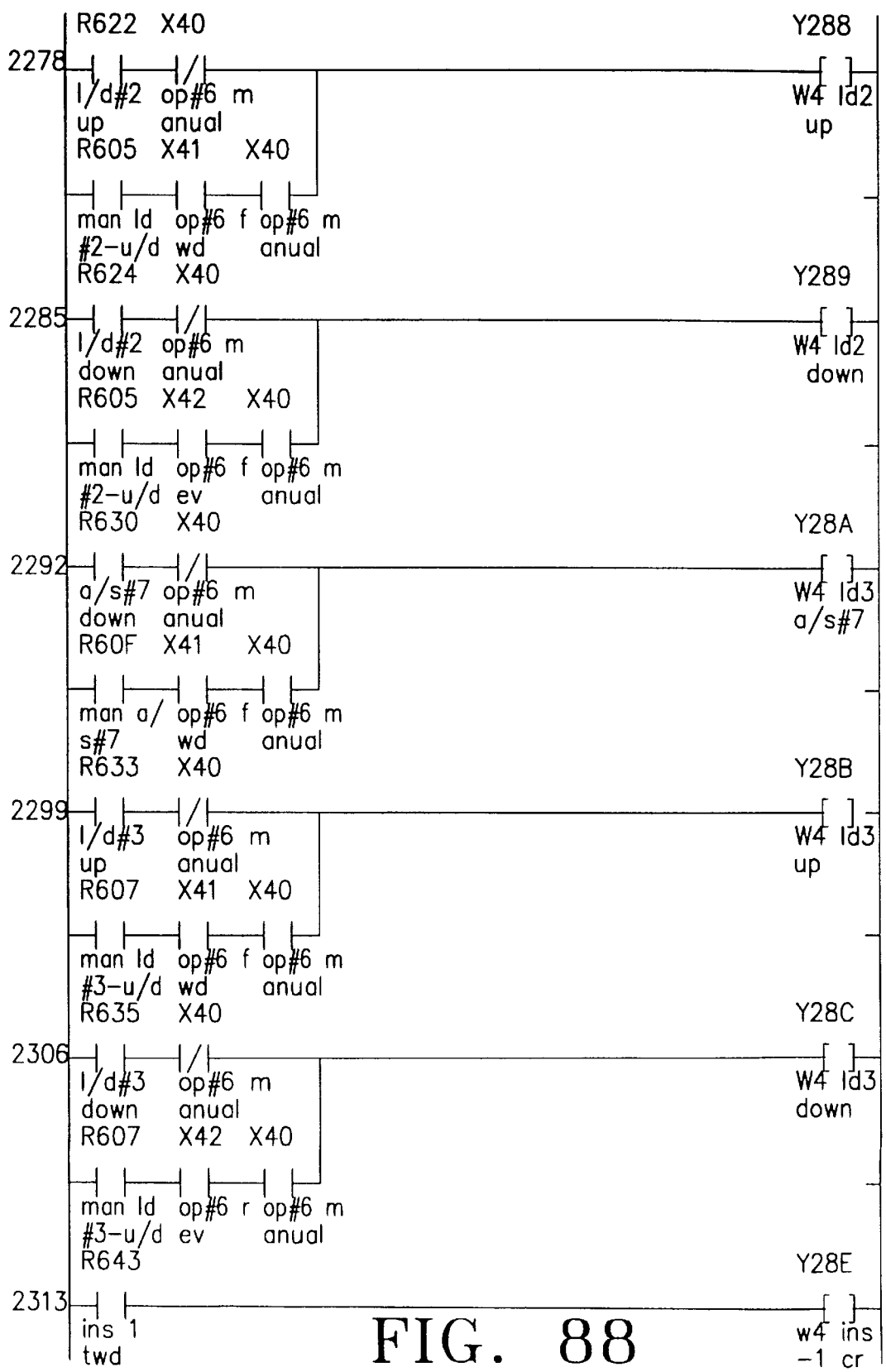
Figure 89:
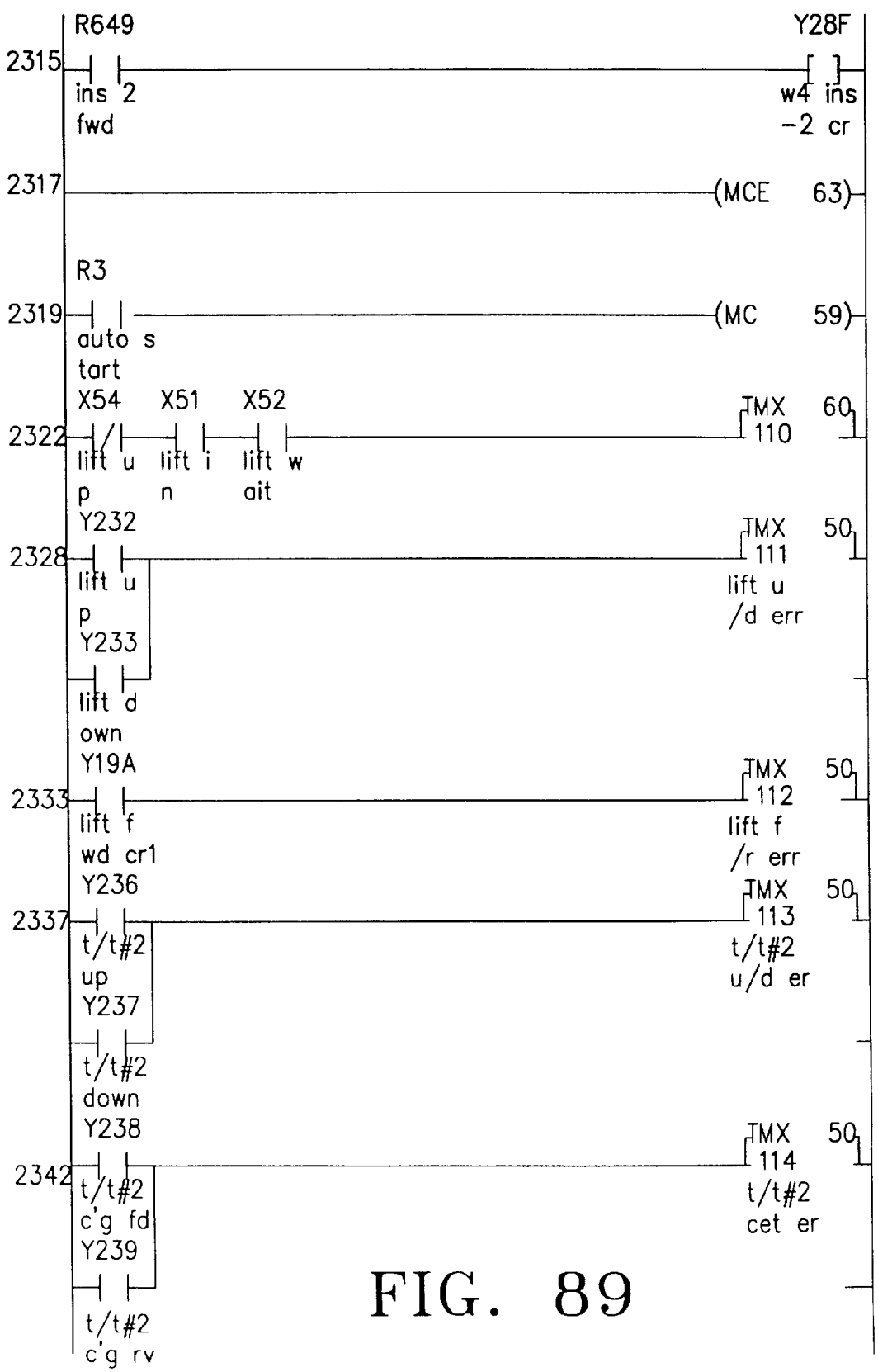
Figure 90:
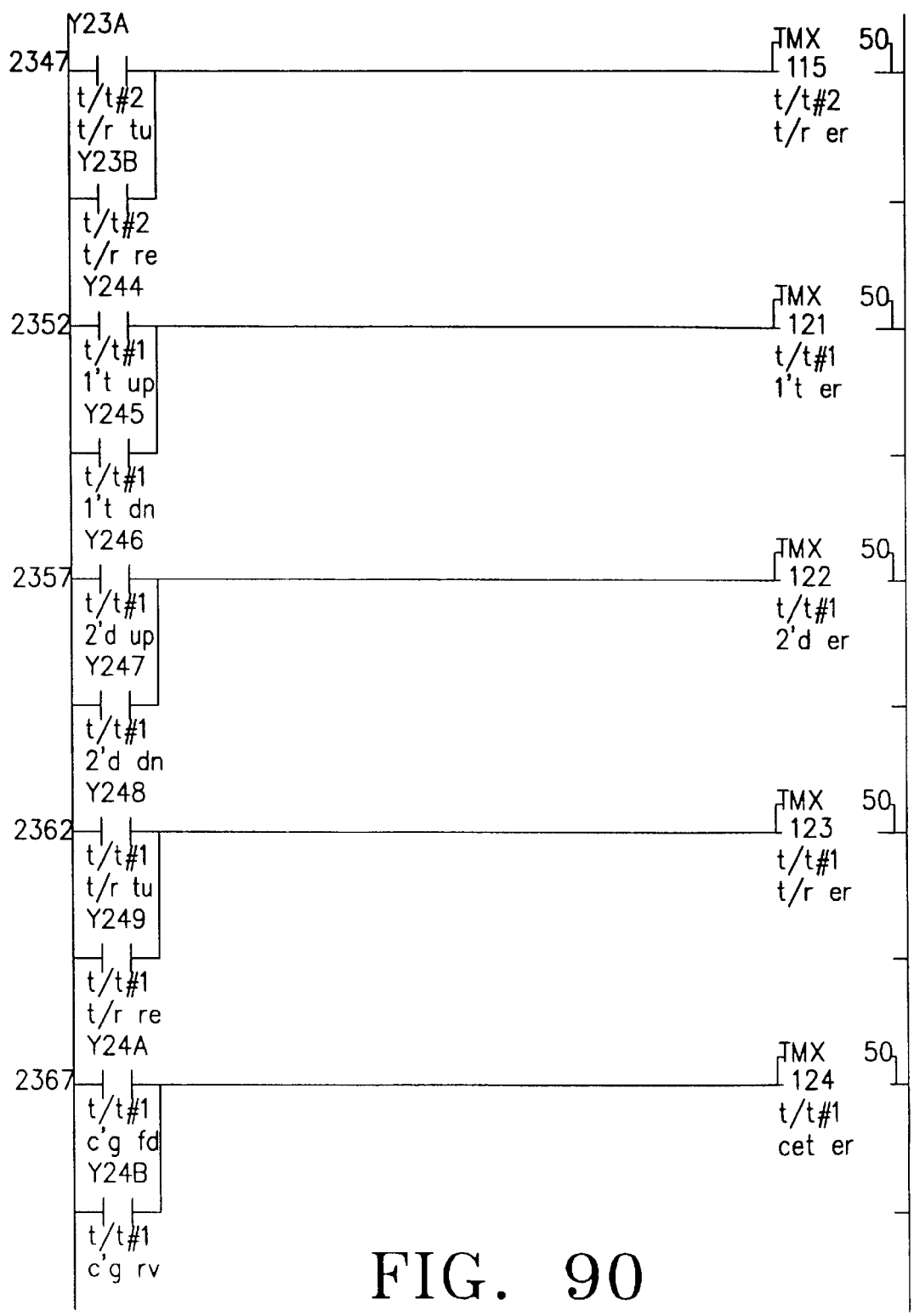
Figure 91:
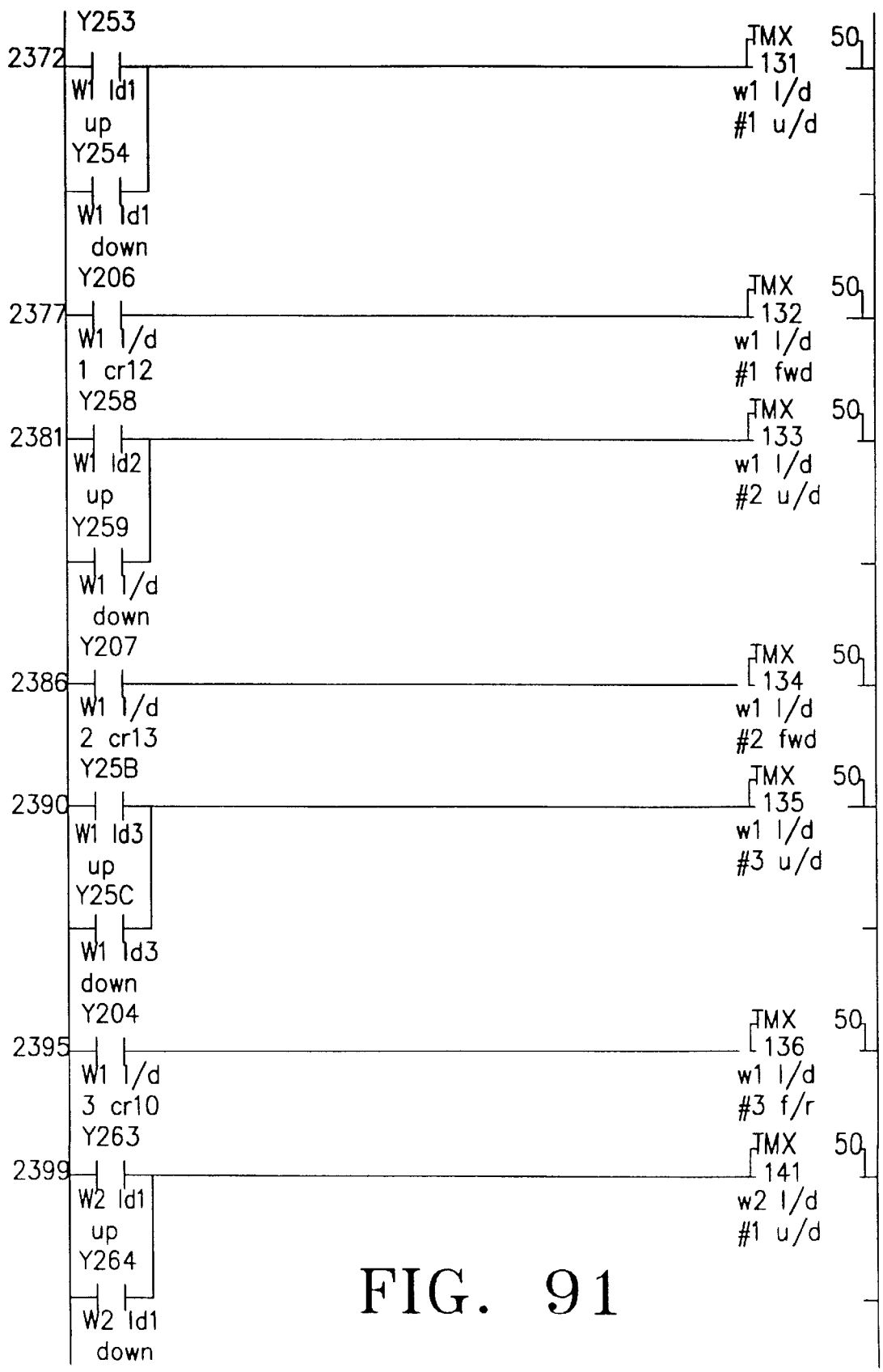
Figure 92:
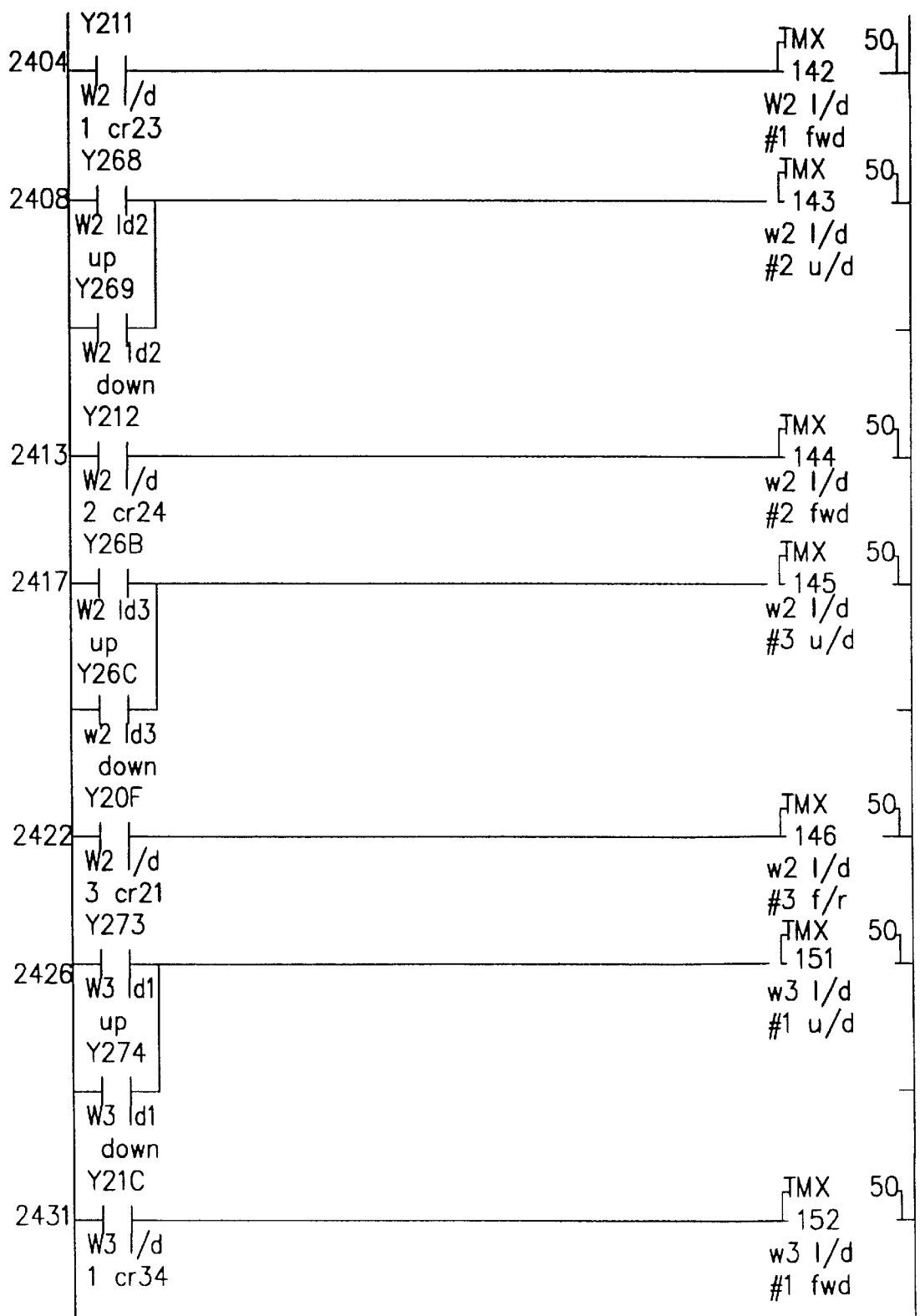
Figure 93:
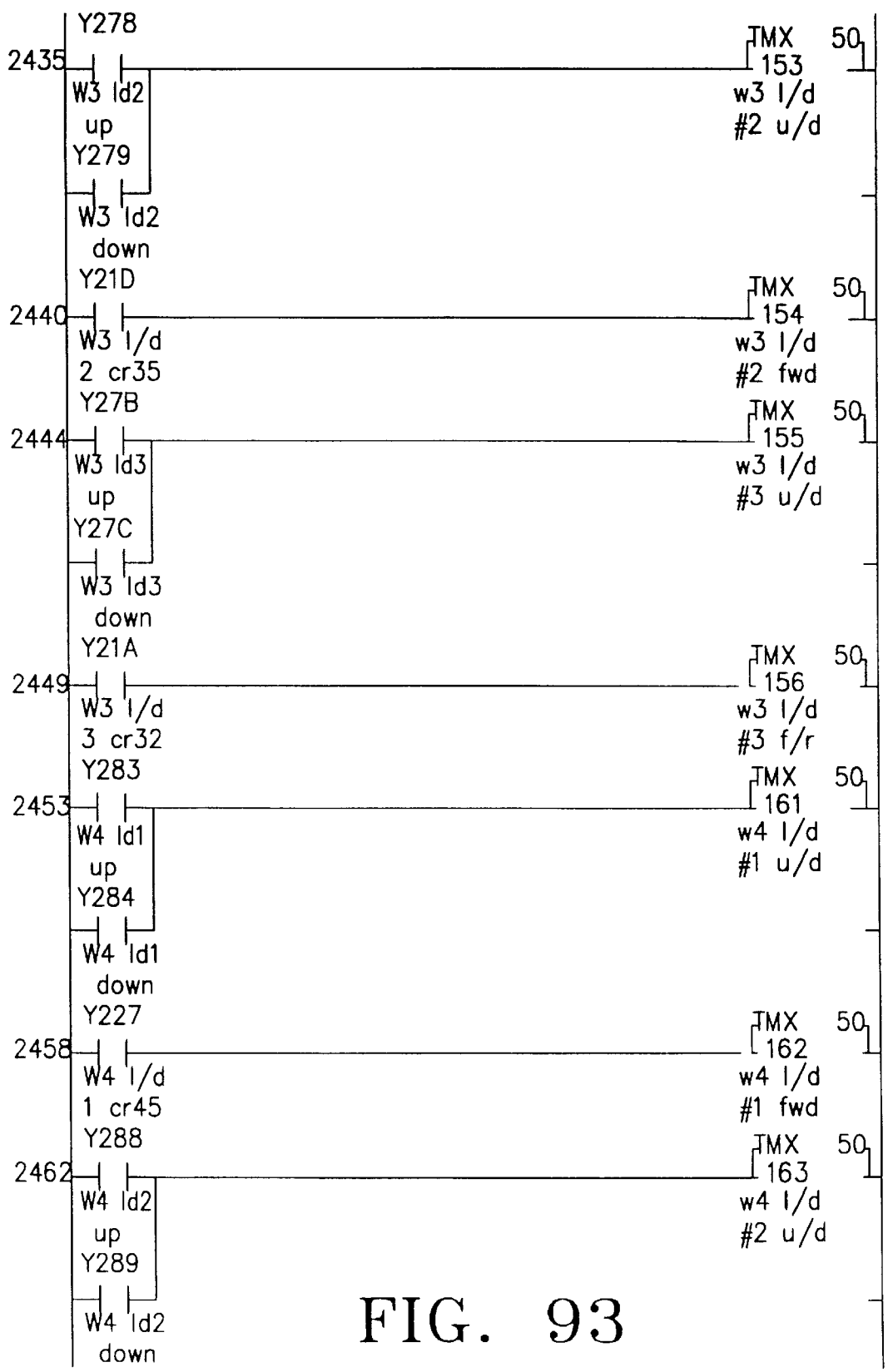
Figure 94:
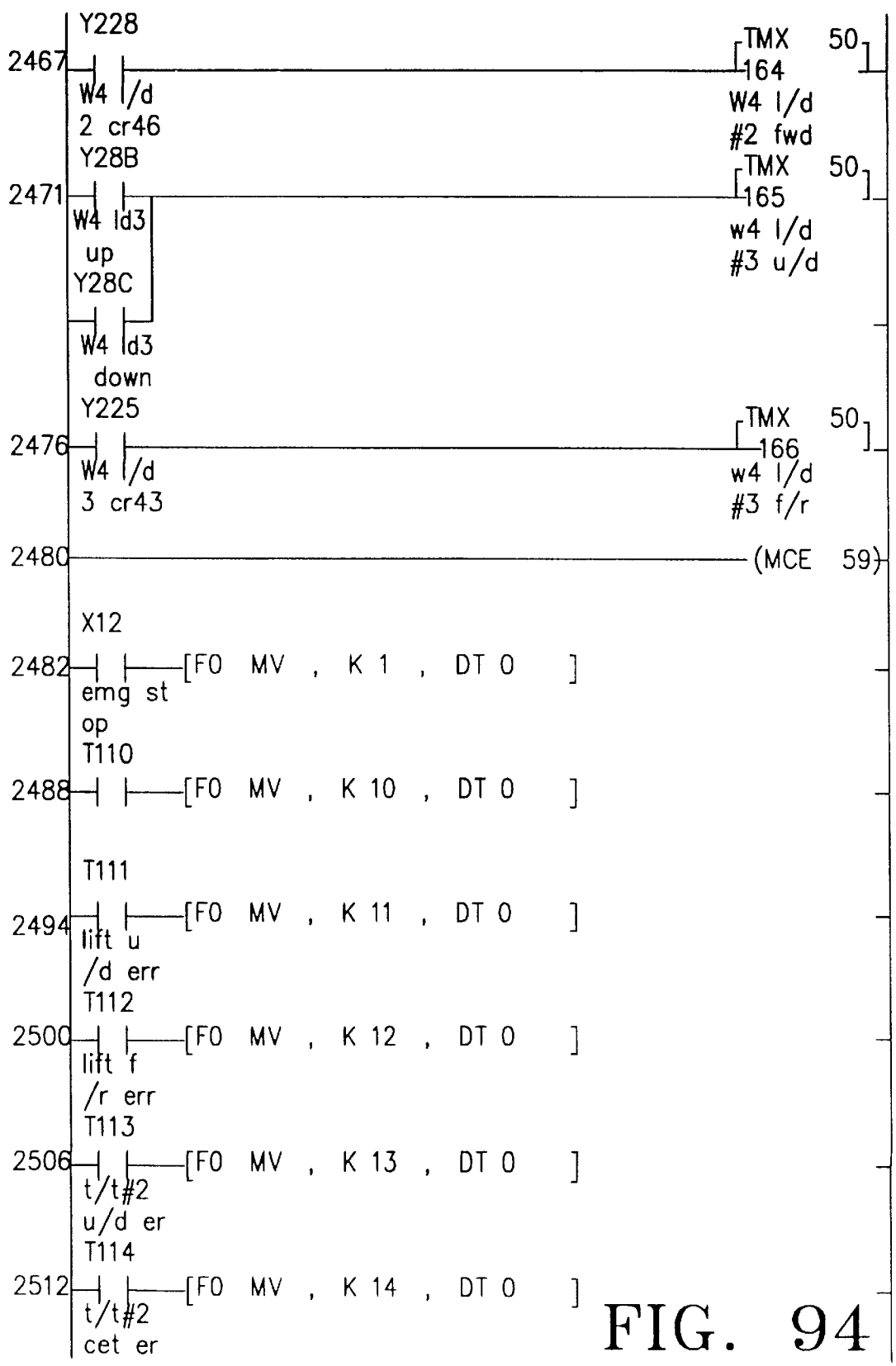
Figure 97:
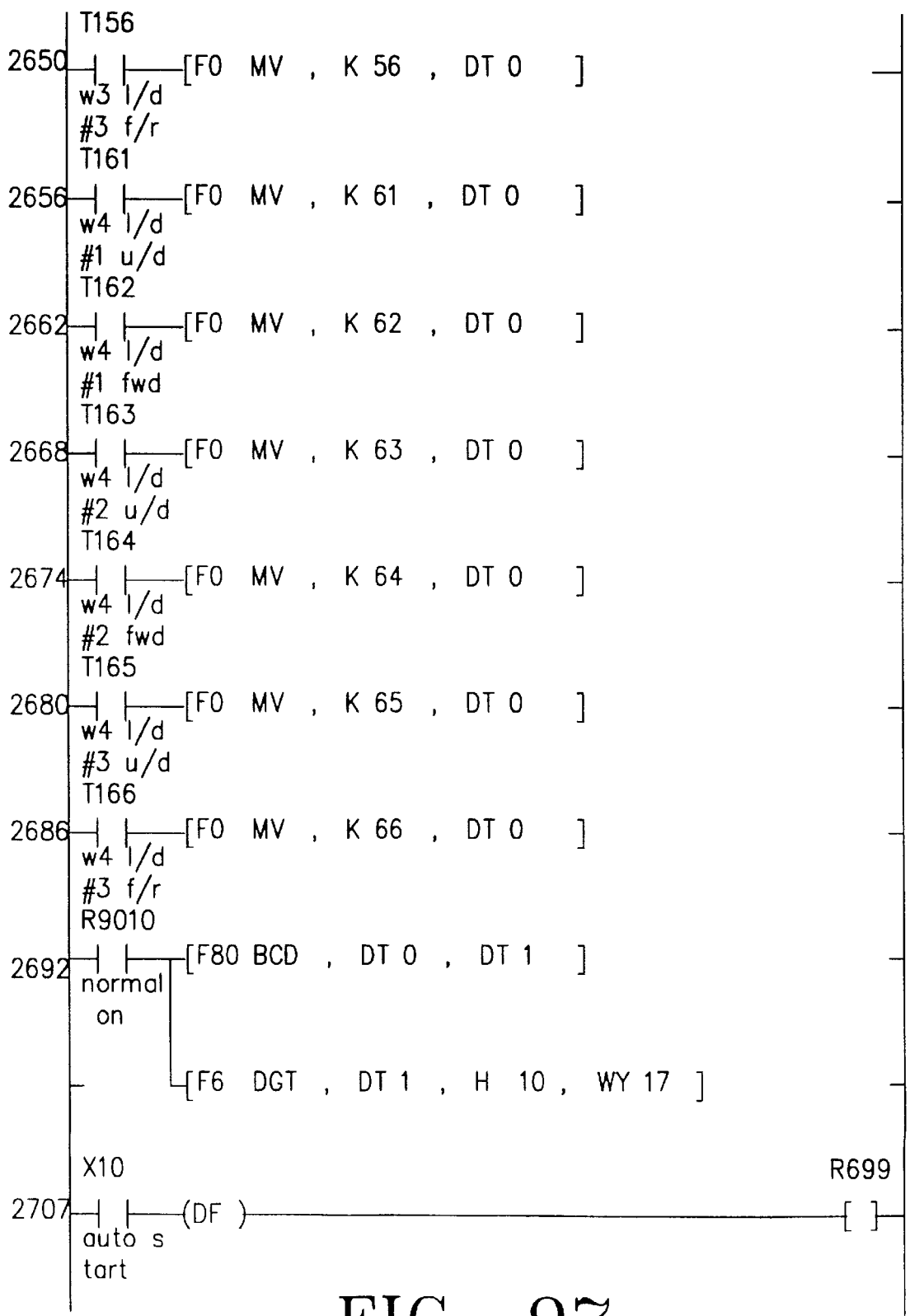
Figure 98:
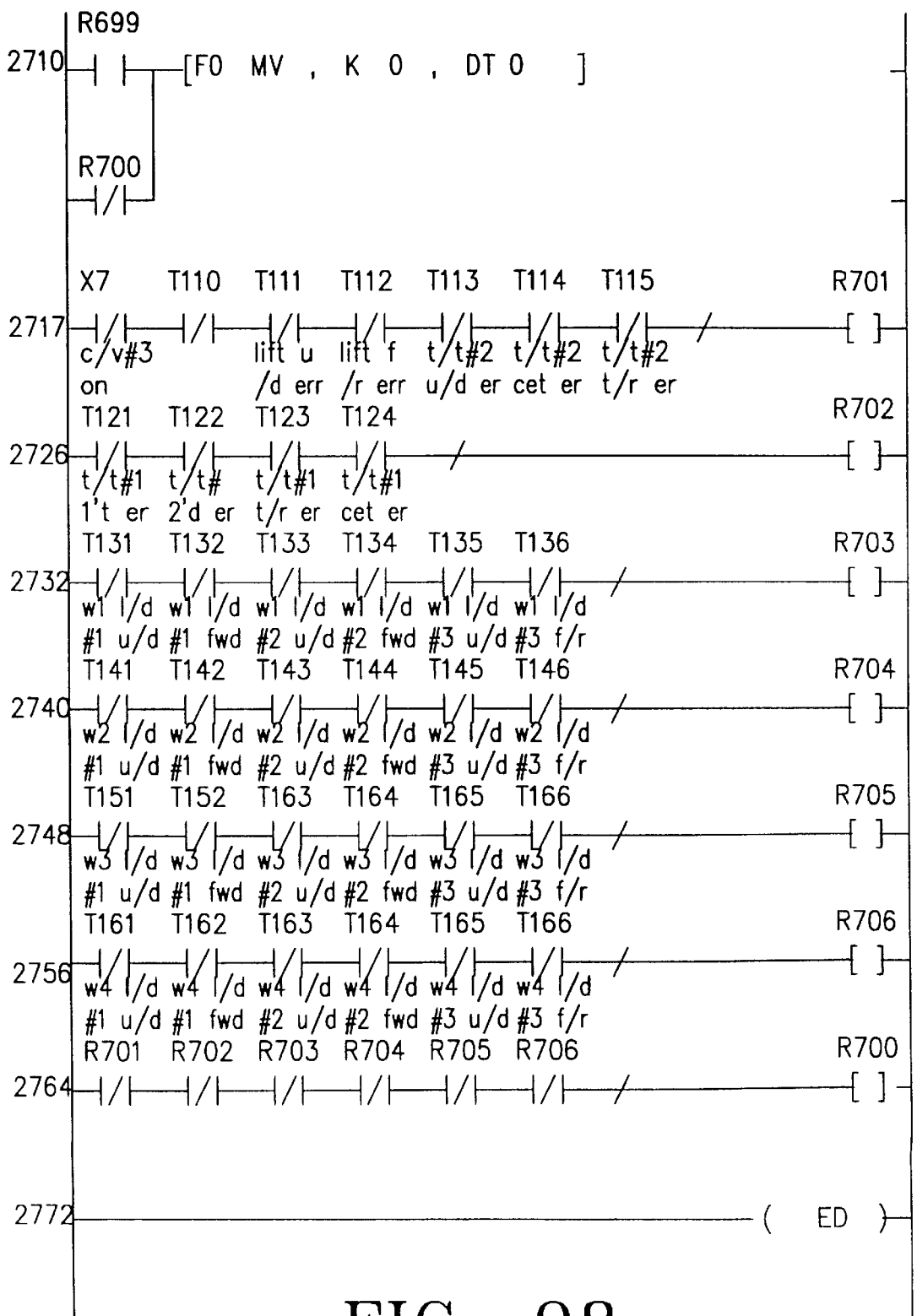

FIGS. 19–98 illustrate the operation of a control program of PLC 220 according to the present invention. The operation of a preferred embodiment of the present invention will now be described in detail with reference to FIGS. 2 to 98. To realize the embodiment, computers 240 to 243 must be programmed to display part insertion instruction diagrams according to different kinds of PCB corresponding thereto in the following procedures.

PCB CAD data is changed from *.CDI file into *.DXF file, so that an edit operation is available in EASY CAD (TM) to highlight certain parts or practice character works. This may be done separately with computers 240 to 243 if each has a Fab-Master (TM) software program installed thereon. The program is operated with two clicks the Fab icon in the initial screen of Window 95 (TM). Operation proceeds by clicking TEST twice and then INCPROC twice. Choose REDAC.EXE and click INPUT in the next screen.

In the Select REDAC Source File window, choose either drive A or C, and Folder. Check if REDAC[*.CDI] is selected in the List File of Type window. Select Files to Work from the File name menu and click OK. Then a *.CDI file is displayed in a poly window. At this time, the Fab program runs and the *.CDI file is opened. Alphanumeric characters are shown in a new window. When a message "press any key" is displayed, press any key. If the file has no error, circuit diagrams and their code numbers are displayed in a square box. Select a diagram to be saved as a DXF file with two clicks, in response to which three circuit diagrams (specifically, Parts, Drill and Signals) are shown.

For the first circuit diagram, choose Parts to display only the Parts circuit diagram. Press F6 to designate the name of Parts as Plot. Rename the file name as the code name of the circuit diagram edited and click OK to store directories and files that have been edited in C:\TEST.Fab. Accordingly, a desired circuit diagram exists as a file having the name of "code name of circuit diagram.dxf" under the directory "code name.job". When a mistake is made after or during the work, discard the icon of the directory or file under C:\TEST direction (i.e., "throw it into the wastebasket") to delete it.

After registering the circuit diagram as described above, quickly click the Easy CAD (TM) icon two times to display the Easy CAD (TM) Tool. If opening the file to edit, the File List menu is displayed. Choose a desired dxf file from the File List menu and click Yes to open .DXF file. Open Edit and click the Erase menu, and the Menu Option will be displayed. Click the Window icon. Select the Coordination Line with the mouse (or pointer), and press the right button of the mouse (or pointer) to show the Menu Option. Click Do it to remove the selected coordination line. Click Select icon from the icons arranged in right side of the Easy CAD (TM) window to display the circuit diagram of .dxf file without coordination lines.

If.DXF file taken from the Fab Master (TM) is not displayed in standard white color, click EXIT and choose Explode to show the Menu Option. Click the Window button and drag the left button from the+mouse pointer to select overall PCB. Click the left button of the mouse once more to convert the color and show the Menu Option. Click Do it, and the color of the entire circuit diagram is converted into white. Select EXIT and choose Color from the Change menu to show the Menu Option. Click the Window icon and select the desired portion of the circuit diagram by drawing a box with the left button of the mouse. Then the color is changed to white and the Menu Option is displayed. When a message is displayed indicating to select NEW Color in the Command menu, choose White from the Color icons at the left to show the entire circuit diagram.

Draw a note column to insert text such as work items and notes. To draw a box, choose Draw and Click Paths and Polys and then select BOX. To draw a line, choose Draw and click LINE from the subordinate menu of Lines. Then insert the desired text. Designate Text Size by choosing the T icon from the icons arranged on right side. When a Menu Prompt is shown, the user designates Height of the Metrics group according to the size of the Box, usually about 0.5. Character Style and Font are designated by Default. Click Default Text to insert into the BOX. Click Draw and Text as a subordinate menu from the Text menu to display the Edit Text menu. Check Multi-line in order to use several lines for entering the name of the note therein.

Copy this basic format for each of the different types of parts. Select the COPY command displayed and click the subordinate menu COPY to display the Window Corner selection menu on Command Line. Select the entire display with the left button of the mouse and Click Do it to show the Copy origin command display. Select the left bottom end of the entire of the display as Origin. Choose Origin Point at the left bottom end and set the Origin Point. With a message, place the mouse pointer to the position to be copied and click the left button of the mouse.

To designate the position and color of the parts to insert, the parts are recognized through a basic indicating method of each parts. Select Change from the Edit menu. Then click Color to display the menu options. Click Window icon from the menu options to select the parts to change by using a pointer. If parts are selected, their color is changed when the Menu Option appears. Click Do it to display a message of NEW Color on the Command Line.

To change to colors of the part into yellow, select a yellow out of the color icons arranged in the left side. To paint a BOX, click the checkerboard button from the icons arranged in the right side to display the Menu Option. Choose the style Default, then click DRAW from the Easy CAD (TM) command menu and select Paths and Polys. Select BOX to paint the position of parts to insert on the screen. All positions of the parts to insert are indicated by assigning only one SEC-CODES to one PBA. All information about the parts such as name, quantity, position and notes are recorded for a product. The file is then saved.

The saved file can be changed to a .gif file by using the Capture Professional as follows. On the initial screen of Window 95 (TM), click the Easy CAD (TM) and Capture icons twice each to execute the Easy CAD (TM window and the Capture Professional v2.0 window. Prior to a work for the program, click Capture from the menu of the Capture window to adjust and set up the size of the Easy CAD (TM) window into 800×600. Select File from the menu of the Easy CAD window to display the File menu. If Open is chosen from the File menu, the Open Drawing command menu will be displayed. When a dialog box is displayed, search for a directory Dcsecw and click twice.

Enlarge the first circuit diagram out of several circuit diagrams displayed as large as possible by clicking a square button once and dragging the desired circuit diagram from the left top to the right bottom. Click Capture from the menu of the Capture Professional v2.0 window once to remove if the Capture Professional v2.0 window and change the shape of a cursor from an arrow to a camera form. Capture the enlarged circuit diagram with the camera-shaped cursor from the left top to the right bottom, (780–790)×(580–590). Enlarge the circuit diagram again as described above. When all the circuit diagram desired are captured, click File from the Capture Professional v2.0 window menu once and click Save to display a dialog box of Capture Professional-File Save.

For example, if the code name of the PBA is 9200004A and the captured circuit diagram is the eighth diagram, search for 9200004A from the directory box in the right side to click it twice and type aa08 for a name of the file in the left side and press Enter. Then the file is saved as aa08 .gif and the dialog box disappears. Close the circuit diagram saved. Click File from the Capture window menu and click Save once. With a dialog box displayed again, type aa07 for a new name of the file and press Enter. In the same manner, the other circuit diagrams are saved as files by typing aa06, aa05, aa04, aa03, aa02 and aa01. For 20 circuit diagrams, type aa20, aa19, aa18, . . . , aa02 and aa01 to save the diagrams as aa20.gif, aa19.gif, aa18.gif, . . . , aa02.gif and aa01.gif.

After the files are saved, the computerized work instructions are displayed on each monitor of the computers 240 to 243 in the following procedures.

Turn on the power of, for example, computer 240. To ensure the process, for example, if a test process is performed in the first and second work frames 101 and 102, type CD test on the C drive and press Enter. Type S in the C drive Test path and press Enter. If there is no test process, type CD test-no on the C drive and press Enter. Then type S in the C drive Test-no path and press Enter. Choose a PBA code to work on with the arrow key and press Enter. Press T key to Tag the file *.gif displayed. Position the cursor on aa01.gif out of the files displayed and press T key to convert the color of the Text and Tag process. Ensure that all gif files are tagged. Type F9.Operation>Side show and press Enter and space bar.

To display the desired parts insertion instructions at, for example, work frame 101, follow air the precedures as follows. When the worker turns the power switch of PLC 220 on, all magnet contact switches C1 to C10 are turned on to drive all of the conveyors. Motors M1 to M10 drive first and second conveyors 120 and 210. With the parts insertion instructions displayed on the monitor of computer 240, the worker ensures that the materials of base board 232 is identical to the material indicated on the display. He takes a carrier 710 out of a carrier case and places it on work frame upper conveyor 111 to install a PCB in it. The parts loaded on base board 232 are inserted into the PCB installed in carrier 710.

This operation may be done by a group of two persons, or one person. In case of a group of two persons, the worker on the left side inserts from compartments 246 large-sized parts that are hard to load on the base board 232, or parts loaded on the base board 231, into the PCB and takes them over the other worker on the right side. When the parts on base board 232 are all inserted, the worker presses clockwise rotation switch 252 to rotate base board 232, divided into 16 (or, in the preferred embodiment, 18) sections, and move to the next set of parts to insert. At this time, the monitor of computer 240 displays the parts insertion instructions for the next parts.

Pressing clockwise rotation switch 252 makes PLC 220 generate a control signal to turn on switches 521 and 524. Thus motor DM2 is driven to rotate base board 232, which is provided with label having therein 16 (or 18) rotation sensing apertures 50 in order for photosensor X08B to detect the position of the next set of parts on rotating base board 232. Photosensor X08B senses the position of the next rotation sensing aperture 50 on the rotating base board 232 while apertures 50 are detected. Then PLC 220 turns off switches 521 and 524 to interrupt motor DM2. Apertures 50 corresponding to a section without parts loaded thereon must be sealed with a reflective material (such as silvered paper or aluminum) to block detection by photosensor X08B. Thus the base board control unit (not shown) rotates base board 232 until 51 detects the next aperture 50.

The worker then takes parts loaded succeeding parts compartment 54 of base board 232 as indicated by the parts insertion instructions displayed on the monitor of computer 240 and inserts them into the PCB. Clockwise rotation switch 252 is pressed again to rotate base board 232 to the position of the next parts to insert.

Figure 14:
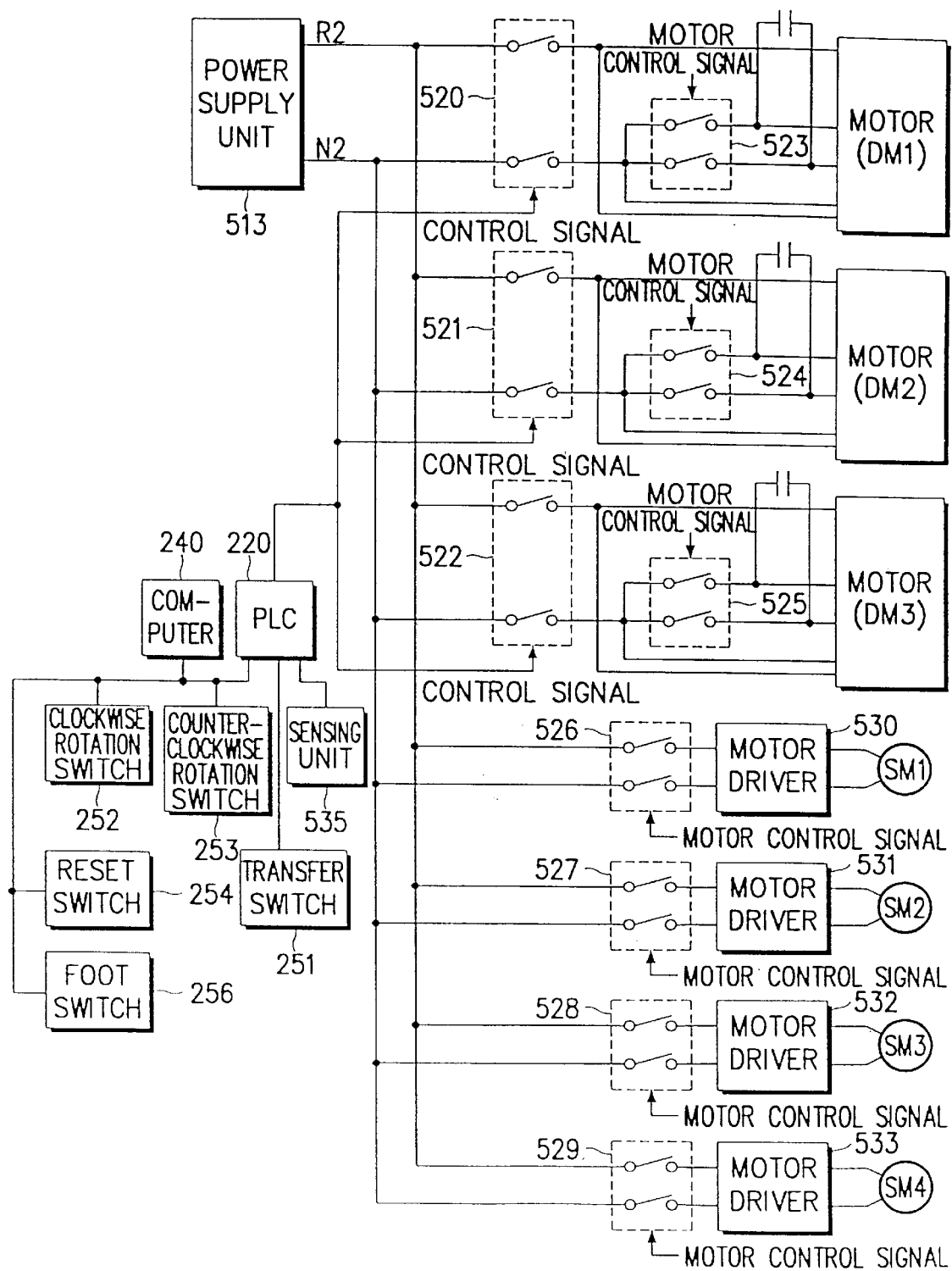
FIGS. 14 to 17 are circuit diagrams of the motor drivers installed on each work frame according to the present invention.
Figure 15:
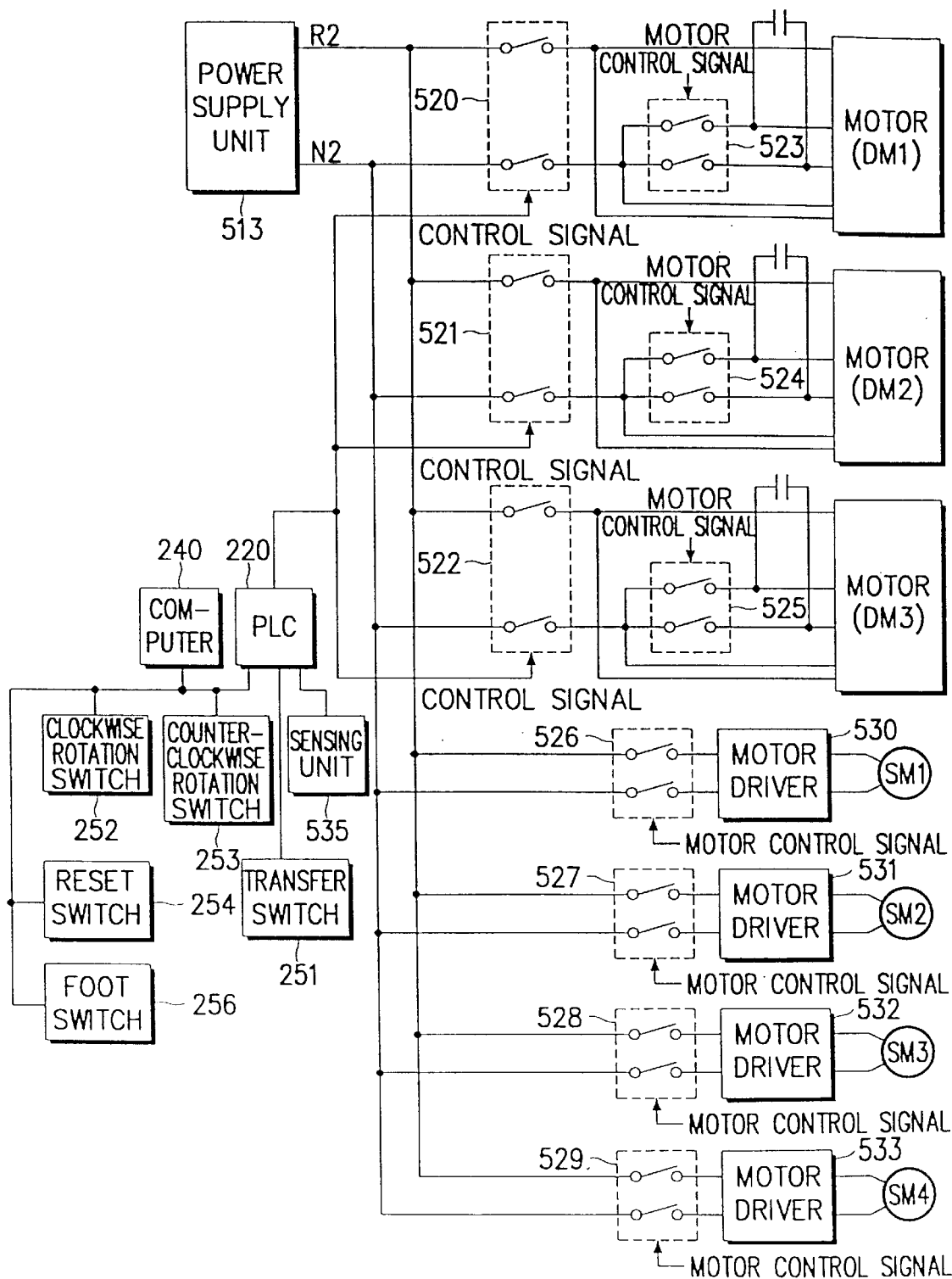
Figure 16:
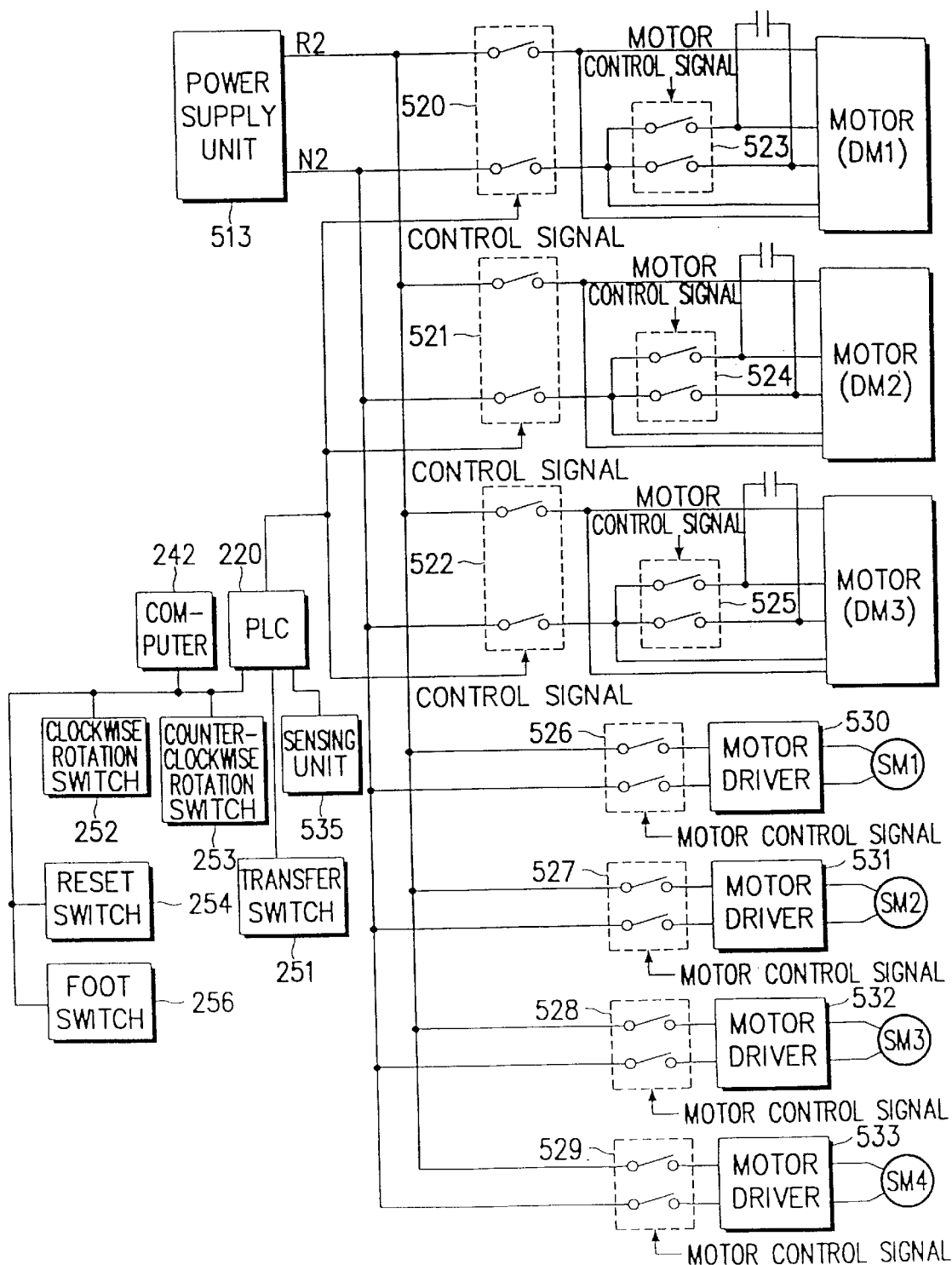
Figure 17:
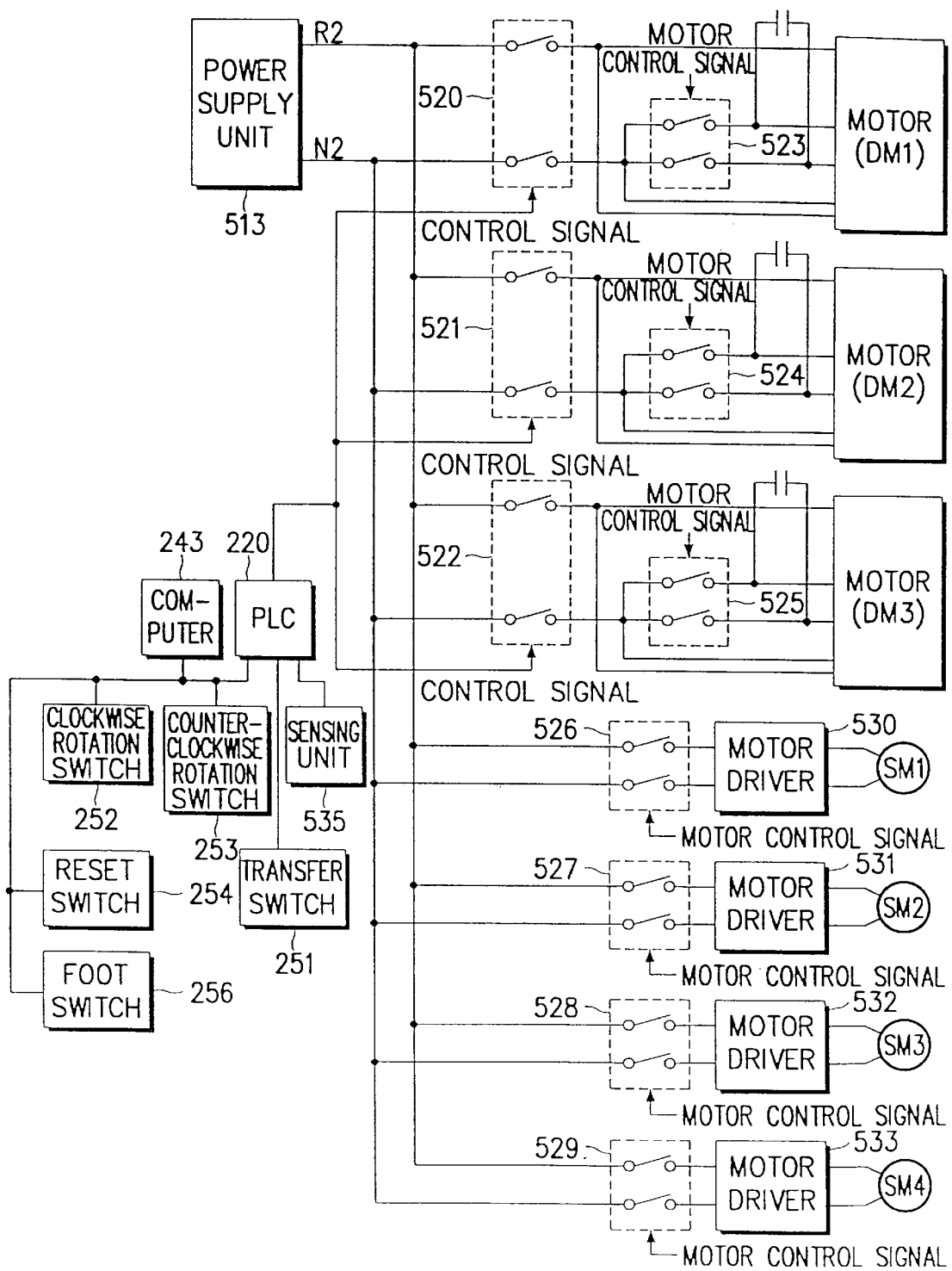

When the PCB is completed through repetition of these operations, the worker places carrier 710 at the right side end of work frame upper conveyor 111 and presses transfer switch 251. Then PLC 220 controls magnet sensor X076 to check that up-down unit 134 is moved up. If the up-down unit 134 is moved up, motor driver 532 is powered up by moving stopper Y250 down and turning on switch 528 as shown in FIG. 14, thereby driving motor SM3 and, thereby, work frame upper conveyor 111. PLC 220 turns on switch 526 as shown in FIG. 14 to supply power to motor driver 530 for driving motor SM1. Carrier 710 is transferred to fourth up-down unit 134, so that photosensor X072 senses that carrier 710 is completely transferred.

PLC 220 then turns off switches 526 and 528 to stop motors SM1 and SM3 and restore stopper Y250. When driving solenoid valve 601 shown in FIG. 18, cylinder 602 is operated to move fourth up-down unit 134 down to its original position. Then carrier 710 is transferred onto first conveyor 120. Similarly, in second, third and fourth work frames 102, 103 and 104, carriers 710 with different types of PCBs installed therein are transferred to first conveyor 120 through the same operation described above with respect to first work frame 101.

When photosensor X073 senses carriers 710 transferred, PLC 220 considers that one cycle of the work is completed and returns up-down unit 134 to its original state. If photosensor X073 installed on the transfer path of first conveyor 120 senses the motion of carrier 710 but no other carriers 710 are sensed by photosensors X061 and X064, then PLC 220 moves down stopper Y25D and drives motor M13 for driving up-down and rotation unit 140. When photosensor X64 senses that carrier 710 is moving, PLC 220 moves up stopper Y25D to prevent a next carrier 710 from being transferred, then suspending driving motor Ml3 for a required time. PLC 220 moves up carrier 710 by a cylinder Y244.

Photosensor X066 detects the completion of the upward motion of cylinder Y244, and similarly for cylinder Y246 moving up the up-down and rotation unit 140. Photosensor X068 senses that cylinder Y246 is completely moved up, a cylinder Y248 rotates carrier 710 in the clockwise direction through a 90-degree angle. When the rotation is sensed by photosensor X06A, PLC 220 drives a cylinder 24A to adjust the width of the conveyor. With this adjustment sensed by photosensor X06C, a cylinder Y245 is moved down so as to place carrier 710 on a transfer conveyor (not shown). Carrier 710 is transferred through spray flux station 150 via the transfer conveyor.

If photosensor X61 senses that carrier 710 transferred, then PLC 220 returns up-down and rotation unit 140 to its initial state. PLC 220 repeatedly operates as described above for each carrier 710 sensed by photosensor X073. Each carrier 710 is transferred to spray flux station 150 to coat it with flux. While carrier 710 is in on auxiliary conveyor 160, it is transferred at an incline of 6 degrees to soldering unit 170. Carrier 710 is soldered in soldering unit 170 and transferred to slope conveyor 180.

PLC 220 recognizes carrier 710 sensed by photosensor XO5F and controls motor driver 507 to stop motor M7. A slope cylinder Y23D is moved down. At slope conveyor 180, PLC 220 drives cylinder 602 to lower one side of carrier 710. When magnet switch X057 recognizes the downward motion of slope conveyor 180, PLC 220 controls motor drivers 506 and 507 to drive motors M6 and M7, transferring carrier 710 to elevator 190. If carrier 710 is sensed by photosensor X51, then PLC 220 recognizes that carrier 710 is out of slope conveyor 180 and controls motor driver 507 to stop motor M7 and return slope conveyor 180 to its original position. With photosensor X051 sensing, PLC 220 receives a signal from photosensor X054 sensing that elevator 190 is moved up and drives motor M11 of elevator 190. Photosensor X050 senses that carrier 710 is transferred to elevator 190 by motor M11. PLC 220 then stops motors M6 and M11, driving a cylinder Y233 to move elevator 190 down.

When photosensor X054 detects carrier 710 without photosensors X053 and X058 sensing, then PLC 220 drives motors M11 and M12 to transfer carrier 710 to rotation unit 200. With carrier 710 detected by photosensor X053, PLC 220 determines that carrier 710 is completely transferred and stops motor M11. Elevator 190 is moved up to its original position by driving a cylinder Y232. With photosensor X059 sensing, PLC 220 recognizes that rotation unit 220 is completely moved up and drives motor Y23A to rotate carrier 710 through a 90-degree angle.

Driving cylinders Y238 and Y237 adjusts the width of the conveyor and moves down rotation unit 200, respectively. When magnet sensor X05A senses the upward motion of rotation unit 200, the cylinder rod is moved down by driving stopper Y235 to drive motor M12 and thus transfer carrier 710 to second conveyor 210. With photosensor X058 sensing the transfer of carrier 710, PLC 220 drives a cylinder Y236 to move up the turn table of rotation unit 200 and rotates the turn table reversely by a cylinder Y23B. PLC 220 then drives cylinder Y237 to move down the turn table and returns the width of the conveyor to its original state by a cylinder Y239, recognizing that one cycle of the operation is completed.

If photosensor X07B is sensed, then PLC moves down stopper Y257. Thus carrier 710 is transferred to second conveyor 210. With photosensor X07A sensing, PLC 220 moves up stopper Y257 but moves down the cylinder rod of stopper Y256. With photosensor X078 sensing, PLC 220 controls the cylinder rod of stopper 255 to move up, thereby interrupting the transfer of carrier 710. After an interval of t seconds, the cylinder rod is moved up by using cylinder Y258 in return (i.e., lower) up-down unit 135. With photosensor X07D sensing, PLC 220 drives motor SM2 to transfer carrier 710 to work frame lower conveyor 115. When photosensor X07C senses, motor SM2 is suspended and PLC 220 drives cylinder Y259 to move down return up-down unit 135. With photosensor X07E sensing, PLC 220 controls the operation according to the sensing of the photosensor concerned.

Motor SM4 is always operative. With photosensor X07F sensing, PLC 220 moves up stopper Y25A to prevent the transfer of carrier 710. If a lifer moving-down signal is detected by photosensor X084, then PLC 220 moves down stopper Y25A and drives motor DM3 to transfer carrier 710 to lifter 221. With limit switch X081 sensing, PLC 220 moves up the stopper, stopping motor DM3 and driving cylinder Y25B to move lifter 221 up to work frame upper conveyor 115. When magnet sensor X083 senses, PLC 220 detects that lifter 221 is completely moved up. If photosensor X082 senses that carrier 710 has been transferred, then PLC 220 stops motor DM3 and controls cylinder Y25C to move down lifter 221. With photosensor X084 sensing, PLC 220 determines that lifter 221 is completely moved down. Photosensor X079 releases the stopper in order for reset switch 254 to transfer carrier 710 to return up-down unit 135.

When photosensor X078 does not sense the type of carrier 710 but photosensor X079 senses the transfer of carrier 710 to second conveyor 210, then PLC 220 continues to transfer carrier 710 to second conveyor 210. With the photosensor sensing, PLC 220 moves down stopper Y267 to transfer the carrier 710 to the second conveyor 210, which is sensed by the photosensor X09A. The PLC 220 moves up the stopper Y267 but moves down the cylinder rod of the stopper Y265. With the photosensor X098 sensing, the PLC 220 moves up the cylinder rod of the stopper Y265 to stop the transfer of the carrier 710. In t seconds, the cylinder Y268 in the return up-down unit 136 is moved up. With the photosensor X09D sensing, the PLC 220 drives the motor SM2 to transfer the carrier 710 to the work frame lower conveyor 116D. Through the photosensor X09C sensing, the motor SM2 is stopped to drive the PLC 220, thus moving return up-down unit 136 down.

If magnet sensor X09E senses, then PLC 220 resets return up-down unit 136 for the next operation for a subsequent carrier 710. Motor SM4 is always operative. With photosensor X09F sensing, PLC 220 moves stopper Y26A up to prevent the transfer of carrier 710. When photosensor X104 senses that lifter 222 is completely moved down, then PLC 220 moves stopper Y26A down and drives motor DM3 to transfer carrier 710 in lifter 222. Pressing it switch X101 makes PLC 220 move stopper Y26A up. PLC 220 stops motor DM3 to move lifter 222 up to work frame upper conveyor 115. With photosensor X103 sensing, PLC 220 determines that lifter 222 is completely moved up and maintains the state of the lifter. Turning photosensor X102 off drives motor DM3 to transfer carrier 710. If carrier 710 is sensed by photosensor X102, then PLC 220 stops motor DM3 and moves lifter 222 down to cylinder Y26C. With photosensor X104 sensing, PLC 220 determines that lifter 222 is completely moved down.

In third work frame 103, carrier 710 is recognized and returned to the work frame with the same precedures. If fourth work frame 104 is the last one, then any carrier 710 that is not returned before reaching fourth work frame 104 is considered as originating from fourth work frame 104 and thus returned thereto.

When carriers 710 with soldered PCBs are transferred to work frame upper conveyors 111 to 114, the workers separate the PCBs from their respective carriers 710 and trim them, followed by inspecting them for incorrect insertion of parts.

To sense the type of carrier 710 transferred to second conveyor 210, transparent fiber sensors X078, X098 and X118 are installed in different positions on second conveyor 210 as photosensors. Transparent fiber sensors X078, X098 and XI 18 may detect a bracket (not shown) attached to carrier 710 as a cell-recognizing indicator and recognize the carrier 710 as that of the work frame. In the preferred embodiment, the indicium of cell detection plate 730 is detected for cell recognition. For a last work frame, no separate sensing device is installed.

To return base boards 231–238 to their original positions for the purpose of insertion of parts, photosensors X08B, X086, X10B, X106, X12B, X126, X14B and X146DMF may be installed under the gear for rotating base boards 231–238. Base boards 231 to 238 are rotated by pressing rotation switches 252 and 253 to drive a motor. Alternatively, base boards 231–238 may be rotated manually after the insertion of the parts.

According to the present invention, carriers with different types of PCB installed therein are transferred to a soldering unit through an upper conveyor. After soldering, each of the carriers is moved down to a lower conveyor to return to its work frame designated according to detecting the position of a cell-recognizing indicator installed on the carrier. The PCBAs on the carriers are then inspected by the same workers who inserted the parts into the PCBs. With these procedures, the present invention can enhance productivity and thus decrease production cost.

One benefit of the present invention is that the failure rate may be reduced, because the worker is in charge of an entire production process from assembly through inspection. The workers can have greater job satisfaction in a production system for different processes. The present invention also prevents the waste of manpower that may be caused while a new production set-up is established.

It should be understood that the present invention is not limited to the particular embodiment disclosed herein as the best mode contemplated for carrying out the present invention, and neither is the present invention limited to the specific embodiments described in this specification except as defined in the appended claims.

What is claimed is:

1. A system for manufacturing a print board assembly, which has a spray flux for flux-coating a printed circuit board installed in a carrier, and a soldering unit for soldering the printed circuit board coated with flux, comprising:

a multitude of work frames having a multitude of work frame upper conveyors for placing each of the carriers thereon by a number of workers, installing different types of the printed circuit boards in the carriers and inserting parts into the printed circuit boards according to parts insertion instructions, the carriers with the printed circuit boards soldered being returned to the work frame upper conveyors by types of the printed circuit board;

an upper conveyor for transferring the carriers from the work frames to the soldering unit, with a multitude of transfer switch turned on;

a carrier transfer distance controller for adjusting a transfer distance of the carriers on the upper conveyor so as to prevent the carriers from colliding with each other;

a multitude of up/down and rotation units for moving the carriers up to the height of the spray flux and rotating them in a 90-degree arc;

a slope conveyor for moving one side of the carriers down so as to have a declination during soldering;

an elevator for moving the carriers down when the carriers are transferred from the slope conveyor and enter the elevator;

a rotation unit for rotating the carriers reversely in a 90-degree arc so as to change their orientations;

a lower conveyor for transferring the carriers rotated reversely by the rotation units to return, the carriers being moved down to the lower conveyor by the elevator when they are transferred from the slope conveyor;

a multitude of lifters for moving the carriers returned by the lower conveyors up to the work frame upper conveyors;

a multitude of carrier type sensing units installed in each designated position of the lower conveyor to detect positions of cell-recognizing indicators of the carriers;

a controller for controlling the carriers to return to each work frame designated in response to a determining signal received from a carrier type discrimination unit to determine a transfer status of the carriers, generating a dig control signal for the work frame upper and lower conveyors and a carrier control signal to move up or down the carriers, and generating a motor control signal to drive base boards for supplying the parts in the clockwise or counterclockwise direction; and a multitude of sensors installed on the upper and lower conveyors to sense the transfer status of the carriers.

2. The system as defined in claim 1, further comprising an auxiliary conveyor for moving the carriers horizontally transferred from the spray flux, at an incline of 6 degrees to the soldering unit.

3. The system as defined in claim 2, wherein pressing the transfer switches generates a key signal to transfer the carriers.

4. The system as defined in claim 2, wherein each of the work frames comprises:

a computer for displaying the parts insertion instructions by parts on a monitor thereof in response to a clockwise and counterclockwise rotation switching signal in order for workers to insert the parts sequentially, the parts insertion instructions including information about the parts such as position to insert, name and quantity thereof;

a plurality of base boards for loading with different types of the parts;

a plurality of clockwise and counterclockwise rotation switches for generating a key signal to rotate the base boards clockwise or reversely;

a reset switch for generating a key signal to turn back the base boards to original position;

a work frame upper conveyor for placing the carriers thereon to insert the parts into the printed circuit board and transferring the carriers assembled;

a plurality of up-down units for placing the carriers from the work frame upper conveyor to the upper conveyor whenever the transfer switch is pressed;

a work frame lower conveyor for returning the carriers soldered and transferred through the lower conveyor; and a plurality of return up-down units installed at the bottom of the lower conveyor and perpendicularly to the up-down units and returning the carriers transferred through the lower conveyor by moving them up to the work frame lower conveyor.

5. The system as defined in claim 4, wherein each of the base boards is round-shaped and separated by a plurality of partitions so as to be loaded with different kinds of parts, the base boards being rotated to supply required parts under the control of the controller.

6. The system as defined in claim 1, wherein the carrier type sensing units are photosensors.

7. The system as defined in claim 1, wherein the cell-recognizing indicators are brackets formed in different positions of the carriers.

8. The system as defined in claim 1, wherein each of the work frames comprises:
- at least one base board installed on a base plate, for rotating by stages;
- a gear installed in the lower direction of the base board, for rotating the base board clockwise or counterclockwise;
- a driving motor interlocked with the gear and fixed to a support plate, for rotating the base board;
- a work frame upper conveyor installed at a work plate which is installed on the base board, for conveying a carrier to a main conveyor;
- a work frame lower conveyor installed in the lower direction of the base board, for conveying a soldered carrier;
- clockwise and counterclockwise rotation switches for causing the base board to be rotated clockwise and counterclockwise, respectively; and
- a reset switch installed beside the clockwise and counterclockwise rotation switches, for causing the base board to be situated at an initial position.

9. The system as defined in claim 8, further comprising a cut-away portion installed on the work plate, for easily taking out parts from the base board.

10. The system as defined in claim 8, further comprising a sensor installed at the inner side of the cut-away portion, for sensing that the worker's hand is put on the cut-away portion in order to prevent the worker from damaging under the state that the base board is rotated.

11. The system as defined in claim 8, further comprising a foot switch connected to the controller and installed on the floor, for rotating the base board clockwise or counterclockwise by the worker's foot.

12. The system as defined in claim 4, wherein the base board has multiple parts containers in which a variety of parts are classified and laid and a parts information label mounting face to which a label is attached in order to prevent mis-insertion of parts.

13. The system as defined claim 12, wherein the parts information label mounting face of the base board and the label include multiple first and second rotation sensing apertures, respectively, for selecting the position of the parts, through sensing of a photo sensor installed in the work frame.

14. The system as defined in claim 13, wherein the parts information label mounting face of the base board and the label comprises first and second original point setting apertures are formed in the parts data label mounting face of the base board and the label, respectively, for making the base board return to its original position, through sensing of a sensor, after the first process is finished, and include first and second fixing apertures, respectively, for fixing the label on the parts information label mounting face of the base board.

15. The system as defined in claim 13, wherein the label is divided into equal portions, with its central axis, corresponding to the size and number of cells formed in the base board.

16. The system as defined in claim 13, wherein each equally-divided portion comprises: a work procedure indicator indicating the work procedure of the respective parts assembled in the PCB; a quantity indicator indicating the number of the parts according to the kind of goods; a parts code indicator indicating the consecutive numbers of the respective parts; and a parts name indicator indicating the names of the respective parts.

17. The system as defined in claim 1, wherein the carrier comprises:
- guide grooves formed in bars facing each other in a square frame;
- first bracket means formed on the bottom of one side in a positioning bar which moves back and forth along the guide grooves; and
- second bracket means formed on the bottom of one side of the frame, facing the first bracket means formed in the positioning bar,
- wherein various sizes of printed circuit boards can be mounted in the carrier.

18. The system as defined in claim 17, wherein leaf springs, corresponding to the first bracket means attached to the positioning bar, are attached to the top of the positioning bar, and extend downward along the side of the positioning bar.

19. The system as defined in claim 17, wherein a solder preventive sill is attached to the frame where the guide groove is formed, and is double-curved from left to right on the bottom of the frame.

20. The system as defined in claim 17, wherein guides are inserted in the guide grooves, and both ends of the positioning bar are fastened to the guides.

21. The system as defined in claim 20, wherein clamping screws thread into holes formed at both ends of the positioning bar and the guides, and butt up against the bottoms of the guide grooves.

22. The system as defined in claim 1, wherein coupling grooves of a specified depth and width are formed in both sides where the guide grooves are formed and which face each other in the frame, to make installation and removal of the positioning bar possible.

23. The system as defined in claim 17, wherein stop grooves are cut into the outer edges of the side bars of the frame where the guide grooves are not formed.

24. The system as defined in claim 17, wherein threaded holes are symmetrically cut into the left and right top corners of the frame to attach a cell detection plate for sorting the carriers.

25. The system as defined in claim 1, wherein the carrier comprises:
- a square frame;
- guide grooves formed in tops of two bars facing each other in the frame and running along the bars;
- guides inserted in the guide grooves;
- a positioning bar at both ends of which grooves are formed, the grooves respectively mating with the inner sides of the frame and the guides, wherein the positioning bar is attached to the guides with screws;
- clamping screws threaded into holes formed in the positioning bar and the guides and butting against the bottoms of the guide grooves;

first bracket means which are attached onto the bottom of the positioning bar, and whose protrusions extend horizontally from the side of the positioning bar;

second bracket means which are attached onto the bottom of the frame, facing the first bracket means, and project toward the positioning bar;

leaf springs which are attached at the top of the positioning bar, corresponding to the brackets and extend downward along the side of the positioning bar; and a solder preventive sill which is attached to the bottom of the frame containing guide groove and extends to a predetermined depth, then projects horizontally inward.

26. The system as defined in claim 25, wherein coupling grooves of a specified depth and width are formed in both sides where the guide grooves are formed and which face each other in the frame, to make installation and removal of the positioning bar possible.

27. The system as defined in claim 26, wherein stop grooves are cut into the outer edges of the side bars of the frame where the guide grooves are not formed.

28. The system as defined in claim 27, wherein threaded holes are symmetrically cut into the left and right top corners of the frame to attach a cell detection plate for sorting the carriers.

29. A system for assembling a plurality of printed circuit boards, said system comprising:

a printed circuit board being individually assembled by an arranger, then transported through a soldering process, and then transported back to said arranger that originally assembled said printed circuit board to check the quality and the accuracy of assembly;

a plurality of circuitry controlling said system and allowing said system to produce different types of said printed circuit boards concurrently;

a main assembly line comprising:

a first conveyor vertically aligned with and parallel to a second conveyor, said first conveyor and said second conveyor transporting a carrier securely supporting said printed circuit board;

said first conveyor having means for receiving an assembled said printed circuit board from any one of a plurality of parallel assembly lines an automatic flux unit operating on said printed circuit board after said first conveyor receives said carrier and while said first conveyor transports said carrier to a first elevator device;

an automatic soldering unit operating on said printed circuit board during the transport of said carrier from said automatic flux unit to said first elevator device;

said first elevator device receiving said carrier from said first conveyor and transporting said carrier to said second conveyor, said second conveyor transporting said printed circuit board to a parallel assembly line that provided said printed circuit board; and means for transferring said carrier from said second conveyor to said parallel assembly line that said carrier was received from;

said parallel line stations each connected at a distal end to said main assembly line, each of said parallel line stations, comprising:

a third conveyor vertically aligned and parallel to a fourth conveyor, said third conveyor supporting said carrier during the assembly of said printed circuit board and then providing said carrier supporting said printed circuit board to said first conveyor of said main assembly line;

a display device controlled by said circuitry and showing instructions for assembling said printed circuit board of a predetermined type;

said fourth conveyor receiving said carrier from said second conveyor of said main assembly line after the completion of said soldering process and transporting said carrier to a second elevator device;

said second elevator device transporting said carrier to said third conveyor; and said third conveyor transporting said carrier supporting a soldered said printed circuit board to said arranger that assembled said printed circuit board; and a plurality of sensors transmitting a plurality of data to said circuitry to allow said circuitry to control said system and to ensure that a soldered said printed circuit board is checked by said arranger that assembled said printed circuit board.

30. The system of claim 29, said main assembly line further comprising:

said first conveyor having a rotation and elevation device for loading said carrier carrying an assembled said printed circuit board into said automatic flux unit, said first conveyor having a sloped conveyor for loading said carrier into said first elevator device;

a first up-down unit attached to said first conveyor at every location where said distal end of said parallel assembly line is connected to said main assembly line, said first up-down unit capable of loading said carrier from said third conveyor of said parallel assembly line; and a second up-down unit attached to said second conveyor at every location where said distal end of said parallel assembly line is connected to said main assembly line, said second up-down unit loading said carrier from said second conveyor onto said fourth conveyor of said parallel assembly line.

31. The system of claim 29, said carrier further comprising:

a frame having a front member, a rear member, and two side members forming a rectangular shape, said front member having a blade attached perpendicularly attached to the plane of said rectangular shape, said two side members having flanges protruding along the length of said two side members to engage a plurality of conveyors;

two recesses oppositely located on said two side members engagable with said system to secure said carrier;

a crossbar slidably attached to said front member and said rear member, said crossbar having a clamping screw at each distal end, a first plurality of brackets facing one side bar, and a plurality of leaf springs located above said first plurality brackets; and a second plurality of brackets facing said first plurality of brackets and located on one of said two side members.

32. The system of claim 29, further comprised of said arranger being a person.

33. The system of claim 29, further comprised of said automatic soldering unit applying solder to said printed circuit board while supporting said printed circuit board at a predetermined angle.

34. The system of claim 33, further comprised of said predetermined angle being 6 degrees.

35. The system of claim 29, said parallel assembly line further comprising a plurality of circular bins divided into a plurality of compartments, each of said compartments containing a plurality of components for assembling said printed circuit board of said predetermined type, said circular bins rotated by a motor.

36. The system of claim 35, further comprised of said circular bins rotationally controlled by said circuitry and coordinated with instructions given by said display device.

37. The system of claim 35, said circular bins further comprising a hand sensor to prevent said circular bins from rotating while an appendage is inside said circular bins.

38. The system of claim 35, said circular bins rotationally controlled by a foot switch operated by said arranger for rotating said circular bins.

39. The system of claim 29, further comprised of said sensors being photosensors.

* * * * *